(12) United States Patent
Zhu et al.

(10) Patent No.: US 7,104,453 B1
(45) Date of Patent: *Sep. 12, 2006

(54) UNITARY PACKAGE IDENTIFICATION AND DIMENSIONING SYSTEM EMPLOYING LADAR-BASED SCANNING METHODS

(75) Inventors: Xiaoxun Zhu, Marlton, NJ (US); Ka Man Au, Philadelphia, PA (US); Gennady Germaine, Cherry Hill, NJ (US); George Kolis, Pennsauken, NJ (US); Timothy A. Good, Clementon, NJ (US); Michael D. Schnee, Aston, PA (US); Robert E. Blake, Woodbury Heights, NJ (US); Carl Harry Knowles, Moorestown, NJ (US); Sankar Ghosh, Glenolden, PA (US); Charles A. Naylor, Sewell, NJ (US); David M. Wilz, Sr., Sewell, NJ (US); Constantine J. Tsikos, Voorhees, NJ (US); Francis E. Lodge, Haddonfield, NJ (US); Stephen J. Colavito, Brookhaven, PA (US); George B. Rockstein, Audubon, NJ (US)

(73) Assignee: Metrologic Instruments, Inc., Blackwood, NJ (US)

( * ) Notice: Subject to any disclaimer, the term of this patent is extended or adjusted under 35 U.S.C. 154(b) by 309 days.

This patent is subject to a terminal disclaimer.

(21) Appl. No.: 10/009,368
(22) PCT Filed: Jun. 7, 2000
(86) PCT No.: PCT/US00/15624
§ 371 (c)(1),
(2), (4) Date: Jun. 3, 2002
(87) PCT Pub. No.: WO00/75856
PCT Pub. Date: Dec. 14, 2000

Related U.S. Application Data

(63) Continuation-in-part of application No. 09/327,756, filed on Jun. 7, 1999, now abandoned.

(51) Int. Cl.
*G06K 7/10* (2006.01)

(52) U.S. Cl. .................. 235/462.14; 235/462.01; 235/462.35; 235/462.24; 235/462.25; 235/462.18; 235/462.07; 235/375

(58) Field of Classification Search ............ 235/462.14, 235/462.24; 359/216; 356/2, 3
See application file for complete search history.

(56) References Cited

U.S. PATENT DOCUMENTS 3,671,766 A 6/1972 Howe (Continued)

FOREIGN PATENT DOCUMENTS

EP 0 492 065 * 1/1992

(Continued)

OTHER PUBLICATIONS

Accu–Sort—Tunnel Scanning System by, www.accusort.com/mktg/as01.html, 1999, p. 1–2.

(Continued)

*Primary Examiner*—Daniel Stcyr
*Assistant Examiner*—Daniel Walsh
(74) *Attorney, Agent, or Firm*—Thomas J. Perkowski, Esq., P.C.

(57) ABSTRACT

A fully automated package identification and measuring system (300), in which an onmidirectional holographic scanning tunnel (100) is used to read bar codes on packages entering the tunnel, while a package dimensioning subsystem (500, 600) is used to capture information about the package prior to entry into the tunnel. Mathematical models are created on a real-time basis for the geometry of the package and the position of the laser scanning beam used to read the bar code symbol thereon. The mathematical models are analyzed to determine if collected and queued package identificaton data is spatially and/or temporally correlated with package measurement data using vector-based ray-tracing methods, homogeneous transformations, and object-oriented decision logic so as to enable simultaneous tracking of multiple packages being transported through the scanning tunnel.

4 Claims, 116 Drawing Sheets

U.S. PATENT DOCUMENTS

| | | |
|---|---|---|
| 3,947,816 A | 3/1976 | Rabedeau |
| 4,044,283 A | 8/1977 | Allison |
| 4,063,287 A | 12/1977 | van Rosmalen |
| 4,333,006 A | 6/1982 | Gorin et al. |
| 4,387,297 A | 6/1983 | Swartz et al. |
| 4,580,894 A | 4/1986 | Wojcik |
| 4,632,501 A | 12/1986 | Glynn |
| 4,717,241 A | 1/1988 | Aagano |
| 4,904,034 A | 2/1990 | Narayan et al. |
| 4,958,894 A | 9/1990 | Khowles |
| 5,076,690 A | 12/1991 | deVos et al. |
| 5,080,456 A | 1/1992 | Katz et al. |
| 5,168,149 A | 12/1992 | Dvorkis et al. |
| 5,193,120 A * | 3/1993 | Gamache et al. ........... 382/286 |
| 5,220,536 A | 6/1993 | Stringer et al. |
| 5,224,088 A | 6/1993 | Atiya |
| 5,280,165 A | 1/1994 | Dvorkis et al. |
| 5,329,103 A | 7/1994 | Rando |
| 5,331,118 A | 7/1994 | Jensen |
| 5,373,148 A | 12/1994 | Dvorkis et al. |
| 5,412,198 A | 5/1995 | Dvorkis |
| 5,495,097 A | 2/1996 | Katz et al. |
| 5,543,610 A | 8/1996 | Bard et al. |
| 5,547,034 A | 8/1996 | Wurz et al. |
| 5,555,090 A | 9/1996 | Schmutz |
| 5,581,067 A | 12/1996 | Grosfeld et al. |
| 5,600,119 A | 2/1997 | Dvorkis et al. |
| 5,633,487 A | 5/1997 | Schmutz et al. |
| 5,656,799 A * | 8/1997 | Ramsden et al. ............... 177/2 |
| 5,661,561 A | 8/1997 | Wurz et al. |
| 5,689,092 A | 11/1997 | Wurz et al. |
| 5,699,161 A * | 12/1997 | Woodworth ................ 356/628 |
| 5,737,438 A | 4/1998 | Zlotnick et al. |
| 5,814,802 A | 9/1998 | Hecht et al. |
| 5,831,220 A | 11/1998 | Ramsden et al. |
| 5,831,737 A * | 11/1998 | Stringer et al. ............. 356/634 |
| 5,850,370 A | 12/1998 | Stringer et al. |
| 5,869,827 A | 2/1999 | Rando |
| 5,870,220 A * | 2/1999 | Migdal et al. .............. 359/216 |
| 5,889,550 A | 3/1999 | Reynolds |
| 5,900,611 A | 5/1999 | Hecht |
| 5,923,428 A | 7/1999 | Woodworth |
| 5,969,823 A * | 10/1999 | Wurz et al. ................. 356/639 |
| 5,978,512 A * | 11/1999 | Kim .......................... 382/241 |
| 5,979,760 A | 11/1999 | Freyman et al. |
| 5,984,186 A | 11/1999 | Tafoya |
| 5,991,041 A | 11/1999 | Woodworth |
| 6,049,386 A | 4/2000 | Stringer et al. |
| 6,053,409 A | 4/2000 | Brobst et al. |
| 6,064,629 A | 5/2000 | Stringer et al. |
| 6,069,696 A | 5/2000 | McQueen et al. |
| 6,123,264 A | 9/2000 | Li et al. |
| 6,137,577 A | 10/2000 | Woodworth |
| 6,147,358 A | 11/2000 | Hecht |
| 6,177,999 B1 | 1/2001 | Wurz et al. |
| 6,257,490 B1 | 7/2001 | Tafoya |
| 6,296,187 B1 | 10/2001 | Shearer |
| 6,457,642 B1 * | 10/2002 | Good et al. ............ 235/462.01 |
| 6,674,904 B1 * | 1/2004 | McQueen ................... 382/199 |
| 2002/0014533 A1 * | 2/2002 | Zhu et al. .............. 235/472.01 |

FOREIGN PATENT DOCUMENTS

| | | |
|---|---|---|
| GB | 2 189 594 A | 10/1987 |
| WO | WO 97/22082 | 8/1997 |
| WO | WO 00/75856 | 12/2000 |

OTHER PUBLICATIONS

Dimensioning The Right Way:Reliably by, Cargoscan, 1996, p. 1–16.

The MINI–X by, Accu–Sort Systems, Inc., Telford, PA, 1998.

International Search Report, 2000.

* cited by examiner

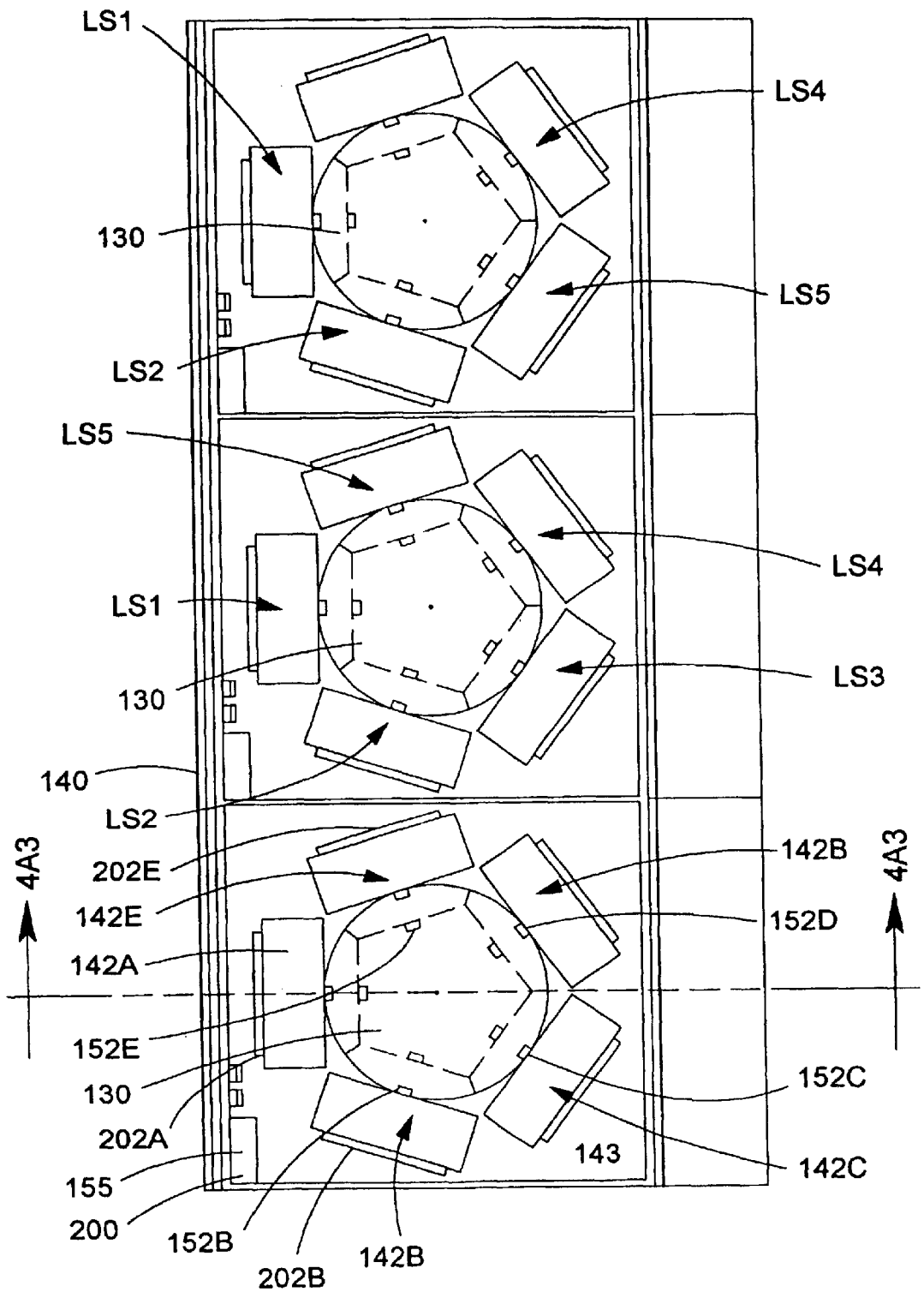
FIG. 4A1

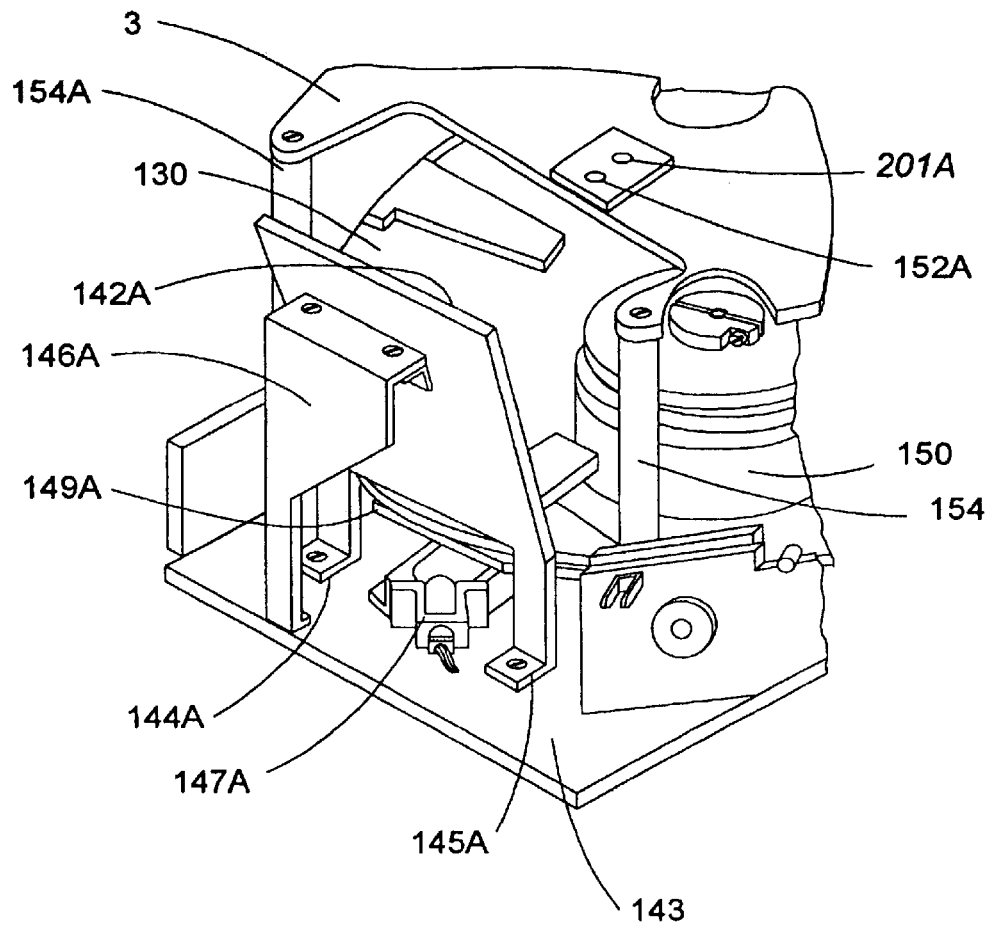
FIG. 4A2

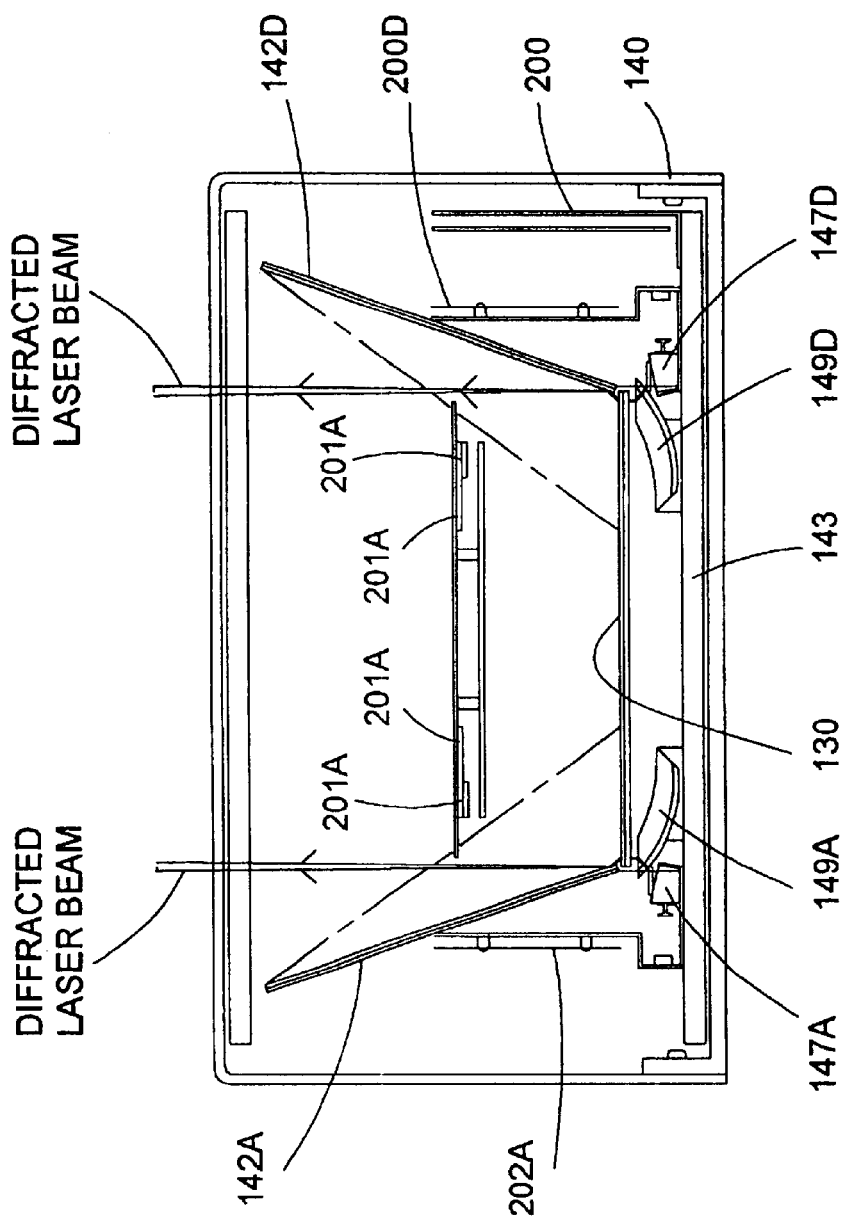
FIG. 4A3

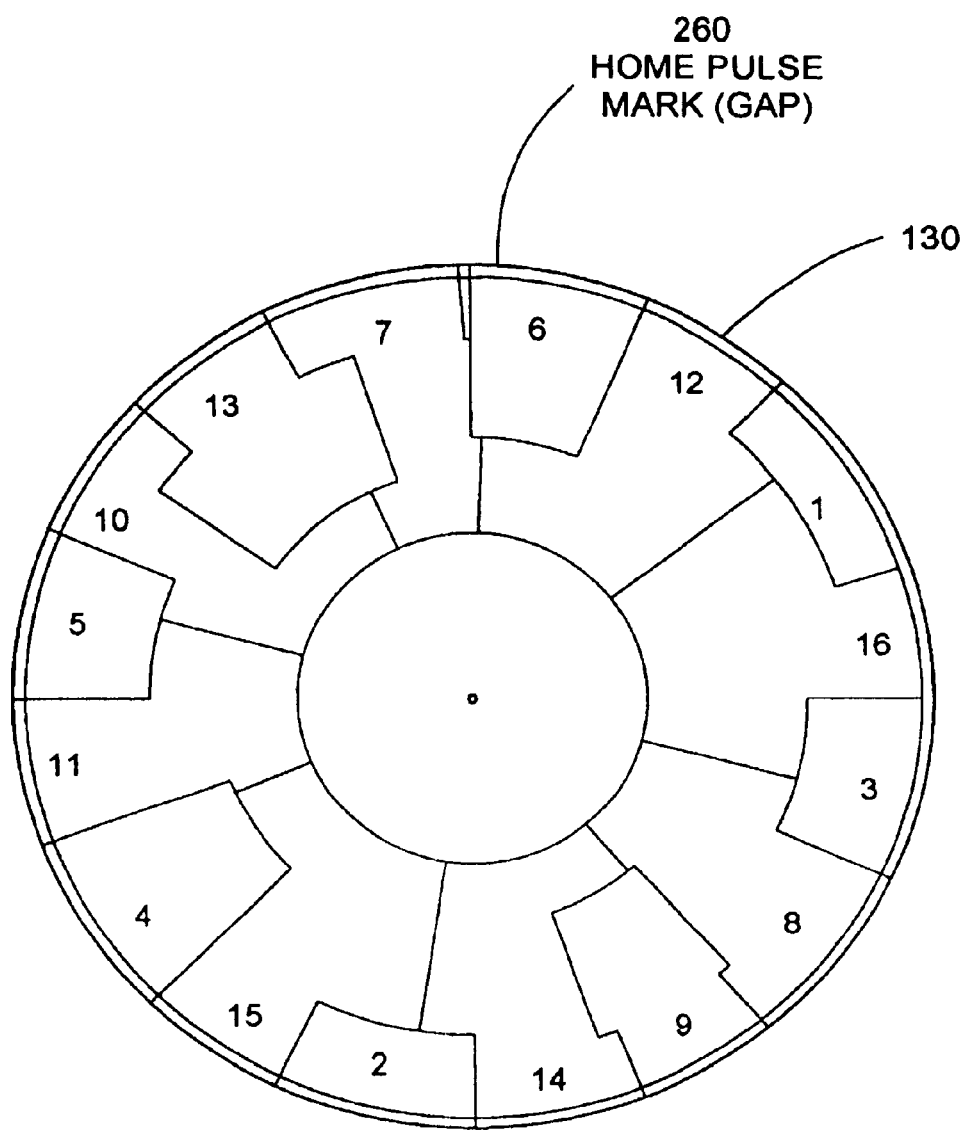
FIG. 4A4

| FACET | DIFFRACTION FOCAL LENGTH (INCHES) | GEOMETRICAL FOCAL LENGTH (INCHES) | ANGLE A (DEGREE) | ANGLE B (DEGREE) | ANGLE OF DIFFRACTION (DEGREES) | ANGLE OF BEAM FROM VERTICAL (DEGREES) | SCAN ANGLE (DEGREES) | SCAN MULT. FACTOR (m) | ROTATION ANGLE (DEGREES) |
|---|---|---|---|---|---|---|---|---|---|
| 1 | 49.57 | 49.76 | 45.9 | 61.06 | 28.94 | -3.06 | 29.61 | 1.26 | 23.51 |
| 2 | 49.54 | 49.73 | 45.9 | 55.62 | 34.38 | 2.38 | 29.62 | 1.34 | 22.10 |
| 3 | 49.96 | 50.16 | 45.9 | 50.23 | 39.77 | 7.77 | 29.39 | 1.41 | 20.77 |
| 4 | 50.81 | 51.01 | 45.9 | 44.97 | 45.03 | 13.03 | 28.92 | 1.48 | 19.52 |
| 5 | 49.57 | 49.76 | 45.9 | 61.06 | 28.94 | -3.06 | 29.61 | 1.26 | 23.51 |
| 6 | 49.54 | 49.73 | 45.9 | 55.62 | 34.38 | 2.38 | 29.62 | 1.34 | 22.10 |
| 7 | 49.96 | 50.16 | 45.9 | 50.23 | 39.77 | 7.77 | 29.39 | 1.41 | 20.77 |
| 8 | 50.81 | 51.01 | 45.9 | 44.97 | 45.03 | 13.03 | 28.92 | 1.48 | 19.52 |
| 9 | 59.06 | 59.38 | 45.9 | 60.56 | 29.44 | -2.56 | 25.01 | 1.25 | 55.73 |
| 10 | 59.04 | 59.36 | 45.9 | 56.00 | 34.00 | 2.00 | 25.02 | 1.32 | 55.73 |
| 11 | 59.39 | 59.72 | 45.9 | 51.47 | 38.53 | 6.53 | 24.88 | 1.39 | 55.73 |
| 12 | 60.10 | 60.44 | 45.9 | 47.01 | 42.99 | 10.99 | 24.59 | 1.44 | 55.73 |
| 13 | 59.06 | 59.38 | 45.9 | 60.56 | 29.44 | -2.56 | 25.01 | 1.25 | 55.89 |
| 14 | 59.04 | 59.36 | 45.9 | 56.00 | 34.00 | 2.00 | 25.02 | 1.32 | 55.89 |
| 15 | 59.39 | 59.72 | 45.9 | 51.47 | 38.53 | 6.53 | 24.88 | 1.39 | 55.89 |
| 16 | 60.10 | 60.44 | 45.9 | 47.01 | 42.99 | 10.99 | 24.59 | 1.44 | 55.89 |

FIG. 4A5

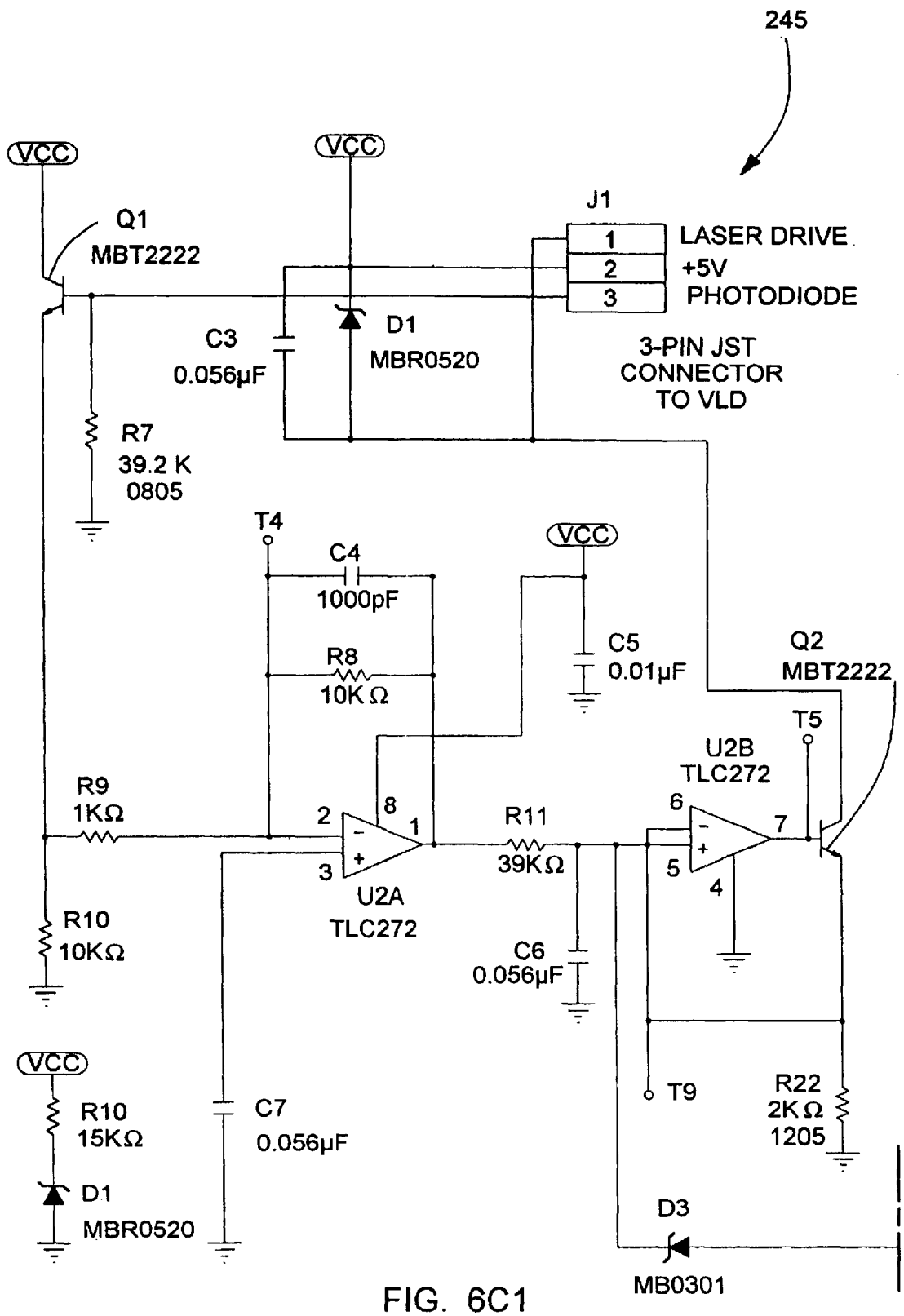
FIG. 6C1

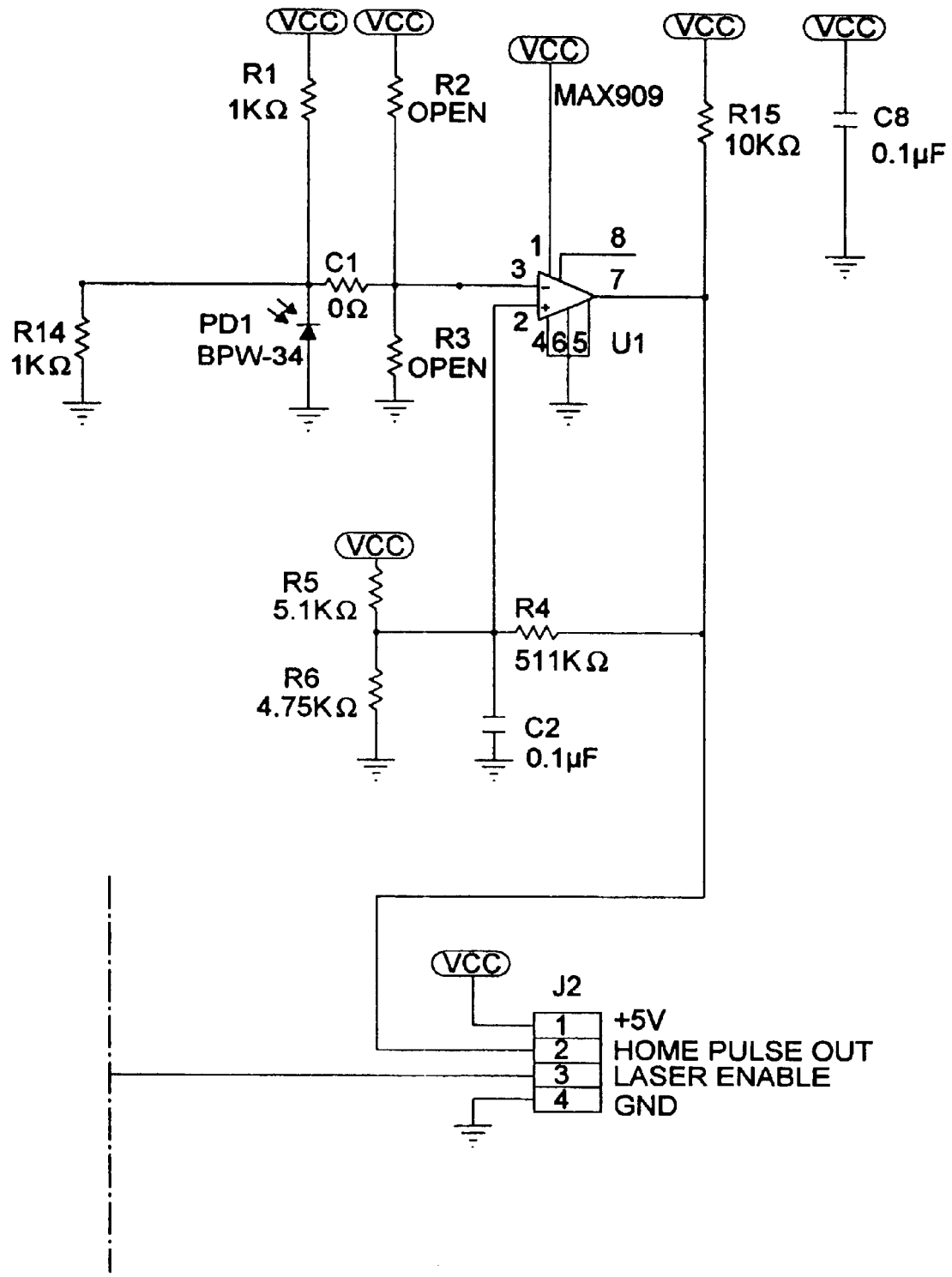
FIG. 6C2

| SPECIFICATIONS FOR PENTA 1, PENTA 2, PENTA 3 SCANNERS |
|---|
| OPERATIONAL |
| LIGHT SOURCE 5 VISIBLE LASER DIODES 858 + 5mm |
| LASER POWER 8.4mW (PEAK): LESS THAN 1 mW AVERAGE POWER |
| DEPTH OF SCAN FIELD 914mm (36") FOR 0.33 mm (13mil) BAR CODES<br>965mm (38") FOR 0.38 mm (15mil) BAR CODES<br>1,016mm (40") FOR 0.43 mm (17mil) BAR CODES |
| WIDTH OF SCAN FIELD PENTA 1 : 457mm (18")<br>PENTA 2 : 838mm (33")<br>PENTA 3: 1219mm (48") |
| SCAN SPEED PENTA 1 : 6,930 SCAN LINES PER SECOND<br>PENTA 2 : 13,860 SCAN LINES PER SECOND<br>PENTA 3 : 20,790 SCAN LINES PER SECOND |
| SCAN PATTERN OMNIDIRECTIONAL 5-SIDED PENTAGON SCAN PATTERN<br>PENTA 1: 20 SCAN LINES REPEATED AT FOUR DISTANCES (80 TOTAL)<br>PENTA 2: 40 SCAN LINES REPEATED AT FOUR DISTANCES (160 TOTAL)<br>PENTA 3: 60 SCAN LINES REPEATED AT FOUR DISTANCES (240 TOTAL) |
| MINIMUM BAR WIDTH 0.33 mm (13mil) |
| DECODE CAPABILITY AUTODISCRIMINATES ALL STANDARD BAR CODES |
| SYSTEM INTERFACES RS 232. POINT TO POINT. RS422. LIGHT PEN EMULATION |
| PRINT CONTRAST 35% MINIMUM REFLECTANCE DIFFERENCE |
| NUMBER CHARACTERS READ UP TO 60 DATA CHARACTERS. (MAXIMUM NUMBER WILL VARY BASED ON SYMBOLOGY AND DENSITY) |
| ASPECT RATIO UP TO 2.6 TO 1 |

FIG. 8

DATA TABLE EMBODIED IN SFP GENERATOR ON DECODE PROCESSOR BOARD

| SCANNING FACET NO. | TRIGGERING EVENT WHEN THE CLOCK PULSE COUNT ATTAINS THE VALUE EQUAL TO THE COUNT VALUE SET FORTH BELOW | PULSE EVENT FROM SFP MODULE |
|---|---|---|
| 12 | 7 | SF12P |
| 16 | 146 | SF16P |
| 4 | 271 | SF4P |
| 20 | 4467 | SF20P |
| 8 | 561 | SF8P |
| 11 | 716 | SF11P |
| 15 | 855 | SF15P |
| 3 | 980 | SF3P |
| 19 | 1155 | SF19P |
| 7 | 1270 | SF7P |
| 10 | 1425 | SF10P |
| 14 | 1564 | SF14P |
| 2 | 1689 | SF2P |
| 18 | 1864 | SF18P |
| 6 | 1979 | SF6P |
| 9 | 2134 | SF9P |
| 13 | 2273 | SF13P |
| 1 | 2398 | SF1P |
| 17 | 2573 | SF17P |
| 5 | 2688 | SF5P |

W = 5200 RPM
CLOCK PULSE WIDTH = 4 µSEC

FIG. 10B

TABLE EMBODIED IN SFSP GENERATOR DECODE PROCESSOR BOARD

| SCANNING FACET NO. | SFSP TRIGGERING EVENT | PULSE EVENT FROM SFSP MODULE. |
|---|---|---|
| 12 | RULES 1 - 4 IN FIGS. | SFSP 12/1P<br>SFSP 12/2P<br>SFSP 12/3P<br>SFSP 12/4P |
| 16 | RULES 1 - 4 IN FIGS. | SFSP 16/1P<br>SFSP 16/2P<br>SFSP 16/3P<br>SFSP 16/4P |
| 4 | RULES 1 - 4 IN FIGS. | SFSP 4/1P<br>SFSP 4/2P<br>SFSP 4/3P<br>SFSP 4/4P |
| 20 | RULES 1 - 4 IN FIGS. | SFSP 20/1P<br>SFSP 20/2P<br>SFSP 20/3P<br>SFSP 20/4P |
| 8 | RULES 1 - 4 IN FIGS. | SFSP 8/1P<br>SFSP 8/2P<br>SFSP 8/3P<br>SFSP 8/4P |
| 11 | RULES 1 - 4 IN FIGS. | SFSP 11/1P<br>SFSP 11/2P<br>SFSP 11/3P<br>SFSP 11/4P |
| ○<br>○<br>○ | | |
| 17 | RULES 1 - 4 IN FIGS. | SFSP 17/1P<br>SFSP 17/2P<br>SFSP 17/3P<br>SFSP 17/4P |
| 5 | RULES 1 - 4 IN FIGS. | SFSP 5/1P<br>SFSP 5/2P<br>SFSP 5/3P<br>SFSP 5/4P |

FIG. 10D

RULE 1: FOR GENERATING SFSP/1P TYPE PULSES

FOR EACH FACET X BEFORE WHICH IS LOCATED FACET X-1 AND BEYOND WHICH IS LOCATED FACET X+1 (ABOUT THE SCANNING DISC), THE SFSP GENERATION MODULE GENERATES SFSX/1P TYPE PULSES WHEN THE COUNT IS EQUAL TO:

COUNT (SFSP)

RULE 2: FOR GENERATING SFSX/2P TYPE PULSES

FOR EACH FACET X BEFORE WHICH IS LOCATED FACET X-1 AND BEYOND WHICH IS LOCATED FACET X+1 (ABOUT THE SCANNING DISC), THE SFSP GENERATION MODULE GENERATES SFSX/2P TYPE PULSES WHEN THE COUNT IS EQUAL TO:

$$\text{COUNT (SFSP)} + 1 \left[ \frac{\text{COUNT (SFX+1P)} - \text{COUNT (SFXP)}}{4} \right]$$

FIG. 10E1

RULE 3: FOR GENERATING SFSP/3P TYPE PULSES

FOR EACH FACET X BEFORE WHICH IS LOCATED FACET X-1 AND BEYOND WHICH IS LOCATED FACET X+1 (ABOUT THE SCANNING DISC), THE SFSP GENERATION MODULE GENERATES SFSX/3 TYPE PULSES WHEN THE COUNT IS EQUAL TO:

$$\text{COUNT (SFSP)} + 2 \left[ \frac{\text{COUNT (SFX+1P)} - \text{COUNT (SFXP)}}{4} \right]$$

---

RULE 4: FOR GENERATING SFSX/4P TYPE PULSES

FOR EACH FACET X BEFORE WHICH IS LOCATED FACET X-1 AND BEYOND WHICH IS LOCATED FACET X+1 (ABOUT THE SCANNING DISC), THE SFSP GENERATION MODULE GENERATES SFSX/4 TYPE PULSES WHEN THE COUNT IS EQUAL TO:

$$\text{COUNT (SFSP)} + 3 \left[ \frac{\text{COUNT (SFX+1P)} - \text{COUNT (SFXP)}}{4} \right]$$

FIG. 10E2

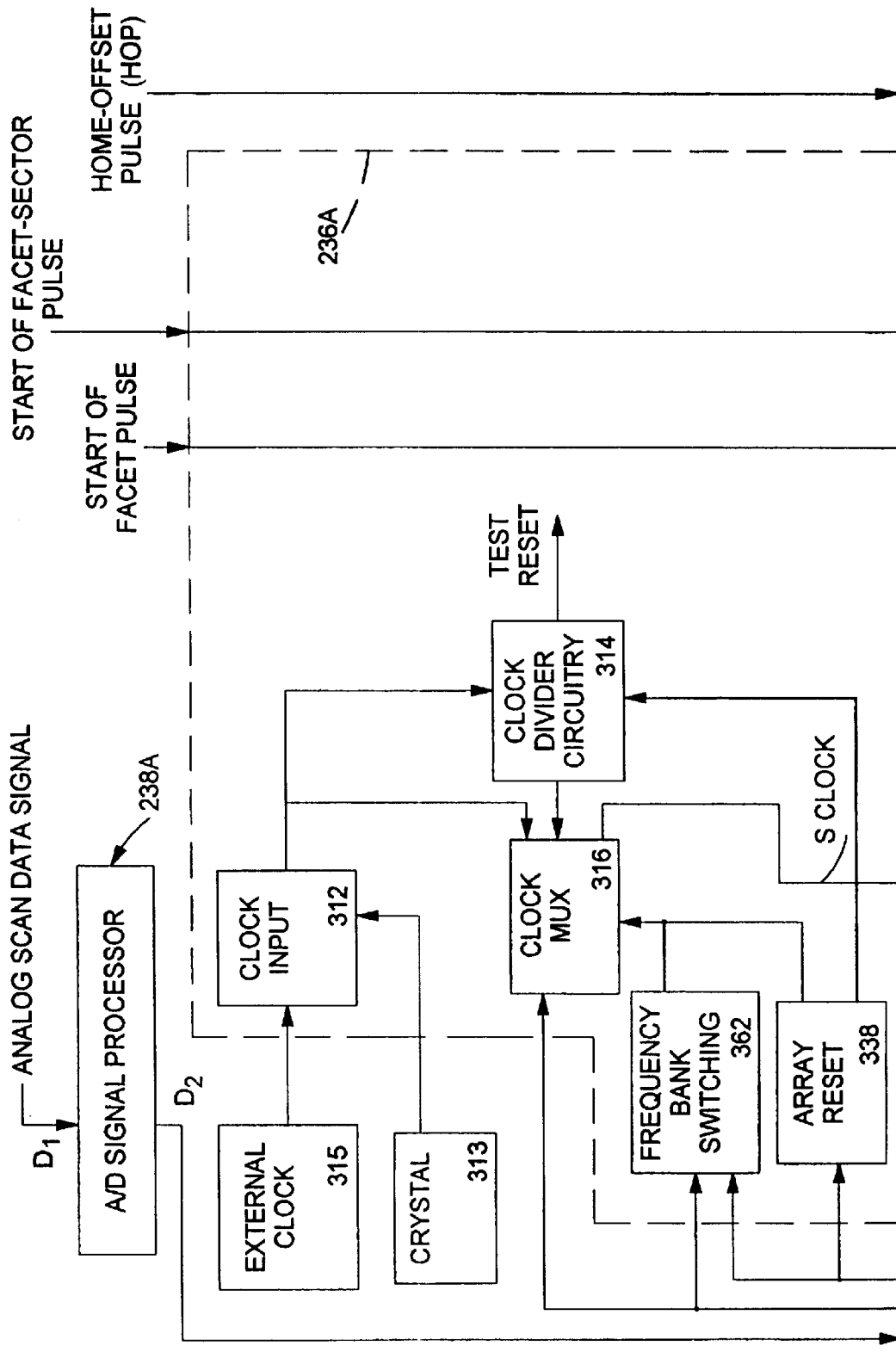
FIG. 11A1

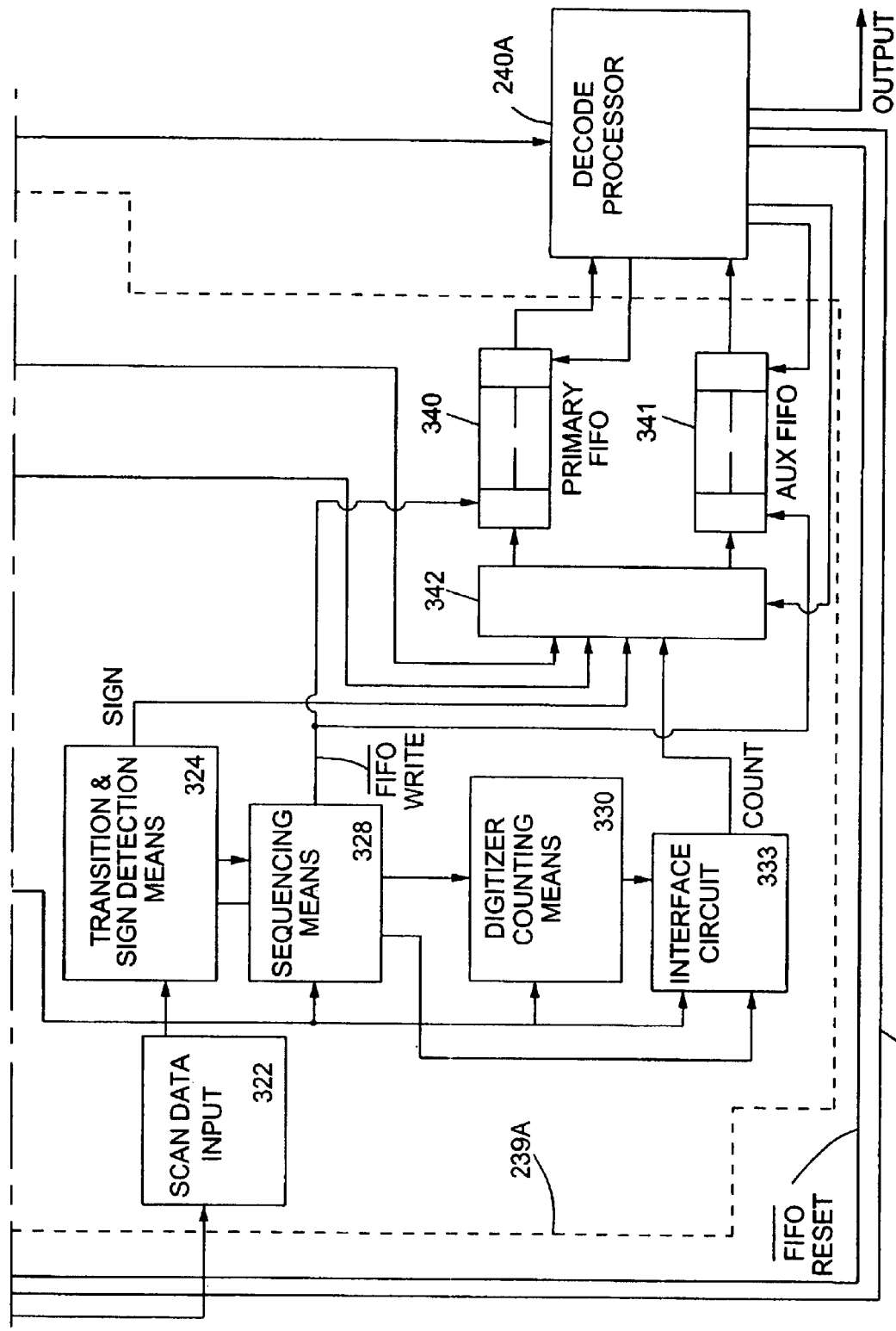
FIG. 11A2

| SCANNER NO. | TOTAL NO. OF FACETS ON DISC |
|---|---|
| NO. OF SECTORS / FACET | SCANNING STATION NO. |

FIG. 11C1

| SCANNING FACET NO. | TRIGGERING EVENT WHEN THE CLOCK PULSE COUNT ATTAINS THE VALUE EQUAL TO THE COUNT VALUE SET FORTH BELOW | PULSE EVENT FROM SFP MODULE |
|---|---|---|
| 12 | 7 | SF12P |
| 16 | 146 | SF16P |
| 4 | 271 | SF4P |
| 20 | 4467 | SF20P |
| 8 | 561 | SF8P |
| 11 | 716 | SF11P |
| 15 | 855 | SF15P |
| 3 | 980 | SF3P |
| 19 | 1155 | SF19P |
| 7 | 1270 | SF7P |
| 10 | 1425 | SF10P |
| 14 | 1564 | SF14P |
| 2 | 1689 | SF2P |
| 18 | 1864 | SF18P |
| 6 | 1979 | SF6P |
| 9 | 2134 | SF9P |
| 13 | 2273 | SF13P |
| 1 | 2398 | SF1P |
| 17 | 2573 | SF17P |
| 5 | 2688 | SF5P |

TABLES EMBODIED IN DECODE PROCESSOR
CLOCK PULSE WIDTH = 4 μSEC
W = 5200 RPM

FIG. 11C2

TABLE EMBODIED IN DECODE PROCESSOR

| SCANNING FACET NO. | SFS TRIGGERING EVENT | PULSE EVENT FROM SFSP MODULE. | MINIMUM AND MAXIMUM FACET ANGLES CORRESPONDING TO FACET-SECTOR IDENTIFIED BY SFSP EVENT |
|---|---|---|---|
| 12 | RULES 1 - 4 IN FIGS. | SFSP 12/1P | $\theta_{ROT\ MIN}, \theta_{ROT\ MAX}$ |
| | | SFSP 12/2P | |
| | | SFSP 12/3P | |
| | | SFSP 12/4P | |
| 16 | RULES 1 - 4 IN FIGS. | SFSP 16/1P | |
| | | SFSP 16/2P | |
| | | SFSP 16/3P | |
| | | SFSP 16/4P | |
| 4 | RULES 1 - 4 IN FIGS. | SFSP 4/1P | |
| | | SFSP 4/2P | |
| | | SFSP 4/3P | |
| | | SFSP 4/4P | |
| 20 | RULES 1 - 4 IN FIGS. | SFSP 20/1P | |
| | | SFSP 20/2P | |
| | | SFSP 20/3P | |
| | | SFSP 20/4P | |
| 8 | RULES 1 - 4 IN FIGS. | SFSP 8/1P | |
| | | SFSP 8/2P | |
| | | SFSP 8/3P | |
| | | SFSP 8/4P | |
| 11 | RULES 1 - 4 IN FIGS. | SFSP 11/1P | |
| | | SFSP 11/2P | |
| | | SFSP 11/3P | |
| | | SFSP 11/4P | |
| ○ ○ ○ | | | |
| 17 | RULES 1 - 4 IN FIGS. | SFSP 17/1P | |
| | | SFSP 17/2P | |
| | | SFSP 17/3P | |
| | | SFSP 17/4P | |
| 5 | RULES 1 - 4 IN FIGS. | SFSP 5/1P | |
| | | SFSP 5/2P | |
| | | SFSP 5/3P | |
| | | SFSP 5/4P | |

FIG. 11D

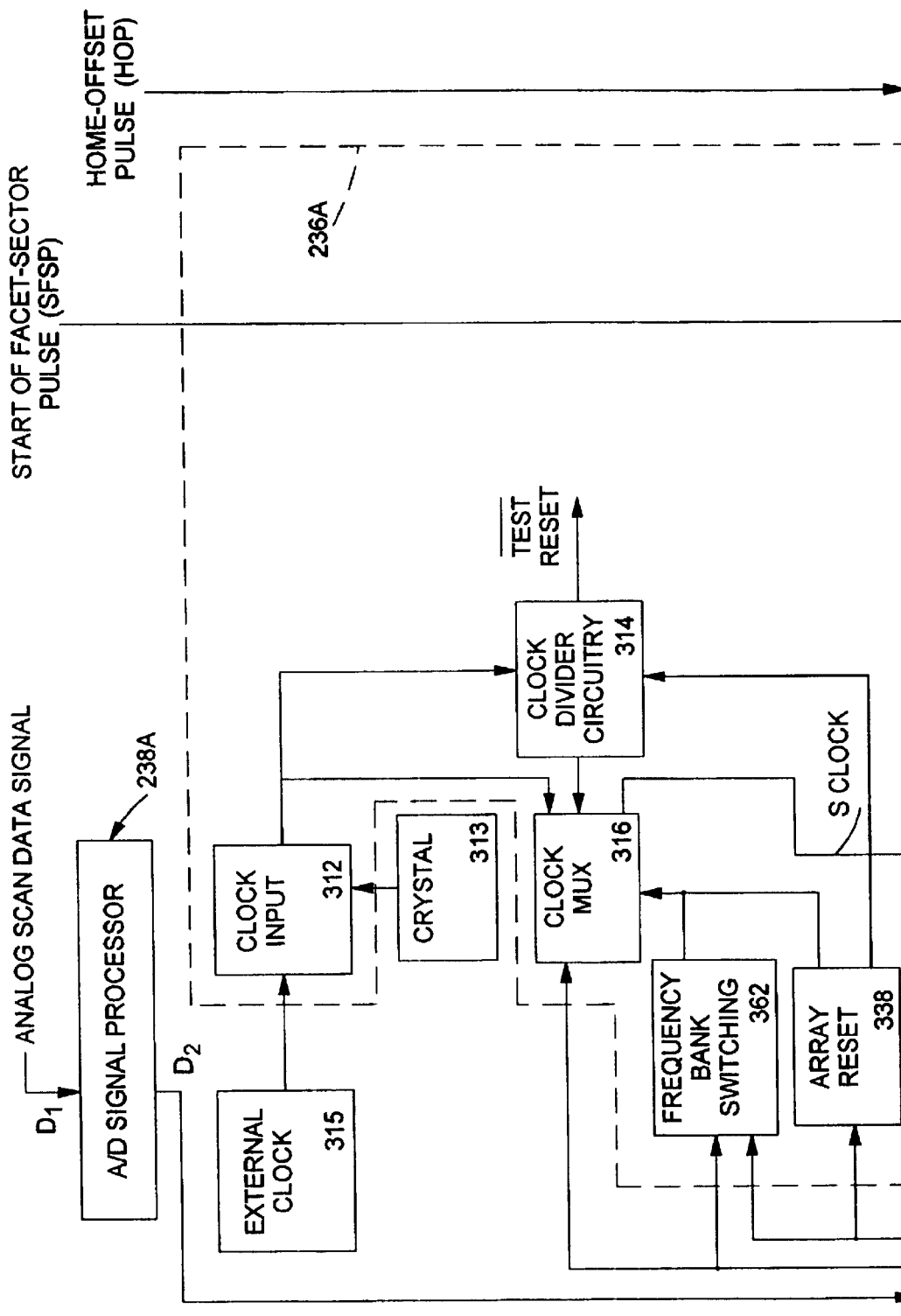
FIG. 13A1

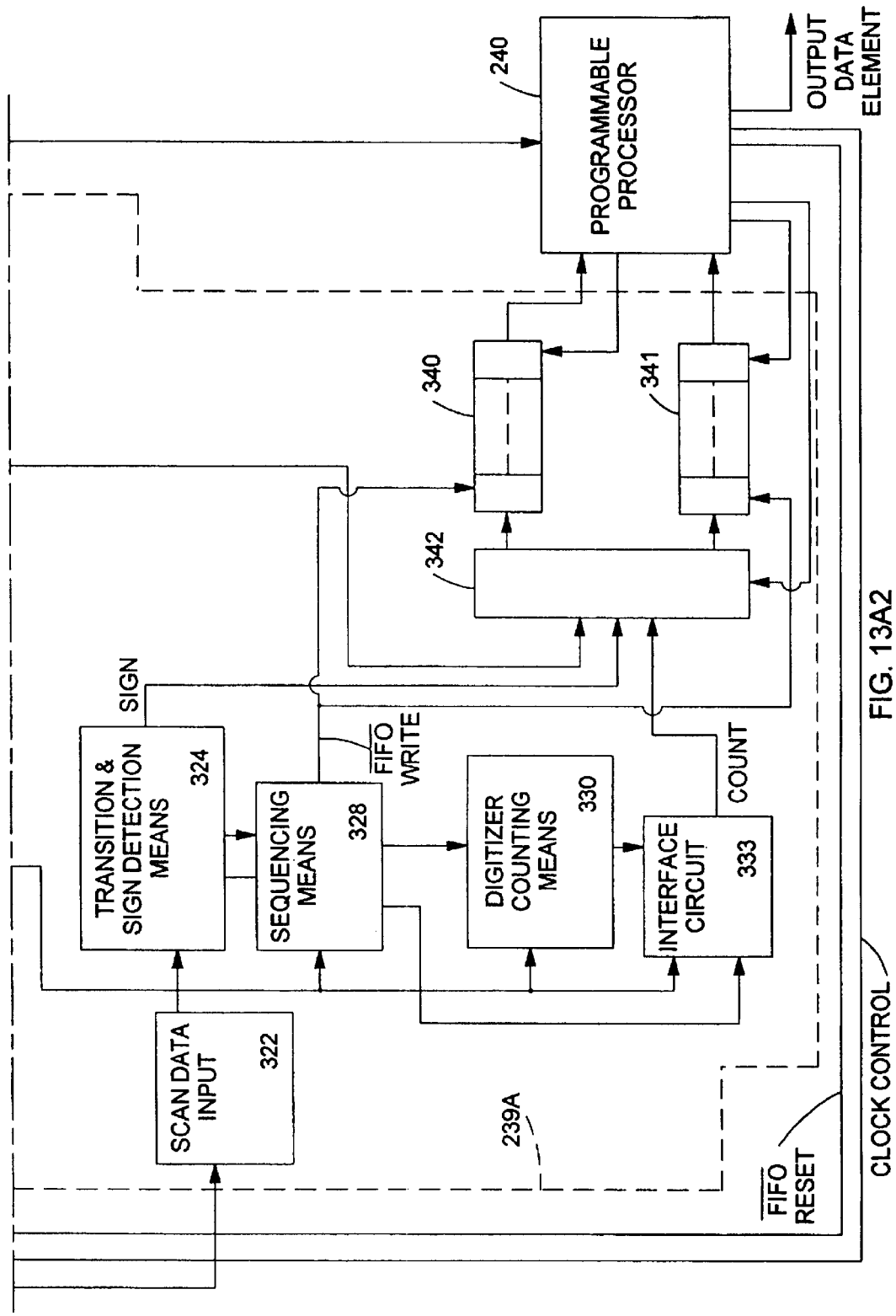
FIG. 13A2

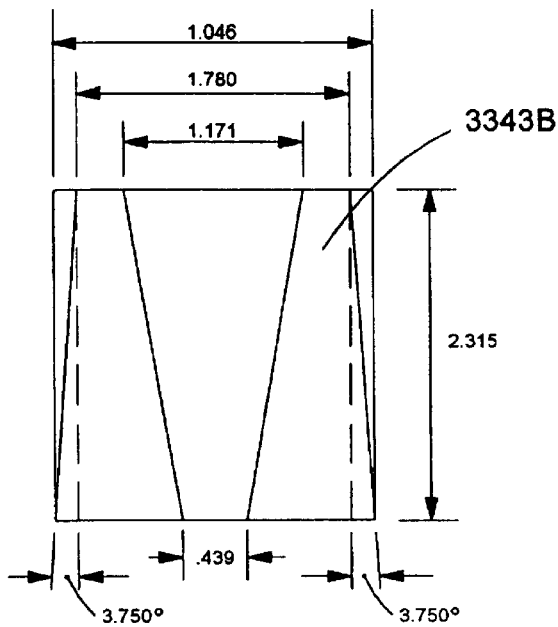
FIG. 15E1
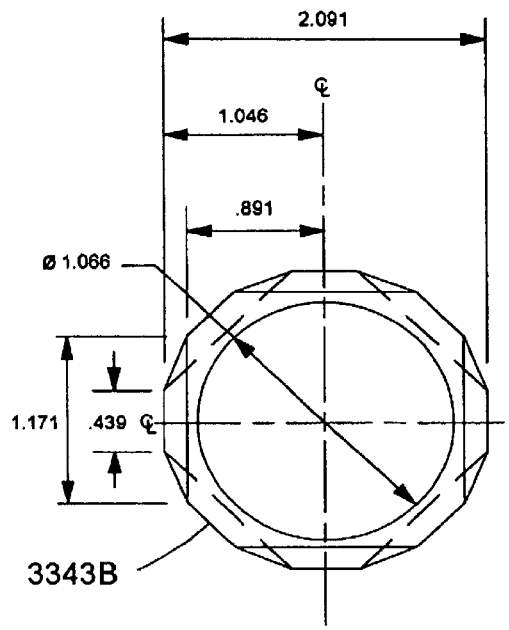
FIG. 15E2
| FACE # | ANGLE (DEGREES) |
|---|---|
| 1 | 3.75 |
| 2 | -3.75 |
| 3 | 3.75 |
| 4 | -3.75 |
| 5 | 3.75 |
| 6 | -3.75 |
| 7 | 3.75 |
| 8 | -3.75 |
FIG. 15E3
| | | |
|---|---|---|
| BEAM NO. 1 | 1 | $\Delta\lambda_1$ |
| | 3 | $\Delta\lambda_2$ |
| | 5 | |
| | 7 | |
| BEAM NO. 2 | 2 | $\Delta\lambda_1$ |
| | 4 | $\Delta\lambda_2$ |
| | 6 | |
| | 8 | |
FIG. 15E4

THE EQUATION FOR THE CALCULATION OF THE DISTANCE FROM THE DEVICE TO THE OBJECT:

$a = h \tan\alpha$, $a = d \tan\beta$, $d = h - c$ $h = (c \tan\beta)(\tan\alpha - \tan\beta)$

| ROTATIONAL SPEED OF DISK (RPM) | | | | | | | | |
|---|---|---|---|---|---|---|---|---|
| | | | | | | 658 nm | | |
| FACET | DIFFRACTION FOCAL LENGTH (INCHES) | GEOMETRICAL FOCAL LENGTH (INCHES) | ANGLE A (DEGREES) | ANGLE B (DEGREES) | ANGLE OF DIFFRACTION (DEGREES) | ANGLE OF BEAM FROM VERTICAL (DEGREES) | SCAN ANGLE (DEGREES) | SCAN MULTI. FACTOR (m) |
| 1 | 65.41 | 5000.00 | 45.9 | 53.00 | 37.00 | 5.00 | 54.93 | 1.29 |
| 2 | 65.41 | 5000.00 | 45.9 | 53.00 | 37.00 | 5.00 | 54.93 | 1.29 |
| 3 | 65.41 | 5000.00 | 45.9 | 53.00 | 37.00 | 5.00 | 54.93 | 1.29 |
| 4 | 65.41 | 5000.00 | 45.9 | 53.00 | 37.00 | 5.00 | 54.93 | 1.29 |
| 5 | 65.41 | 5000.00 | 45.9 | 48.00 | 42.00 | 10.00 | 54.93 | 1.36 |
| 6 | 65.41 | 5000.00 | 45.9 | 48.00 | 42.00 | 10.00 | 54.93 | 1.36 |
| 7 | 65.41 | 5000.00 | 45.9 | 48.00 | 42.00 | 10.00 | 54.93 | 1.36 |
| 8 | 65.41 | 5000.00 | 45.9 | 48.00 | 42.00 | 10.00 | 54.93 | 1.36 |

FIG. 15JI

| ROTATION ANGLE (DEGREES) | ACCOUNTING FOR DEAD TIME FOR LASER BEAM | LIGHT COLLECTION FACTOR | MAXMIMUM COLLECTION AREA (IGNORING NOTCH) (SQ. IN.) | DESIGN COLLECTION AREA (INCLUDES NOTCH LOSS OF 0.15 SQ. INCHES) | BEAM SPEED AT CENTER OF SCAN LINE (INCHES /SEC) | BEAM SPEED AT MAX. DEPTH OF FIELD (INCHES /SEC) | BEAM SPEED AT MIN. DEPTH OF FIELD (INCHES /SEC) | BEAM SKEW ANGLE (DEGREES) |
|---|---|---|---|---|---|---|---|---|
| 42.30 | 44.30 | 1.00 | 5.29 | 5.30 | 46251 | 51021 | 41302 | 0 |
| 42.30 | 44.30 | 1.00 | 5.29 | 5.30 | 46251 | 51021 | 41302 | 0 |
| 42.30 | 44.30 | 1.00 | 5.29 | 5.30 | 46251 | 51021 | 41302 | 0 |
| 42.30 | 44.30 | 1.00 | 5.29 | 5.30 | 46251 | 51021 | 41302 | 0 |
| 39.82 | 41.82 | 1.19 | 6.30 | 6.28 | 48649 | 53855 | 43443 | 0 |
| 39.82 | 41.82 | 1.19 | 6.30 | 6.28 | 48649 | 53855 | 43443 | 0 |
| 39.82 | 41.82 | 1.19 | 6.30 | 6.28 | 48649 | 53855 | 43443 | 0 |

FIG. 15J2

| BEAM NO. | FACET NOS. | |
|---|---|---|
| 1 | 1 | $\Delta\lambda_1, \Delta\lambda_2$ |
| | 2 | |
| | 3 | |
| | 4 | |
| 2 | 5 | $\Delta\lambda_1, \Delta\lambda_2$ |
| | 6 | |
| | 7 | |
| | 8 | |

FIG. 15K

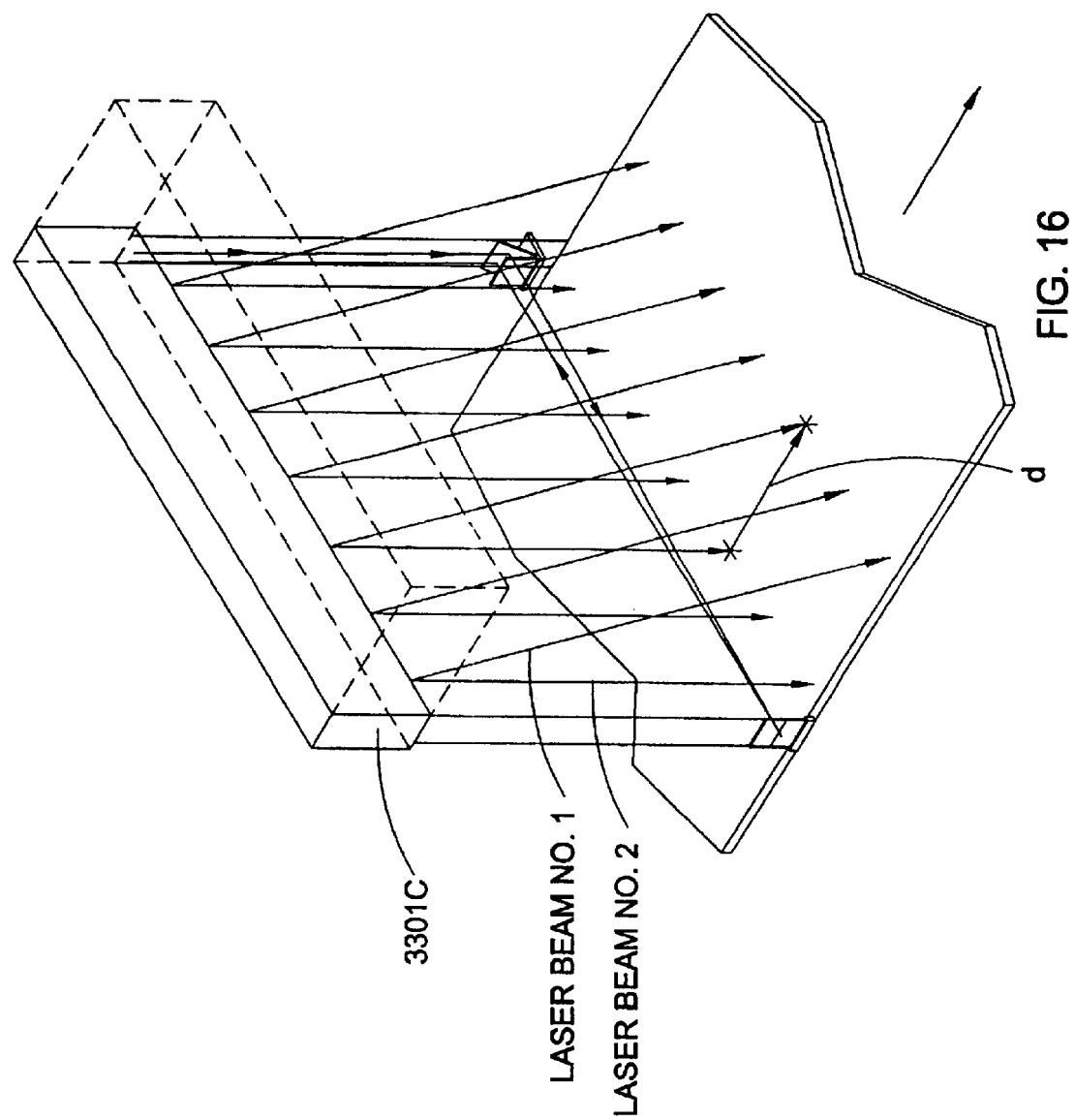

CONTROL STRUCTURES

INPUT OF OPERATOR PARAMETERS AND INITIALIZATIONS

```
FOR z := 1 TO n  DO
     READ ROW  z OF  f  INTO THE IMAGE  ROW STORE
     BUF(1...M, IND (z));
FOR y :=  k + 1  to N - k  DO BEGIN
        FOR x :=k + 1 TO M - k  DO BEGIN
           FOR z := 1 TO a DO
                      F (z) :=BUF(x + xind(z), ind(k + 1 + yind(z))):
```

PROCESSING OF THE PICTURE WINDOW F($f$,(x,y)) WITH A SPECIFIC OPERATOR KERNEL ARGUMENTS:   F(z), WITH $1 \leq z \leq a$, OR F(i,j,), WITH $-k \leq i, j \leq k$)
RESULT:         GRAY VALUE v ⊕           IF (PARSEQ = 0) THEN
                  BUFOUT (x) := v
⊕           ELSE  BUF (x, IND (k+1)) := v
            END{for};
⊕        IF (PARSEQ = 0) THEN
              WRITE ROW BUFFER STORE BUFOUT(1...M) INTO
              ROW y OF THE RESULTANT IMAGE FILE OUT
⊕        ELSE
⊕           WRITE IMAGE ROW STORE BUF(1...M, IND(K+ 1)) INTO
⊕           ROW y OF THE RESULTANT IMAGE FILE OUT;
         IF (y  N - k)  THEN BEGIN
              READ ROW y + k + 1 OF THE INPUT IMAGE FILE INTO
              THE IMAGE ROW STORE BUF(1...M, IND(1));
              LINK := IND(1);
              FOR z := 1 TO n - 1 DO IND(z) := IND(z +1)
              IND(n) := LINK
              END {if}
         END {for}

CONTROL STRUCTURE FOR THE COMPUTATION OF LOCAL OPERATORS, USING ROW-WISE BUFFERING, THE CENTERED ij-COORDINATE SYSTEM, AND THE SPATIAL ARRANGEMENT FOR THE WINDOW CONTENT IF THE ONE-DIMENSIONAL ARRAY F(z) IS USED.  PROGRAM LINES LABLED WITH ⊕ ARE SUPERFLUOUS IF A PARALLEL OPERATOR HAS TO BE IMPLEMENTED

FIG. 19

RAW RANGE DATA

SMOOTHED RANGE DATA

VERTICAL EDGE

TABLE 1

| -13 | -12 | -7 | -2 | 2 | 12 | 8 | 97 | 160 | 479 | 580 | 813 | 1129 | 276 | 161 | 286 | 404 | 411 | 403 | 149 | 106 | 81 | 68 |
|---|---|---|---|---|---|---|---|---|---|---|---|---|---|---|---|---|---|---|---|---|---|---|
| | | | | | | | | | | | t1 | | | t2 | | | | | | | | |
| | | | | | | | | | | -8.02 | -185 | -135 | -137 | -401 | 7.28 | 683 | 396 | 697.6 | -217 | -4.7 | -71 | 114.3 |

FIRST DERIVATIVE

FIG. 36A

TABLE 2

| -0.2 | 0.25 | -0.33 | 0.5 | -1 | 0 | 1 | -0.5 | 0.33 | -0.25 | 0.2 |
|---|---|---|---|---|---|---|---|---|---|---|

FIR FILTER TABS

FIG. 36B

TABLE 3

| -11 | -6 | -2 | 2 | 6 | 42 | 18 | 105 | 172 | 463 | 594 | 684 | 197 | 105 | 79 | 102 | 338 | 375 | 387 | 177 | 182 | 96 | 72 | 61 |
|---|---|---|---|---|---|---|---|---|---|---|---|---|---|---|---|---|---|---|---|---|---|---|---|
| | | | | | | | | | | | t1 | | | t2 | | | | | | | | | |
| | | | | | | | | | | -22.3 | -123 | -8.8 | -257 | -191 | -205 | 84.3 | -29.3 | -153 | 182 | -214 | -45.9 | 1.783 | |

FIRST DERIVATIVE

FIG. 36C

DATA ELEMENT HANDLING RULES

1. WHEN A PACKAGE DATA ELEMENT (PDE) OF ANY TYPE IS REMOVED FROM THE SYSTEM EVENT QUEUE, THEN IT IS PLACED IN THE MOVING PACKAGE TRACKING QUEUE

2. WHEN A SCAN BEAM DATA ELEMENT (SBDE) IS REMOVED FROM THE SYSTEM EVENT QUEUE, THEN IT IS COMBINED WITH EACH PACKAGE DATA ELEMENT IN THE MOVING PACKAGE TRACKING QUEUE AND THEN EACH RESULTING DATA ELEMENT PAIR IS PROCESSED ALONG THE PACKAGE DATA ELEMENT CHANNEL AND SCAN DATA ELEMENT CHANNEL AS SHOWN IN FIGS. 40A & 40B

3. WHEN A PACKAGE-IN-TUNNEL (PIT) DATA ELEMENT IS REMOVED FROM THE SYSTEM EVENT QUEUE, THEN THE OLDEST PACKAGE DATA ELEMENT IN THE MOVING PACKAGE TRACKING QUEUE IS REMOVED THERE FROM

4. WHEN A PACKAGE OUT-OF TUNNEL (POOT) DATA ELEMENT IS REMOVED FROM THE SYSTEM EVENT QUEUE, THEN THE FOLLOWING OPERATIONS ARE CARRIED OUT

FIG. 41A (a) IF THE TIME STAMP $T_i$ ON THE REMOVED POOT DATA ELEMENT INDICATES THAT CORRESPONDING PACKAGE HAS MOVED OUT OF THE SCANNING TUNNEL, THEN REMOVE THE OLDEST PACKAGE DATA ELEMENT IN MOVING PACKAGE TRACKING QUEUE (b) IF THE TIME STAMP $T_i$ ON THE REMOVED POOT DATA ELEMENT INDICATES THAT THE CORRESPONDING PACKAGE IS STILL MOVING THROUGH THE SCANNING TUNNEL, THEN DO NOT REMOVE ANY PACKAGE DATA ELEMENT FROM THE MOVING PACKAGE TRACKING QUEUE.

FIG. 41B

VECTOR-BASED SURFACE MODELING OF PACKAGES MOVING IN SCANNING TUNNEL

MATHEMATICAL FORM OF EACH SURFACE ON THE PACKAGE: VECTOR-BASED MODEL CONSISTING OF (1) AT LEAST THREE VERTICE POINTS WITHIN THE PLANE OF THE PACKAGE SURFACE, AND (2) NORMAL VECTOR FOR THE PLANE.

PROCEDURE:

(1) USE POSITION VECTOR (REFERENCED TO X=0, Y=0, Z=0 IN $R_{global}$), FOR SPECIFYING THE POSITION OF EACH VERTEX IN THE PACKAGE SURFACE PLANE; AND (2) USE NORMAL VECTOR FOR SPECIFYING THE SURFACE DIRECTION OF THE PACKAGE SURFACE (AT WHICH LIGHT REFLECTS)

(3) THEDE FOUR VECTORS S[ECIFU THE SURFACE OR THE PACKAGE IN COOEDINATE REFERENCE FROM $R_{global}$

FIG. 43

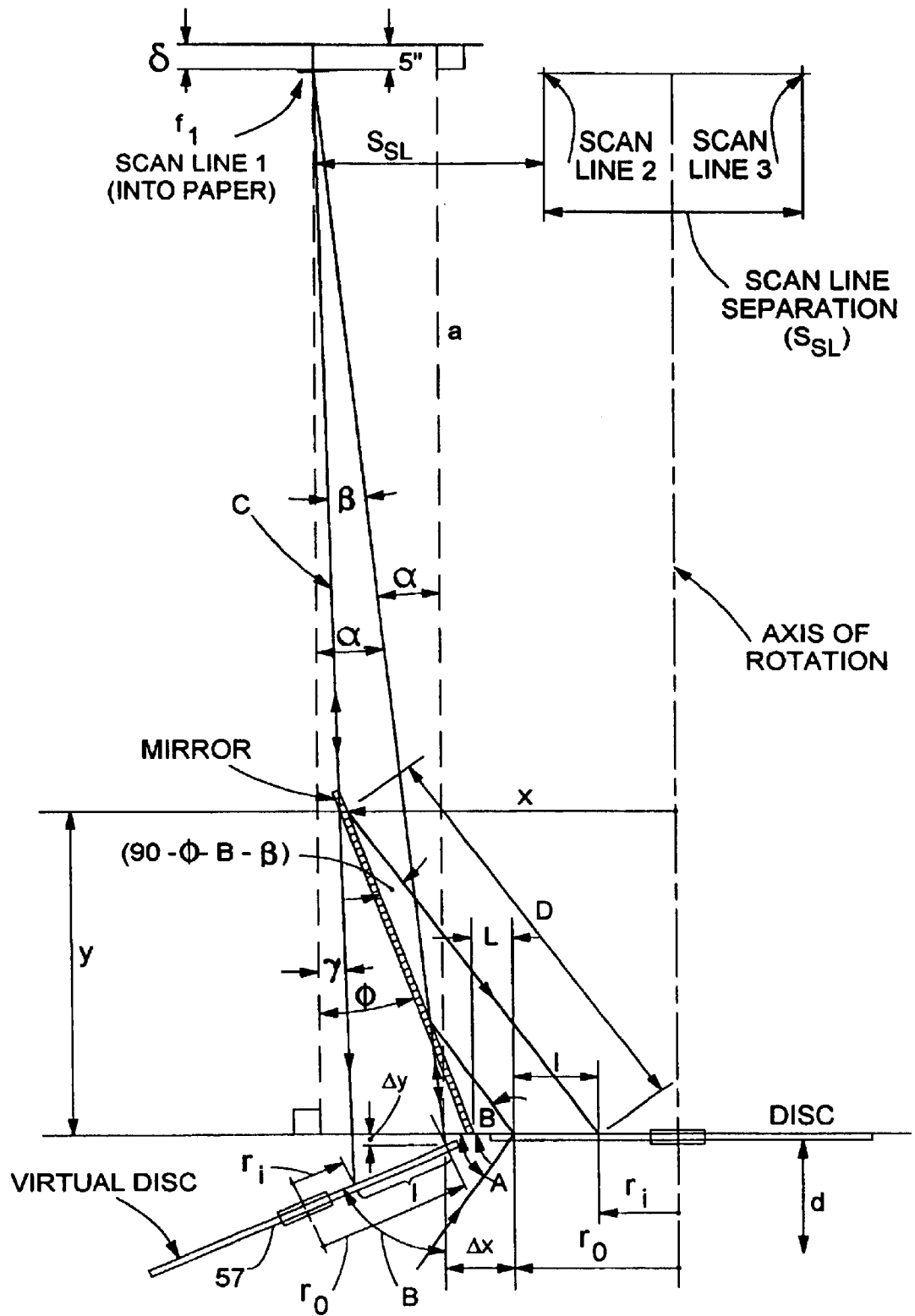
FIG. 44A1

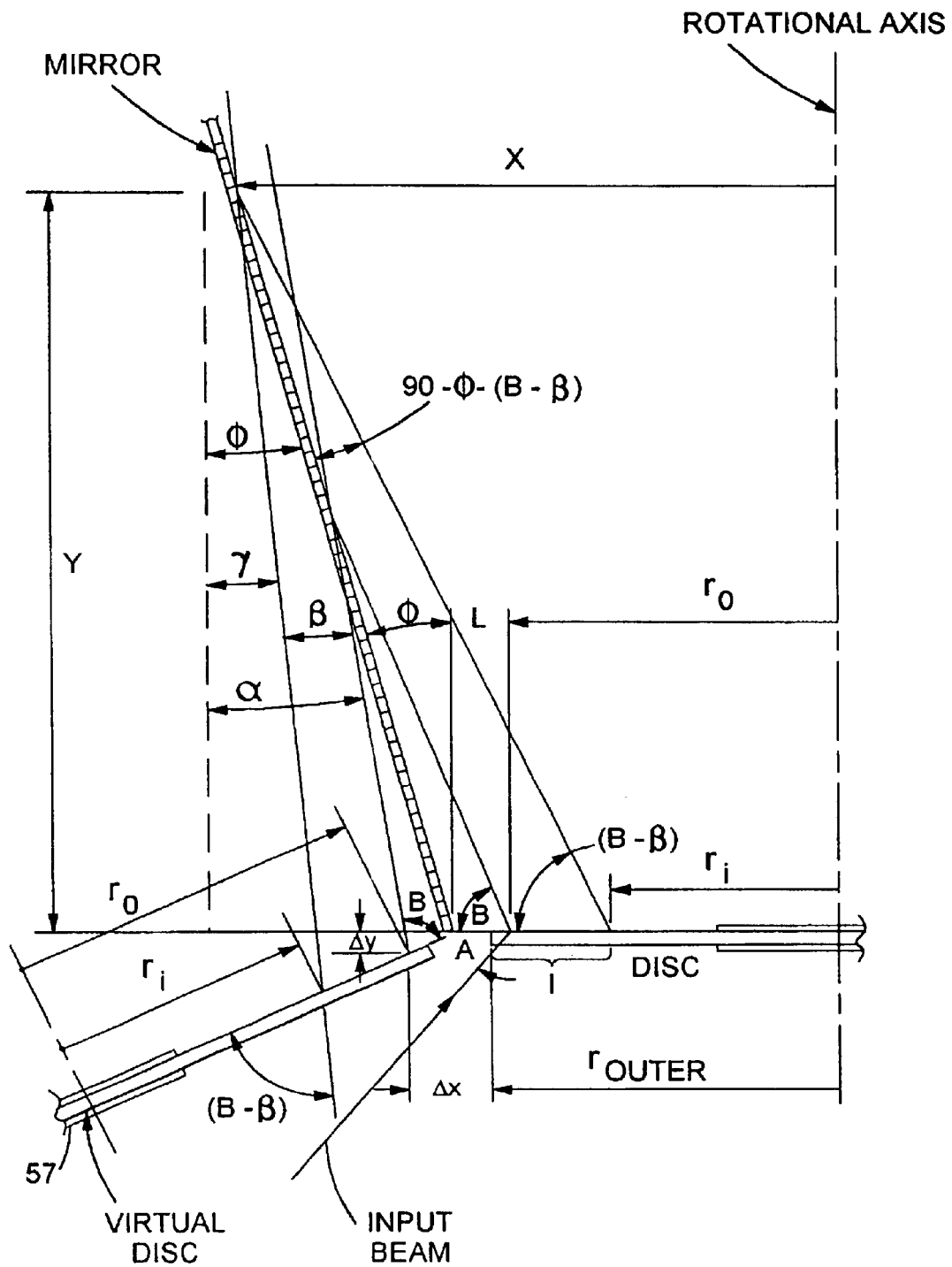
FIG. 44A2

(1) THE RADIUS TO BEAM-INCIDENT-POINT ON THE HOLOGRAPHIC SCANNING DISC, ASSIGNED THE SYMBOLIC NOTATION "$r_0$"

(2) SCANLINE SEPARATION BETWEEN ADJACENT SCANLINES AT THE FOCAL PLANE OF THE (i,J)-TH SCANLINE, ASSIGNED THE SYMBOLIC NOTATION "$S_{SL}$"

(3) THE SCANLINE LENGTH (MEASURED INTO PAPER) FOR THE (i,J)-TH SCANLINE, ASSIGNED THE SYMBOLIC NOTATION "$L_{SL}$"

(4) THE DISTANCE MEASURED FROM THE SCANNING DISC TO THE FOCAL PLANE OF THE (i,J)-TH SCANLINE, ASSIGNED THE SYMBOLIC NOTATION $a_i$ (5) THE DISTANCE FROM RADIUS TO BEAM-INCIDENT-POINT $r_0$ TO BEAM FOLDING MIRROR, ASSIGNED THE SYMBOLIC NOTATION "L"

(6) THE TILT ANGLE OF THE J-TH BEAM FOLDING MIRROR ASSOCIATED WITH GENERATION OF THE (i,J)-TH SCANLINE, ASSIGNED THE SYMBOLIC NOTATION "$\phi_j$"

(7) THE TILT ANGLE OF THE VIRTUAL SCANNING DISC, ASSIGNED THE SYMBOLIC NOTATION "$2\phi$"

(8) THE LATERAL SHIFT OF THE BEAM INCIDENT POINT ON THE VIRTUAL SCANNING DISC, ASSIGNED THE SYMBOLIC NOTATION "$\Delta X$"

(9) THE VERTICAL SHIFT OF THE BEAM INCIDENT POINT ON THE VIRTUAL SCANNING DISC, ASSIGNED THE SYMBOLIC NOTATION "$\Delta Y$"

(10) THE DISTANCE FROM THE ROTATION AXIS TO THE BEAM INCIDENT POINT ON THE VIRTUAL SCANNING DISC, ASSIGNED THE SYMBOLIC NOTATION "$r_0 + \Delta X$"

(11) THE DISTANCE FROM THE BEAM INCIDENT POINT ON THE VIRTUAL SCANNING DISC TO THE FOCAL PLANE WITHIN WHICH THE (i,J)-TH SCANLINE RESIDES, ASSIGNED THE SYMBOLIC NOTATION "$f_i$"

(12) THE DIAMETER OF THE CROSS-SECTION OF THE LASER BEAM SCANNING STATION, ASSIGNED THE SYMBOLIC NOTATION "$d_{BEAM}$"

(13) THE ANGULAR GAP BETWEEN ADJACENT HOLOGRAPHIC SCANNING FACETS, ASSIGNED THE SYMBOLIC NOTATION "$d_{GAP}$"

(14) THE OUTER RADIUS OF THE AVAILABLE LIGHT COLLECTION REGION ON THE HOLOGRAPHIC SCANNING DISC, ASSIGNED THE SYMBOLIC NOTATION "$r_{OUTER}$"

FIG. 44B1

(15) THE INNER RADIUS OF THE AVAILABLE LIGHT COLLECTION REGION ON THE HOLOGRAPHIC SCANNING FACET, ASSIGNED THE SYMBOLIC NOTATION "$r_{INNER}$"

(16) ONE-HALF OF THE DEPTH OF FIELD OF THE (i, J)-TH SCANLINE, ASSIGNED THE SYMBOLIC NOTATION "$\delta$"

(17) THE DISTANCE FROM THE MAXIMUM READ DISTANCE ($f_i$ + 5") TO THE INNER RADIUS $r_i$ OF THE SCANNING FACET, ASSIGNED THE SYMBOLIC NOTATION "C"

(18) THE OUTER RAY ANGLE MEASURED RELATIVE TO THE NORMAL TO THE i-TH HOLOGRAPHIC FACET, ASSIGNED THE SYMBOLIC NOTATION "$\alpha$"

(19) THE INNER RAY ANGLE MEASURED RELATIVE TO THE NORMAL TO THE i-TH HOLOGRAPHIC FACET, ASSIGNED THE SYMBOLIC NOTATION "$\gamma$"

(20) THE LIGHT COLLECTION ANGLE MEASURED FROM THE FOCAL POINT OR THE i-TH FACET TO THE LIGHT COLLECTION AREA OF THE SCANNING FACET, ASSIGNED THE SYMBOLIC NOTATION "$\beta$"

(21) THE INTERSECTION OF THE BEAM FOLDING MIRROR AND LINE C, ASSIGNED THE SYMBOLIC NOTATION "X"

(21A) THE INTERSECTION OF THE BEAM FOLDING MIRROR AND LINE C, ASSIGNED THE SYMBOLIC NOTATION "Y"

(22) THE DISTANCE MEASURED FROM THE INNER RADIUS TO THE POINT OF MIRROR INTERSECTION, ASSIGNED THE SYMBOLIC NOTATION "D"

(23) THE DISTANCE MEASURED FROM THE BASE OF THE SCANNER HOUSING TO THE TOP OF THE j-TH BEAM FOLDING MIRROR, ASSIGNED THE SYMBOLIC NOTATION "h"

(24) THE DISTANCE MEASURED FROM THE SCANNING DISC TO THE "d" BASE OF THE HOLOGRAPHIC, ASSIGNED THE SYMBOLIC NOTATION

(25) THE FOCAL LENGTH OF THE i-TH HOLOGRAPHIC SCANNING FACET FROM THE CORRESPONDING FOCAL PLANE WITHIN THE SCANNING VOLUME, ASSIGNED THE SYMBOLIC NOTATION "$f_i$"

(26) INCIDENT BEAM ANGLE, ASSIGNED THE SYMBOLIC NOTATION "$A_i$"

(27) DIFFRACTED BEAM ANGLE, ASSIGNED THE SYMBOLIC NOTATION "$B_i$"

FIG. 44B2

(28) THE ANGLE OF THE J-TH LASER BEAM MEASURED FROM THE VERTICAL, ASSIGNED THE SYMBOLIC NOTATION "$-\alpha$"

(29) THE SCAN ANGLE OF THE LASER BEAM, ASSIGNED THE SYMBOLIC NOTATION "$\theta_{si}$"

(30) THE SCAN MULTIPLICATION FACTOR FOR THE i-TH HOLOGRAPHIC FACET, ASSIGNED THE SYMBOLIC NOTATION "$M_i$"

(31) THE FACET ROTATION ANGLE FOR THE i-TH HOLOGRAPHIC FACET, ASSIGNED THE SYMBOLIC NOTATION "$\theta_{ROTi}$"

(32) ADJUSTED FACET ROTATION ANGLE ACCOUNTING FOR DEADTIME, ASSIGNED THE SYMBOLIC NOTATION "$\theta'_{ROTi}$"

(33) THE LIGHT COLLECTION EFFICIENCY FACTOR FOR THE i-TH HOLOGRAPHIC FACET, NORMALIZED RELATIVE TO THE 16TH FACET, ASSIGNED THE SYMBOLIC NOTATION "$\xi_i$"

(34) THE MAXIMUM LIGHT COLLECTION FOR THE i-TH HOLOGRAPHIC FACET, ASSIGNED THE SYMBOLIC NOTATION "$Area_i$"

(35) THE BEAM SPEED AT THE CENTER OF THE (i, j)-TH SCANLINE, ASSIGNED THE SYMBOLIC NOTATION "$V_{CENTER}$"

(36) THE ANGLE OF SKEW OF THE DIFFRACTED LASER BEAM AT THE CENTER OF THE i-TH HOLOGRAPHIC FACET, ASSIGNED THE SYMBOLIC NOTATION "$\phi_{SKEW}$"

(37) THE MAXIMUM BEAM SPEED OF ALL LASER BEAMS PRODUCED BY THE HOLOGRAPHIC SCANNING DISC, ASSIGNED THE SYMBOLIC NOTATION "$V_{MAX}$"

(38) THE MINIMUM BEAM SPEED OF ALL LASER BEAMS PRODUCED BY THE HOLOGRAPHIC SCANNING DISC, ASSIGNED THE SYMBOLIC NOTATION "$V_{MIN}$"

(39) THE RATIO OF THE MAXIMUM BEAM SPEED TO THE MINIMUM BEAM SPEED, ASSIGNED THE SYMBOLIC NOTATION "$V_{MAX}/V_{MIN}$"

(40) THE DEVIATION OF THE LIGHT RAYS REFLECTED OFF THE PARABOLIC LIGHT REFLECTING MIRROR BENEATH THE SCANNING DISC, FROM THE BRAGG ANGLE FOR THE FACET, ASSIGNED THE SYMBOLIC NOTATION "$\delta_e$"

FIG. 44B3

PARAMETER EQUATION USED IN THE SPREADSHEET DESIGN OF THE SCANNER (1) $\Delta x := L(1 + \cos(2\phi))$ (2) $\Delta y := L \sin(2\phi)$ (3) $\Delta y := r_0 + \Delta x$ (4) $C := \sqrt{(f+\delta)^2 + l^2 + 2(f+\delta)l \cos(B)}$ LAW OF COSINES, WHERE : $l = r_{outer} - r_{inner}$ $$\beta = \alpha - \gamma = B + 2\phi - 90 - \gamma$$

(5) $\alpha := B - 90 + 2\phi$ (6) $r := \alpha - \cos\left[\dfrac{(f+\delta)^2 + C^2 - l^2}{2(f+\delta)C}\right]$ (7) $\beta := \alpha - \gamma$ (8) $X := D \cos(B - \beta) + r_i$ (9) $Y := D \sin(B - \beta)$

(10) $D := \dfrac{[r_0 + L - r_i] \sin(90 + )}{\sin(90 - B + \beta - \phi)}$   LAW OF SINES

$$(12) \quad f_i := \sqrt{a_i^2 + \left[m\, S_{SL} - \left[r_0 + \Delta x\right]\right]^2}$$

m IS A FACTOR THAT VARIES FROM SCAN LINE TO SCAN LINE AND DETERMINED BY SCAN LINE SEPARATION AND DISTANCE FROM THE ROTATIONAL AXIS OF THE DISC.

$$(13) \quad B_i := \operatorname{atan}\left[\left[\frac{m\, S_{SL} - \left[r_0 + \Delta x\right]}{a_i}\right]\right] + 90 - 2\phi$$

$$(14) \quad \phi_{Si} := 2\operatorname{atan}\left[\left[\frac{\frac{1}{2}\text{ScanLineLength}}{f_i}\right]\right]$$

$$(15) \quad M_i := \frac{r_0}{f_i} + \cos(\lambda_1) + \cos(B_i)$$

$$(16) \quad \Theta_{roti} := \frac{\Theta_{Si}}{M_i}$$

$$(17) \quad \Theta'_{roti} := \Theta_{roti} + \underbrace{\frac{d_{beam}}{r_0} + \frac{d_{gap}}{r_0}}_{\Theta_{dead}}$$

$$(18) \quad \xi_i := \left[\frac{f_i}{f_{16}}\right]^2 \frac{\sin[B_{16}]}{\sin(B_i)} H_i$$

$$(19) \quad \text{Area}_i := \pi\left[r_{outter}^2 + r_{inner}^2\right] \frac{\xi_i}{\sum_{i=1}^{16}[\xi_i]} \qquad i = 1,2,\ldots16$$

**VECTOR MODELING OF LASER SCAN BEAMS IN
HOLOGRAPHIC SCANNING SUBSYSTEMS**

---

MATHEMATICAL FORM FOR EACH LASER SCAN BEAM:
VECTOR-BASED MODEL OF OPTICAL PATH OF BEAM FROM DISC TO
MIRROR TO FOCAL PLANE ($\infty$)

PROCEDURE:

(1) USE POSITION VECTOR REFERENCED FROM X=0, Y=0, Z=O IN $R_{local\ scanner}$, FOR SPECIFYIED THE STARTING POINT OF LASER SCAN BEAM ON DISC, AND DIRECTION VECTOR FOR SPECIFYING THE DIRECTION OF LASER BEAM THE BEAM FOLDING MIRROR; AND (2) USE POSITION VECTOR FOR SPECIFYING POINT ON MIRROR WHERE BEAM IS REFLECTED FROM BEAM FOLDING MIRROR TOWARDS FOCAL PLANE OF FACET, EXTENDING TO INFINITY, AND DIRECTION VECTOR FOR SPECIFYING THE DIRECTION OF LASER BEAM TOWARDS DESIGNATED FOCAL PLANE (3) THESE FOUR VECTORS SPECIFY THE LASER BEAM RAY IN LOCAL COORDINATE REFERENCE $R_{local\ scanner}$

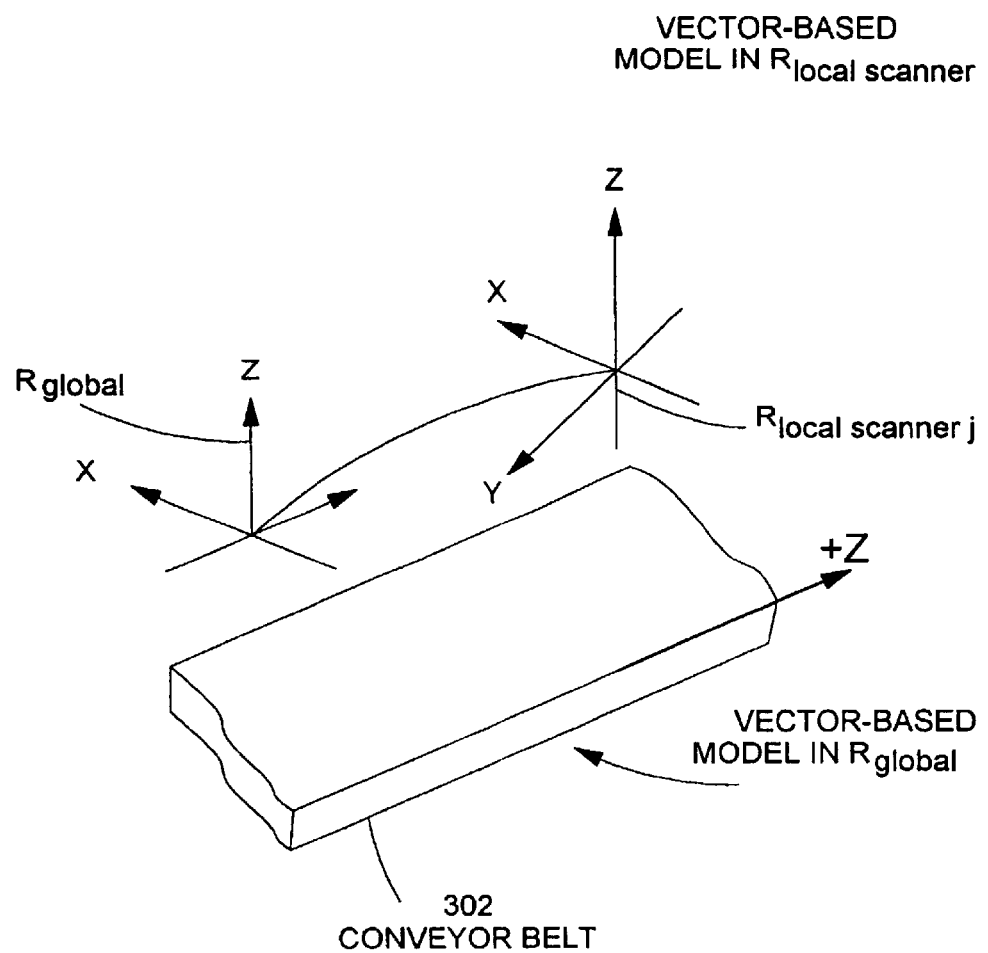
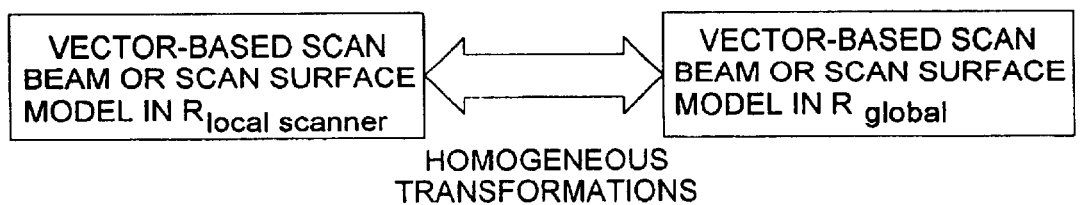
FIG. 46

UNITARY PACKAGE IDENTIFICATION AND DIMENSIONING SYSTEM EMPLOYING LADAR-BASED SCANNING METHODS

RELATED CASES

This Application is a National Phase Entry Application of International Application PCT/US00/15624 filed Jun. 7, 2000, which is a Continuation-in-Part of the following U.S. patent application Ser. No. 09/327,756 filed Jun. 7, 1999.

BACKGROUND OF THE INVENTION

1. Technical Field

The present invention relates generally to an automated tunnel-type laser scanning package identification and measuring system arranged about a high-speed conveyor structure used in diverse package routing and transport applications, and also a method of identifying and measuring packages labeled with bar code symbols.

2. Brief Description of the Prior Art

In many environments, there is a great need to automatically identify and measure objects (e.g. packages, parcels, products, luggage, etc.) as they are transported along a conveyor structure. While over-the-head laser scanning systems are effective in scanning upwardly-facing bar codes on conveyed objects, there are many applications where it is not practical or otherwise feasible to ensure that bar code labels are upwardly-facing during transportation under the scanning station.

Various types of "tunnel" scanning systems have been proposed so that bar codes can be scanned independently of their orientation within scanning volume of the system. One such prior art tunnel scanning system, a disclosed in U.S. Pat. No. 5,019,714 to Knowles. In this prior art scanning system, a plurality of single scanline scanners are orientated about a conveyor structure in order to provide limited degree of omni-directional scanning within the "tunnel-like" scanning environment. Notably, however, prior art tunnel scanning systems, including the system disclosed in U.S. Pat. No. 5,019,714, are incapable of scanning bar code systems in a true omni-directional sense, i.e. independent of the direction that the bar code faces as it is transported along the conveyor structure. At best, prior art scanning systems provide omni-directional scanning in the plane of the conveyor belt or in portions of planes orthogonal thereto. However, true omnidirectional scanning along the principal planes of a large 3-D scanning volume has not been hitherto possible.

Also, while numerous systems have been proposed for automatically identifying and measuring the dimensions and weight of packages along a high-speed coveyor, prior art systems have been very difficult to manufacture, maintain, and operate in a reliable manner without the use of human supervision.

Thus, there is a great need in the art for an improved tunnel-type automated laser scanning package identification/measuring system and a method of identifying and measuring packages transported along a high-speed conveyor system, while avoiding the shortcomings and drawbacks of prior art scanning systems and methodologies.

DISCLOSURE OF THE PRESENT INVENTION

Accordingly, a primary object of the present invention is to provide a novel tunnel-type automated package identification and measuring system that is free of the shortcomings and drawbacks of prior art tunnel-type laser scanning systems and methodologies.

Another object of the present invention is to provide a fully automated unitary-type package identification and measuring system (i.e. contained within a single housing or enclosure), wherein a scanning subsystem is used to read bar codes on packages entering the system, while a package dimensioning subsystem is used to capture information about the package prior to entry into the tunnel.

Another object of the present invention is to provide such an automated package identification and measuring system, wherein Laser Detecting And Ranging (LADAR-based) scanning methods are used to capture two-dimensional range data maps of the space above a conveyor belt structure and two-dimensional image contour tracing methods are used to extract package dimension data therefrom.

Another object of the present invention is to provide such a unitary system, in which the scanning subsystem can be realized using either a holographic scanning mechanism, a 1D or 2D camera system or polygonal scanning mechanism.

Another object of the present invention is that the package velocity is computed by using a pair of laser beams projected at different angular projections over the conveyor belt.

Another object of the present invention is to provide such a system in which the laser scanning lasers beams having multiple wavelengths to sensing packages have a wide range of reflectivity characteristics.

Another object of the present invention is to provide such a system, in which the same amplitude modulated laser beam used to dimension packages is also used to detect the presence of packages over a prespecified time interval.

Another object of the present invention is to provide a fully automated package identification and measuring system, wherein the package dimensioning subsystem is realized as a LADAR-based package imaging and dimensioning unit (i.e. subsystem) supported above the conveyor belt structure of the system.

Another object of the present invention is to provide such an automated package identification and measuring system, wherein the LADAR-based imaging, detecting and dimensioning subsystem produces a synchronized amplitude-modulated laser beam that is automatically scanned across the width of the conveyor belt structure and, during each scan thereacross, detects and processes the reflected laser beam in order to capture a row of raw range (and optionally reflection-intensity) information that is referenced with respect to a polar-type coordinate system symbolically-embedded within the LADAR-based imaging, detecting and dimensioning subsystem.

Another object of the present invention is to provide such an automated package identification and measuring subsystem, wherein the rows of range data captured by the LADAR-based imaging, detecting and dimensioning subsystem are continuously loaded into a preprocessing data buffer, one row at a time, and processed in real-time using window-type convolution kernals that smooth and edge-detect the raw range data and thus improve its quality for subsequent dimension data extraction operations.

Another object of the present invention is to provide such an automated package identification and measuring subsystem, wherein the LADAR-based imaging, detecting and dimensioning subsystem automatically subtracts detected background information (including noise) from the continuously updated range data map as to accommodate for changing environmental conditions and enable high system performance independent of background lighting conditions.

Another object of the present invention is to provide such an automated package identification and measuring subsystem, wherein the LADAR-based imaging, detecting and dimensioning subsystem automatically buffers consecutively captured rows of smoothed/ledge-detected range data to provide a range data map of the space above the conveyor belt, and employs two-dimensional image contour tracing techniques to detect image contours within the buffered range data map, indicative of packages being transported through the laser scanning tunnel system.

Another object of the present invention is to provide such an automated package identification and measuring subsystem, wherein the LADAR-based imaging, detecting and dimensioning subsystem automatically processes the indices (m,n) of the computed-contours in order to detect vertices associated with polygonal-shaped objects extracted from the range data map, which are representative of packages or like objects being transported through the laser scanning tunnel system.

Another object of the present invention is to provide such an automated package identification and measuring subsystem, wherein the LADAR-based imaging, detecting and dimensioning subsystem automatically processes the m and n indices of the detected vertices associated with the computed contours in order to detect candidates for corner points associated with the corners of a particular package being transported through the laser scanning tunnel system.

Another object of the present invention is to provide such an automated package identification and measuring subsystem, wherein the LADAR-based imaging, detecting and dimensioning subsystem automatically processes the m and n indices of detected corner point candidates in order to reduce those corner point candidates down to those most likely to be the corners of a regular-shaped polygonal object (e.g. six sided box).

Another object of the present invention is to provide such an automated package identification and measuring subsystem, wherein the LADAR-based imaging, detecting and dimensioning subsystem automatically processes the m and n indices of the corner points extracted from the range data map in order to compute the surface area of the package represented by the contours traced therein.

Another object of the present invention is to provide such an automated package identification and measuring subsystem, wherein the LADAR-based imaging, detecting and dimensioning subsystem automatically processes the m and n indices of the corner points extracted from the range data map in order to compute the x,y and z coordinates corresponding to the corners of the package represented by the contours traced therein, referenced relative to a Cartesian-type global coordinate reference system symbolically embedded within the automated package identification and measuring subsystem.

Another object of the present invention is to provide such an automated package identification and measuring subsystem, wherein the LADAR-based imaging, detecting and dimensioning subsystem automatically processes the m and n indices of the corner points extracted from the range data map in order to compute the average height of the package represented by the contours traced therein, referenced relative to the Cartesian-type global coordinate reference system.

Another object of the present invention is to provide such an automated package identification and measuring subsystem, wherein the LADAR-based imaging, detecting and dimensioning subsystem employs a polygonal-type laser scanning mechanism for scanning an amplitude-modulated laser beam across the width of the conveyor belt.

Another object of the present invention is to provide such an automated package identification and measuring subsystem, wherein the LADAR-based imaging, detecting and dimensioning subsystem employs a holographic-type laser scanning mechanism for scanning an amplitude-modulated laser beam across the width of the conveyor belt.

Another object of the present invention is to provide a fully automated package identification and measuring system, wherein mathematical models are created on a real-time basis for both the geometry of the package and the position of the laser scanning beam used to read the bar code symbol thereon.

Another object of the present invention is to provide a fully automated package identification and measuring system, wherein the mathematical models are analyzed to determine if collected and queued package identification data is spatially and/or temporally correlated with package measurement data using vector-based ray-tracing methods, homogeneous transformations, and object-oriented decision logic so as to enable simultaneous tracking of multiple packages being transported through the scanning tunnel.

Another object of the present invention is to provide such a system, in which a plurality of holographic laser scanning subsystems are mounted from a scanner support framework, arranged about a high-speed conveyor belt, and arranged so that each scanning subsystem projects a highly-defined 3-D omni-directional scanning volume with a large depth-of-field, above the conveyor structure so as to collectively provide omni-directional scanning with each of the three principal scanning planes of the tunnel-type scanning system.

Another object of the present invention is to provide an automated package identification and measuring system, wherein singulated packages can be detected, dimensioned, weighed, and identified in a fully automated manner without human intervention, while being transported through a laser scanning tunnel subsystem using a package conveyor subsystem.

Another object of the present invention is to provide such a system, wherein a package detection and dimensioning subsystem is provided on the input side of its scanning tunnel subsystem, for detecting and dimensioning singulated packages passing through the package detection and dimensioning subsystem.

Another object of the present invention is to provide such a system, wherein a data element queuing, handling and processing subsystem is provided for queuing, handling and processing data elements representative of package identification, dimensions and/or weight, and wherein a moving package tracking queue is maintained so that data elements comprising objects, representative of detected packages entering the scanning tunnel, can be tracked along with dimensional and measurement data collected on such detected packages.

Another object of the present invention is to provide such a system, wherein a package detection subsystem is provided on the output side of its scanning tunnel subsystem.

Another object of the present invention is to provide such a system, wherein the tunnel scanning subsystem provided therein comprises a plurality of laser scanning subsystems, and each such laser scanning subsystem is capable of automatically generating, for each bar code symbol read by the subsystem, accurate information indicative of the precise point of origin of the laser scanning beam and its optical path to the read bar code symbol, as well as produced symbol character data representative of the read bar code symbol.

Another object of the present invention is to provide such a system, wherein the plurality of laser scanning subsystems generated an omnidirectional laser scanning pattern within a 3-D scanning volume, wherein a bar code symbol applied to any one side of a six-sided package (e.g. box) will be automatically scanned and decoded when passed through the 3-D scanning volume using the conveyor subsystem.

Another object of the present invention is to provide such a system, wherein the laser scanning subsystems comprise holographic laser scanning subsystems, and also polygonal-type laser scanning subsystems for reading bar code symbols facing the conveyor surface.

Another object of the present invention is to provide such a system, wherein each holographic laser scanning subsystem employed in the tunnel scanning subsystem comprises a device for generating information specifying which holographic scanning facet or holographic facet sector (or segment) produced the laser scan data used to read any bar code symbol by the subsystem.

Another object of the present invention is to provide such a system, wherein each non-holographic (e.g. polygonal-type and CCD camera type) laser scanning subsystem employed in the tunnel scanning subsystem comprises a device for generating information specifying which mirror facet or mirror sector produced the laser scan data used to read any bar code symbol by the subsystem.

Another object of the present invention is to provide such a system, wherein the data element queuing, handling and processing subsystem provided therein further comprises a scan beam geometry modeling subsystem for producing, relative to a local coordinate reference system symbolically embedded within the laser scanning subsystem, coordinate information comprising a geometric model of each laser scanning beam used to read a particular bar code symbol for which symbol character data has been produced by the laser scanning subsystem.

Another object of the present invention is to provide such a system, wherein the data element queuing, handling and processing subsystem provided therein further comprises a first homogeneous transformation module for converting the coordinate information comprising the geometric model of each laser scanning beam used to read a particular bar code symbol on a detected package, from the local coordinate reference system symbolically embedded within the laser scanning subsystem, to a global coordinate reference system symbolically embedded within the tunnel-type scanning system.

Another object of the present invention is to provide such a system, wherein the data element queuing, handling and processing subsystem provided therein further comprises a package surface modeling subsystem for producing, relative to a local coordinate reference system symbolically embedded within the laser scanning subsystem, coordinate information comprising a geometric model of each surface on each package detected by the package detection and dimensioning subsystem.

Another object of the present invention is to provide such a system, wherein the data element queuing, handling and processing subsystem provided therein further comprises a second homogeneous transformation module for converting the coordinate information comprising the geometric model of each surface on a detected package, from the local coordinate reference system symbolically embedded within the laser scanning subsystem, to a global coordinate reference system symbolically embedded within the tunnel-type scanning system.

Another object of the present invention is to provide such a system, wherein a laser scan beam and package surface intersection determination subsystem is provided for determining which detected package was scanned by the laser scanning beam that read a particular bar code symbol, and for linking (i.e. correlating) package measurement data associated with the detected package with package identification data associated with the laser scanning beam that read a bar code symbol on a detected package.

Another object of the present invention is to provide such a system with a package velocity measurement subsystem for measuring the velocity of the package as it moves from the package detection and dimensioning subsystem through the laser scanning tunnel subsystem of the system.

Another object of the present invention is to provide such a system, wherein the package velocity measurement subsystem is realized as an integral part of the LADAR-based imaging, detecting and dimensioning subsystem.

Another object of the present invention is to provide such a system, wherein a package weighing-in-motion subsystem is provided for weighing singulated packages moving through the package detection and dimensioning subsystem, and producing weight measurement information for assignment to each detected package.

Another object of the present invention is to provide an automated package identification and measuring system, wherein singulated packages can be detected, dimensioned, weighed, and identified in a fully automated manner without human intervention, while being transported through a laser scanning tunnel subsystem using a package conveyor subsystem.

Another object of the present invention is to provide such a system, wherein a package detection and dimensioning subsystem is provided on the input side of its scanning tunnel subsystem, for detecting and dimensioning singulated packages passing through the package detection and dimensioning subsystem.

Another object of the present invention is to provide such a system, wherein a data element queuing, handling and processing subsystem is provided for queuing, handling and processing data elements representative of package identification, dimensions and/or weight, and wherein a moving package tracking queue is maintained so that data elements comprising objects, representative of detected packages entering the scanning tunnel, can be tracked along with dimensional and measurement data collected on such detected packages.

Another object of the present invention is to provide such a system, wherein a package detection subsystem is provided on the output side of its scanning tunnel subsystem.

Another object of the present invention is to provide such a system, wherein each holographic laser scanning subsystem employed in the tunnel scanning subsystem comprises a device for generating information specifying which holographic scanning facet or holographic facet sector (or segment) produced the laser scan data used to read any bar code symbol by the subsystem.

Another object of the present invention is to provide such a system, wherein each non-holographic (e.g. polygonal-type) laser scanning subsystem employed in the tunnel scanning subsystem comprises a device for generating information specifying which mirror facet or minor sector produced the laser scan data used to read any bar code symbol by the subsystem.

Another object of the present invention is to provide such a system, wherein the data element queuing, handling and processing subsystem provided therein further comprises a scan beam geometry modeling subsystem for producing, relative to a local coordinate reference system symbolically embedded within the laser scanning subsystem, coordinate information comprising a geometric model of each laser scanning beam used to read a particular bar code symbol for which symbol character data has been produced by the laser scanning subsystem.

Another object of the present invention is to provide such a system, wherein the data element queuing, handling and processing subsystem provided therein further comprises a first homogeneous transformation module for converting the coordinate information comprising the geometric model of each laser scanning beam used to read a particular bar code symbol on a detected package, from the local coordinate reference system symbolically embedded within the laser scanning subsystem, to a global coordinate reference system symbolically embedded within the tunnel-type scanning system.

Another object of the present invention is to provide such a system, wherein the data element queuing, handling and processing subsystem provided therein further comprises a package surface modeling subsystem for producing, relative to a local coordinate reference system symbolically embedded within the laser scanning subsystem, coordinate information comprising a geometric model of each surface on each package detected by the package detection and dimensioning subsystem.

Another object of the present invention is to provide such a system, wherein the data element queuing, handling and processing subsystem provided therein further comprises a second homogeneous transformation module for converting the coordinate information comprising the geometric model of each surface on a detected package, from the local coordinate reference system symbolically embedded within the laser scanning subsystem, to a global coordinate reference system symbolically embedded within the tunnel-type scanning system.

Another object of the present invention is to provide such a system, wherein a laser scan beam and package surface intersection determination subsystem is provided for determining which detected package was scanned by the laser scanning beam that read a particular bar code symbol, and for linking (i.e. correlating) package measurement data associated with the detected package with package identification data associated with the laser scanning beam that read a bar code symbol on a detected package.

Another object of the present invention is to provide such a system with a package velocity measurement subsystem for measuring the velocity of the package as it moves from the package detection and dimensioning subsystem through the laser scanning tunnel subsystem of the system.

Another object of the present invention is to provide such a system, wherein a package weighing-in-motion subsystem is provided for weighing singulated packages moving through the package detection and dimensioning subsystem, and producing weight measurement information for assignment to each detected package.

Another object of the present invention is to provide an automated package identification and measuring system, wherein multiple packages, arranged in a side-by-side, stacked and/or singulated configuration, can be simultaneously detected, dimensioned, weighed, and identified in a fully automated manner without human intervention, while being transported through a laser scanning tunnel subsystem using a package conveyor subsystem.

Another object of the present invention is to provide such a system, wherein a multiple package detection and dimensioning subsystem can be provided on the input and output sides of the scanning tunnel subsystem, and multiple moving package tracking queues are simultaneously maintained therein for spatially different regions above the conveyor belt in order that data elements comprising objects, representative of detected packages exiting the scanning tunnel, can be tracked along with dimensional and measurement data collected on such detected packages.

Another object of the present invention is to provide such a system, wherein the tunnel scanning subsystem provided therein comprises a plurality of laser scanning subsystems, and each such laser scanning subsystem is capable of automatically generating, for each bar code symbol read by the subsystem, accurate information indicative of the precise point of origin of the laser scanning beam and its optical path to the read the bar code symbol, as well as symbol character data representative of the read bar code symbol.

Another object of the present invention is to provide such a system, wherein the data element queuing, handling and processing subsystem provided therein further comprises a scan beam geometry modeling subsystem for producing, relative to a local coordinate reference system symbolically embedded within the laser scanning subsystem, coordinate information comprising a geometric model of each laser scanning beam used to read a particular bar code symbol for which symbol character data has been produced by the laser scanning subsystem.

Another object of the present invention is to provide such a system, wherein the data element queuing, handling and processing subsystem provided therein further comprises a first homogeneous transformation module for converting the coordinate information comprising the geometric model of each laser scanning beam used to read a particular bar code symbol on a detected package, from the local coordinate reference system symbolically embedded within the laser scanning subsystem, to a global coordinate reference system symbolically embedded within the tunnel-type scanning system.

Another object of the present invention is to provide such a system, wherein the data element queuing, handling and processing subsystem provided therein further comprises a package surface modeling subsystem for producing, relative to a local coordinate reference system symbolically embedded within the laser scanning subsystem, coordinate information comprising a geometric model of each surface on each package detected by the package detection and dimensioning subsystem.

Another object of the present invention is to provide such a system, wherein the data element queuing, handling and processing subsystem provided therein further comprises a second homogeneous transformation module for converting the coordinate information comprising the geometric model of each surface on a detected package, from the local coordinate reference system symbolically embedded within the laser scanning subsystem, to a global coordinate reference system symbolically embedded within the tunnel-type scanning system.

Another object of the present invention is to provide such a system, wherein a laser scan beam and package surface intersection determination subsystem is provided for determining which detected package was scanned by the laser scanning beam that read a particular bar code symbol, and for linking (i.e. correlating) package measurement data associated with the detected package with package identification data associated with the laser scanning beam that read a bar code symbol on a detected package.

Another object of the present invention is to provide such a system with a package velocity measurement subsystem for measuring the velocity of the package as it moves from the package detection and dimensioning subsystem through the laser scanning tunnel subsystem of the system.

Another object of the present invention is to provide such a system, wherein the package detection and dimensioning subsystem provided on the input side of the laser scanning tunnel subsystem comprises a laser scanning mechanism that generates an amplitude modulated laser scanning beam that is scanned across the width of the conveyor structure in the package conveyor subsystem while the scanning beam is disposed substantially perpendicular to the surface of the conveyor structure, and light reflected from scanned packages is collected, detected and processed to produce information representative of the package height profile across the width of the conveyor structure for each timing sampling instant carried out by the package detection and dimension subsystem.

Another object of the present invention is to provide a LADAR-based package imaging, detecting and dimensioning subsystem for imaging and/or profiling packages transported thereby a substantially constant velocity.

Another object of the present invention is to provide such a LADAR-based imaging, detecting and dimensioning subsystem, wherein a synchronized amplitude-modulated laser beam is automatically produced and scanned across the width of a conveyor belt structure and, during each scan thereacross, detects and processes the reflected laser beam in order to capture a row of raw range (and optionally reflection-intensity) information that is referenced with respect to a polar-type coordinate system symbolically-embedded within the LADAR-based imaging, detecting and dimensioning subsystem.

Another object of the present invention is to provide such a LADAR-based imaging, detecting and dimensioning subsystem, wherein captured rows of range data are continuously loaded into a preprocessing data buffer, one row at a time, and processed in real-time using window-type convolution kernals that smooth and edge-detect the raw range data and thus improve its quality for subsequent dimension data extraction operations.

Another object of the present invention is to provide such a LADAR-based imaging, detecting and dimensioning subsystem, wherein detected background information (including noise) is automatically subtracted from consecutively captured rows of smoothed/ledge-detected range data to provide a range data map of the space above the conveyor belt, for use in carrying out package dimension data extraction operations involving the same.

Another object of the present invention is to provide such a LADAR-based imaging, detecting and dimensioning subsystem, wherein two-dimensional image contour tracing techniques are used to detect image contours within the buffered range data map, indicative of packages being transported thereby.

Another object of the present invention is to provide such a LADAR-based imaging, detecting and dimensioning subsystem automatically processes the indices (m,n) of the computed contours in order to detect possible vertices associated with polygonal-shaped objects extracted from the range data map, which are representative of packages or like objects being transported by the subsystem.

Another object of the present invention is to provide such a LADAR-based imaging, detecting and dimensioning subsystem, wherein the m and n indices of the vertices associated with the computed contours are automatically processed in order to detect candidates for corner points associated with the corners of packages transported by the subsystem.

Another object of the present invention is to provide such a LADAR-based imaging, detecting and dimensioning subsystem, wherein the m and n indices of detected corner point candidates are automatically processed in order to reduce those corner point candidates down to those most likely to be the corners of a regular-shaped polygonal object (e.g. six sided box).

Another object of the present invention is to provide such a LADAR-based imaging, detecting and dimensioning subsystem, wherein the m and n indices of the corner points extracted from the range data map are automatically processed in order to compute the surface area of the package represented by the contours traced therein.

Another object of the present invention is to provide such a LADAR-based imaging, detecting and dimensioning subsystem, wherein the m and n indices of the corner points extracted from the range data map are automatically processed in order to compute the x,y and z coordinates corresponding to the corners of the package represented by the contours traced therein, referenced relative to a Cartesian-type global coordinate reference system symbolically embedded within the automated package identification and measuring subsystem.

Another object of the present invention is to provide such a LADAR-based imaging, detecting and dimensioning subsystem wherein the m and n indices of the corner points extracted from the range data map are automatically processed in order to compute the average height of the package represented by the contours traced therein, referenced relative to the Cartesian-type global coordinate reference system.

Another object of the present invention is to provide such a LADAR-based imaging, detecting and dimensioning subsystem, wherein a polygonal-type laser scanning mechanism is used to scan an amplitude-modulated laser beam across the width of the conveyor belt.

Another object of the present invention is to provide such a LADAR-based imaging, detecting and dimensioning subsystem, wherein a holographic-type laser scanning mechanism is used to scan an amplitude-modulated laser beam across the width of the conveyor belt.

These and other objects of the present invention will become apparent hereinafter and in the Claims to Invention.

BRIEF DESCRIPTION OF THE DRAWINGS

For a more complete understanding of the present invention, the following Detailed Description of the Illustrative Embodiment should be read in conjunction with the accompanying Drawings, wherein:

FIG. 4A1 is a plan view of the triple-disc holographic scanning subsystem mounted within the unitary package identification and measurement system of the first illustrative embodiment, showing three holographic scanning discs mounted on an optical bench with about a 15.0 inch spacing between the axis of rotation of each neighboring holographic scanning disc, and each holographic scanning disc mounted therein being surrounded by five beam folding mirrors, five parabolic light collection mirrors, five laser beam production modules, five photodetectors, and five analog and digital signal processing boards mounted on the optical bench of the subsystem;

FIG. 4A2 is a perspective view of one of the laser scanning stations mounted about each holographic laser scanning disc in the triple-disc holographic laser scanning subsystem shown in FIG. 4A1;

FIG. 4A3 is a cross-sectional view of the triple-disc holographic laser scanning subsystem shown in FIG. 4A2, taken along line 4A3—4A3 thereof, showing one of its holographic scanning discs rotatably supported by its scanning motor mounted on the optical bench of the subsystem;

FIG. 4A4 is a schematic representation of the layout of the volume-transmission type holographic optical element (HOEs) mounted between the glass support plates of each holographic scanning disc employed within the triple-disc holographic scanning subsystem shown in FIG. 4A1;

FIG. 4A5 is a table setting forth the design parameters used to construct each holographic disc within the single-disc holographic scanning subsystem employed in the tunnel scanning system of the first illustrative embodiment;

FIGS. 6C1 through 6C2, taken together, provide a schematic diagram of an analog signal processing circuit which can be used to implement the home-pulse detector employed in the holographic laser scanning subsystems of the first illustrative embodiment of the present invention;

FIG. 8 is a scanner specification table setting forth operational specifications for the holographic laser scanning subsystems shown in FIGS. 7A, 7B and 7C, for the Penta 3, Penta 2 and Penta 1 scanners, respectively;

FIG. 10B is a first table containing parameters and information that are used within the SOFP generation module of the SOFSP generator shown in FIG. 10A;

FIG. 10D is a second table containing parameters and information that are used within the SOFSP generation module of the SOFSP generator shown in FIG. 10A;

FIG. 10E1 and 10E2 set forth a table containing a set of production rules used within the SOFSP generation module of the SOFSP generator shown in FIG. 10A, to generate start-of-facet-sector pulses therewithin;

FIGS. 11A1 and 11A2, taken together, set forth a schematic diagram of the digitizing circuit shown in FIG. 10, using a pair of dual FIFO memory storage buffers to synchronously track digital scan data and information about the facet-sectors on the optically-encoded holographic scanning disc of FIG. 12 used to generate the laser scanning beam that was used to collect such digital scan data from a bar code symbol on a package transported through the tunnel scanning subsystem of the first illustrative embodiment of the present invention;

FIGS. 11C1, 11C2 and 11D set forth tables containing parameters and information that are used within the decode processor of the present invention shown in FIG. 11A2 in order to recover digital count data from time-based facet-sector related information, and generate decoded symbol character data and the minimum and maximum facet sector angles that specify the facet sector on a particular holographic scanning disc used to generate the laser scanning beam/plane that collects the scan data associated with the decoded bar code symbol;

FIGS. 13A1 and 13A2 is a schematic diagram of the digitizing circuit shown in FIG. 12A using a pair of dual FIFO memory storage buffers to synchronously track digital scan data and information about the facet-sectors on a holographic scanning disc used to generate the laser scanning beam that was used to collect such digital scan data from a bar code symbol on a package transported through the tunnel system of the present invention;

FIG. 15A is a schematic representation of a generic dual-beam/multi-wavelength LADAR-based imaging, detecting and dimensioning subsystem of the present invention configured in relation to a set of retro-reflective beam-steering mirrors mounted on opposite sides of a conveyor belt, beneath the LADAR-based imaging, detecting and dimensioning subsystem, mounted thereabove;

FIG. 15E1 is a schematic diagram showing an elevated side view of the eight-sided polygonal scanning element employed in the polygon-based LADAR-based subsystem of FIG. 15B, wherein the dimensions of the scanning facets are specified in inches;

FIG. 15E2 is a schematic diagram showing a plan view of the eight-sided two-angle polygonal scanning element employed in the polygon-based LADAR-based subsystem of FIG. 15B, wherein the dimensions of the scanning facets are specified in inches;

FIG. 15E3 is a table specifying the angle at which each reflective scanning facet on the polygon scanning element of FIG. 15E2 is mounted off the vertical rotational axis thereof, showing that the alternating faces of the scanning element are mounted +or −3 and ¾ degrees to the vertical resulting in an angular seperation of 15 degrees between the first and second multi-wavelength laser scanning/ranging beams produced from the LADAR-based subsystem of FIG. 15B;

FIG. 15E4 is a table listing which polygon scanning element contributes to the generation of the first and second multi-wavelength laser scanning/ranging beams produced from the LADAR-based subsystem of FIG. 15B;

FIGS. 15J1 and 15J2, taken together, show a table setting forth the design parameters used to construct the holographic scanning disc employed in the dual-beam/multi-wavelength LADAR-based subsystem of the second illustrative embodiment;

FIG. 15K is a table listing the facets which produce laser scanning beams Nos. 1 and 2 from the dual-beam/multi-wavelength LADAR-based subsystem shown in FIGS. 15G and 15H;

FIG. 16 is a schematic representation of the unitary package identification and dimensioning system of the present invention shown in FIG. 2A, wherein any dual-beam/multi-wavelength LADAR-based subsystem shown in FIGS. 15 through 15K can be modified so that the pair of laser scanning beams generated therefrom are projected perpendicular to the surface of the conveyor belt along the entire length thereof, using a cylindrical-type focusing element (i.e. cylindrical holographic optical element HOE) as shown in FIGS. 16D and 16E;

FIG. 19 is a flow chart of an algorithmic control structure for the computation of local operators in the LADAR-based subsystem of the present invention;

FIG. 36A is a digital representation of an exemplary object sensing signal which has been derived from a selected portion of the AM laser scanning beam generated by the LADAR-based subsystem of the present invention, and a time-windowed portion of which is digitally processed by a FIR-type digital filter so as to compute a first derivative signal thereof which is then compared against threshold values to determine whether or not a package is present or absent from the conveyor belt over the time period (i.e. time window) of interest, as required by the package-in-the-tunnel (PITT) indication subsystem shown in FIG. 3, as well as the package height, width and length profiling subsystem of FIG. 3;

FIG. 36B is a schematic representation the weights (i.e. coefficients) of the FIR-type digital filter used in the software-based programming implementation of the package-in-the-tunnel (PITT) indication subsystem shown in FIG. 3;

FIG. 36C is a digital representation of the output of the FIR digital filter employed in the software-based programming implementation of the package-in-the-tunnel (PITT) indication subsystem of FIG. 3, illustrated in FIGS. 36A and 36B;

FIGS. 41A and 41B set forth a table of rules used to handle the data elements stored in the system event queue in the data element queuing, handling and processing subsystem of FIGS. 40A and 40B;

FIG. 43 is a table setting forth a preferred procedure for creating a vector-based surface model for each surface of each package transported through the package dimensioning/measuring subsystem and package velocity/length measurement subsystem of the system hereof;

FIGS. 44A1 through 44A2 is schematic representation of a diffraction-based geometric optics model, created by the scan beam geometry modeling subsystem (i.e. module) of FIGS. 40A and 40B, for the propagation of the laser scanning beam (ray) emanating from a particular point on the facet, towards its point of reflection on the corresponding beam folding mirror, towards to the focal plane determined by the focal length of the facet, created within the scan beam geometry modeling module shown in FIGS. 40A and 40B;

FIGS. 44B1 through 44B3 set forth a table of parameters used to construct the diffraction-based geometric optics model of the scanning facet and laser scanning beam shown in FIGS. 44A1 and 44A2;

FIGS. 44C1 and 44C2, taken together, set forth a table of parameters used in the spreadsheet design of the holographic laser scanning subsystems of the present invention, as well as in real-time generation of geometrical models for laser scanning beams using 3-D ray-tracing techniques;

FIG. 45 is a table setting forth a preferred procedure for creating a vector-based ray model for laser scanning beams which have been produced by a holographic laser scanning subsystem of the system hereof, that may have collected the scan data associated with a decoded bar code symbol read thereby within the tunnel scanning subsystem;

FIG. 46 is a schematic representation graphically illustrating how a vector-based model created within a local scanner coordinate reference frame $R_{localscanner}$ can be converted into a corresponding vector-based model created within the global scanner coordinate reference frame $R_{global}$ using homogeneous transformations;

DETAILED DESCRIPTION OF THE ILLUSTRATIVE EMBODIMENTS OF THE PRESENT INVENTION

Figure 1A:
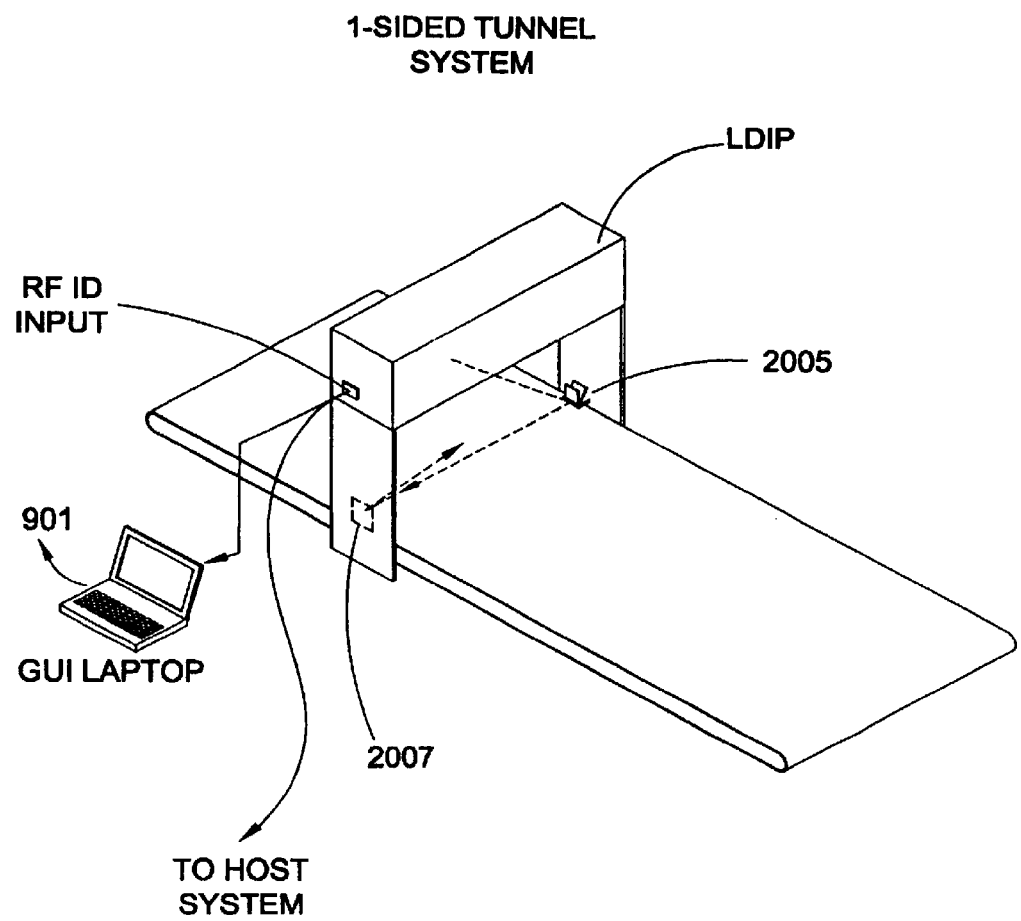
FIG. 1A is a perspective view of an automated one-sided tunnel-type package identification and measurement (e.g. dimensioning and weighing) system constructed in accordance with the first illustrated embodiment of the present invention, wherein a single unitary package dimensioning and identification unit of the present invention is mounted over a conveyor belt.

Referring to the figures in the accompanying Drawings, the preferred embodiments of the automated package identification and measurement system of the present invention will be described in great detail, wherein like elements will be indicated using like reference numerals.

Figure 1B:
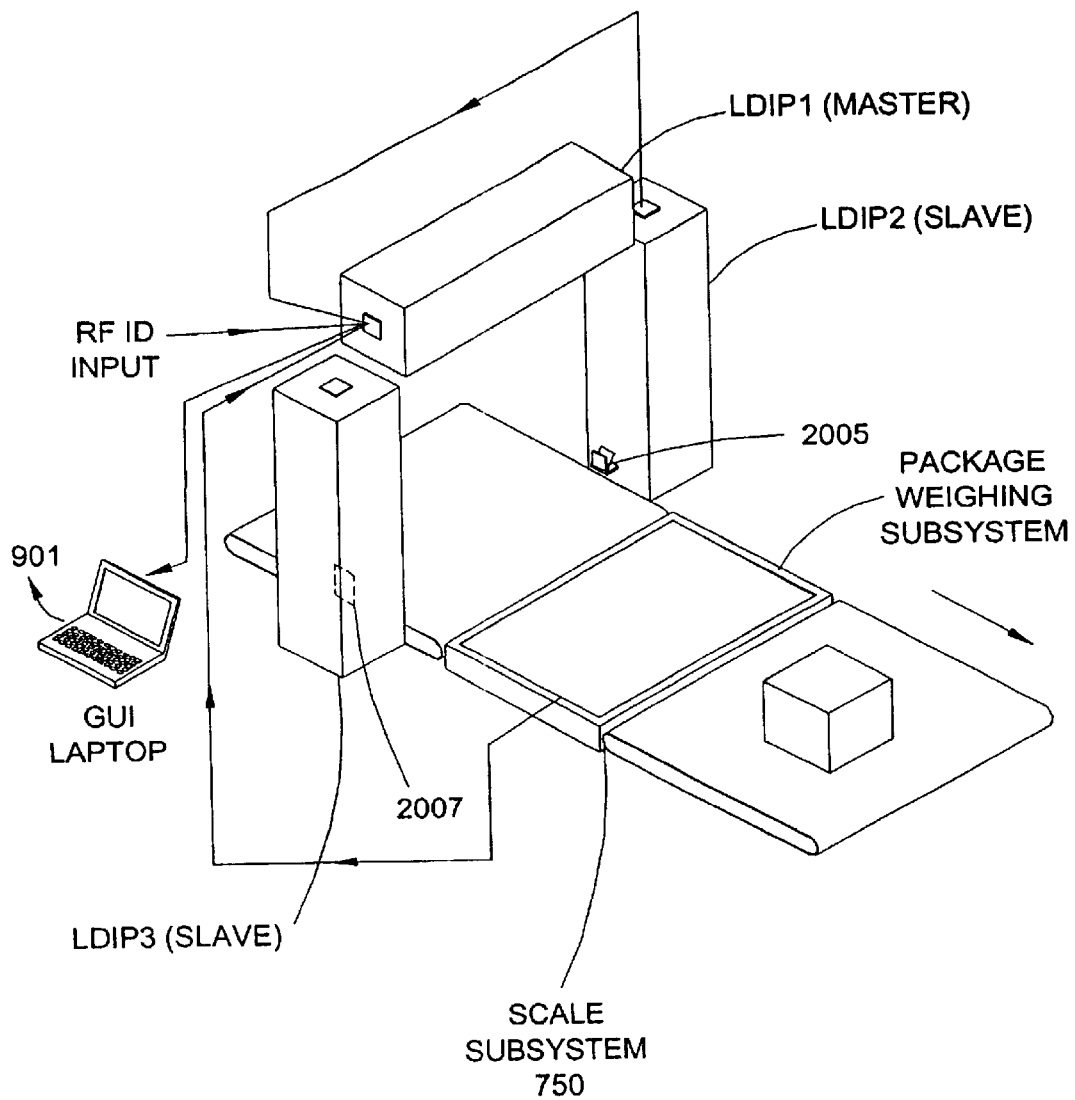
FIG. 1B is a perspective view of an automated three-sided tunnel-type package identification and measurement (e.g. dimensioning and weighing) system constructed in accordance with the second illustrated embodiment of the present invention, wherein one unitary package dimensioning and identification unit of the present invention is mounted over a conveyor belt and functions as the master-control unit, while two such units are mounted on opposite sides thereof and interconnected therewith and function as slave units (i.e. supply package identification and dimension information to the master unit)

Automated Tunnel-Type Laser Scanning Package Identification and Measurement System of the First Illustrative Embodiment of the Present Invention In FIG. 1A, there is shown an automated tunnel-type laser scanning package identification and measuring (e.g. dimensioning and weighing) system employing the unitary package identification and dimensioning system (i.e. unit) of the present invention which is shown in greater detail in FIGS. 2A through 48B. Three such unitary systems are configured together about a conveyor belt subsystem as shown in FIG. 1B to provide a 3-sided package identification and dimensioning solution, whereas four such unitary units are configured together in FIG. 1C to provide a 4-sided identification and dimensioning solution. In FIG. 1D, six or more such units are configured together about a conveyor belt system to provide a 6-sided identification and dimensioning solution, as required by the needs of demanding customers, such as the United States Postal Service (USPS), which requires "hands-free" bar code (or code symbol) scanning of at least six-sided packages, wherein the label containing the code symbol to be read could be positioned in any orientation on any one of the six or more sides of the box or container structure. As used hereinafter, the term "hands-free" shall mean scanning of bar codes on boxes or parcels that are travelling past the scanners in only one direction on some sort of conveyor system. As will be described in greater detail, each of these resulting systems can include peripheral subsystems such as for example, radio-frequency (RD) identification tag subsystems, package weighing subsystems, and the like to address the needs of particular customers.

Figure 1C:
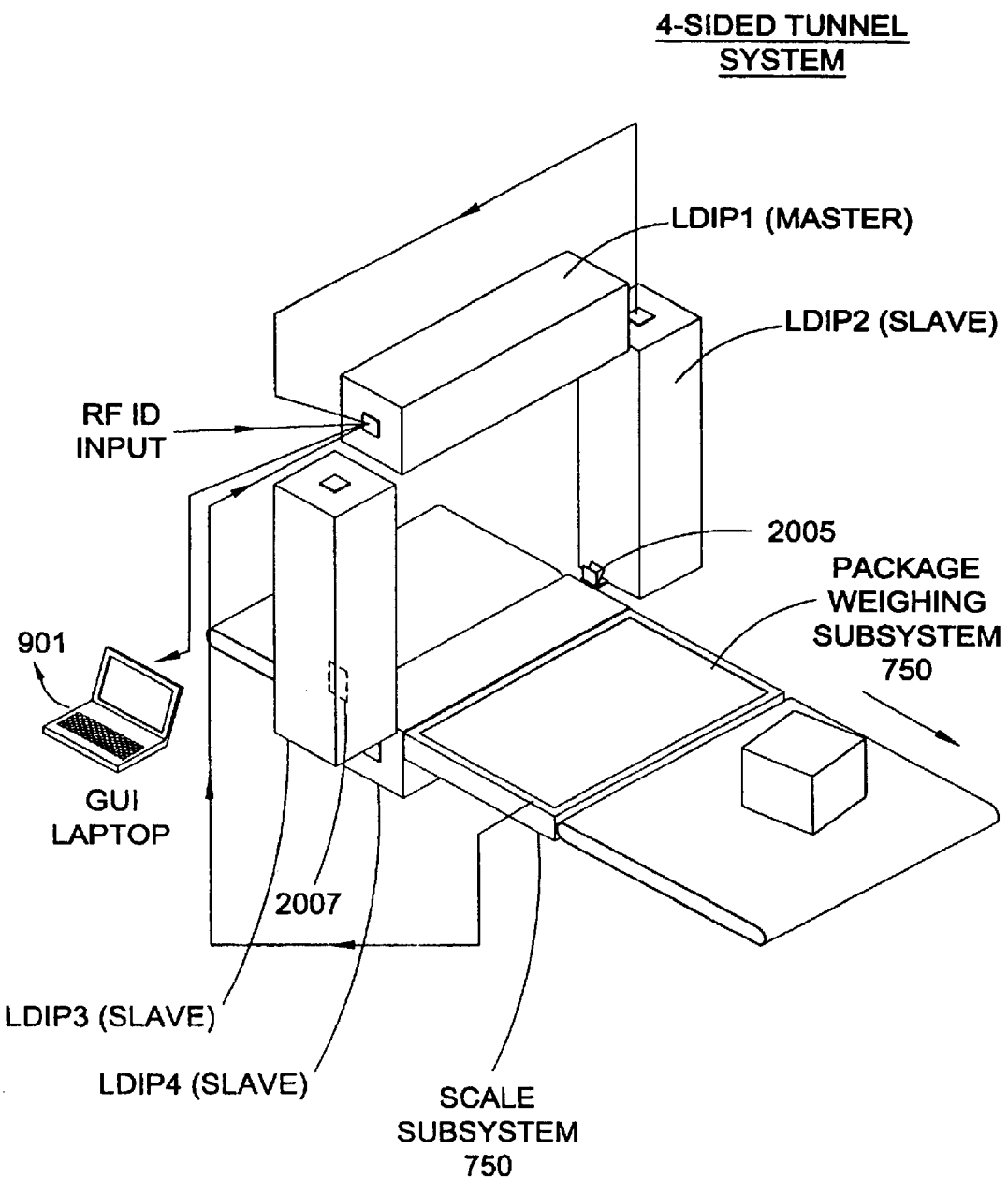
FIG. 1C is a perspective view of an automated four-sided tunnel-type package identification and measurement (e.g. dimensioning and weighing) system constructed in accordance with the third illustrated embodiment of the present invention, wherein one unitary package dimensioning and identification unit of the present invention is mounted over a conveyor belt and functions as the master-control unit, while two such units are mounted on the sides thereof and function as slave units, and one such unit is mounted along the bottom of the conveyor belt also functioning as a slave unit.
Figure 1D:
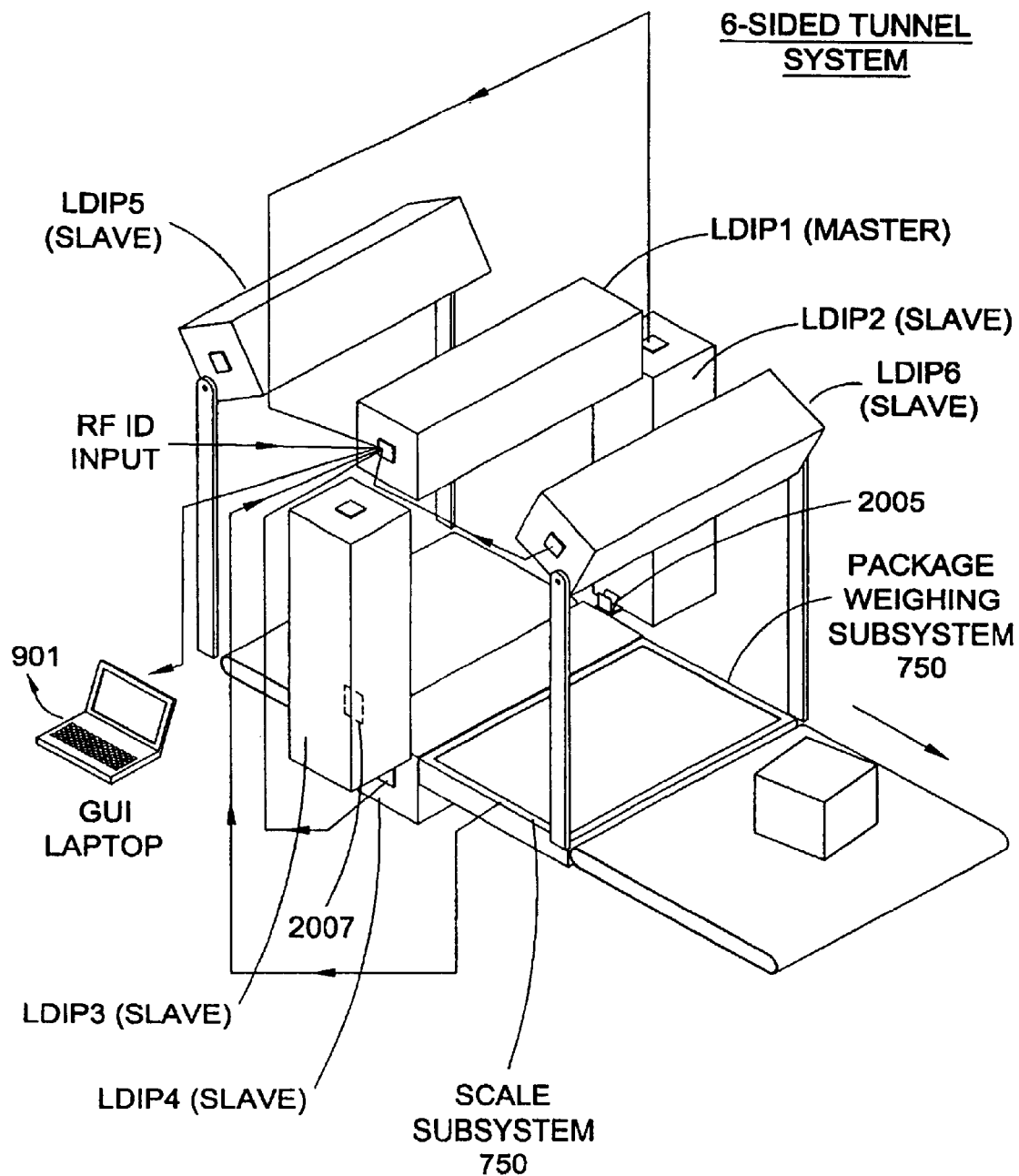
FIG. 1D is a perspective view of an automated six-sided tunnel-type package identification and measurement (e.g. dimensioning and weighing) system constructed in accordance with the third illustrated embodiment of the present invention, wherein one unitary package dimensioning and identification unit of the present invention is mounted over a conveyor belt and functions as the master-control unit, while two such units are mounted on the sides thereof and function as slave units, one such unit is mounted along the bottom of the conveyor belt and functions as a slave unit, and two such units mounted along the forward and rearward facing directions of the conveyor belt, also functioning as slave units to the master unit.
Figure 2A:
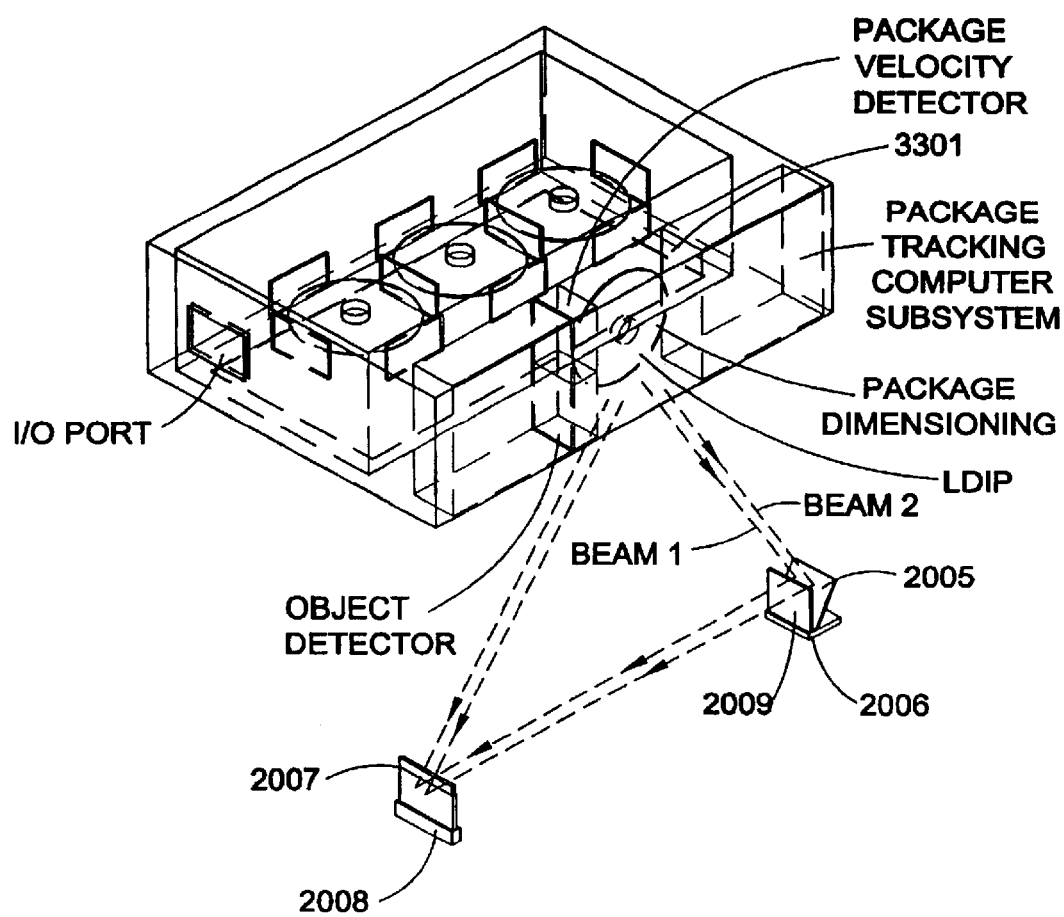
FIG. 2A is a partially-phantom perspective view of the unitary package identification and measurement system of the illustrative embodiment, wherein the holographic scanning based bar code symbol reading subsystem, the laser-based package dimensioning subsystem, the package tracking subsystem, the data element handling subsystem and the input/output subsystem associated therewith are contained within its housing.
Figure 2B:
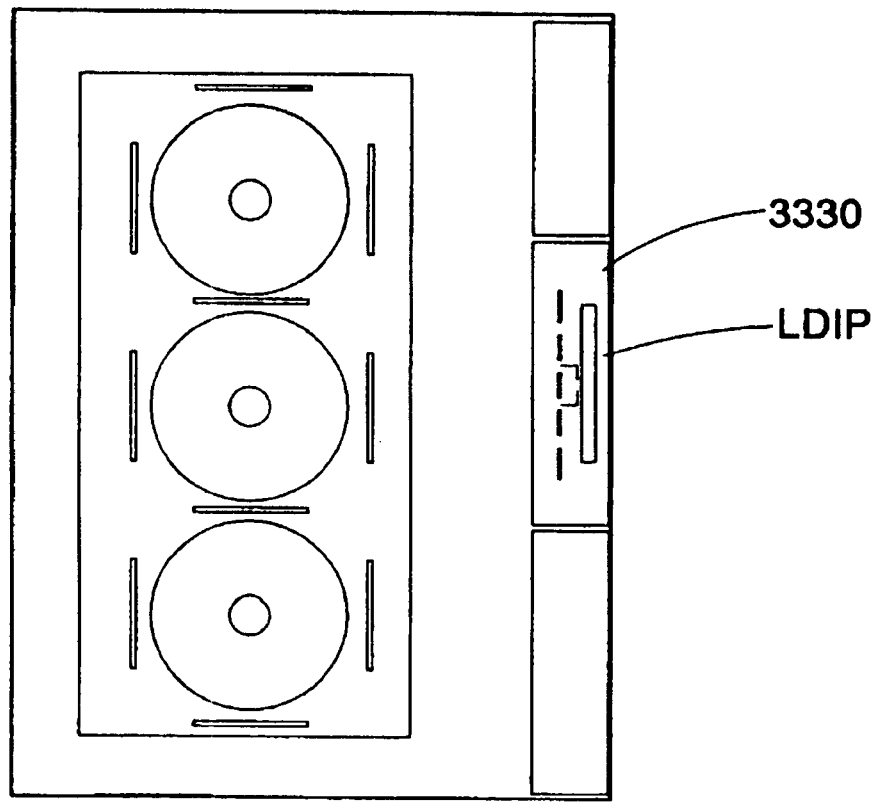
FIG. 2B is a plan view of the unitary package identification and measurement system of FIG. 2A, showing its three holographic scanning subsystems mounted beneath the scanning window of the unitary system.
Figure 3:
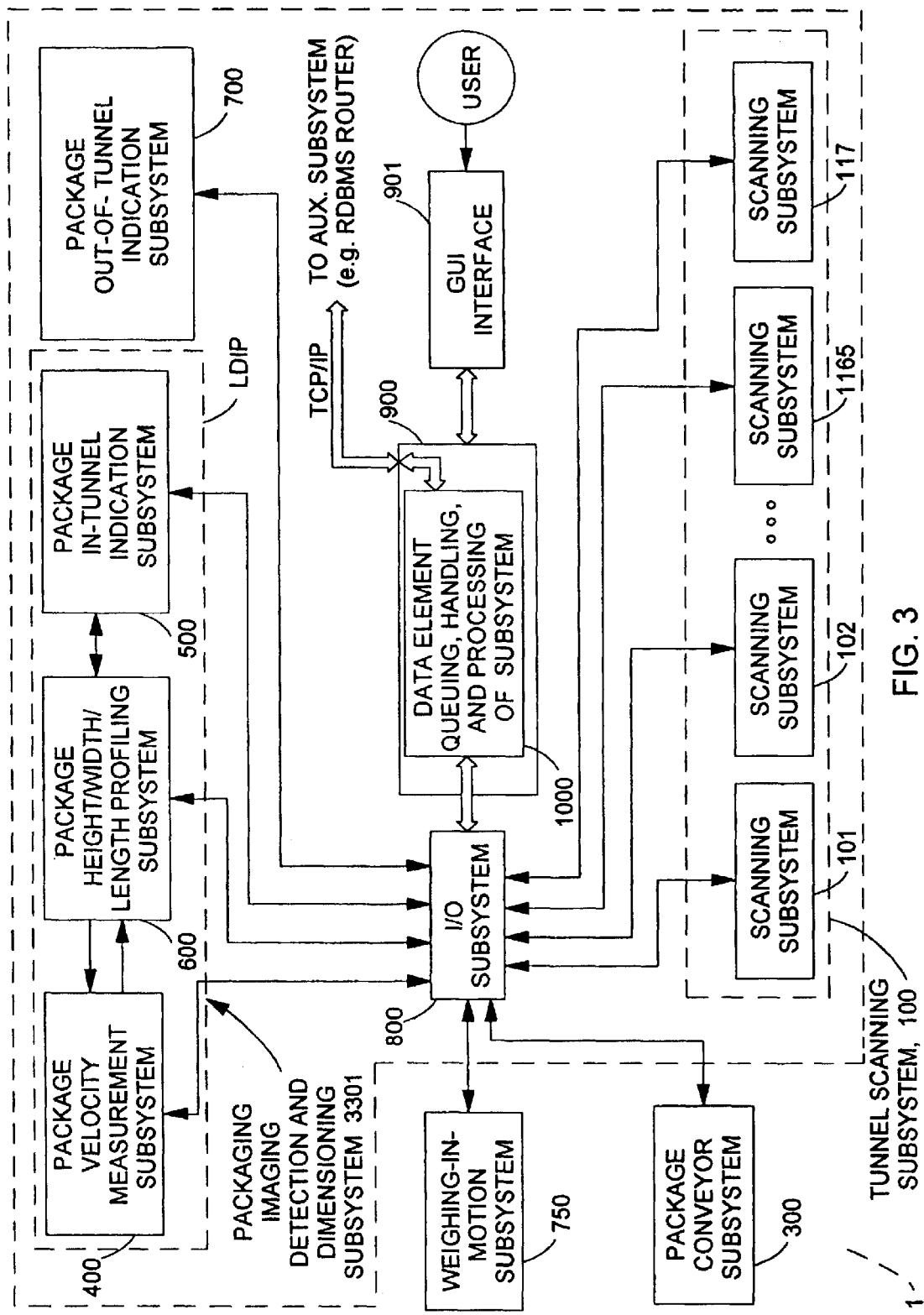
FIG. 3 is a schematic block diagram illustrating the subsystem components of the automated tunnel-type package identification and measurement system of the first illustrative embodiment of the present invention, namely its LADAR-based package imaging, detecting and dimensioning subsystem, package velocity computation subsystem, the package-in-tunnel indication subsystem, the package-out-of-tunnel subsystem, the package weighing-in-motion subsystem, the holographic laser scanning subsystems, the data-element queuing, handling and processing subsystem, the input/output port multiplexing subsystem, and the conveyor belt subsystem integrated together as shown.
Figure 32:
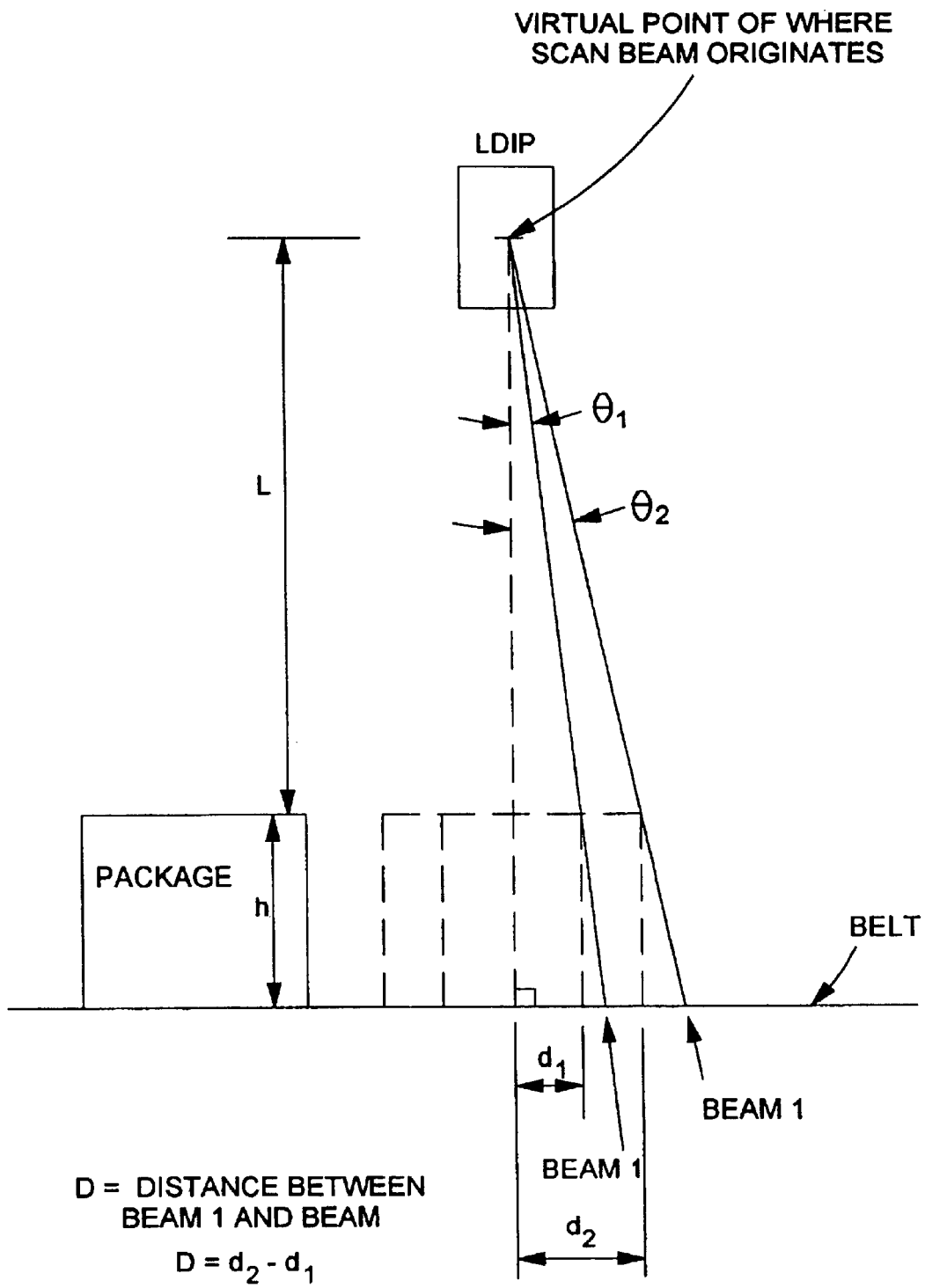
FIG. 32 is a schematic representation specifying particular geometric parameters used in the computation of package velocity according to the dual laser scanning beam method illustrated in FIG. 31.
Figure 40A:
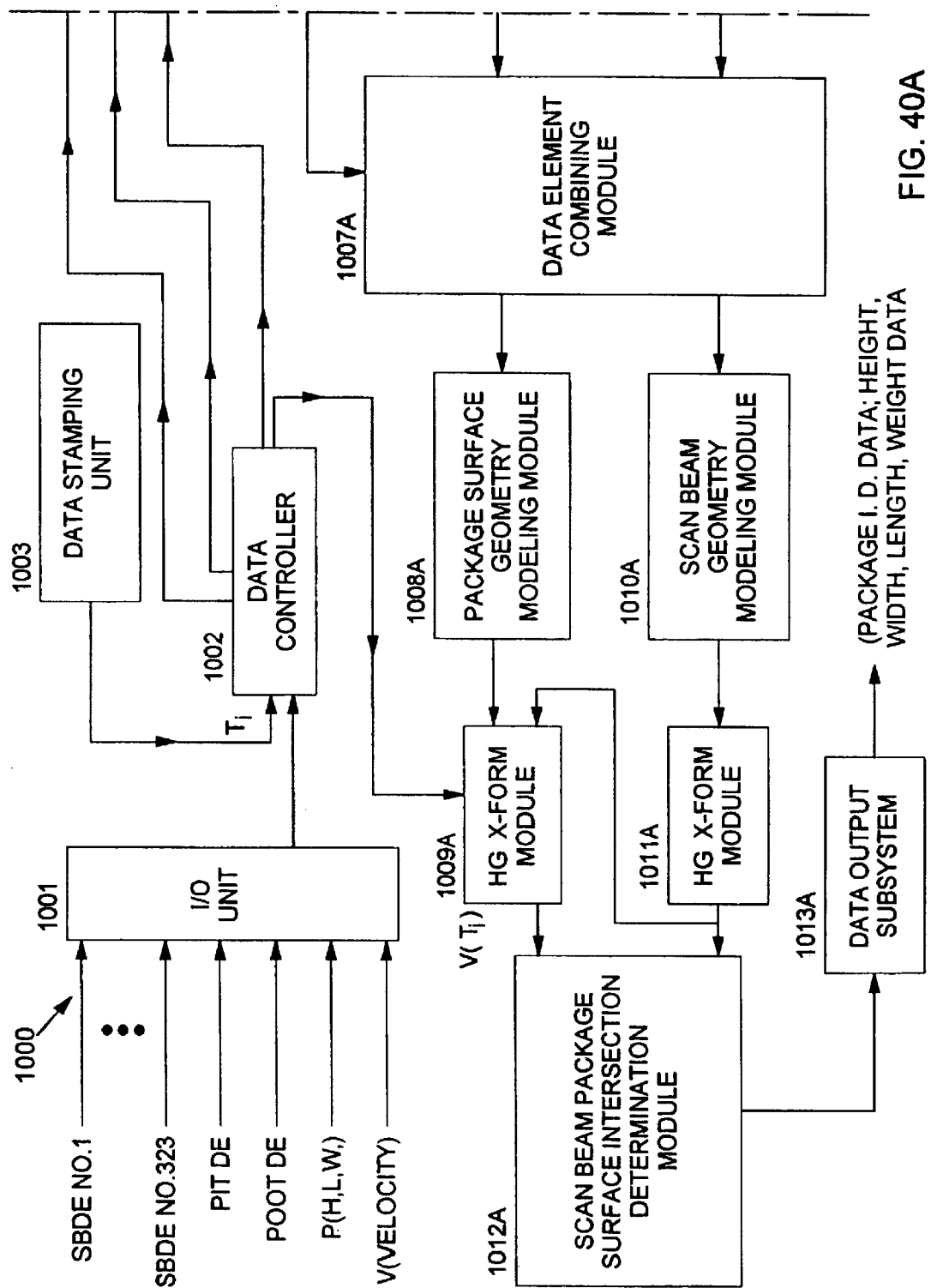
FIGS. 40A and 40B taken together provide a schematic representation of the data element queuing, handling and processing subsystem of the present invention shown in FIG. 3.
Figure 40B:
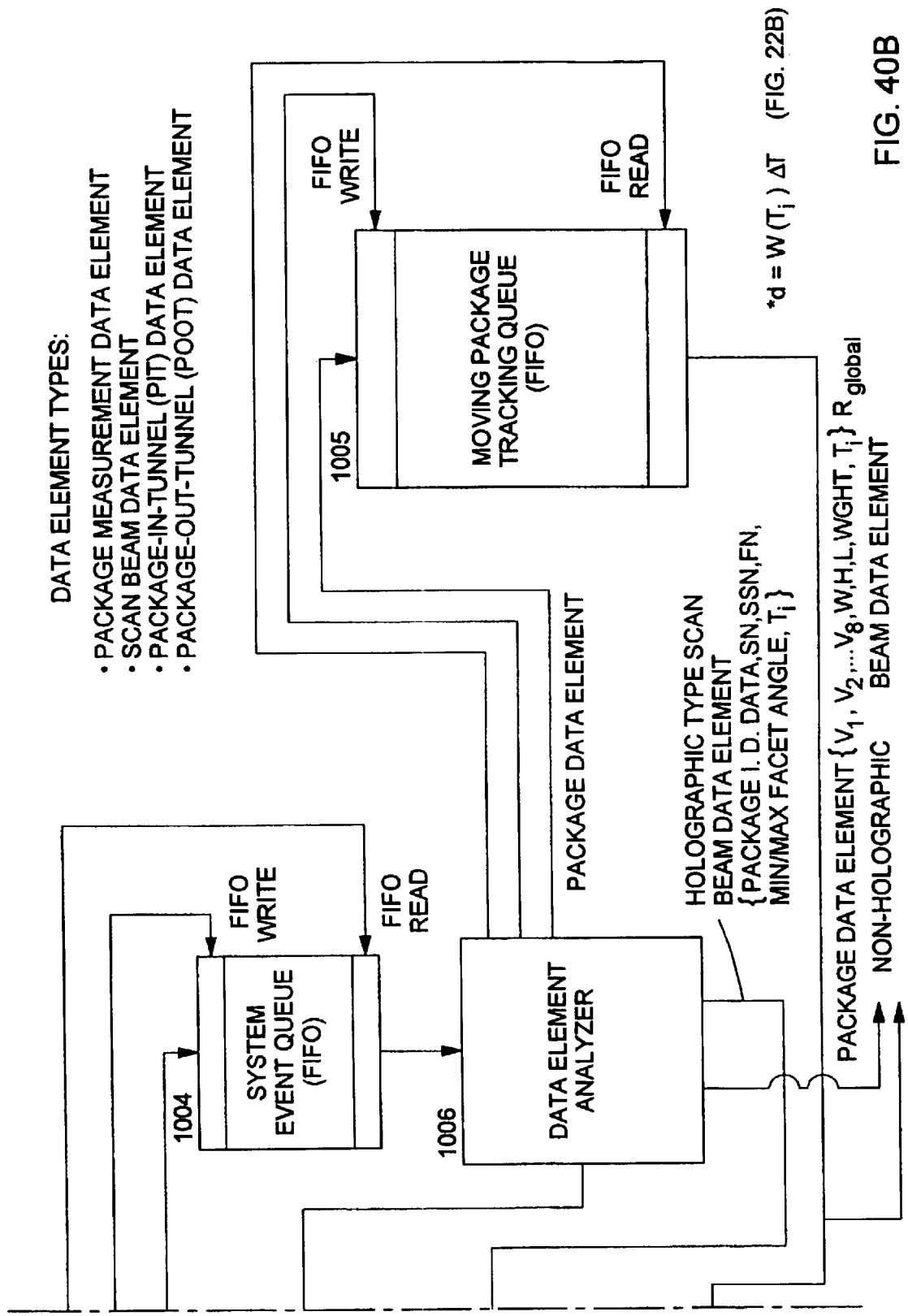

As shown in FIG. 3, the automated tunnel-based package identification and dimensioning system of the present invention, illustrated in FIGS. 1A through 4D, is indicated by reference numeral 1 and comprises an integration of subsystems, namely: a high-speed package conveyor system 300 having a conveyor belt 300 having a width of at least 48 inches to support one or more package transport lanes along the conveyor belt; a tunnel scanning subsystem 100 including one or more bar code symbol reading subsystems (indicated as 101 through 117) supported overhead and below the conveyor belt by a support frame 150 so as to produce a 3-D omnidirectional scanning volume above the conveyor belt, for scanning bar codes on packages transported therethrough independent of the package or bar code orientation; a LADAR-based imaging, detecting and dimensioning subsystem 3301 capable of collecting range data from objects on the conveyor belt using a pair of multi-wavelength (i.e. containing visible and IR spectral components) laser scanning beams projected at different angular spacing as shown in FIG. 32, and within which are integrated a package velocity measurement subsystem 400 for measuring the velocity of transported packages by analyzing range data maps by the different scanning beams, a package-in-the-tunnel indication subsystem 500 for automatically detecting the presence of each package moving into the scanning tunnel by reflecting a portion of one of the laser scanning beams across the width of the conveyor belt in a retroreflective manner and then analyzing the return signal using first derivative and thresholding techniques; a package (x-y) height/width/length dimensioning (or profiling) subsystem 600 for producing x,y,z profile data of detected packages, and a package-out-of-the-tunnel indication subsystem 700 realized using predictive techniques based on the output of the PITT subsystem 500, for automatically detecting the presence of packages moving out of the scanning tunnel; a weighing-in-motion subsystem 900 for weighing packages as they are transported along the conveyor belt; an input/output subsystem 800 for managing the inputs to and output from the unitary system shown in FIGS. 2A and 2B; and a data management computer 900 with a graphical user interface (GUI) 901, for realizing a data element queuing, handling and processing subsystem 1000 as shown in FIGS. 40A and 40B, as well as other data and system management functions.

Laser Scanning Tunnel Subsystem of First Illustrative Embodiment of the Present Invention For purposes of discussion below, the system embodiment shown in FIGS. 1D will be considered, as this system in principle is capable of more robust performance than the systems shown in FIGS. 1A and 1B. The other systems are subsets of this more robust system.

As shown in FIG. 1D, the tunnel scanning system of the first illustrative embodiment 1 comprises an arrangement of laser scanning subsystems (i.e. scanners) which, by virtue of their placement, relative to the conveyor belt subsystem 300, essentially form a "tunnel" scanning subsystem over and about the conveyor belt of the conveyor subsystem 300. In the field of package sortation of any sort, whether it be mail, luggage (as in an airport terminal) or other items or boxes, this type of code symbol scanning system is known as a "tunnel scanning system" by those skilled in the art.

The tunnel scanning system of the first illustrative embodiment can be designed and constructed to meet any specific set of customer-defined scanning parameters. For example, in the first illustrative embodiment, the bar code label can be on any one side of a box having six or more sides. The bar code label could be in any orientation. Furthermore, the object bearing the bar code label to be read would be moving past the scanners of the conveyor belt travelling at speeds in excess of 600 feet per second. In the illustrative embodiment, the conveyor belts 302A and 302B are moving at 520 feet per second but many move faster in other embodiments. The types of codes to be read to include such codes as Code 39, Code 128 and others. The aspect ratio of the bar codes to be read is on the order of 10 mils and up.

The tunnel scanning system of the present invention can be used in various types of applications, such as for example, where the bar codes are read to determine (a) identification of incoming packages, (b) identification of outgoing packages, and (c) sortation of outgoing packages. For sortation types of applications, the information derived from the bar code will be used not only to identify the package, but also to direct the package along a particular path using deflectors, routers and other instruments well known in the package and parcel handling art.

In the first illustrative embodiment shown in FIG. 1D, the volume to be scanned within the tunneling subsystem (e.g. its 3-D scanning volume) is approximately: 48 inches wide (i.e. the width of the conveyor belt); ten feet long; and 1 meter tall (i.e. the height of the tallest possible box going through). The laser scanning pattern produced by the concerted operation of the holographic laser scanning subsystems identified in the drawings, and described above, fills this entire 3-D scanning volume with over 400,000 scan lines per second. The 3-D scanning volume of the tunnel scanning system, measured with respect to the surface of the conveyor belt, begins at the surface of the conveyor belt in order to scan flat items (such as envelopes), and extends up approximately 1 meter ("h) above the surface of the conveyor belt subsystem.

The various omnidirectional and orthogonal scanning directions provided for within the 3-D scanning volume of the tunnel-scanning system of the present invention are schematically illustrated in FIGS. 5A through 9B of Applicant's International Application No. WO 99/49411. These illustrations indicate how each of the laser scanning subsystems within the tunnel scanning system contribute to produce the truly omnidirectional scanning performance attained by the tunnel scanner hereof.

Omni-Directional Holographic Laser Scanning Subsystem of the Present Invention

Figure 9A:
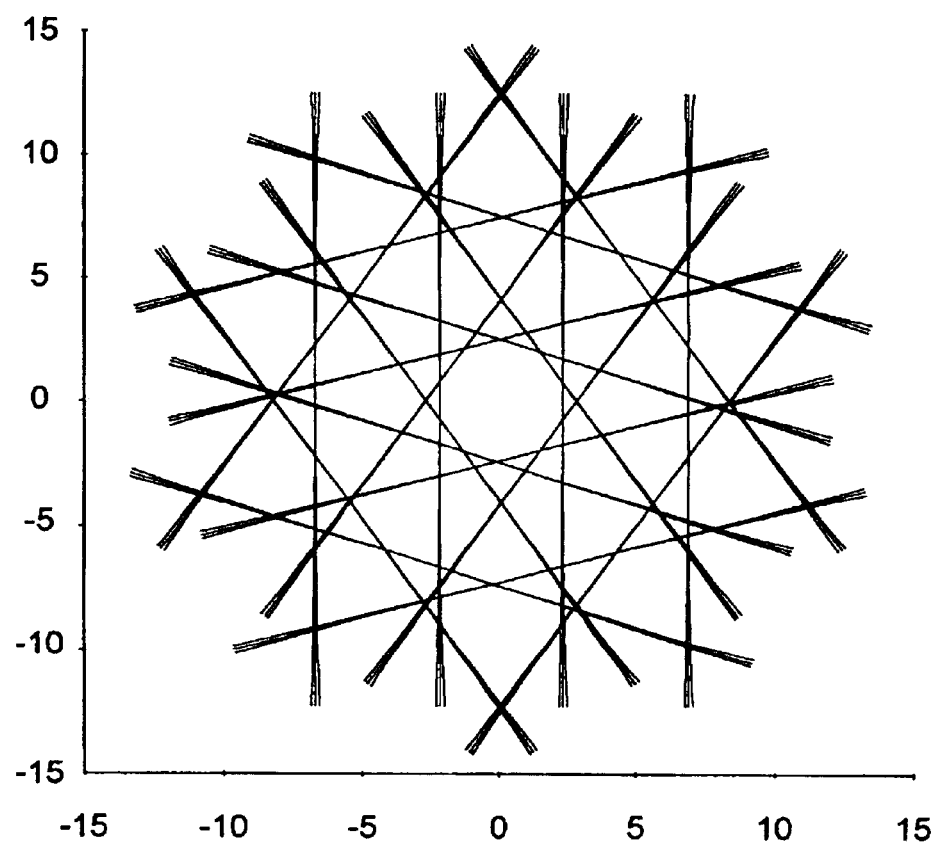
FIG. 9A is a schematic representation of all the laser scan lines produced by a single scanning platform within the laser scanning subsystem of FIG. 4A1, projected into the respective focal planes of such laser scan lines.
Figure 9B:
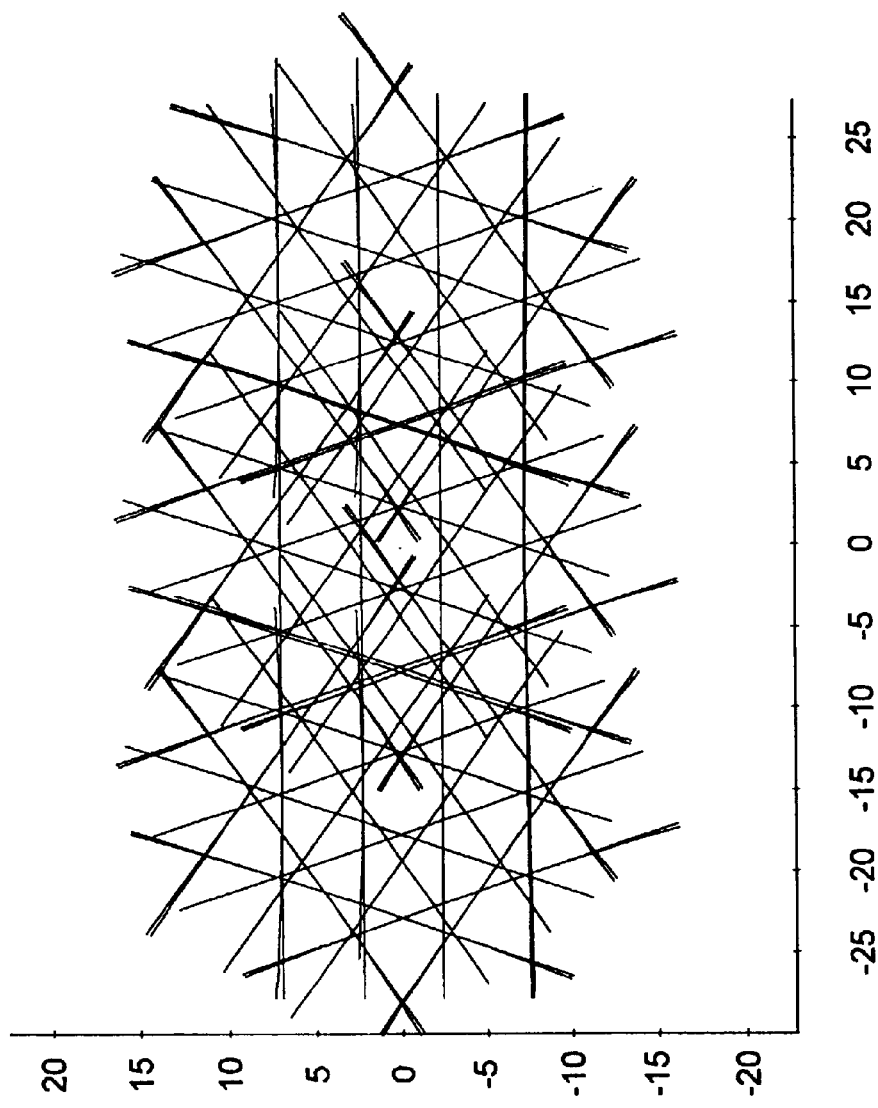
FIG. 9B is a schematic representation of all the laser scan lines produced by all three of the laser scanning platforms within the holographic laser scanning subsystem of FIG. 4B1, projected into the respective focal planes of such laser scan lines.

In the first illustrative embodiments shown in FIGS. 1A through 1D, each of the unitary package identification and dimensioning systems employ triple-disc holographic scanning subsystem which, as shown in FIG. 4A1, comprises three laser scanning platforms installed within a scanner housing 140. Each laser scanning platform, shown in greater detail in FIG. 4A2 produces a 3-D laser scanning volume as shown in FIG. 9C to produce Penta 1 Scanner. Each 3-D scanning volume contains a omnidirectional laser scanning pattern having four over-lapping focal zones which are formed by five laser scanning stations indicated as LS1, LS2, LS3, LS4 and LS5 in FIG. 4A1, arranged about a sixteen-facet holographic scanning disc 130. When combining a pair of such scanning platforms, a Penta 2 Scanner is produced that is capable of producing a double-sized scanning volume as shown in FIG. 9B. When combining three such scanning platforms, a Penta 3 Scanner is produced that is capable of producing a triple-sized scanning volume as shown in FIG. 9A. The scan pattern and scan speeds for such alternative embodiments of this omni-directional scanning subsystem of the present invention is shown in the specification table set forth in FIG. 8.

In general, each holographic laser scanning subsystem within these triple-disc scanners can be designed and constructed using the methods detailed in Applicant's copending application Ser. No. 08/949,915 filed Oct. 14, 1997; Ser. No. 08/854,832 filed May 12, 1997, now U.S. Pat. No. 6,085,978; Ser. No. 08/886,806 filed Apr. 22, 1997, now U.S. Pat. No. 5,984,185; Ser. No. 08/726,522 filed Oct. 7, 1996; and Ser. No. 08/573,949 filed Dec. 18, 1995, now abandoned; each incorporated herein by reference. The design parameters for each sixteen facet holographic scanning disc shown in FIG. 4A4, and the supporting subsystem used therewith, are set forth in the Table of FIG. 4A5. The design parameters set forth in the table of FIG. 4A5 are defined in detail in the above-referenced U.S. Patent Applications. The scanning pattern projected within the middle (third) focal plane of the holographic scanning subsystem by one of its scanning platforms is shown in FIG. 9A. The composite scanning pattern projected within the middle (third) focal/scanning plane of the triple-disc holographic scanning subsystem of FIG, 4A1 is shown in FIG. 9B.

Figure 5A:
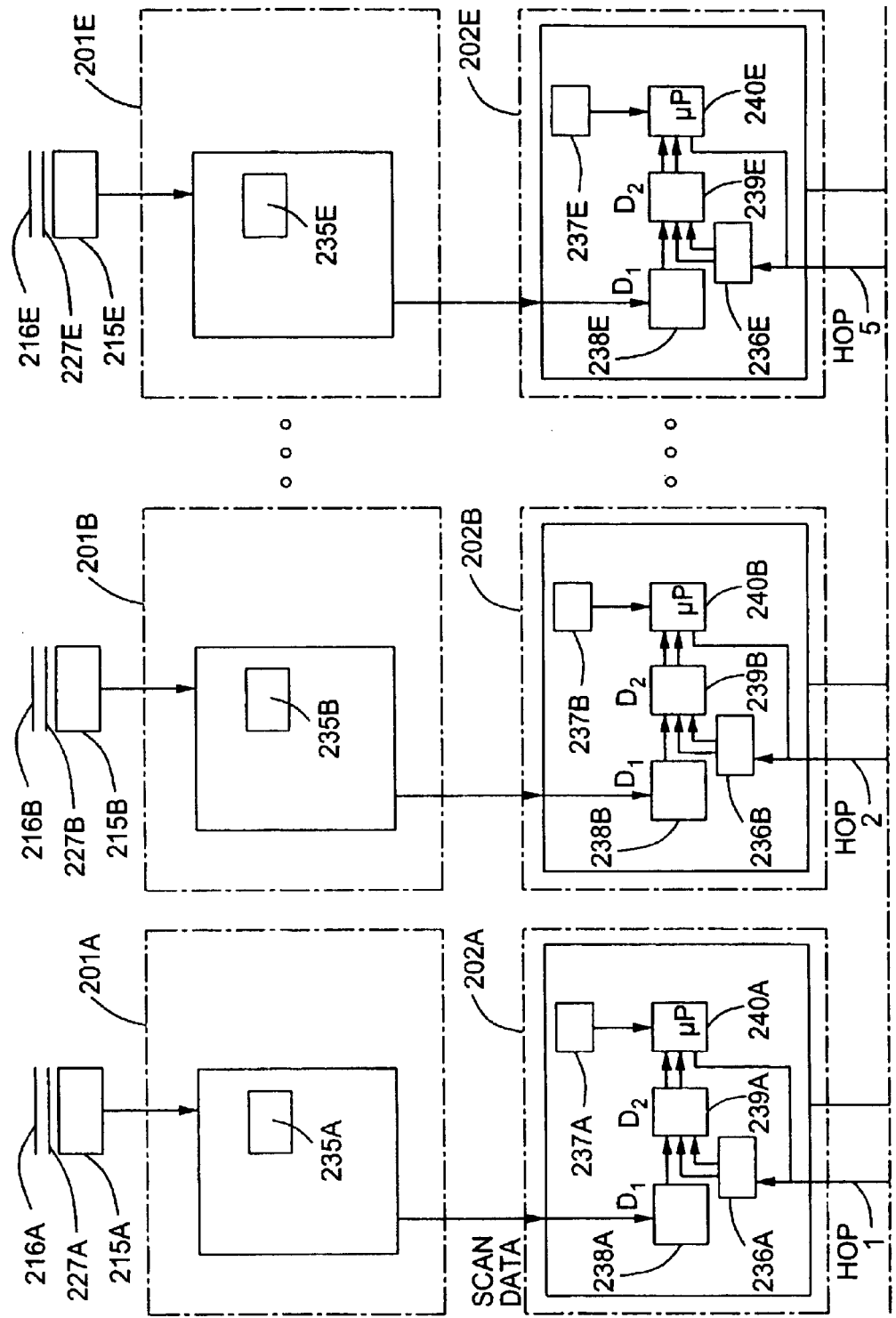
FIGS. 5A through 5C, taken together, set forth a schematic representation showing the subcomponents configured together on the analog signal processing boards, decode signal processing boards and within the subhousing of one of the (single-disc) holographic laser scanning subsystems contained within the unitary package identification and measurement system of the present invention.
Figure 5B:
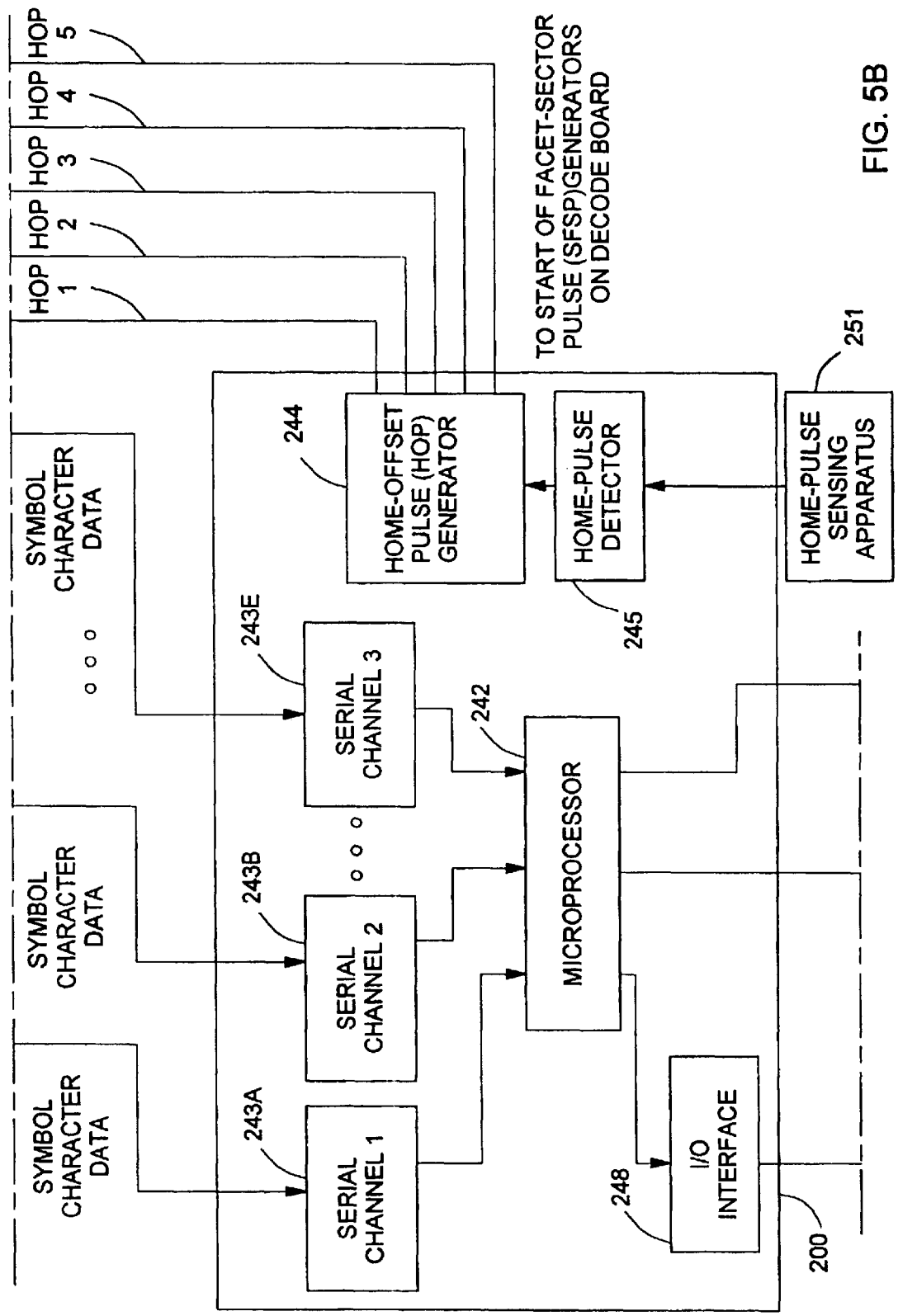
Figure 5C:
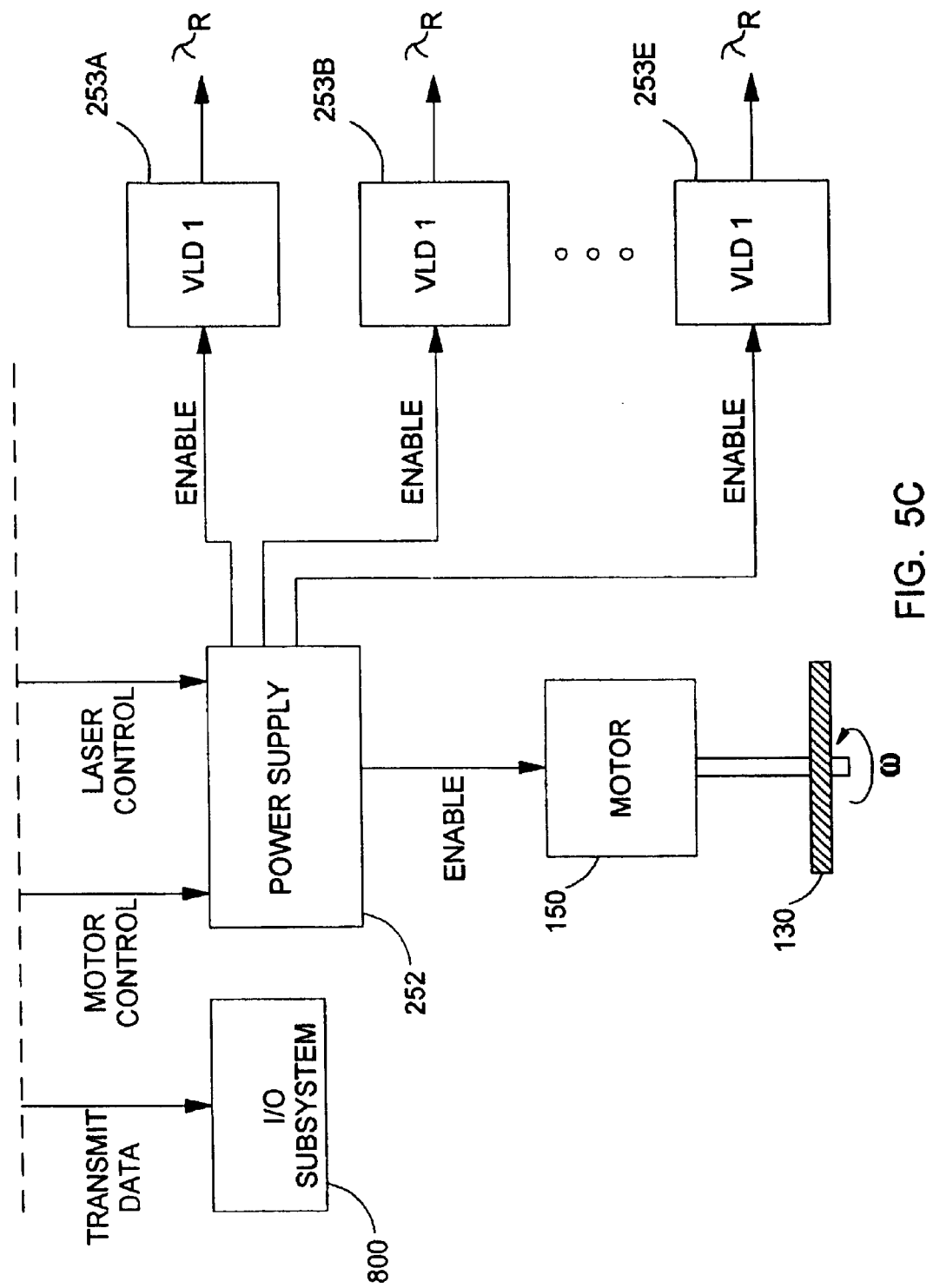
Figure 6A:
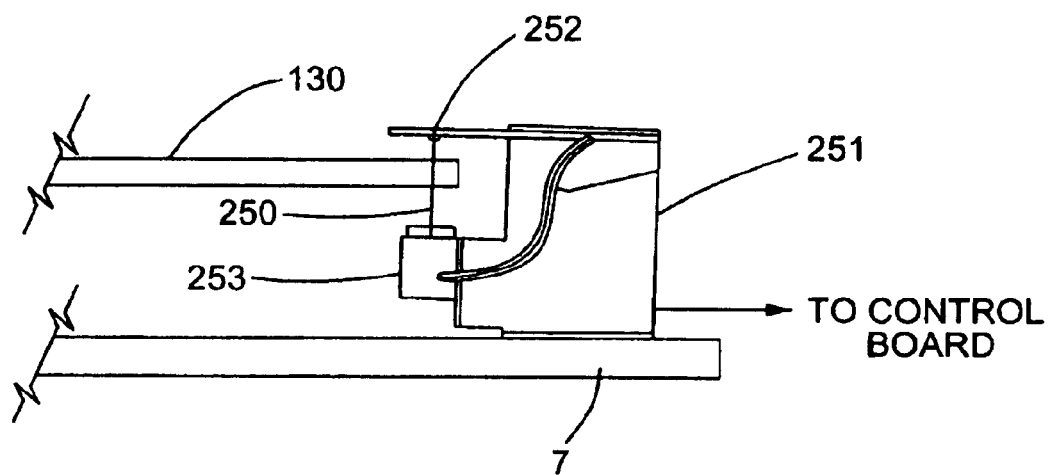
FIG. 6A is an elevated view of the home-pulse mark sensing module of the present invention deployed about each holographic scanning disc in the unitary package identification and measurement system of the first illustrative embodiment of the present invention.
Figure 6B:
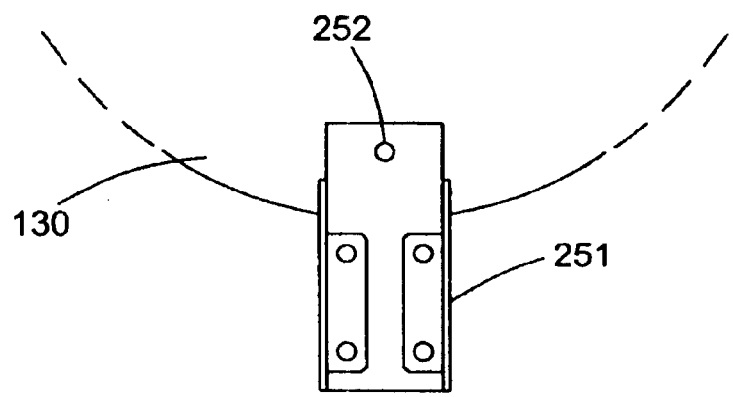
FIG. 6B is a plan view of the home pulse mark sensing module shown in FIG. 6A.
Figure 7A:
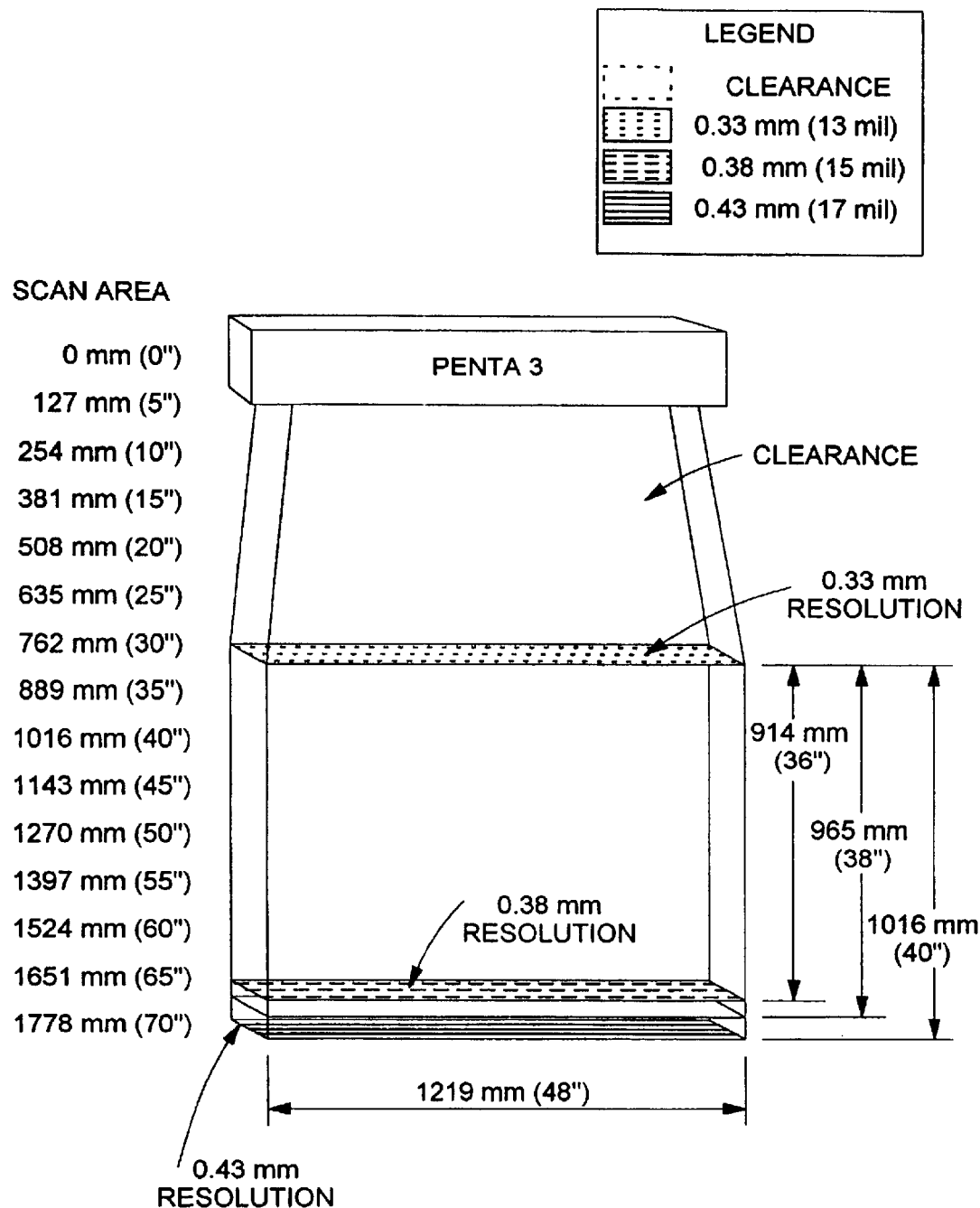
FIG. 7A is a schematic representation of the 3-D laser scanning volume produced from the triple-disc holographic laser scanning subsystem of FIG. 4A1 (indicated as "Penta 3"), indicating the physical dimensions of the 3-D scanning volume, as well as the minimum bar code element width resolutions that the subsystem can achieve over three identified subregions within the scanning volume.
Figure 7B:
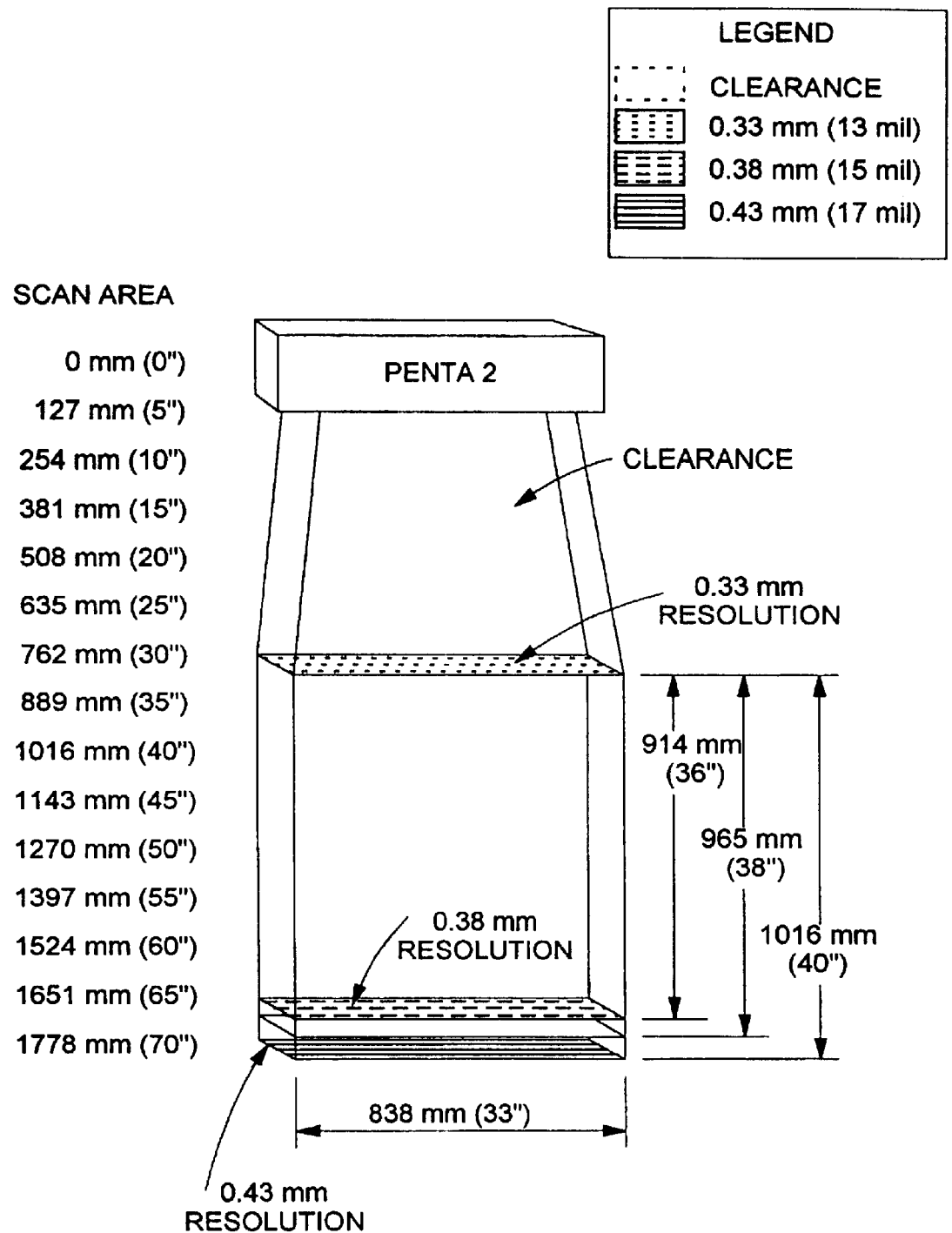
FIG. 7B is a schematic representation of the 3-D laser scanning volume produced from a double-disc embodiment of the holographic laser scanning subsystem of FIG. 4A1 (indicated as "Penta 2"), indicating the physical dimensions of the 3-D scanning volume, as well as the minimum bar code element width resolutions that the subsystem can achieve over three identified subregions within the scanning volume.
Figure 7C:
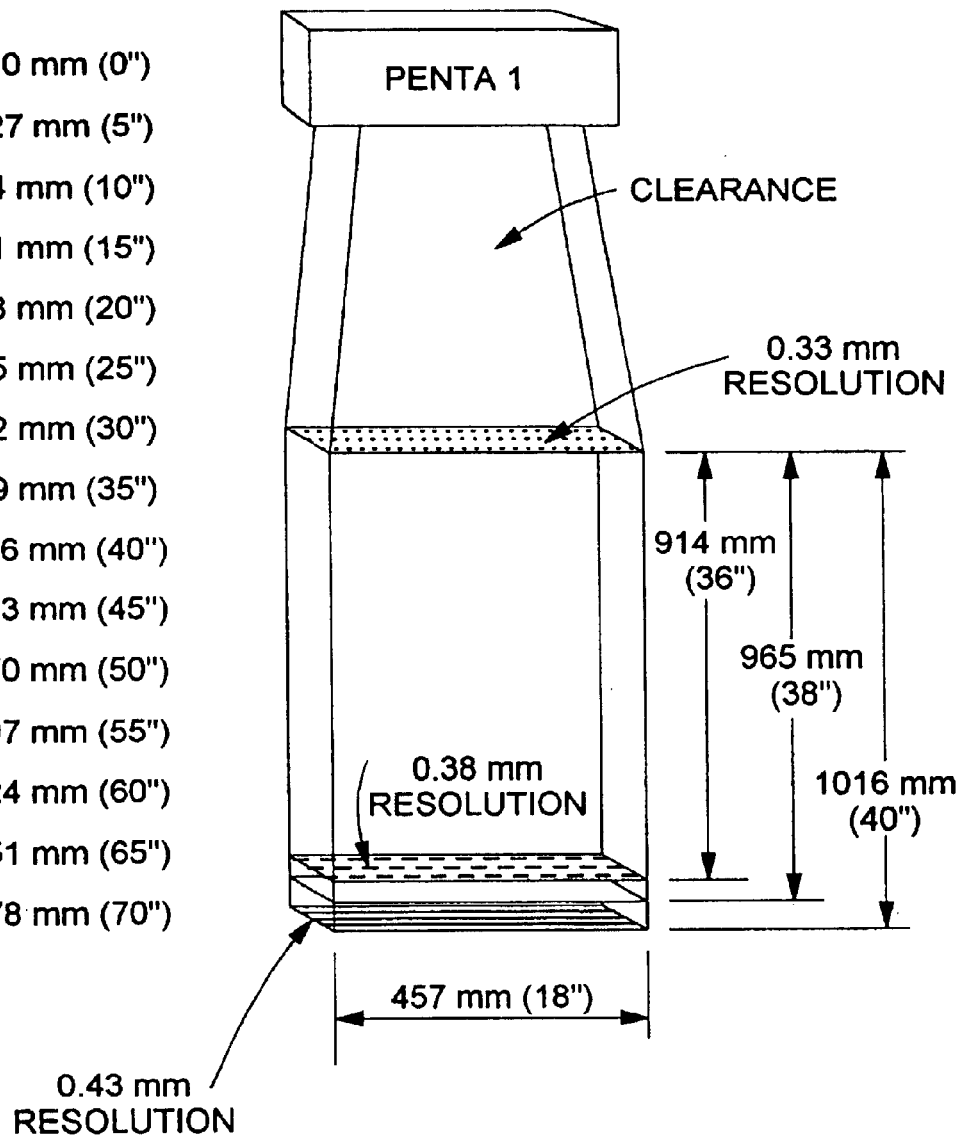
FIG. 7C is a schematic representation of the 3-D laser scanning volume produced from a single-disc embodiment of the holographic laser scanning subsystem of FIG. 4A1 (indicated as "Penta 1"), indicating the physical dimensions of the 3-D scanning volume, as well as the minimum bar code element width resolutions that the subsystem can achieve over three identified subregions within the scanning volume.

As shown in the system diagram of FIGS. 5A through 5C, each holographic laser scanning unit of the present invention 101 through 108 comprises a number of system components, many of which are realized on a control board 200, a plurality (e.g. six) analog signal processing boards 201A–201-F, and six digital signal processing boards 202A–202F.

As described in WIPO Patent Application Publication No. WO 98/22945, each holographic laser scanning unit 101 through 108 employed herein cyclically generates from its compact scanner housing 140 shown in FIG. 4A1, a complex three-dimensional laser scanning pattern within a well defined 3-D scanning volume which will be described in greater detail hereinbelow. In the system of the first illustrative embodiment, each such laser scanning pattern is generated by a rotating holographic scanning disc 130, about which are mounted five (5) independent laser scanning stations, sometimes referred to as laser scanning modules by Applicants. In FIG. 4A1, these laser scanning stations are indicated by LS1, LS2, LS3, LS4 and LS5.

In FIG. 4A2, one of the laser scanning stations in the holographic scanner is shown in greater detail. For illustration purposes, all subcomponents associated therewith shall be referenced with the character "A", whereas the subcomponents associated with the other four laser scanning stations shall be referenced using the characters B through E. As illustrated in FIG. 4A2, the beam folding mirror 142A associated with each laser scanning station, has a substantially planar reflective surface and is tangentially mounted adjacent to the holographic scanning disc 130. In the illustrative embodiment, beam folding mirror 142A is supported in this position relative to the housing base (i.e. the optical bench) 143 using support legs 115A and 145A and rear support bracket 146.

As shown in FIG. 4A2, the laser beam production module 147 associated with each laser scanning station is mounted on the optical bench (i.e. housing base plate 143), immediately beneath its associated beam folding mirror 142A. Depending on which embodiment of the laser beam production module is employed in the construction of the holographic laser scanner, the position of the laser beam production module may be different.

As shown in FIGS. 4A1, five laser production modules 142A through 142E are mounted on base plate 143, substantially but not exactly symmetrically about the axis of rotation of the shaft of electric motor 150. During laser scanning operations, these laser beam production modules produce six independent laser beams which are directed through the edge of the holographic disc 130 at an angle of incidence $A_i$, which, owing to the symmetry of the laser scanning pattern of the illustrative embodiment, is the same for each laser scanning station (i.e. $A_i$=43.0 degrees for all values of i). The incident laser beams produced from the six laser beam production modules 142A through 142E extend along the five central reference planes each extending normal to the plane of base plate 143 and arranged about 72 degrees apart from its adjacent neighboring central planes, as best illustrated in FIG. 4A2. While these central reference planes are not real (i.e. are merely virtual), they are useful in describing the geometrical structure of each laser scanning station in the holographic laser scanner of the present invention.

As taught in WIPO Publication No. WO 98/22945, careful analysis must be accorded to the light diffraction efficiency of the holographic facets on the scanning disc and to the polarization state(s) of collected and focused light rays being transmitted therethrough for detection. As will become more apparent hereinafter, the purpose of such light diffraction efficiency analysis ensures the realization of two important conditions, namely: (i) that substantially all of the incoming light rays reflected off an object (e.g. bar code symbol) and passing through the holographic facet (producing the corresponding instant scanning beam) are collected by the parabolic light collecting mirror; and (ii) that all of the light rays collected by the parabolic light collecting mirror are focused through the same holographic facet onto the photodetector associated with the station, with minimal loss associated with light diffraction and refractive scattering within the holographic facet. A detailed procedure is described in WIPO Patent Application Publication No. WO 98/22945 for designing and installing the parabolic light collecting mirror in order to satisfy the critical operating conditions above.

In the first illustrative embodiment of the package identification and processing system, the five digital scan data signal processing boards 202A through 202E are arranged in such a manner to receive and provide for processing the analog scan data signals produced from analog scan data signal processing boards 201A through 201E, respectively. As best shown in FIGS. 4A2 and 4A3, each digital scan data signal processing board is mounted vertically behind its respective beam folding mirror. A control board (i.e. motherboard) 200 is also mounted upon the base plate 143 for processing signals produced from the digital scan data signal processing hoards. A conventional power supply board 155 is also mounted upon the base plate 143, within one of its extreme corners. The function of the digital scan data signal processing boards, the central processing board, and the power supply board will be described in greater detail in connection with the functional system diagram of FIGS. 5A through 5C. As shown, electrical cables are used to conduct electrical signals from each analog scan data signal processing board to its associated digital scan data signal processing board, and from each digital scan data signal processing board to the central processing board. Regulated power supply voltages are provided to the central signal processing board 200 by way of an electrical harness (not shown), for distribution to the various electrical and electro-optical devices requiring electrical power within the holographic laser scanner. In a conventional manner, electrical power from a standard 120 Volt, 60 HZ, power supply is provided to the power supply board by way of flexible electrical wiring (not shown). Symbol character data produced from the central processing board 200 is transmitted to the I/O subsystem 800, over a serial data transmission cable connected to a serial output (i.e. standard RS232) communications jack installed through a wall in the scanner housing 140.

Many of the system components comprising each of the holographic laser scanning units 101 through 108 are realized on control board 200, the plurality (e.g. five) analog signal processing boards 201A through 201E, and the six digital signal processing boards 202A through 202E.

In the illustrative embodiment shown in FIG. 5A, each analog scan data signal processing board 201A through 201E has the following components mounted a: and photodetector 152A (through 152E) (e.g. a silicon photocell) for detection of analog scan data signals as described hereinabove; and analog signal processing circuit 235A (through 235E) for processing detected analog scan data signals.

In the illustrative embodiment, each photodetector 152A through 152E is realized as an optoelectronic device and each analog signal processing circuit 235A aboard the analog signal processing board (201A through 201E) is realized as an Application Specific Integrated Circuit (ASIC) chip. These chips are suitably mounted onto a small printed circuit (PC) board, along with electrical connectors which allow for interfacing with other boards within the scanner housing. With all of its components mounted thereon, each PC board is suitably fastened to the photodetector support frame 153, along its respective central reference frame, as shown in FIG. 4A2.

In a conventional manner, the optical scan data signal $D_o$ focused onto the photodetector 152A during laser scanning operations is produced by light rays of a particular polarization state (e.g. S polarization state) associated with a diffracted laser beam being scanned across a light reflective surface (e.g. the bars and spaces of a bar code symbol) and scattering thereoff. Typically, the polarization state distribution of the scattered light rays is altered when the scanned surface exhibits diffuse reflective characteristics. Thereafter, a portion of the scattered light rays are reflected along the same outgoing light ray paths toward the holographic facet which produced the scanned laser beam. These reflected light rays are collected by the scanning facet and ultimately focused onto the photodetector of the associated light detection subsystem by its parabolic light reflecting mirror 149A disposed beneath the scanning disc 130. The function of each photodetector 152A is to detect variations in the amplitude (i.e. intensity) of optical scan data signal $D_o$, and to produce in response thereto an electrical analog scan data signal $D_1$ which corresponds to such intensity variations. When a photodetector with suitable light sensitivity characteristics is used, the amplitude variations of electrical analog scan data signal $D_1$ will linearly correspond to the light reflection characteristics of the scanned surface (e.g. the scanned bar code symbol). The function of the analog signal processing circuitry is to band-pass filter and preamplify the electrical analog scan data signal DI, in order to improve the SNR of the output signal.

In the illustrative embodiment of FIG. 4A1, each digital scan data signal processing board 202A through 202E is constructed in substantially the same manner. On each of these signal processing boards, the following devices are provided: an analog-to-digital (A/D) conversion circuit 238A through 238E, as taught in copending U.S. application Ser. No. 09/243,078 filed Feb. 2, 1999 and Ser. No. 09/241, 930 filed Feb. 2, 1999, realizable as a first application specific integrated circuit (ASIC) chip; a programmable digitizing circuit 239A through 239E realized as a second ASIC chip; a start-of-facet-sector pulse (SOFSP) generator 236A through 236E realizable as a programmable IC chip, for generating SOFSPs relative to home-offset pulses (HOP) generated by a HOP generation circuit 244 on the control board 200, shown in FIG. 5B, and received by the SOFSP generator; an EPROM 237A through 237E for storing parameters and information represented in the tables of FIGS. 10B, 10D, 10E1 and 10E2; and a programmed decode computer 240A through 240E realizable as a microprocessor and associated program and data storage memory and system buses, for carrying out symbol decoding operations and recovery of SOFSPs from the digitizer circuit 239A in a synchronous, real-time manner as will be described in greater detail hereinafter. In the illustrative embodiment, the ASIC chips, the microprocessor, its associated memory and systems buses are all mounted on a single printed circuit (PC) board, using suitable electrical connectors, in a manner well known in the art.

The function of the A/D conversion circuit 238A is to perform a thresholding function on the second-derivative zero-crossing signal in order to convert the electrical analog scan data signal $D_1$ into a corresponding digital scan data signal $D_2$ having first and second (i.e. binary) signal levels which correspond to the bars and spaces of the bar code symbol being scanned. In practice, the digital scan data signal $D_2$ appears as a pulse-width modulated type signal as the first and second signal levels thereof vary in proportion to the width of bars and spaces in the scanned bar code symbol.

The function of the programmable digitizing circuit 239A of the present invention is two-fold: (1) to convert the digital scan data signal D2, associated with each scanned bar code symbol, into a corresponding sequence of digital words (i.e. a sequence of digital count values) $D_3$ representative of package identification (I.D.) data; and (2) to correlate time-based (or position-based) information about the facet sector on the scanning disc that generated the sequence digital count data (corresponding to a scanline or portion thereof) that was used to read the decoded bar code symbol on the package scanned in the scanning tunnel subsystem 100. Notably, in the digital word sequence D3, each digital word represents the time length duration of first or second signal level in the corresponding digital scan data signal $D_2$. Preferably, the digital count values are in a suitable digital format for use in carrying out various symbol decoding operations which, like the scanning pattern and volume of the present invention, will be determined primarily by the particular scanning application at hand. Reference is made to U.S. Pat. No. 5,343,027 to Knowles, incorporated herein by reference, as it provides technical details regarding the design and construction of microelectronic digitizing circuits suitable for use in each holographic laser scanning subsystem 101 through 116 in the system of the present invention.

In bar code symbol scanning applications, the each programmed decode computer 240A through 240E has two primary functions: (1) to receive each digital word sequence $D_3$ produced from its respective digitizing circuit 239A through 239E, and subject it to one or more bar code symbol decoding algorithms in order to determine which bar code symbol is indicated (i.e. represented) by the digital word sequence $D_3$, originally derived from corresponding scan data signal $D_1$ detected by the photodetector associated with the decode computer; and (2A) to generate a specification for the laser scanning beam (or plane-sector) that was used to collect the scan data underlying the decode bar code symbol, or alternatively, (2B) to generate a specification of the holographic scanning facet sector or segment that produced the collected scan data from which each laser-scanned bar code symbol is read.

In accordance with general convention, the first function of the programmed decode computer 240A hereof is to receive each digital word sequence $D_3$ produced from the digitizing circuit 239A, and subject it to one or more pattern recognition algorithms (e.g. character recognition algorithms) in order to determine which pattern is indicated by the digital word sequence $D_3$. In bar code symbol reading applications, in which scanned code symbols can be any one of a number of symbologies, a bar code symbol decoding algorithm with auto-discrimination capabilities can be used in a manner known in the art.

The second function of the programmed decode processor 240A through 240E is best described with reference to FIGS. 11C and 11D. In the illustrative embodiment hereof, each programmed decode computer 240A through 240E generates a specification for the laser scanning beam (or plane-sector) in terms of the minimum and maximum facet angles delimited by the facet sector involved in the scanning the decoded bar code symbol. Such minimum and maximum facet angles are indicated in the last column of the table shown in FIG. 11C. Alternatively, each programmed decode computer 240A through 240E could generate a specification of the holographic scanning facet sector or segment that produced the collected scan data from which each laser-scanned bar code symbol is read. In such a case, each programmed decode processor would generate for each decoded bar code symbol, the following items of information: the identification number of the laser scanning subsystem that produced the underlying scan data from which the bar code symbol was read; the identification number of the laser scanning station that produced the underlying scan data from which the bar code symbol was read; the facet number of the scanning facet on the scanning disc that produced the underlying scan data from which the bar code symbol was read; and the facet sector number of the scanning facet on the scanning disc that produced the underlying scan data from which the bar code symbol was read. Such information items could be generated using tables similar to those set forth in FIGS. 11C1 through 11C3, except that instead of reading out minimum and maximum facet angles (as provided in the rightmost column thereof), the facet sector (or segment) number could be read out, and assembled with the other items of information providing the specification of how the laser scanning beam in issue was generated from the holographic laser scanning subsystem. In either case, such information will enable the data management computer system 900 to compute a vector-based geometrical model of the laser scanning beam used to scan the read bar code symbol represented by the coordinated symbol character data.

As will be described in greater detail hereinafter, the geometrical model of the laser beam is produced in real-time aboard the data management computer system 900 using "3-D ray-tracing techniques" which trace the laser scanning beam from (1) its point of original on the holographic scanning disc, (2) to its point of reflection off the corresponding beam folding mirror, and (3) towards the focal point of the laser scanning beam determined by the focal length of the scanning facet involved in the production of the laser scanning beam. From the computed vector-based geometrical model of the laser scanning beam, the location of the decoded bar code symbol (i.e. when it was scanned by the laser scanning beam being geometrically modeled) can be specified (i.e. computed) in real-time relative to a local coordinate reference system symbolically embedded within the laser scanning subsystem.

As shown in FIG. 5B, the control board 200 comprises a number of components mounted on a small PC board, namely: a programmed microprocessor 242 with a system bus and associated program and data storage memory, for controlling the system operation of the holographic laser scanner and performing other auxiliary functions; first, second, third, forth and fifth serial data channels 243A through 243E, for receiving serial data input from the programmable decode computers 240A through 240E; an input/output (I/O) interface circuit 248 for interfacing with and transmitting symbol character data and other information to the I/O subsystem 800, and ultimately to the data management computer system 900; home pulse detector 245 realizable as the electronic circuit shown in FIG. 5C, for detecting the home pulse generated when the laser beam 250 from VLD 253 (in home pulse marking sensing module 251 shown in FIG. 5C) is directed through home-pulse gap 260 (between Facets Nos. 6 and 7) and sensed by photodetector 253; and a home-offset-pulse (HOP) generator 244 realized as an ASIC chip, for generating a set of five home-offset pulses (HOPs) in response to the detection of each home pulse by circuit 245. In the illustrative embodiment, each serial data channel 243A through 243E is realized as an RS232 port, although it is understood that other structures may be used to realize the function performed thereby. The programmed control computer 242 also produces motor control signals, and laser control signals during system operation. These control signals are received as input by a power supply circuit 252 realized on the power supply PC board. Other input signals to the power supply circuit 252 include a 900 Volt, 60 Hz line voltage signal from a standard power distribution circuit. On the basis of the received input signals, the power supply circuit produces as output, (1) laser source enable signals to drive VLDs 253A through 253E, respectively, and (2) a motor enable signal in order to drive the scanning disc motor 150 coupled to holographic scanning disc 130.

Figure 10:
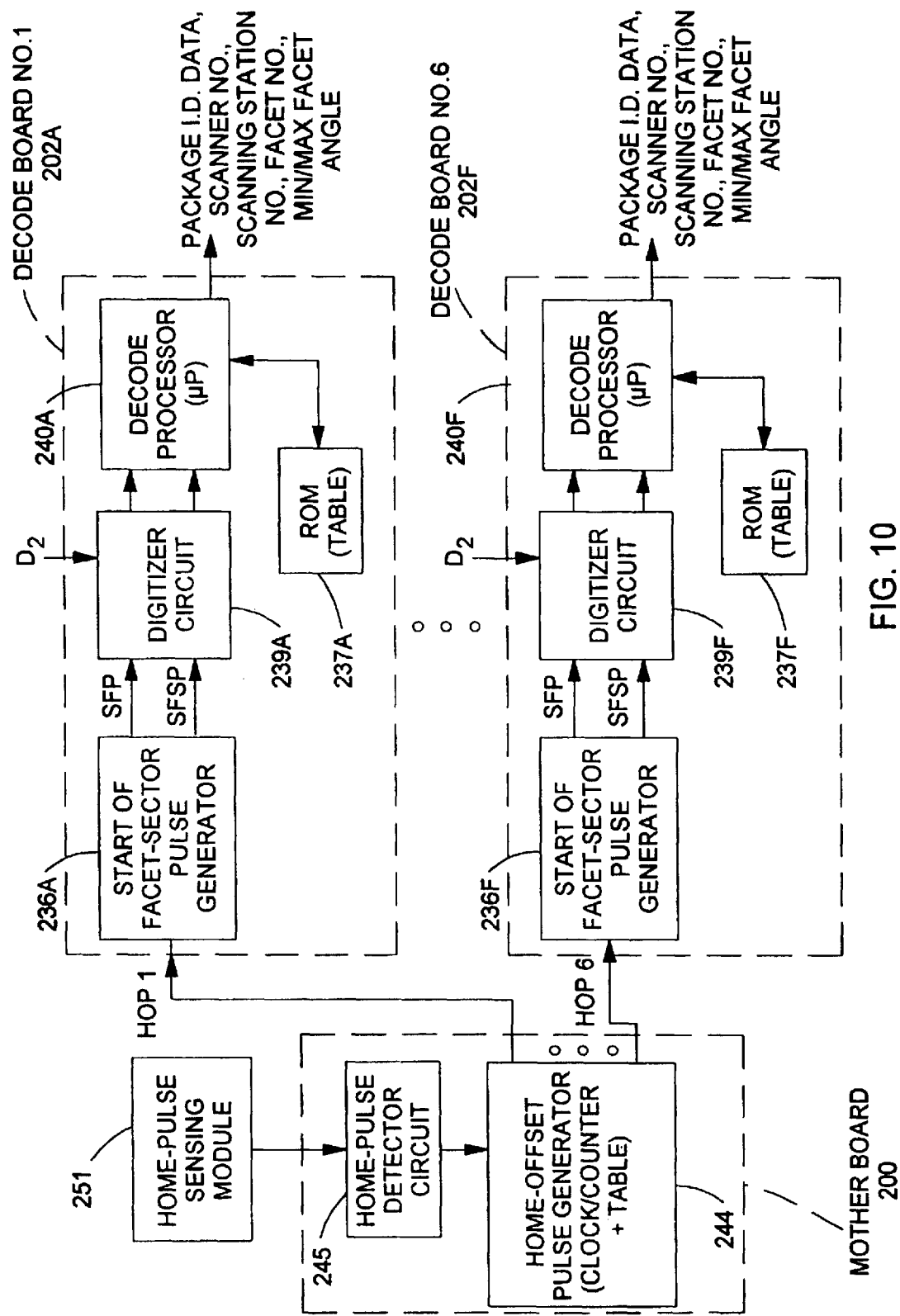
FIG. 10 is a schematic representation of the components on the control board and decode processing boards associated with holographic scanning disc employed within the unitary package identification and dimensioning system of FIG. 2A, showing the home-pulse detector and home-offset pulse (HOP) generator on the control board, and the start-of-facet-sector pulse (SOFSP) generator, digitizer circuitry, decode signal processor and ROM containing relative timing information about each SOFSP in relation to the HOP sent to the decode processing board from the control board of the present invention.
Figure 11B:
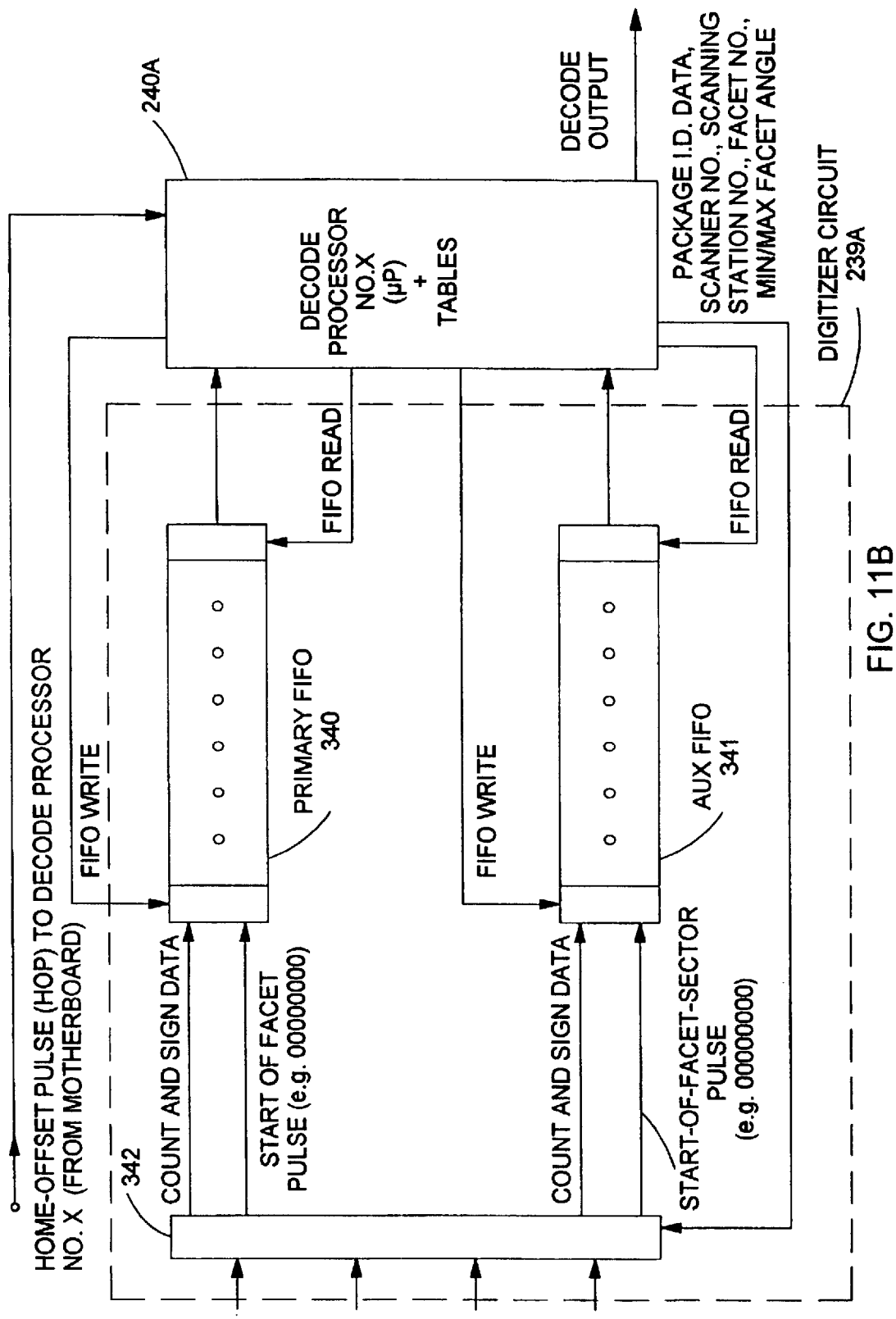
FIG. 11B is a schematic diagram showing in greater detail the digitizing circuit shown in FIG. 10.
Figure 11E:
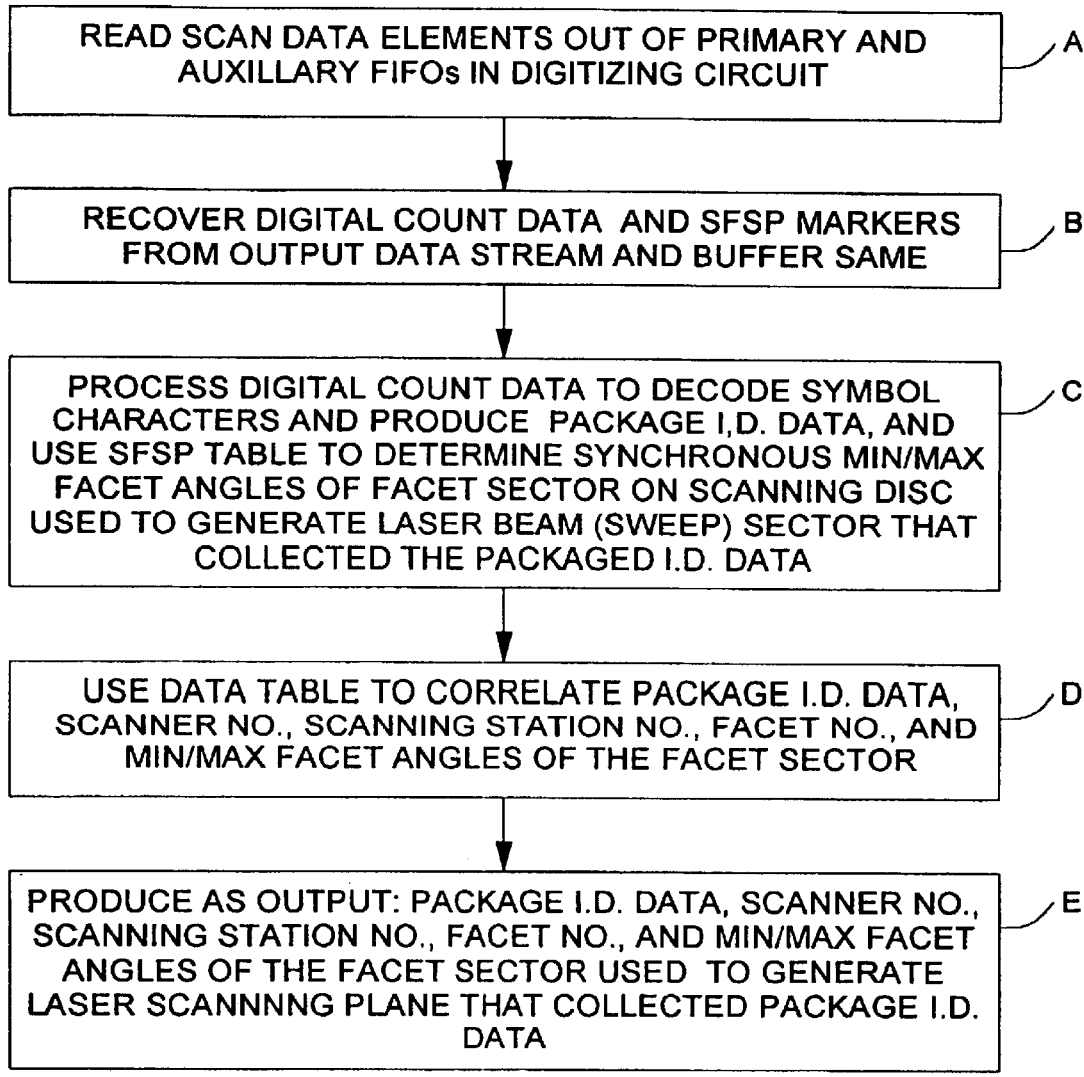
FIG. 11E is a high level flow chart describing the steps of the process carried out by the decode processor of the present invention shown in FIG. 11A2.

Method of Determining Laser Beam Position in Laser Scanning Subsystems Hereof Under Constant Scanning Motor Speed Conditions In FIGS. 10 through 11D, a first method is shown for (i) determining the position of the laser scanning beam produced by either the laser scanning subsystems shown in FIG. 4A1 and/or 4A2 when scanning motor speed is constant, and (ii) synchronously encoding facet section information with digital count data generated by the digitizer circuit on each decode board of such subsystems. In general, this method involves optically encoding the "home pulse mark/gap" along the edge of the holographic scanning disc, and upon detecting the same, generating home offset pulses (HOPs) which are used to automatically generate the start of each facet pulse (SOFPs), and the SOFPs in turn are used to automatically generate the start-of-facet-sector pulses (SOFSPs) aboard each decode board. The details of this process will be described hereinbelow.

Figure 10A:
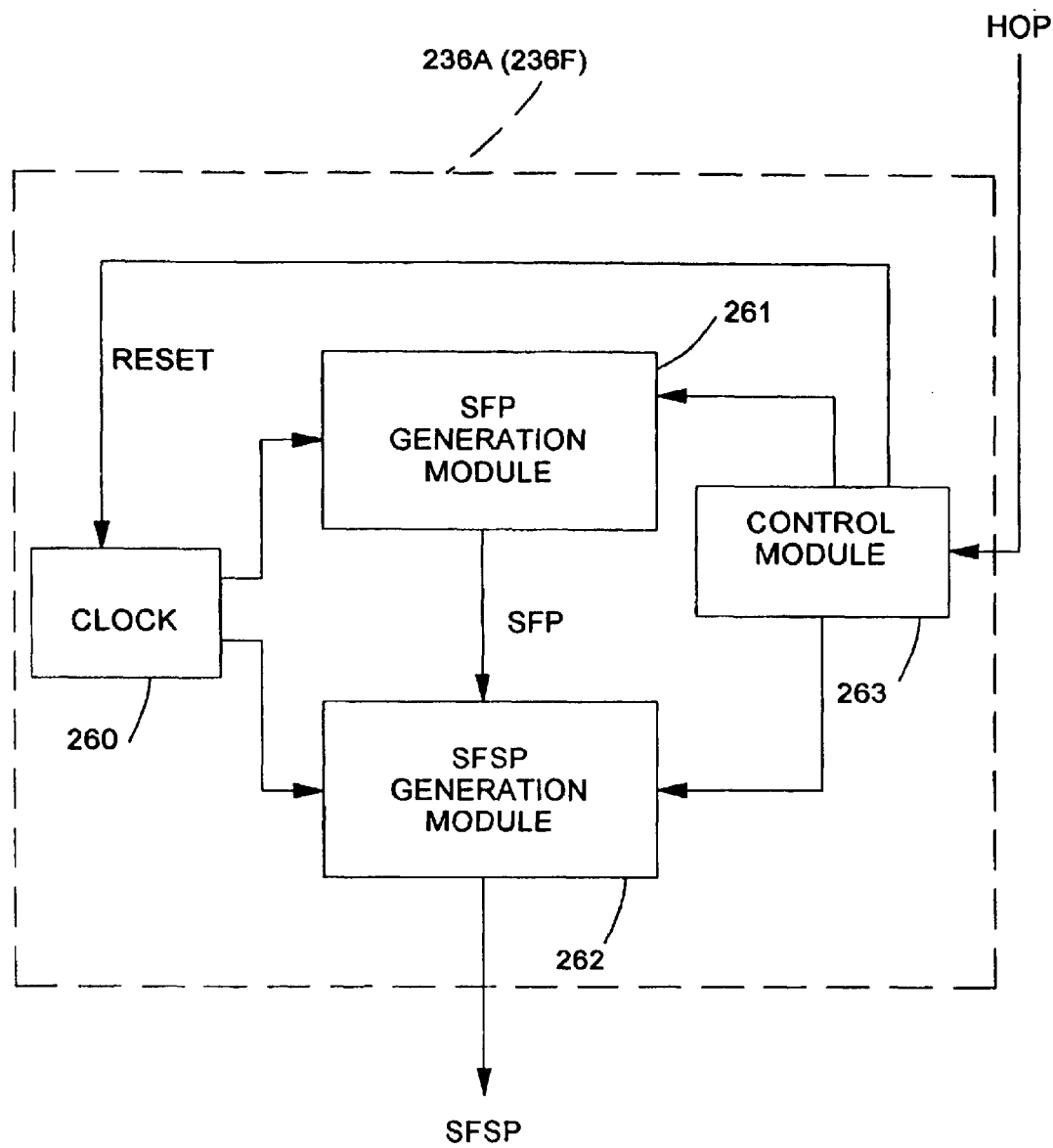
FIG. 10A is a schematic representation of the start-of-facet-sector pulse (SOFSP) generator employed on each decode board associated with a holographic laser scanning subsystem in the system of FIG. 2A.
Figure 10C:
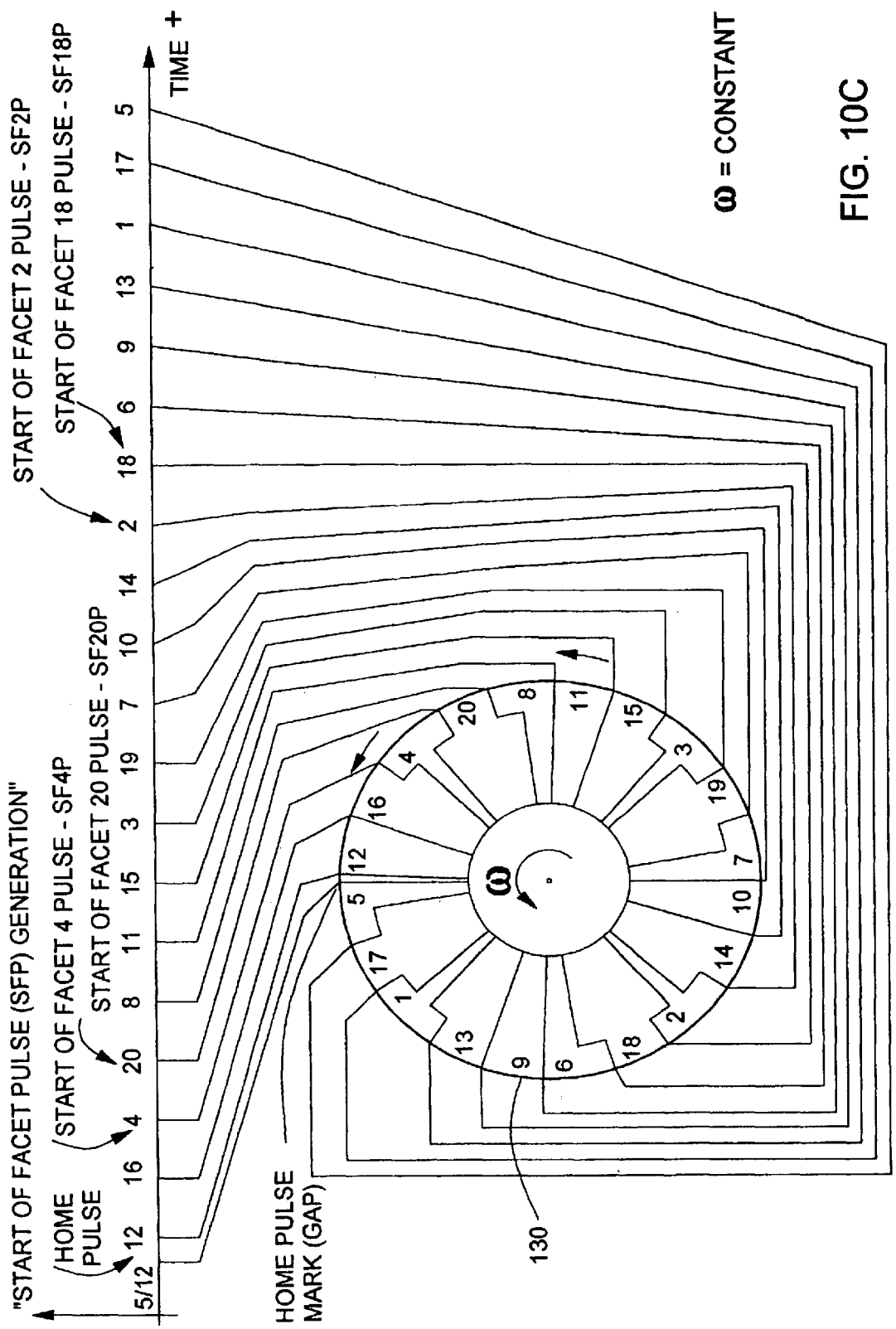
FIG. 10C is a schematic representation of the operation of the start-of-facet pulse (SOFP) generator employed within each SOFSP generator shown in FIG. 10A, wherein start of facet pulses are generated within the SOFP generator relative to the home-offset pulse (HOP) received from the HOP generator on the control board associated with each holographic scanning disc.
Figure 10F:
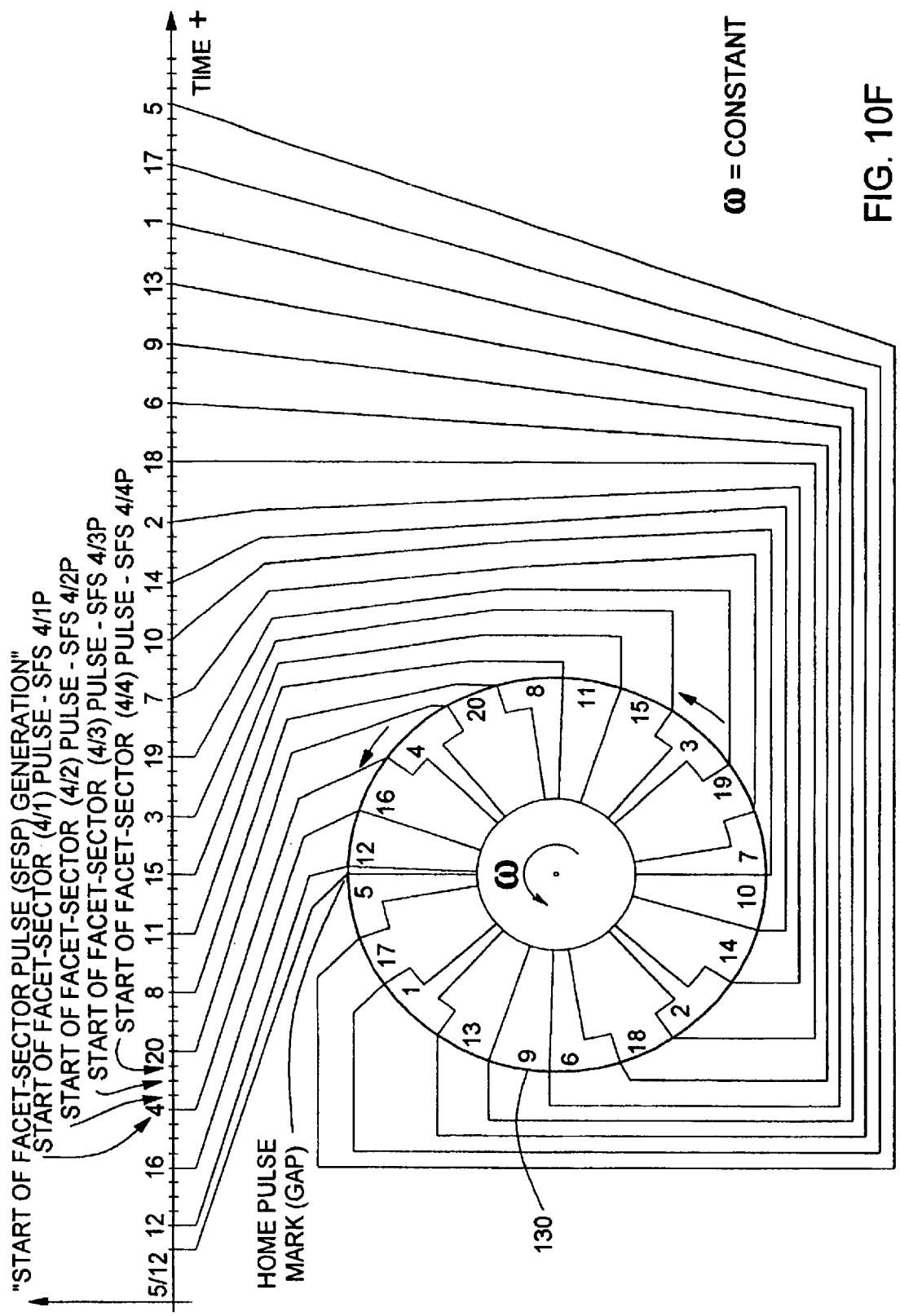
FIG. 10F is a schematic representation of the operation of the start-of-facet-sector pulse (SOFSP) generator of the present invention, wherein start of facet sector pulses (SOFSPs) are generated within the SOFSP generator relative to the home-offset pulse (HOP) received from the HOP generator on the control board associated with each holographic scanning disc.

Referring now to FIGS. 10 through 11D, it is noted that each home offset pulse produced from HOP generating circuit 244 is provided to the SOFSP generator 236A through 236F on the decode processing board. When the HOP pulse is received at the SOFSP generator 236A through 236F on a particular decode processing board, the home pulse gap on the scanning disc 130 is starting to pass through the laser beam directed therethrough at the scanning station associated with the decode signal processing board. As shown in FIGS. 10 through 11D, timing information stored in the tables shown in these figures is used by the SOFSP generator 236A to generate a set of SOFSPs in response to the received HOP pulse during each revolution of the scanning disc. This enables a digital number count (referenced from the HOP) to be generated and correlated along with the digital data counts produced within the digitizer circuit 239A in a synchronous manner. As shown in FIG. 10A, each SOFSP generator 236A through 236C1 comprises: a clock 260 for producing clock pulses (e.g. having a pulse duration of about 4 microseconds); a SOFP generation module 261 for generating SOFPs using the table of FIG. 10B in accordance with the process depicted in FIG. 10C; a SOFSP generation module 262 for generating SOFSPs using the table of FIG. 10D and production rules set forth in FIGS. 10E1 and 10E2, in accordance with the process depicted in FIG. 10F; and a control module 263 for controlling the SOFP generator 261 and the SOFSP generator 262, and resetting the clock 260 upon each detection of a new HOP from the HOP generator on the control board 200 associated with the holographic scanning unit.

As shown in FIG. 11, the digitizer circuit 239A of the present invention comprises a number of subcomponents. In particular a scan data input circuit 322 is provided for receiving digital scan data signal $D_2$. A clock input 132 is provided from an external fixed frequency source 313, e.g. a 40 MHz crystal, or another external clock 15 to produce a pulse train. The output of the clock input circuit 312 is provided to the clock divider circuitry 314. That circuit 314 includes dividers for successively dividing the frequency of the clock pulses by a factor of two to produce a plurality of clock frequencies, as will be described in detail later. This plurality of clock signals is provided to a clock multiplexer 136. As shown in FIG. 11, the 40 MHz clock input signal is also provided directly to the clock multiplexer 316. The clock multiplexer 136 selects the desired output frequencies for the device based upon control signals received from clock control circuitry in the programmable processor 240A and in associated circuitry. The output of the clock multiplexer 316 comprises an S clock signal which provides the basic timing for the digitizer circuit 239A, as well as the input to digital counters. The processing of the input (bar code) scan data $D_2$ is provided from signal processor 238A. The scanner input circuit 322 provides output signals which represent the detected bar code signal to be processed and are provided to the transition and sign detecting circuit 324. That circuit detects the transition from a bar to a space or from a space to a bar from the input signals provided thereto, and also determines whether the symbol occurring before the transition is a bar or a space. Thus, the transition and sign detector 324 provides a signal bearing the "sign: information (referred to as the "SIGN" signal) which is provided to multiplexer 342, and thus a primary first-in, first-out (FIFO) memory which serves as the input of programmable processor 240A. The transition and sign circuit 324 also provides a signal to the sequencing means 328 to commence operation of the sequencing circuit 328. The sequencing circuit 328 sequences the digitizer circuit through a predetermined number of steps which begin at the occurrence of each symbol transition and which will be described in detail later. Sequencing circuit 328 provides a FIFO write signal to the FIFO input of primary FIFO 340 and the auxiliary FIFO 341, at the proper time to enable it to accept data thereinto. The sequencing circuit 328 provides input signals to digitizing counting circuit 330 so that the starting and stopping of the counters, occurring with the detection of each transition, is properly sequenced. The counting circuit 330 also receives an input signal from the clock multiplexer 316 (S Clock). This signal runs the counters at the selected rate when they are enabled by the sequencing means 328. The clock multiplexer 316, the sequencer circuit 328 and the counting circuit 330 each supply signals to the interface circuit 333 which enables it to properly pass the digitized count data to the primary and auxiliary FIFOs 340 and 341, via multiplexer 342, as shown in FIGS. 11 and 11A. The clock multiplexer 316 is arranged to provide two banks of available frequencies for the device to use, namely, an upper and a lower bank. The selection of frequencies from the upper bank or the lower bank is determined by a frequency bank switching circuit 362. The frequency bank switching circuit 362 also provides an input to an array reset 38 which provides a signal to reset the clock divider 314 on command. The clock divider circuitry 314 also generates a TEST reset signal by inverting the array reset signal. The TEST reset signal resets the remainder of the circuit 239A. The command which initiates this reset condition is normally generated by a testing device (not shown) connected to device 239A and used to test it upon its fabrication.

As shown in FIGS. 11 and 11B, digital count data or a string of zeros (representative of correlated SOFP data or count values from the HOP) are written into the primary FIFO using multiplexer 342 and write enable signals generated by the sequencing circuit 238. The SOFP marker (i.e. string of zeros) is written over the data in the primary FIFO 340 whenever the SOFP count data is presented to the digitizer circuit. Also, digital count data or a string of zeros (representative of correlated SOFSP data or SFS count values from the HOP) are written into the auxiliary FIFO 341 using multiplexer 342 and write enable signals generated by the sequencing circuit 238. The SOFSP marker (i.e. string of zeros) is written over the data in the auxiliary FIFO 341 whenever the SOFP count data is presented to the digitizer circuit. With such a data encoding scheme, the decoder 240A is allowed to decode process the scan count data in the FIFOs, as well as determine which facet sector produced the laser scanning beam. The later function is carried out using the tables set forth in FIGS. 11B1 through 11C and the method described in the flow chart of FIG. 11D. As shown in FIG. 11A, the output of the 240A is a scan beam data element comprising the package ID data, the scanner number (SN), the laser scanning station number (SSN), facet number (FN) and minimum and maximum facet angles subtending the facet sector involved in generating the laser beam used to read the decoded bar code symbol representative of the package ID data. Additional details concerning the design and construction of digitizer circuit (239A) can be found in Applicant's U.S. Pat. No. 5,343,027 incorporated herein by reference in its entirety.

Laser Position Determination in Holographic Laser Scanners Under Varying Scanning Motor Speed Conditions In FIGS. 12A through 14B, a novel system and method is illustrated for (i) accurately determining the position of the laser scanning beam produced by either the laser scanning subsystems shown in FIG. 4A1 and/or 4A2 independent of whether or not the scanning motor speed can be maintained constant, and (ii) synchronously encoding facet section information with digital count data generated by the digitizer circuit on each decode board of such subsystems. In this embodiment of the present invention, a holographic scanning disc having a home pulse mark or gap 260 (260) as described hereinabove can be used to generate the required laser scanning pattern. Also, as shown in FIG. 4B1, each holographic scanning disc is provided with a home pulse sensing module 251 (251') and home pulse detection circuit 245 (245') as described in detail hereinabove. For purposes of illustration, this subsystem and method will be described below with reference to the laser scanning subsystem of FIG. 4A1, although the same remarks apply equally to the holographic scanning subsystem of FIG. 4B1, as well as the polygonal scanning subsystem of FIG. 4C1.

Figure 12A:
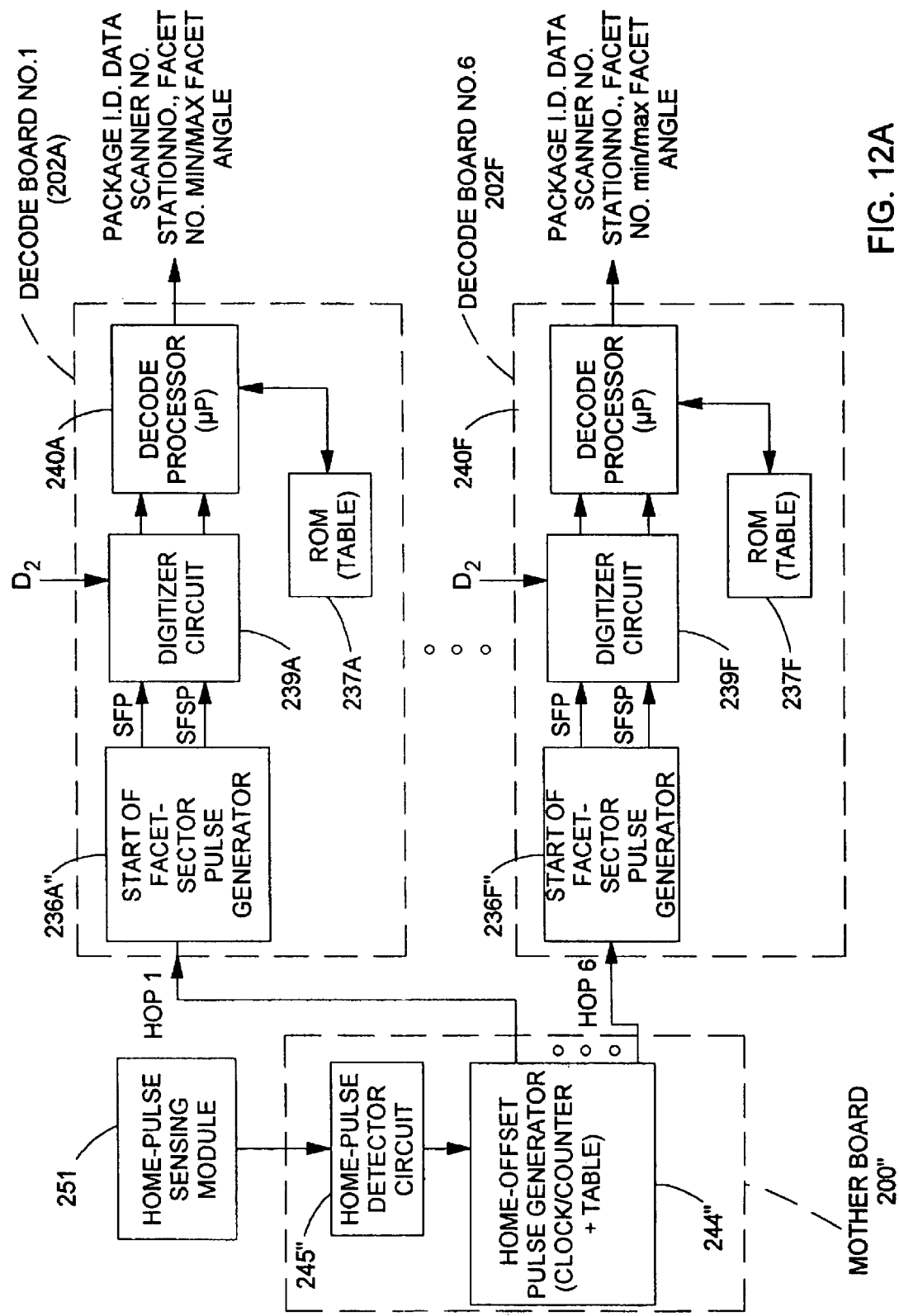
FIG. 12A is a schematic representation of the components on the control board and decode processing boards associated with a holographic scanning disc employed within an alternative embodiment of the holographic scanning subsystems in the unitary package identification and dimensioning system of the first illustrative embodiment of the present invention, showing the home-pulse detector and home-offset pulse (HOP) generator on the control board therewithin, and the start-of-facet-sector pulse (SOFSP) generator, digitizer circuitry, and decode signal processor.

As illustrated in FIG. 12A, each time the home pulse mark or gap on the scanning disc 130 passes the home pulse sensing module 251, a home pulse (HP) is automatically generated from the home pulse detection circuit 245. Each time a home pulse is generated from the home pulse detection circuit 245, a set of home offset pulses (HOPs) is sequentially produced from HOP generation circuit 244' in accordance with the process depicted in FIG. 14A. The number of HOPs produced in response to each detected HP is equal to the number of laser scanning stations (i.e. scanning modules), N, arranged about the laser scanning disc. Each generated HOP is provided to the SOFSP generator (236A' through 236F') on the decode processing board (202A' through 202F') associated with the HOP. When the HOP pulse is received at the SOFSP generator on its respective decode signal processing board, the home pulse mark or gap on the scanning disc 130 is then starting to pass through the laser beam directed therethrough at the laser scanning station associated with the decode signal processing board. During each revolution of the scanning disc, the SOFSP generation module 261' within each SOFSP generation circuit 236A' through 236F' generates a set of start of facet pulses (SOFPs) relative to the HOP, and also a set of start of facet sector pulses (SOFSPs) relative to each SOFSP. This enables a SOFP and a SOFSP (referenced from the HOP) to be generated by each SOFSP generation circuit 236A' through 236F' and provided to the digitizer circuit 239A through 239F so that the SOFP and SOFSP data can be correlated with the digital data counts produced within the digitizer circuits in a synchronous manner. Within the decode processor, SOFP and SOFSP data can be translated into laser beam position data expressed in terms of the minimum and maximum angles that delimit the facet sector producing the scan data from which the bar code symbol was decoded.

In the illustrative embodiment, the HOP generation circuit 244' is implemented using an 87C51 microcontroller. The microcontroller uses two inputs: the home-pulse detected signal from the home pulse detection signal 245" connected to an interrupt pin of the 87C51; and a "motor-stable" signal from the scanning motor controller. The microcontroller has as many outputs as there are laser scanning stations (i.e. scanning modules) in each laser scanning subsystem. Each output pin is dedicated to sending HOPs to a particular laser scanning station within the subsystem.

Figure 12B:
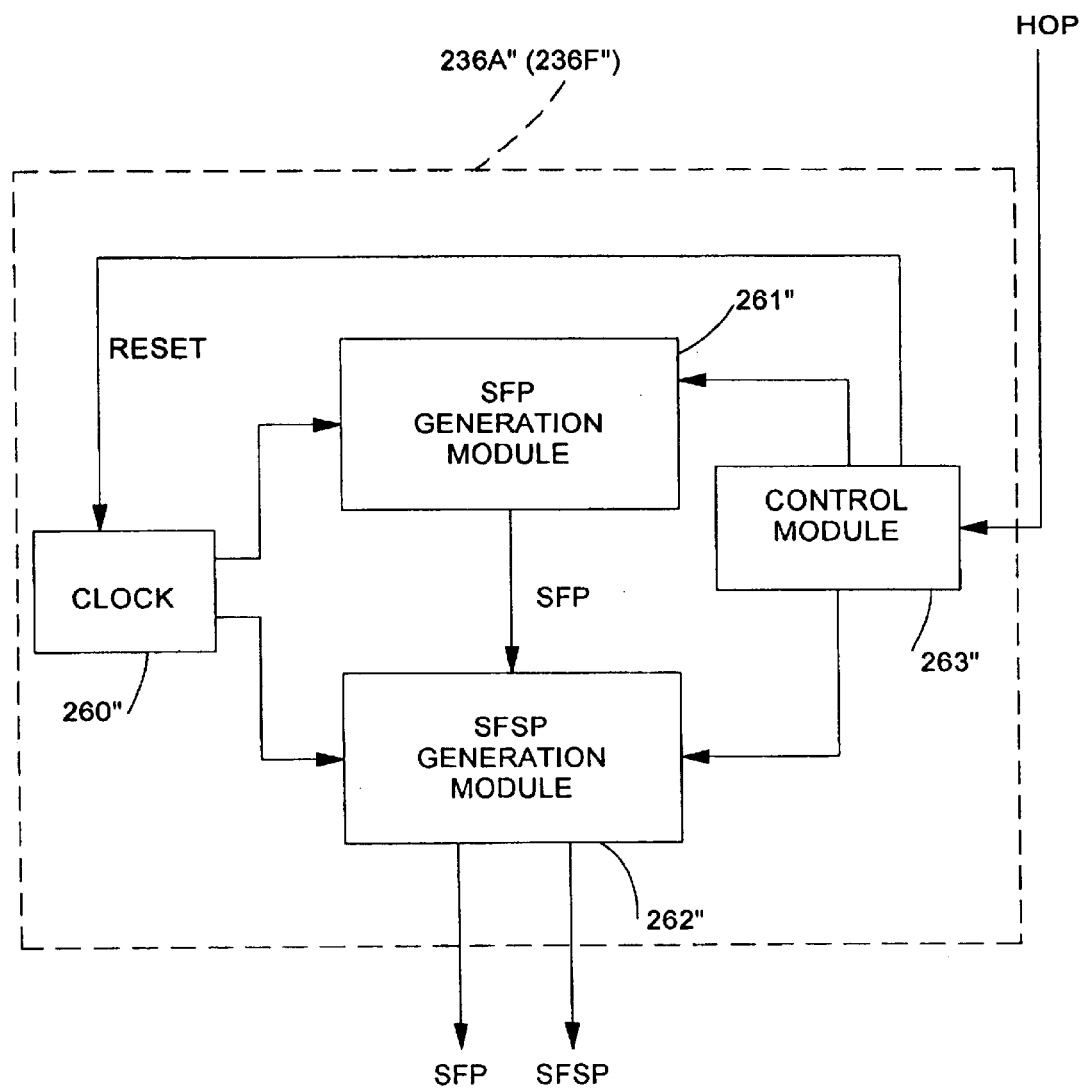
FIG. 12B is a schematic representation of the start-of-facet-sector pulse (SOFSP) generator employed on each decode board associated with the holographic laser scanning subsystem schematically depicted in FIG. 12A.
Figure 13B:
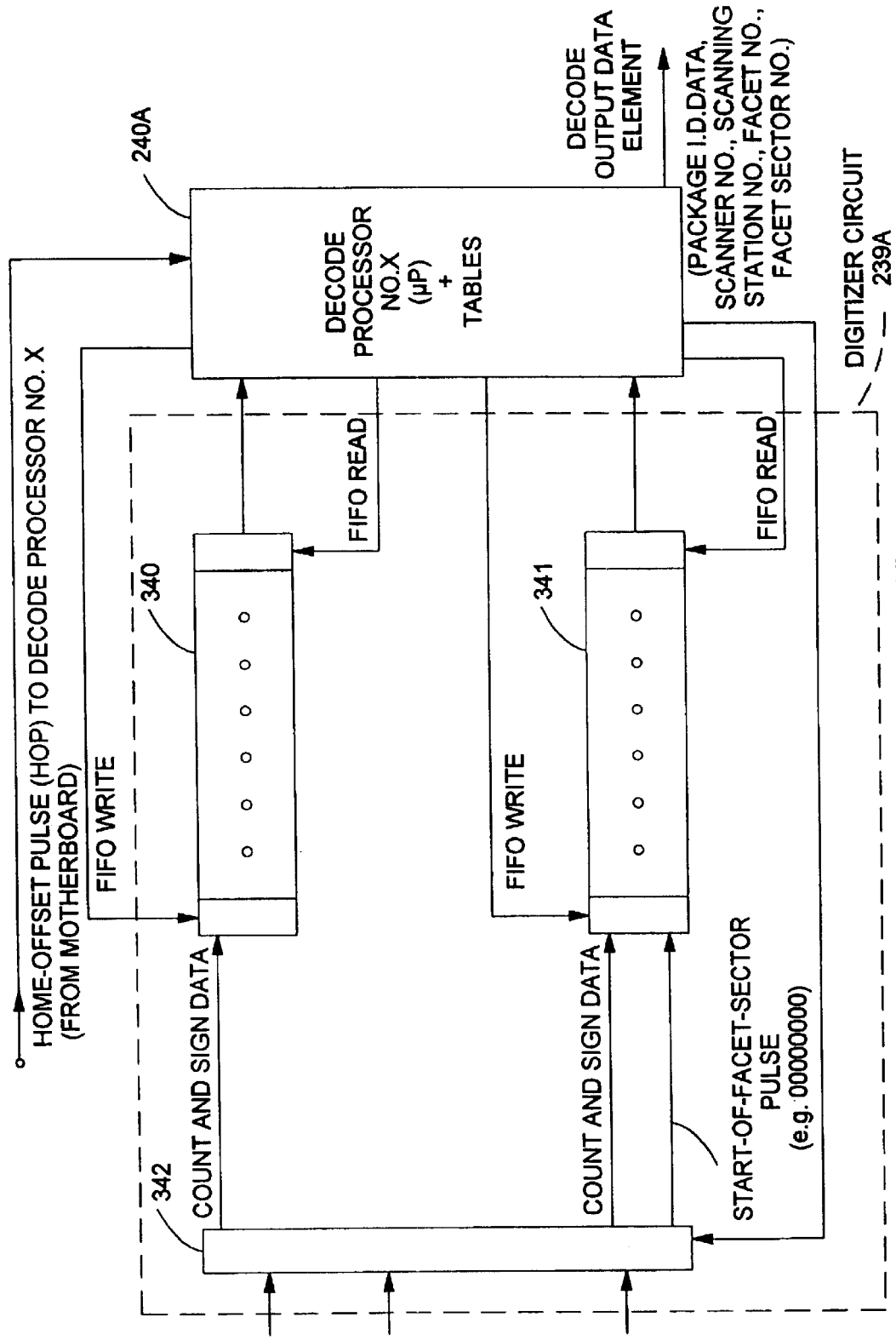
FIG. 13B is a schematic diagram showing the digitizing circuit of FIG. 13A in greater detail.

In general, each SOFSP generation circuit is realized as a programmed microprocessor. However, for purposes of understanding the SOFSP generation circuit, it will be helpful to schematically represent it as comprising a number of subcomponents, as shown in FIG. 12B. As shown therein, each SOFSP generator 236A" through 236C1" comprises: a clock 260" for producing clock pulses (e.g. having a pulse duration of about 4 microseconds); a SOFP generation module 261" for generating SOFPs in accordance with the process depicted in FIG. 14B; a SOFSP generation module 262" for generating SOFSPs in accordance with the process depicted in FIG. 14B; and a control module 263" for controlling the SOFP generator 261" and the SOFSP generator 262", and resetting the clock 260" upon each detection of a new HOP from the HOP generator 244" on the control board 200" associated with the holographic scanning unit.

In the illustrative embodiment, the SOFP/SOFSP generation circuit 236A" (through 236F") has been implemented using an programmed 87C52 microcontroller mounted on each decoding board associated with a particular scanning station. The HOP for the corresponding scanning station is received on an interrupt pin of the microcontroller. The microcontroller outputs three signals to the decode processor 240A (through 240F): (i) SOFPs; (ii) SOFSPs; and (iii) a signal processor adjustment signal which constitutes a level high (or low) when the facet that passes the scanning station's laser is a facet on a near (or far) focal plane.

The operation of the HOP generation circuit 244" and the SOFSP generation circuit 236A" (through 236F') will now be described within reference to the flow charts set forth in FIGS. 14A and 14B. In these flow charts described below, the following list of symbols are used:

$t_i$=timer value at start of home-pulse for the $i^{th}$ rotation of the disc;

$T_i$=time-period of the $(i-1)^{th}$ rotation of the disc;

$x^{Hj}$=angular value of the position of the laser of the $j^{th}$ scanning station (i.e. scanning module) of the system, relative to the previous scanning station (home-pulse laser for scanning station 1);

$x^{Fj}$=angular width of the $j^{th}$ facet of the disc;

$x^{Fjm}$=angular width of the $m^{th}$ sector (i.e. segment) of the $i_{th}$ facet of the disc;

$t_i^{Hj}$=time elapsed between the $j^{th}$ HOP and the $(j-1)^{th}$ HOP of the $i^{th}$ rotation of the disc;

$t_i^{Fj}$=time elapsed between the Start of Facet Pulse (SOFP) of facet j and facet j-1 of the $i^{th}$ rotation of the disc;

$t_i^{Fjm}$=time elapsed between the Start of Facet Segment Pulse (SOFSP) of sector m and sector m-1 of facet j of the $i^{th}$ rotation of the disc;

$t_i^n$=time at which the nth HOP/SOFP of the $i^{th}$ rotation of the disc is outputted; and $t_i^{pn}$=time at which the $p^{th}$ SOFSP of the $n^{th}$ facet of the $i^{th}$ rotation of the disc is outputted.

Each time the "start of home-pulse mark" is detected, the home-pulse pickup circuit 251 described hereinabove automatically produces a negative going output pulse which is provided to the HOP generation circuit 244", as shown in FIG. 12A. The HOP generation circuit 244' uses this negative going output pulse to calculate the times at which the home-pulse mark reaches the different modules (i.e. laser scanning stations) and, in response to such calculated times, to automatically generate and provided HOPs to the SOFSP generation circuit 236A' (through 236F'). The calculation is based on the important assumption that the motor speed for the $i^{th}$ rotation is very close to the motor speed for the $(i-1)^{th}$ rotation.

Figure 14A:
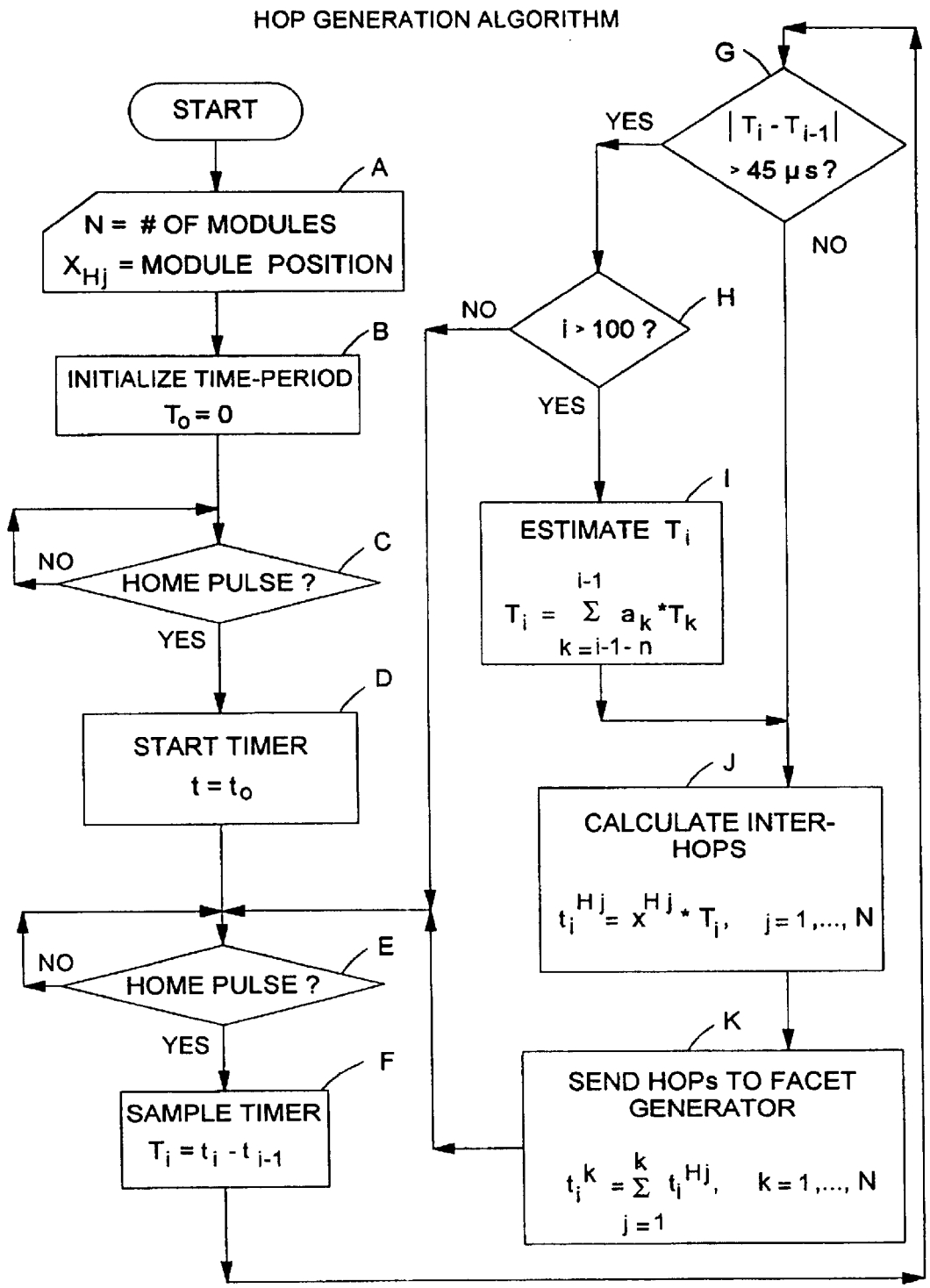
FIG. 14A is a flow chart describing the operation of the HOP generator on the control board associated with each holographic scanning disc, wherein home offset pulses (HOPs) are automatically generated from the HOP generator aboard the control board in each holographic laser scanning subsystem independent of the angular velocity of the holographic scanning disc employed therein.
Figure 14B:
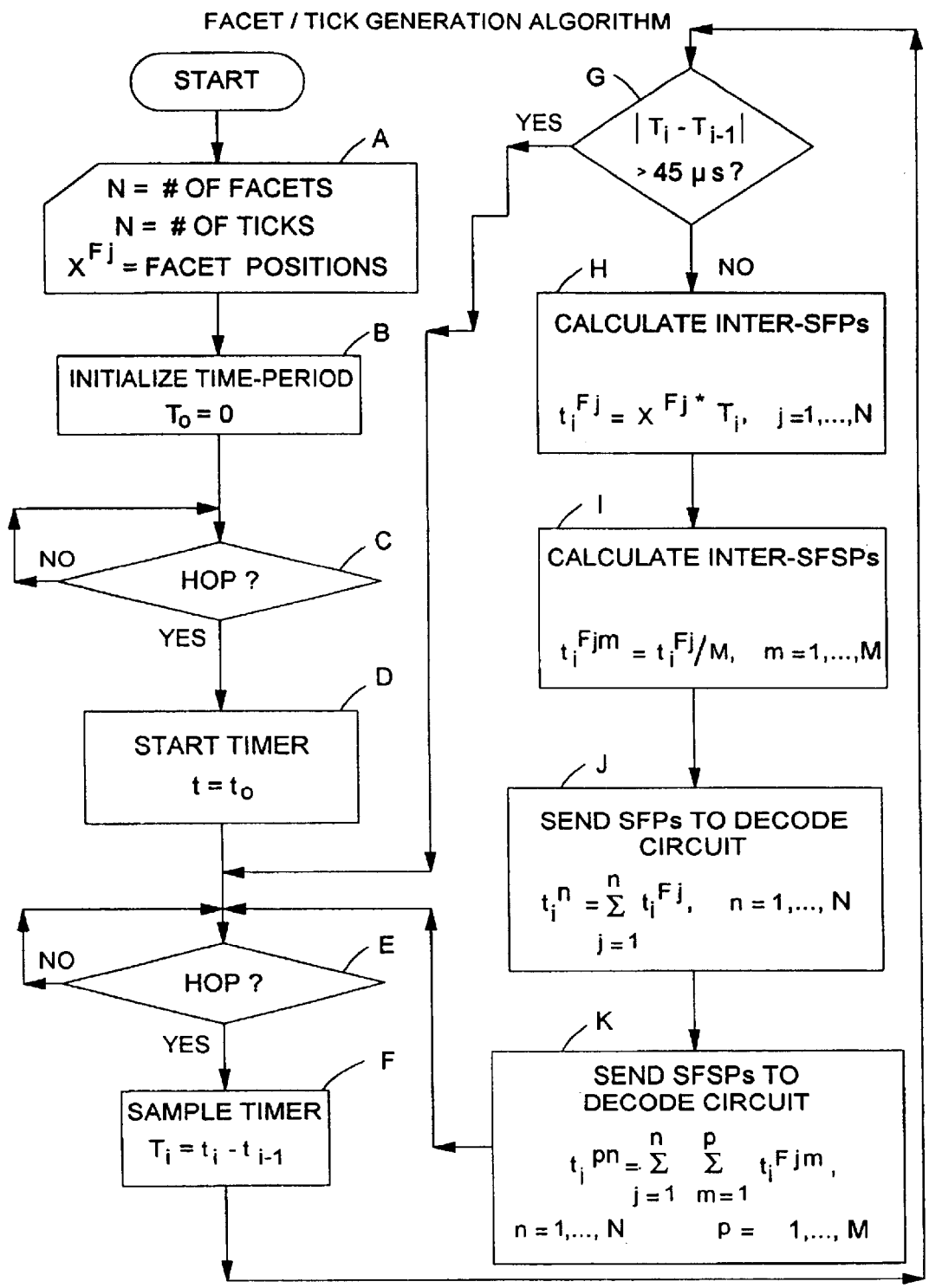
FIG. 14B is a flow chart describing the operation of the SOFSP generator aboard each decode board, wherein start of facet pulses (SOFPs) are automatically generated within the SOFP generation module relative to the home-offset pulse (HOP) received by the control module in the SOFSP generator independent of the angular velocity of the holographic scanning disc of the subsystem, and wherein start of facet sector pulses (SOFSPs) are automatically generated within the SOFSP generation module relative to SOFPs generated by the SOFP generation module, independent of the angular velocity of the holographic scanning disc of the subsystem.

As indicated at Block A in FIG. 14A, the process within the SOFSP generation circuit 236A" defines N as the number of laser scanning stations (i.e. scanning modules) in the holographic scanner, and $x^{Hj}$ as the angular offset (i.e. position) of a laser scanning station from the home-pulse sensing module (i.e. pickup) 251. At Block B in FIG. 14A, the process involves initializing the time period or setting $T_0=0$. Then at Block C, the HOP generation circuit determines whether a home pulse (HP) has been detected at its input port. Until an HP is detected, the circuit remains at this control block. When an HP is detected, then at Block D the circuit starts the timer therewithin (i.e. $t=t_0$). Then at Block E, the circuit determines whether another HP has been detected. As shown, the circuit remains at this control block until the next HP is detected. When the HP is detected, then at Block F the circuit samples the timer. The time-period of rotation of the scanning disc is calculated from two consecutive home-pulse detections as follows:

$T_i=t_i-t_{i-1}$, where $T_i$ is the time-period for the $i^{th}$ rotation of the disc. Then at Block G, the circuit determines whether the time-period for the $i^{th}$ rotation is "close" to that for the $(i-1)^{th}$ rotation.

As indicated at Block G, a measure of "closeness" is defined as: $|T_i-T_{i-1}|<45$ uS. If the time measure is not close, i.e. $|T_i-T_{i-1}|>45$ uS, then if the time-period of rotation for the in and $(i-1)^{th}$ rotation does not satisfy, $|T_i-T_{i-1}|<45$ uS, the circuit checks at Block H to determine whether the scanning disc has rotated at least a 100 times (experimental value). If the scanning disc has not rotated at least a 100 times, then the circuit proceeds to Block E and waits for the next home-pulse and carries out the control process over again. Since it is critical to the performance of the scanner that every scan be associated with laser position information, the time-period has to be accurately predicted when for some reason the time-period between two consecutive rotations of the disc differs by more than 45 uS (experimental value). The assumption here is that the scanning motor speed cannot change suddenly between two rotations.

If the scanning disc has rotated at least a 100 times (i.e. i>100), then the circuit proceeds to Block 1 and estimates the time-period of the current rotation $T_i$ by using the time period data for the past n rotations of the disc, given by the following expression:

$$T_i = \sum_{k=i-1-n}^{i-1} a_k * T_k$$

Where the n coefficients $a_{1-j-n}$ through $a_{i-1}$ can be calculated beforehand (and offline) as follows:

If $T_i$ is the actual time-period of rotation i of the disc, at least squares estimate of the time-prod for rotation i+1 can be calculated by minimizing the function, $$E = \sum_{k=i-1-n}^{i-1} \left( T_k^* - \sum_{j=1}^{n} a_j T_{k-j}^* \right)^2$$

with respect to each $a_i$ (j=1, . . . ,n)

The final expressions for the minimized "optimal" values of the coefficients al are given by:

$$a_j = \left( \sum_k T_k^* T_{k-j}^* \right) \bigg/ \left( \sum_k \sum_j T_{k-j}^* \right)$$

A good value for n with reasonable computational complexity was found to be 5.

As indicated at Block J, the circuit then calculates the "inter-HOPS" $t_i^{Hj}$ which is the time taken by the home-pulse mark to reach to scanning station j from scanning station j−1. This measure is given by the expression: $t_i^{Hj}=x^{Hj}*T_i$, j=1, ... ,N Finally, at Block K, the circuit sends (i.e. transmits) HOPs to the SOFSP generation circuit of each laser scanning station (for the ith rotation) at each instant of time given by the expression:

$$t_i^k = \sum_{j=1}^{k} t_i^{Hj}, k = 1, \ldots, N$$

Thereafter, the control process returns to Block E as indicated in FIG. 14A. If at Block G. the time measure is "close" (i.e. $|T_i-T_{i-1}|<45$ uS), then the circuit proceeds directly to control Block J.

As described above, the HOP generation circuit 244" on the control board 200 accurately predicts when the home-pulse mark on the scanning disc arrives at each scanning station and sends out a negative going pulse to each laser scanning station. In contrast, the SOFP generation circuit 236A" uses the HOPs to calculate when each facet/facet sector passes the laser module in each laser scanning station. Notably, an important assumption here is that the scanning motor speed does not vary too much between two consecutive rotations of the scanning disc.

As indicated at Block A in FIG. 14A, the process within the SOFSP generation circuit 236A" defines the following parameters: N as the number of laser scanning stations (i.e. scanning modules) in the holographic scanner; M as the number of sectors (or "Ticks") on each facet of the scanning disc: $x^{Fj}$ as the angular width of facet j of the scanning disc; and $x^{Fjm}$ as the angular width of sector m of facet j of the scanning disc.

At Block B in FIG. 14A, the process involves initializing the time period or setting $T_0=0$. Then at Block C, the SOFSP generation circuit determines whether a home pulse (HP) has been detected at its input port. Until an HP is detected, the SOFSP generation circuit remains at this control block. When an HP is detected, then at Block D the SOFSP generation circuit starts the timer therewithin (i.e. $t=T_0$). Then at Block E, the SOFSP generation circuit determines whether another HP has been detected. As shown, the SOFSP generation circuit remains at this control block until the next HP is detected. When the HP is detected, then at Block F the SOFSP generation circuit samples the timer contained therewithin. The time-period of rotation of the scanning disc is calculated from two consecutive home-pulse detections as follows: $T_i=t_i-t_{i-1}$, where $T_i$ is the time-period for the $i^{th}$ rotation of the disc. Then at Block G, the SOFSP generation circuit determines whether the time-period for the $i^{th}$ rotation is "close" to that for the $(i-1)^{th}$ rotation.

As indicated at Block G, a measure of "closeness" is defined as: $|T_i-T_{i-1}|<45$ uS. If the time measure is not close, then the time-period of rotation for the $i^{th}$ and $(i-1)^{th}$ rotation does not satisfy, $|T_i-T_{i-1}|<45$ uS, and the SOFSP generation circuit returns to Block E, as indicated in FIG. 14B and looks for another HOP, without sending any SOFP/SOFSP.

If the time-period of rotation for the $i^{th}$ and $(i-1)^{th}$ rotation does satisfy, $|T_i-T_{i-1}|<45$ uS, then the SOFSP generation circuit proceeds to Block H where the time between start of facet pulses (SOFSs) for facets j−1 and j of the disc for the $i^{th}$ rotation is calculated using the expression:

$t_i^{Fj}=x^{Fj}*T_i, j=1, \ldots ,N$

Then at Block 1, the SOFSP generation circuit calculates the "inter-HOPs" which are defined as the time between start of sector pulses m−1 and m for facet j, corresponding to rotation i of the disc. Such inter-HOPs are calculated by the expression:

$t_i^{Fjm}=t_i^{fj}/M, m=1, \ldots ,M$

At Block J, the SOFP generation circuit sends out (to the decode processor) SOFPs at the times given by the expression:

$$t_i^n = \sum_{j=1}^{n} t_i^{Fj}, n = 1, \ldots, N$$

Likewise, the SOFSP generation circuit sends out (to the decode processor) SOFSPs at the times given by the expression:

$$t_i^{pn} = \sum_{j=1}^{n} \sum_{m=1}^{p} t_i^{Fjm}, n = 1, \ldots, N; p = 1, \ldots, M$$

Using the transmitted SOFPs/SOFSPs, correlated with bar code scan data at the digitizer circuit 239A (through 239F), the decode circuit 240A (240F) can then specify the laser beam position in terms of the minimum and maximum angle of the scanning facet sector that generated the bar code scan data that has been correlated therewith using the dual-FIFO digitizer circuit 240 of the present invention. Typically, calculations for each SOFP/SOFSP will be performed in a pipelined fashion since the total computation time far exceeds the time between any two SOFSPs. The laser beam position determination subsystem illustrated in FIGS. 12A through 14B and described hereinabove, has been built and tested in holographic tunnel scanning system employing holographic laser scanners having 5 laser scanning stations, scanning discs with 16 facets and 20 facet sectors/segments, and scanning motor speed variations within the range of between 4800 rpm and 5800 rpm. The system can handle small scanning-motor accelerations (and decelerations).

Notably, the above-described subsystem has limitations on the number of sectors (or segments) that each facet can be resolved into along the scanning disc. While a large number of sectors per facet will guarantee more accurate laser beam position information, the subsystem is limited by the computational time required to output each SOFSP. Average computational times for outputting SOFPs is found to be about 20 uS, and about 12 uS for SOFSPs.

Figure 15:
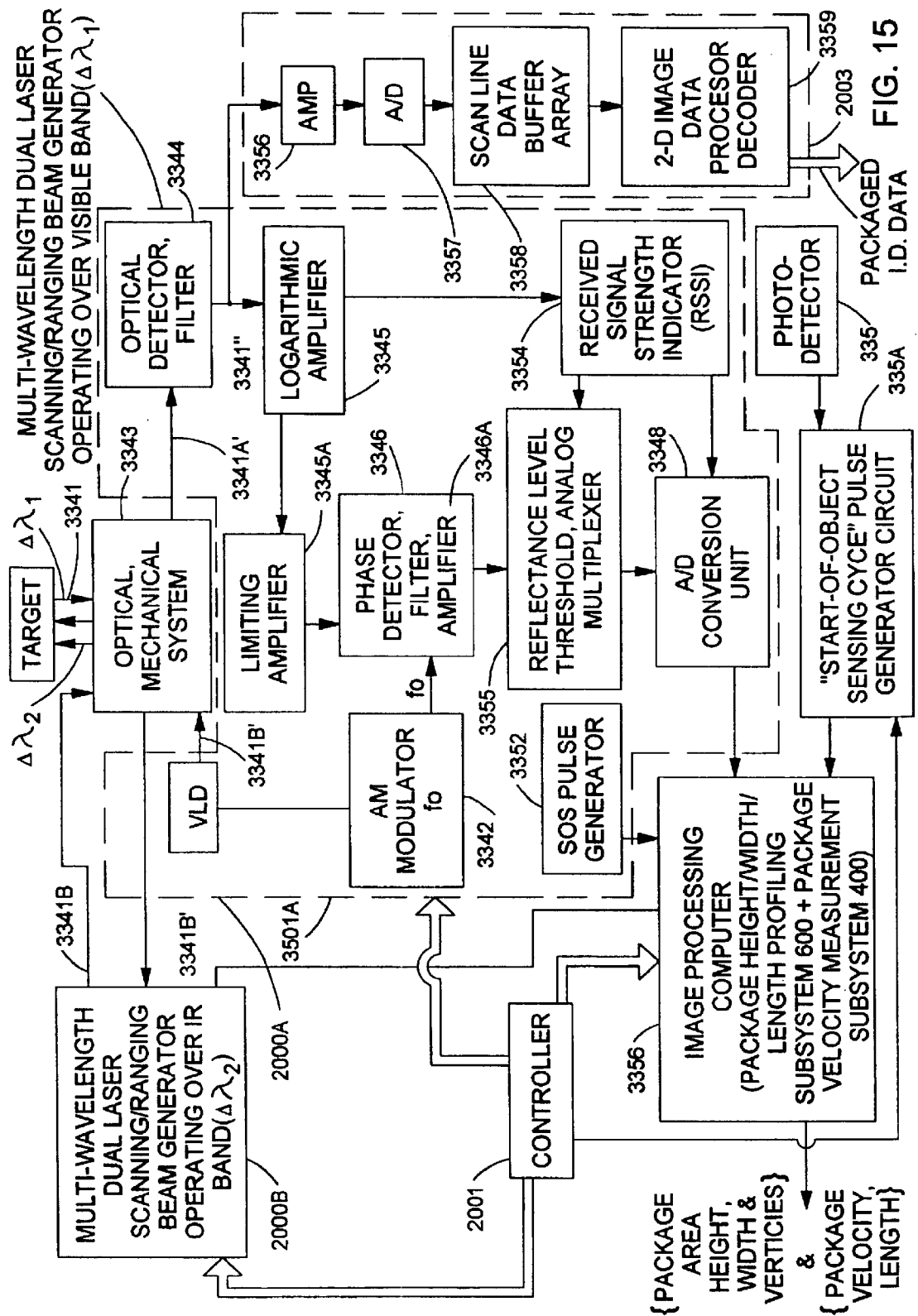
Figure 15A:
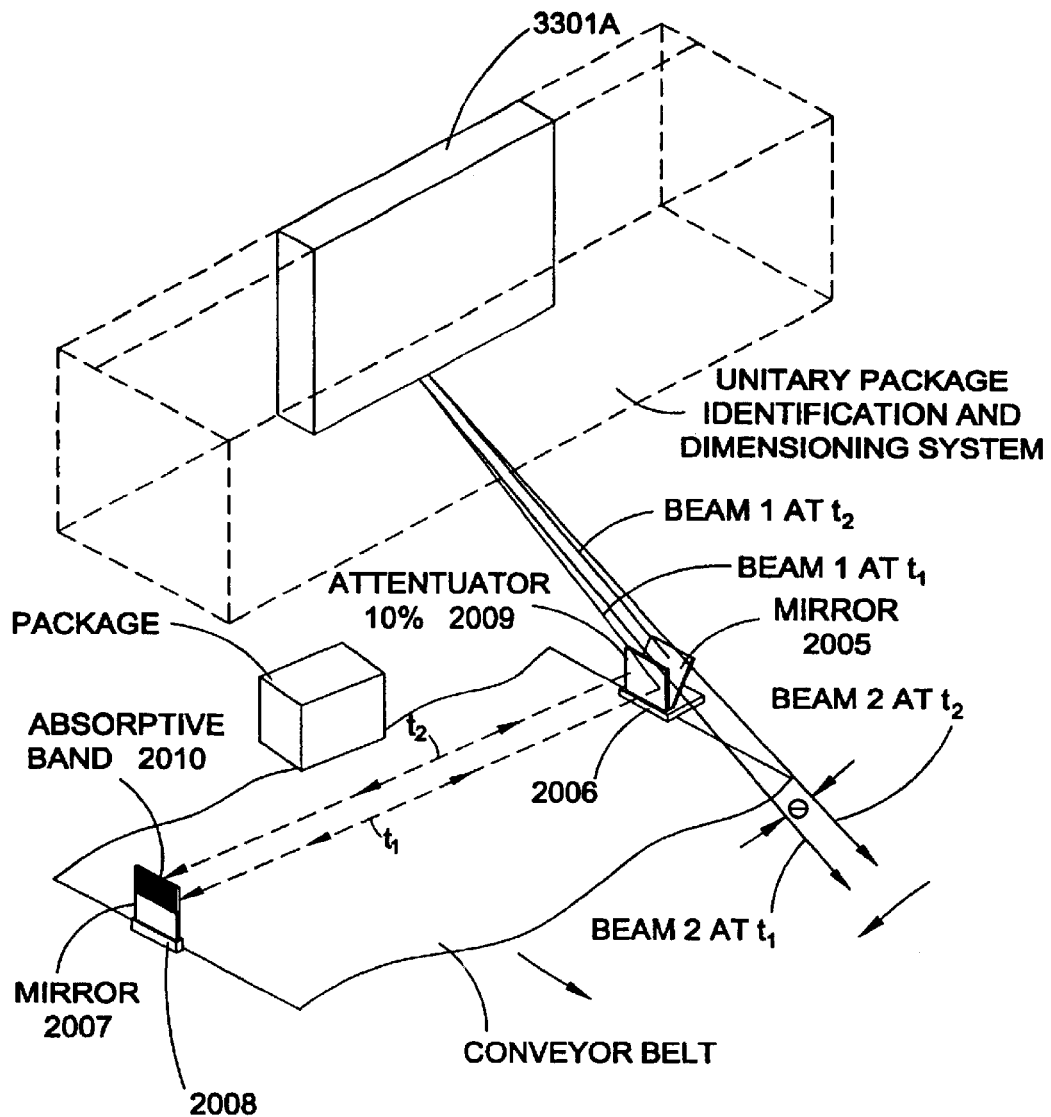
FIG. 15A is a schematic block diagram of the dual-beam/multi-wavelength LADAR-based imaging, detecting and dimensioning subsystem depicted in FIG. 15, and integrated within the housing of the unitary package identification and dimensioning system shown in FIGS. 1A and 2A.
Figure 15B:
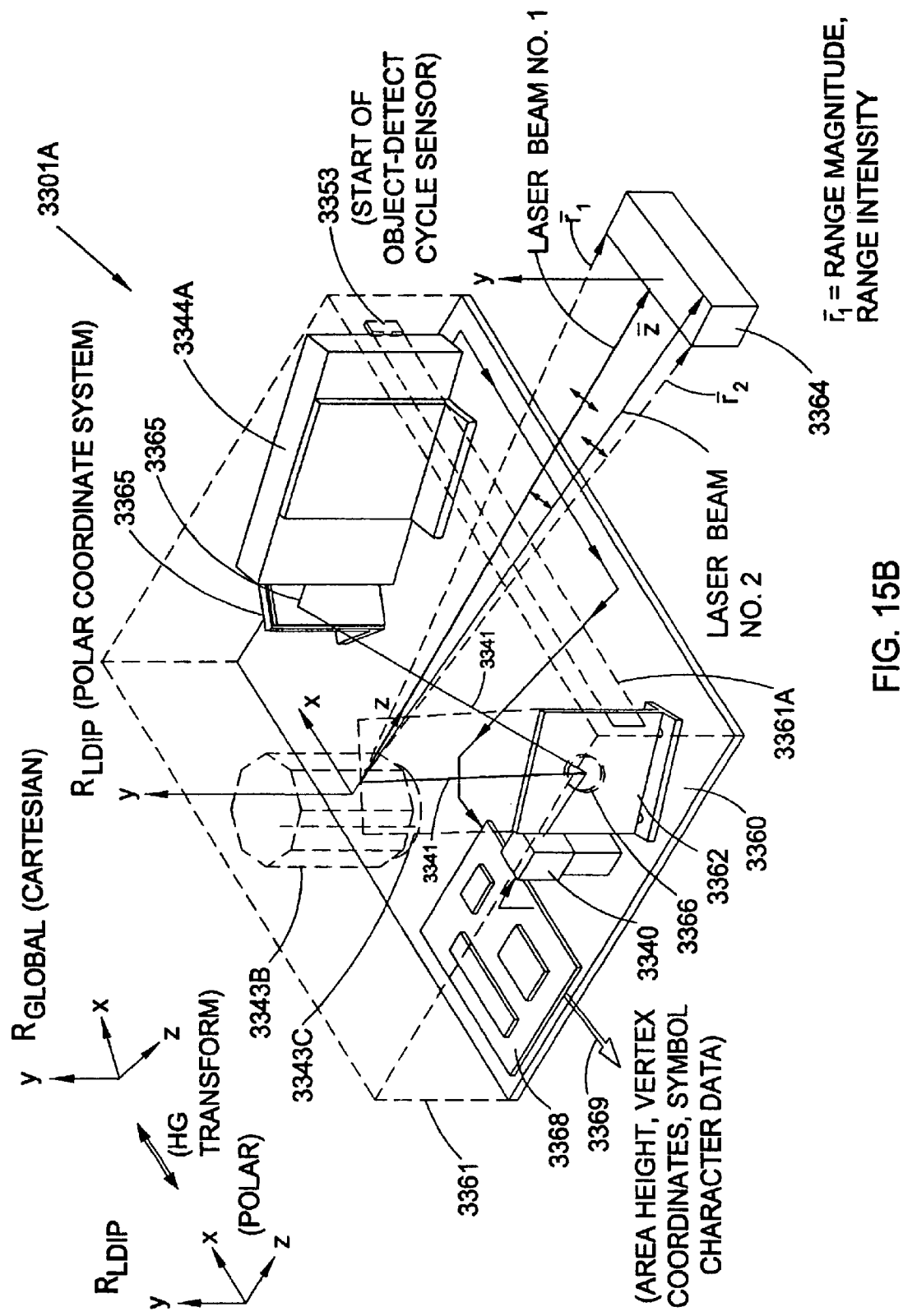
FIG. 15B is a schematic representation of a first illustrative embodiment of the dual-beam/multi-wavelength LADAR-based imaging, detecting and dimensioning subsystem of the present invention, having an eight-sided polygonal scanning element, mounted on an optical bench within the subsystem housing, for generating a pair of amplitude modulated laser beams (from a pair of laser beam production modules) which are projected along a pair of spaced-apart scanning planes through a light transmission aperture formed in the subsystem housing, a light collecting mirror mounted on the optical bench for collecting reflected laser light off a scanned object (e.g. package) and focusing the same to a focal point located on the surface of a stationary planar mirror mounted on the optical bench, and an avalanche-type photodetector mounted on the optical bench for detecting laser light focused onto the stationary planar mirror and producing an electrical signal corresponding thereto, signal processing circuitry for processing the produced electrical signal and generating raw digital range data representative of the distance from the polygonal scanning element to sampled points along the scanned object (as well digital scan data representative of any bar code symbol the scanned surface of the object), a programmed digital image data processor for preprocessing the raw digital range data and removing background information components, and for processing the preprocessed range data so as to extract therefrom information regarding the dimensions (e.g. area, height, length, width and vertices) of the scanned object and produce data representative thereof as well as the velocity of the dimensioned package, and a bar code symbol digitizing and decoding circuitry for processing the digital scan data signal and producing symbol character data representative of any bar code symbol located on the scanned surface of the object.
Figure 15C:
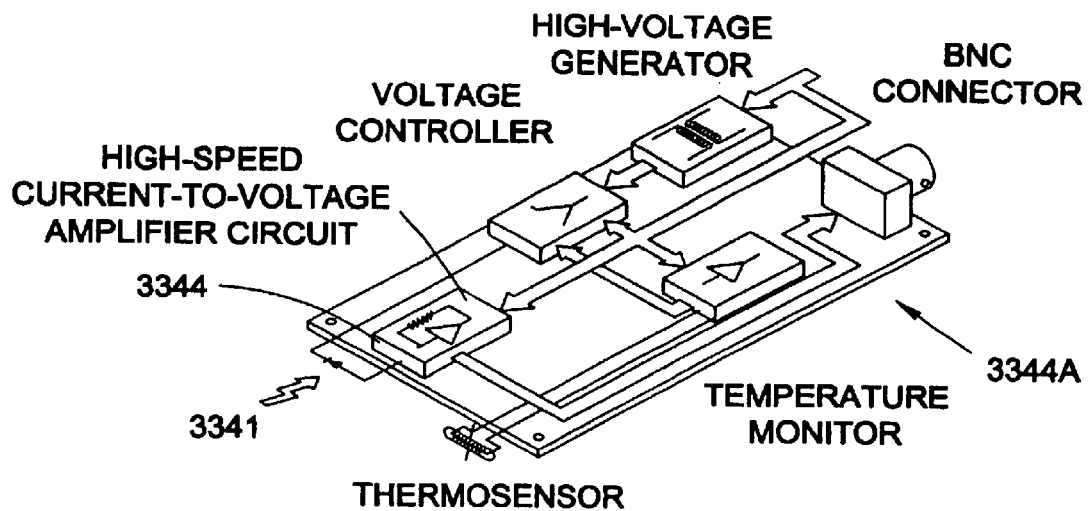
FIG. 15C is a schematic representation of the avalanche photodetector employed within the dual-beam/multi-wavelength LADAR-based imaging, detecting and dimensioning subsystem shown in FIG. 15B.
Figure 15D:
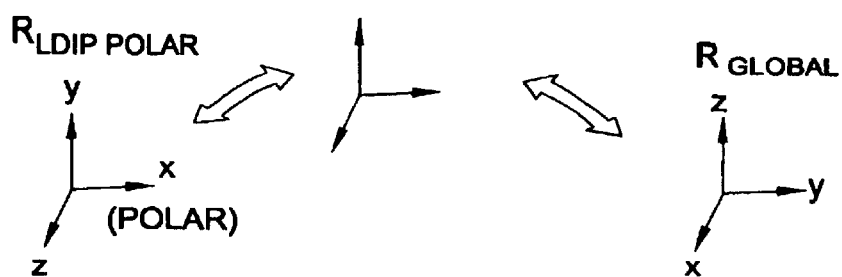
FIG. 15D is a schematic representation illustrating that the information specified in the polar-type coordinate reference subsystem symbolically embedded within the LADAR-based subsystem of FIG. 15B can be converted (or translated) to the Cartesian-type coordinate reference system symbolically embedded within the tunnel-type laser scanning package identification and dimensioning system of FIG. 1A.
Figure 15F:
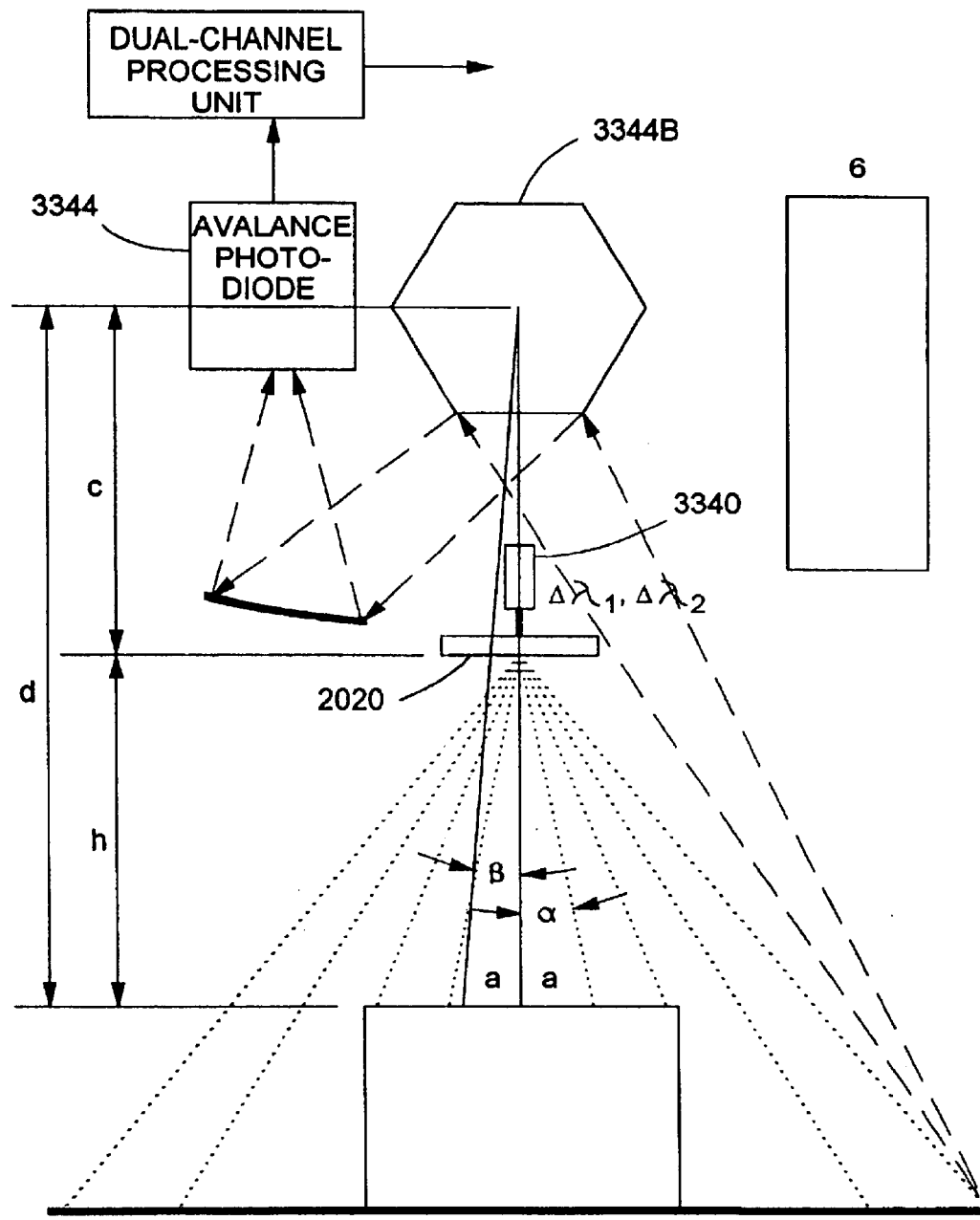
FIG. 15F is a schematic diagram of an alternative embodiment of the dual-beam/multi-wavelength LADAR-based imaging, detecting and dimensioning subsystem shown in FIG. 15B, wherein the laser scanning beams are projected through a holographic spatial filter causing a plurality of modulated laser beams to be simultaneously projected over the conveyor belt surface at different angular spacings to achieve a desired degree of spatial sampling of the conveyor belt surface and objects transported therealong, while a rotating eight-sided polygon scanning element is used to created a moving field of view (FOV) across the illuminated conveyor belt.

The LADAR-Based Package Imaging, Detecting and Dimensioning Subsystem of the Present Invention As explained above, the subsystems 400, 500, 600 and 700 depicted in the system diagram of FIG. 3 are realized using the technological platform provided by the LADAR-based imaging, detecting and dimensioning subsystem 3301 which is integrated within the unitary package identification and dimensioning system of the present invention. In FIG. 15, the subcomponents of subsystem 3301 are schematically represented. In principle, this subsystem 3301 is a Laser-Doppler based Imaging and Profiling device and is therefore often referred to by Applicants as an LDIP device. In general, there are various way in which this subsystem 3301 can be realized. In FIG. 15A, subsystem 3301 is realized so that its multi-wavelength dual AM laser scanning/ranging beams are projected from its subhousing (i.e. optical bench) in such a way that the AM laser beams intersect the surface of the conveyor belt at different angles as the beams scan across the width of the conveyor belt. In FIG. 15B, the subsystem is realized using a polygonal-based laser beam scanning mechanism, whereas in FIG. 15G, the subsystem is realized using a holographic-scanning disc based scanning mechanism. In FIG. 15F, the subsystem 3301 is realized so that the multiwavelength laser beam source is stationary, whereas the field-of-view of the avalance photodiode is scanned across the width of the conveyor belt (or other region of space) by a rotating polygon mechanism.

In FIG. 16, subsystem 3301 is realized so that its multi-wavelength dual AM laser scanning/ranging beams are projected from its subhousing (i.e. optical bench) in such a way that the AM laser beams intersect the surface of the conveyor belt in a substantially normal (i.e. perpendicular) manner as the beams scan across the width of the conveyor belt. This technique employed cylindrical-type lens elements shown in FIGS. 16D and 16E in order to collimate the direction of the dual scanning/ranging beams and thus avoid the effects of shadowing which can be created by tall packages and other objects moving along the conveyor belt. In FIG. 16A, this improved subsystem design 3301 is shown realized using holographic scanning mechanism, whereas in FIG. 16C it is shown realized using a polygonal-type reflective scanning mechanism, as shown in FIG. 15B.

Having provided a brief overview on the LADAR-based imaging, detecting and dimensioning subsystem of the present invention, it is appropriate at this juncture to now describe its structure and functions in greater detail, and thereafter, detail the various illustrative embodiments of this subsystem, within the context of the system within which it is integrated.

As shown in FIG. 15, the LADAR-based imaging, detecting and dimensioning subsystem 3301 comprises an integration of subsystems and components, namely: a first multi-wavelength dual laser scanning/ranging beam generator 2000A for scanning packages and other objects over the visible portion of their reflection characteristics; and: a second multi-wavelength dual laser scanning/ranging beam generator 200B for scanning packages and other objects over the IR portion of their reflection characteristics; an image processing computer 3356 for enabling the package height, width and length profiling subsystem 600 and the package velocity measurement subsystem 400 shown in FIG. 3); a start-of-object sensing cycle (SOSC) or start-of-scan (SOS) pulse photodetector 335 disposed inside the system housing, at the corner of the window, for automatically detecting an extreme portion of one of the AM scanning/ranging beams (as it sweeps through the scanning window, and pulse generator 335A for receiving a signal from photodetector 335 and generating a SOSC (or SOS) pulse signal for referencing purposes within the PITT indication subsystem 500; an optional 1D/2S bar code symbol reading system comprising subcomponents 3357A, 3357, 3358 and 3359) for reading 1D and 2D code symbols when the subsystem 3301 is used in a stand-alone application independent of the unitary package identification and dimensioning system of the present invention; and a programmable controller (e.g. microcomputer) 2001 for controlling the operation of such subsystem components within the context of the greater system structure in which subsystem 3301 is integrated.

In general, the structure and function of the first and multi-wavelength dual laser scanning/ranging beam generators 2000A and 2000B are substantially the same, and comprise a number of subcomponents, namely: at least one visible laser diode VLD 3340A for producing a low power visible laser beam 3341A (for generator 2000A) and a low power IR laser beam 3341B (for generator 2000B); an amplitude modulation (AM) circuit 3342 for modulating the amplitude of the visible laser beam produced from the VLD at a frequency $f_0$ (e.g. 75 Mhz) with up to 7.5 milliWatts of optical power; an opto-mechanical (e.g. polygonal-reflective or holographic-diffractive) scanning mechanism, an electro-optical scanning mechanism or an acousto-optical scanning mechanism 3343 for sweeping the modulated laser beam across a conveyor belt or like transport structure; optical detector (e.g. an avalanche-type photodetector) 3344, a part of a larger photodetection module 3315A, for converting received optical signal 3341A' into an electrical signal 3341A" (or signal 3341B' into electrical signal 3341B"); an amplifier and filter circuit 3345 for isolating the $f_0$ signal component and amplifying it; a limiting amplifier 3345A for maintaining a stable signal level; a phase detector 3346 for mixing the reference signal component $f_0$ from the AM circuit 3342 and the received signal component $f_0$ reflected from the packages and producing a resulting signal which is equal to a DC voltage proportional to the Cosine of the phase difference between the reference and the reflected $f_0$ signals; an amplifier circuit 3346A for amplifying the phase difference signal; a received signal strength indicator (RSSI) 3354 for producing a voltage proportional to a LOG of the signal reflected from the package (i.e. target) which can be used to provide additional information; a reflectance level threshold analog multiplexer 3355 for rejecting information from the weak signals; and a 12 bit A/D converter 3348 for converting the DC voltage signal from the RSSI circuit 3354 into a linear array of M raw range data elements ($R_{m,i}$), taken along m=M (e.g. M=256) equally spaced sampling positions (i.e. locations) along the width of the conveyor belt, where each range data element $R_{m,i}$ provides a measure of the distance from the VLD 3340 to a point on the surface of the scanned package moving therealong. Notably, in the illustrative embodiments, both the first and second scanning/ranging beam generators 2000A and 2000B share a common optical scanning mechanism which ensures that each laser beam is spatially-separated as shown in FIG. 32, to enable the package velocity computation method within the context of the package velocity measurement subsystem 400. In other embodiments of the present invention, each wavelength-dependent scanning/ranging beam generator can employ its own scanning mechanism, regardless of whether it is physical implementation.

In the illustrative embodiments of the present invention, the image processing computer 3356 is realized as a high performance range/image data microcomputer provided with sufficient program memory, and data storage memory for buffering arrays of range data, and derivatives thereof, during the 2-D image data processing methods of the present invention. Also, the optional bar code symbol reading module 2003 can be realized by integrating the following components in a manner well known in the art: a preamplifier circuit 3357 for preamplifying the analog AM signal from the avalanche photodetector 3344 (functioning in this module as an analog scan data signal); an A/D conversion circuit 3357 for converting analog scan data signals into lines of digital scan data samples; scan line data buffer array 3358 for buffering lines of digital scan data samples; and a programmed 2-D image data processor/decoder (e.g. microcomputer) 3359 for decode processing the bar code symbol represented in the structure of digital image in the scan line data buffer array, and producing symbol character data representative of the bar code symbol.

As shown in FIGS. 1A through 1D and 15A, subsystem 3301A further comprises: a first beam reflecting mirror 2005 mounted on one edge of the conveyor belt by a first mounting bracket 2006; a second beam reflecting mirror 2007 mounted on the opposite edge of the conveyor belt by a second mounting bracket 2008; a relatively narrow (e.g. ⅛" to ¼") strip of light absorptive (e.g. black) material 2011 applied to the upper portion of the second beam reflecting mirror 207 for absorbing the intensity of the retro-reflective object sensing laser beam directed across the width of the conveyor belt; and a beam attenuating plate 2009 (having about a 70–90% attenuation coefficient) mounted on bracket 2006 between the first and second beam reflecting mirrors 2005 and 2007 for attenuating the reflected AM scanning/ranging beam (functioning as an object sensing beam within a relatively short prespecified time-window) to prevent over saturation at the avalanche photodetector 3344.

As illustrated in FIG. 15A, function of the above described optical components in relation to the LADAR-based subsystem 3301 is to generate over a short time window, from one of the multi-wavelength AM laser scanning/ranging beams, an object sensing beam produced by the scanning/ranging beam reflecting off the first beam reflecting mirror at time t1, passing through attenuation plate and travelling across the width the conveyor belt towards the second beam reflecting mirror 2007, reflecting thereoff and travelling back through the attenuation plate 2009, reflecting off the first reflecting off the first reflecting mirror 2005 and received by the avalanche photodetector 3344 to produce an analog signal with a time-varying intensity characteristics that are eventually processed to detect the presence or absence of a package along the conveyor belt, between the first and second beam reflecting mirrors 2005 and 2007 over each instance of the prespecified time-window, allocated at the end of each laser scanning/ranging beam cycle carried out within the LADAR-based imaging, detecting and dimensioning subsystem of the present invention. As such optical elements can be thought of as components of the PITT indication subsystem 500, as well as the package height/width/length dimensioning subsystem 600, as package presence/absence information detected using these optical elements can be used to confirm and/or validate package dimensional data prior to transmission to the data element queuing, handling and processing subsystem 1000 which will be described in greater detail hereinafter.

As shown in FIG. 15B, the LADAR-based imaging, detecting and dimensioning subsystem of the first illustrative embodiment 3301A comprises: an optical bench 3360 for supporting optical and electro-optical components of the subsystem; a system housing 3361 having a light transmission aperture 3361A for enclosing the optical bench and components mounted thereon in a shock-resistant manner; an eight-sided two-angle polygonal scanning element 3343B, detailed in FIGS. 15E1 through 15E4, rotatably supported on the shaft of an electrical motor 3343C mounted on the optical bench 3360, as shown, for scanning the amplitude modulated (AM) multi-wavelength (composite) laser beam 3341 produced by the VLDs 3340A and IR laser diode ILD 3340B, along a single scanning plane projected through the light transmission aperture 3361 formed in the subsystem housing; a light collecting mirror 3362 mounted on the optical bench for collecting reflected laser light off a scanned object (e.g. package) 3364 and focusing the same to a focal point 3365A on the surface of a stationary planar mirror 3365 mounted on the optical bench; a small beam directing mirror 3366 mounted on the center of the light collecting mirror 3362 for directing the laser beams from VLD 3340 and ILD 3340B to the rotating polygonal scanning element 3343B, to produce and project a pair of angularly-separated multi-wavelength AM laser scanning/ranging beams (Nos. 1 and 2) out the light transmission aperture 3361A towards the conveyor belt surface along which packages are being transported in a high-speed manner. The ambient light is filtered by a "front window" over the light transmission aperture 3361A. The avalanche-type photodetector (APD) 3344 detects reflected laser light returning onto the surface of the rotating polygon 3343B collected by the light collecting mirror 3362 and focused onto the stationary planar mirror 3365. The APD 3344, within APD module 3315A, converts light into electrical current signal having a frequency of 75 MHz signal and a phase delayed in relation to the reference signal. LOG amplifier 3345 amplifies the signal significantly and at the same time keeps it within a certain amplitude range. The limiting amplifiers 3345 and 3346A ensure that a signal of the same amplitude is produced at the output of each stage regardless of how weak or how strong the reflected light signal is upon striking the APD 3344. This automatic control feature allows the LADAR-based system to "scan" surfaces of different light reflectance at different distances. Also, the LOG amplifier 3345 enables the subsystem to measure an absolute value of the amplitude of the received laser signal. This gives information about any pattern of different reflectance on the "target" (the labels, large letters, pictures, etc.). In addition, the LOC, amplifier 3345 enables setting a "threshold" for a signal level so that very weak or very strong reflections are attenuated.

Figure 42:
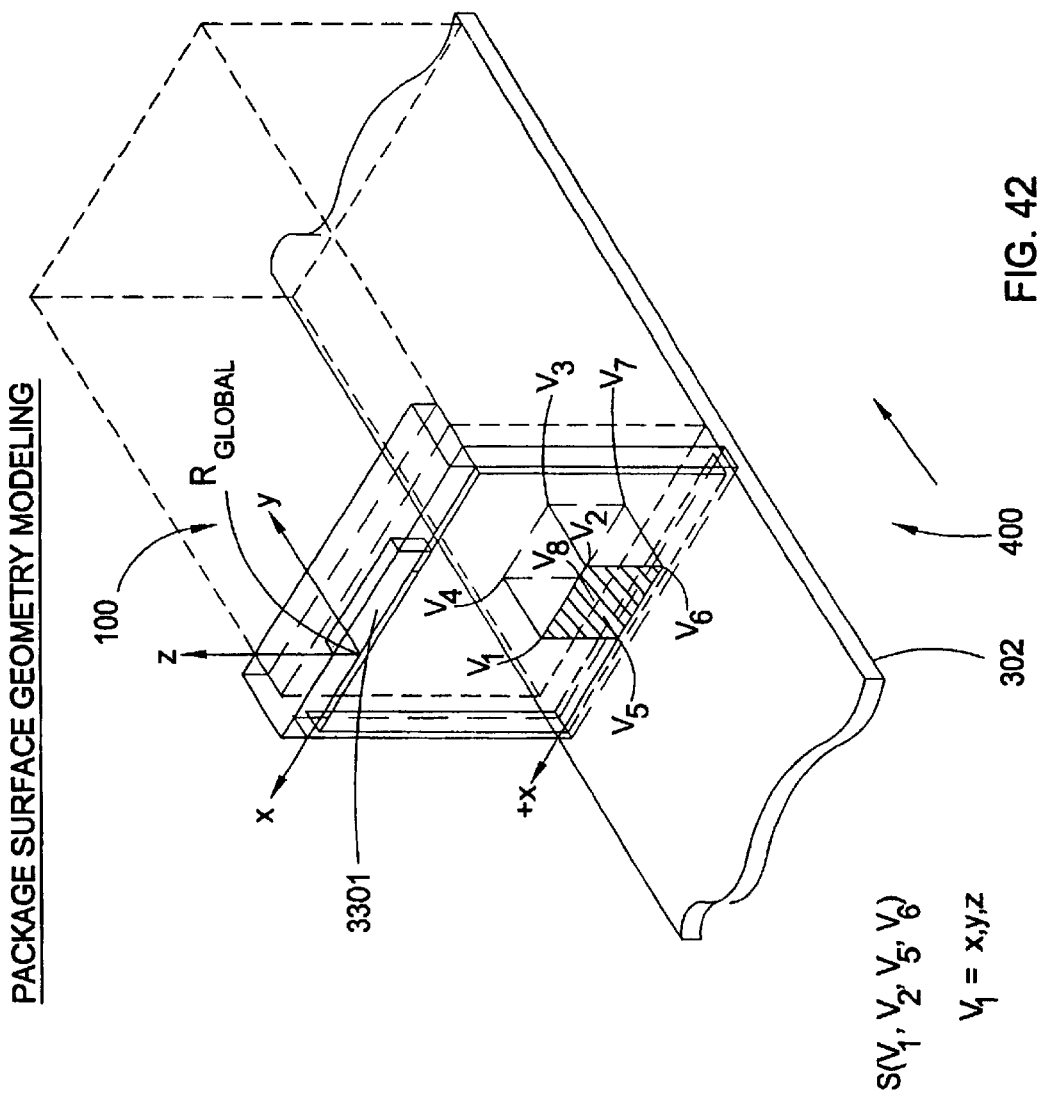
FIG. 42 is a schematic representation of the surface geometry model created for each package surface by the package surface geometry modeling subsystem (i.e. module) deployed with the data element queuing, handling and processing subsystem of FIGS. 40A and 40B, illustrating and showing how each surface of each package (transported through package dimensioning/measuring subsystem and package velocity/length measurement subsystem) is mathematically represented (i.e. modeled) using at least three position vectors (referenced to x=0, y=0, z=0) in the global reference frame $R_{global}$, and a normal vector drawn to the package surface indicating the direction of incident light reflection therefrom.
Figure 47:
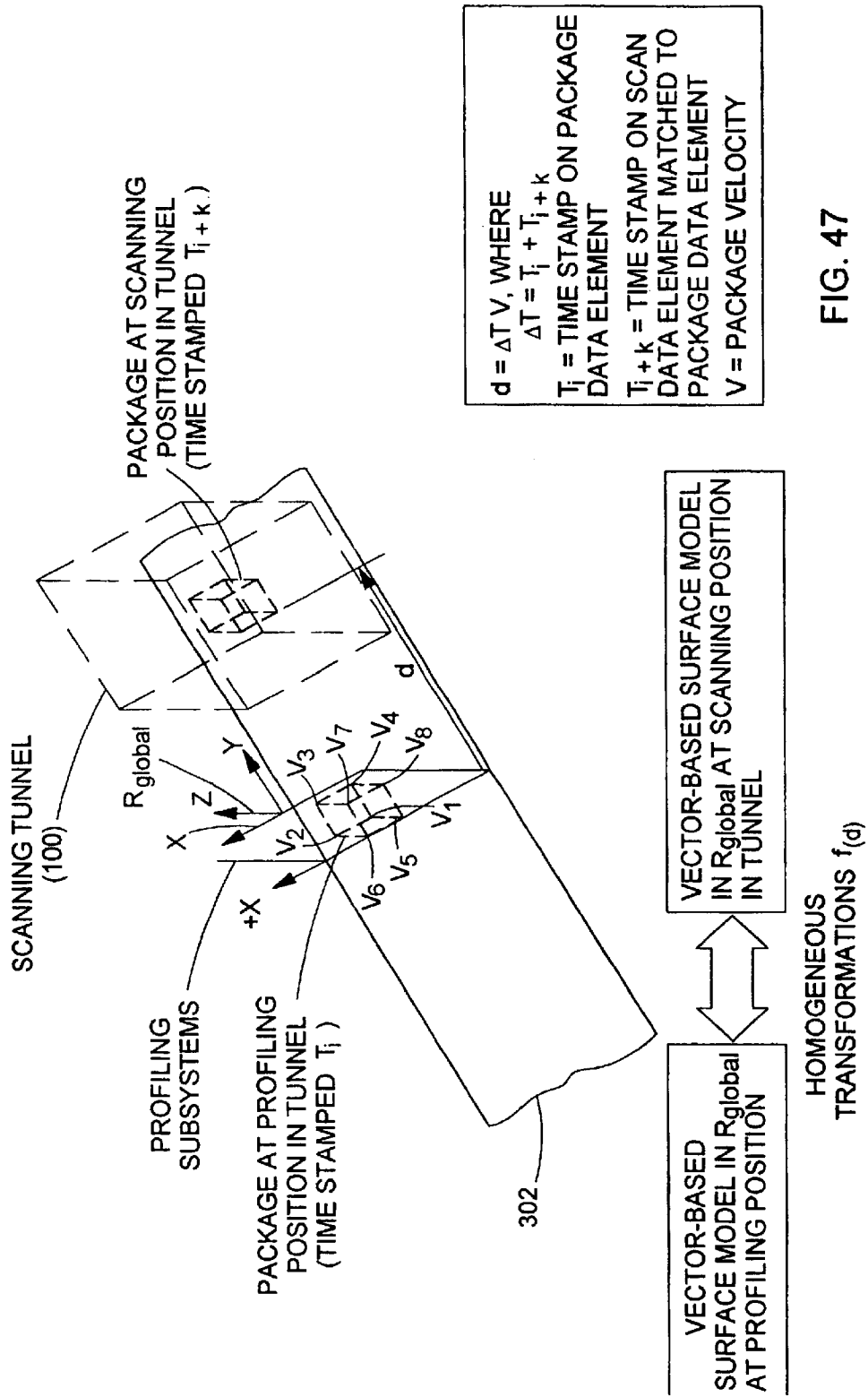
FIG. 47 is a schematic representation graphically illustrating how a vector-based package surface model created within the global coordinate reference frame $R_{global}$ at the "package height/width profiling position" can be converted into a corresponding vector-based package surface model created within the global scanner coordinate reference frame $R_{global}$ at the "scanning position" within the tunnel using homogeneous transformations, and how the package travel distance (d) between the package height/width profiling and scanning positions is computed using the package velocity (v) and the difference in time indicated by the time stamps placed on the package data element and scan beam data element matched thereto during each scan beam/package surface intersection determination carried out within the data element queuing, handling and processing subsystem of FIGS. 40A and 40B.

All incoming laser return signals are processed in a synchronized manner using the SOS (i.e. SOSC) pulse produced by SOS pulse generating circuit 3353 and associated photodetector 3353A so as to produce lines of digital range data representative of the distance from the polygonal scanning element to sampled points along the scanned object 3364. As will be described in greater detail hereinafter, the programmed 2-D digital image data processing computer 3356, realizable as a serial or parallel computing machine, preprocesses each row of raw range data collected during each scan of the amplitude-modulated laser beam, removes background information components, stores the object related data in an image buffer within image processing computer 3356, and extracts therefrom information regarding the dimensions (e.g. area, height, length, width and vertices) of the object (e.g. package), after performing the necessary geometrical transformations. In connection therewith, it is noted at this juncture that the collection and processing of raw "range" data is carried out with respect to the polar coordinate reference system $R_{LDIPPolar}$, symbolically embedded within the LADAR-based imaging and profiling subsystem, and that geometric transformations, schematically depicted in FIG. 15D, are used to translate (i.e. convert) such information to a Cartesian type coordinate system $R_{LDIPcartesian}$ embedded within the LADAR-based subsystem, and then from this coordinate system to a global coordinate reference system $R_{global}$ symbolically embedded within the package identification and measuring system, as illustrated in FIGS. 42, 46 and 47.

Simultaneously, the analog electrical signal input to the logarithmic amplifier 3345 is also processed along a separate data processing channel, as shown in FIG. 15A, in order to recover amplitude modulation information from received lines of scan image data, for subsequent buffering in the 2-D image array 3358 and decoded-processing by 2-D image data processor/decoder 3359. The output from the 2-D image data processor/decoder 3359 is symbol character data representative of the bar code symbol embodied within the structure of the received scan data image.

The signal and data processing circuitry employed in the subsystem 3301 can be realized on one or more PC boards 3368. Various types of I/O interfaces 3369 can be used to interface the subsystem 3301 to I/O subsystem 3900, as well as other devices with which it may be used in any particular application under consideration.

In FIG. 15F, there is shown an alternative embodiment of the dual-beam/multi-wavelength LADAR-based imaging, detecting and dimensioning subsystem shown in FIG. 15B, wherein the laser scanning beams are projected through a holographic spatial filter 2020 causing a plurality of modulated laser beams to be simultaneously projected over the conveyor belt surface at different angular spacings to achieve a desired degree of spatial sampling of the conveyor belt surface and objects transported therealong, while a rotating eight-sided polygon scanning element 3343B is used to move (i.e. scan) the field of view (FOV) of the avalanche photodiode 3344 across the illuminated conveyor belt. As each mirror on the polygon turns, it collects the reflected light from the particular spot of the laser beam, then directs that light into a collector mirror 2250 which focuses it into a photo receiver 3344. A motor control circuit 2251 controls the polygon motor so that it rotates the polygon with constant speed. The laser beam is amplitude modulated at a high frequency (for the convenience we can use a radio IF of 10.7 MHz). The receiver circuit 3344 comprises of a series of the amplifiers, filters and limiters that amplify only the modulated signal collected from the scan field, as described above in connection with FIG. 15. As a result of a signal processing, a pulse sequence is generated where the time between the pulses corresponds to the angle B between the light spots in the scan field.

By having a single source of light and by splitting the laser beams into multiple sets of angularly spaced AM scanning/ranging beams having a fixed angle ($\alpha$) between adjacent beams, produces a line of evenly spaced apart light spots in the scanning field to illuminate any object that might pass therethrough. The number of the light spots determines the resolution of the measurements (the more the light spots the better the resolution). The distance between the light spots (a) on a package in the scanning field increases as the distance from the device to the package increases, following the tangent function of the distance measure (h). The angle $\beta$ between the light spots, as shown in FIG. 15F, is related to the time between the pulses in the digital signal received by the receiver circuit 3344. Therefore knowing the angle a between the light spots on the object, an on-board computer can be used to calculate the distance h from the device to the object. The equation for the calculation of the distance from the device to the object:

$$a = h \tan a \quad a = d \tan\beta \quad d = h + c$$

$$h = (c \tan\beta)/(\tan a - \tan\beta)$$

Using a holographic element it is possible to create a matrix of the light spots (instead of one line) in the scan field. Then with another mirror moving in a direction perpendicular to the "scan," the device can collect the information from an area instead of just a single line.

Figure 15G:
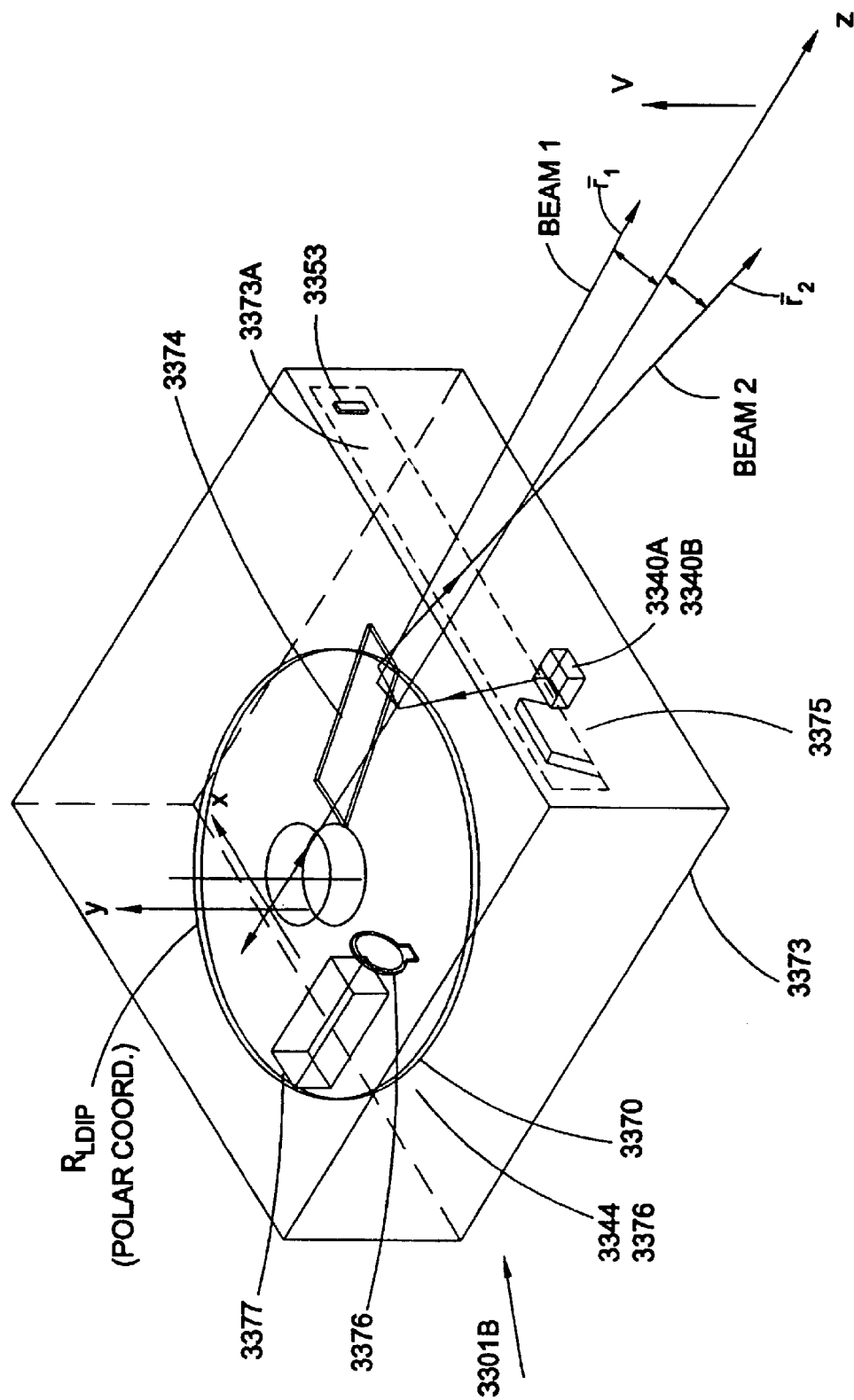
FIG. 15G is a schematic representation of a perspective view of a second illustrative embodiment of the dual-beam/ multi-wavelength LADAR-based imaging, detecting and dimensioning subsystem of the present invention, having a holographic scanning disc, rotatably mounted on an optical bench within the subsystem housing, for generating a pair of amplitude modulated laser beams having multi-wavelengths (produced from a pair of laser beam production module) and projected along a pair of spaced-apart scanning planes (along multiple depths of focus) through a light transmission aperture formed in the subsystem housing, a parabolic light collecting mirror mounted beneath the holographic scanning disc for collecting reflected laser light off a scanned object (e.g. package) and focusing the same to an avalanche-type photodetector mounted above the scanning disc, and producing an electrical signal corresponding thereto, signal processing circuitry for processing the produced electrical signal and generating raw digital range data representative of the distance from the polygonal scanning element to sampled points along the scanned object (as well digital scan data representative of any bar code symbol the scanned surface of the object), a programmed digital image data processor for preprocessing the raw digital range data and removing background information components, and for processing the preprocessed range data so as to extract therefrom information regarding the dimensions (e.g. area, height, length, width and vertices) of the scanned object and produce data representative thereof as well as the velocity of the dimensioned package, and a bar code symbol digitizing and decoding circuitry for processing the digital scan data signal and producing symbol character data representative of any bar code symbol located on the scanned surface of the object.

In FIG. 15G, there is shown a second illustrative embodiment of the dual-beam/multi-wavelength LADAR-based imaging, detecting and dimensioning subsystem of the present invention 3301B. Subsystem 3301B has a holographic scanning disc 3370, rotatably mounted on an optical bench within the subsystem housing, for generating a pair of amplitude modulated laser beams having multi-wavelengths (produced from a pair of laser beam production module) and projected along a pair of spaced-apart scanning planes (along multiple depths of focus) through a light transmission aperture 3373A formed in the subsystem housing. As shown, the subsystem further comprises: a parabolic light collecting mirror 3375 mounted beneath the holographic scanning disc 3370 for collecting reflected laser light off a scanned object (e.g. package) and focusing the same through a condenser-type lens 3376 onto an avalanche-type photodetector 3344 mounted below the scanning disc, and producing an electrical signal corresponding thereto; and signal processing circuitry as shown in FIG. 15 for processing the produced electrical signal and generating raw digital range data representative of the distance from the holographic scanning element to sampled points along the scanned object (as well digital scan data representative of any bar code symbol the scanned surface of the object), and a programmed digital image data processor 3356 as shown in FIG. 15 for preprocessing the raw digital range data and removing background information components, and for processing the preprocessed range data so as to extract therefrom information regarding the dimensions (e.g. area, height, length, width and vertices) of the scanned object and produce data representative thereof as well as the velocity of the dimensioned package.

Many of the details regarding the construction of the LADAR-based imaging, detecting and dimensioning subsystem 3301B are taught in Applicants' copending application Ser. No. 08/949,915 filed Oct. 14, 1997; Ser. No. 08/854,832 filed May 12, 1997; Ser. No. 08/886,806 filed Apr. 22, 1997; Ser. No. 08/726,522 filed Oct. 7, 1996; and Ser. No. 08/573,949 filed Dec. 18, 1995, and International Application No. WO 99/49411 each incorporated herein by reference. Notably, the VLD 3340A and ILD 3340B can be realized as a laser beam production module having a multifunction-HOE (i.e. plate) embedded therewithin as taught in Applicants' copending application Ser. No. 08/949,915 filed Oct. 14, 1997; Ser. No. 08/854,832 filed May 12, 1997, now U.S. Pat. No. 6,085,978; Ser. No. 08/886,806 filed Apr. 22, 1997, now U.S. Pat. No. 5,984,185; Ser. No. 08/726,522 filed Oct. 7, 1996; and Ser. No. 08/573,949 filed Dec. 18, 1995, now abandoned and International Application No. WO 99/49411. The function of these laser beam production modules is to produce a pair of focused amplitude-modulated (AM) laser beams having characteristic wavelengths in both the visible and IR bands of the electromagnetic spectrum so that the subsystem is capable of sensing the color characaeteristics of packages transported along the conveyor belt. It is understood, that more than two laser beam sources can be used to cover the broadest possible extent of the spectrum over which packages reflect incident AM laser scanning/ranging beams in accordance with the principles of the present invention. As shown in FIGS. 15G and H, the laser beam scanning mechanism 3341 of FIG. 15 is realized as a holographic laser scanning disc 3370 rotatably mounted on the shaft of an electric motor 3371 mounted on the optical bench 3372 within the subsystem housing 3373. As shown in FIG. 15J1 and J2, the holographic scanning disc of the first illustrative embodiment has eight facets each having the same focal distance to essentially produce a collimated laser beam over the working distance of the subsystem. The design parameters for each facet on the holographic scanning disc of FIG. 15G are set forth in the Table of FIGS. 15J1 and 15J2. The design parameters set forth in this table are defined in detail in the above-referenced U.S. Patent Applications. Notably, four of the scanning facets have one diffraction angle to generate the first AM laser scanning/ranging beam while the remaining four facets have a different diffraction angle to produce the second AM laser scanning/ranging beam, to generate a pair of angularly seperate scanning beams required by the method of package velocity computation employed in the system and depicted in FIGS. 31 through 32B.

Figure 15H:
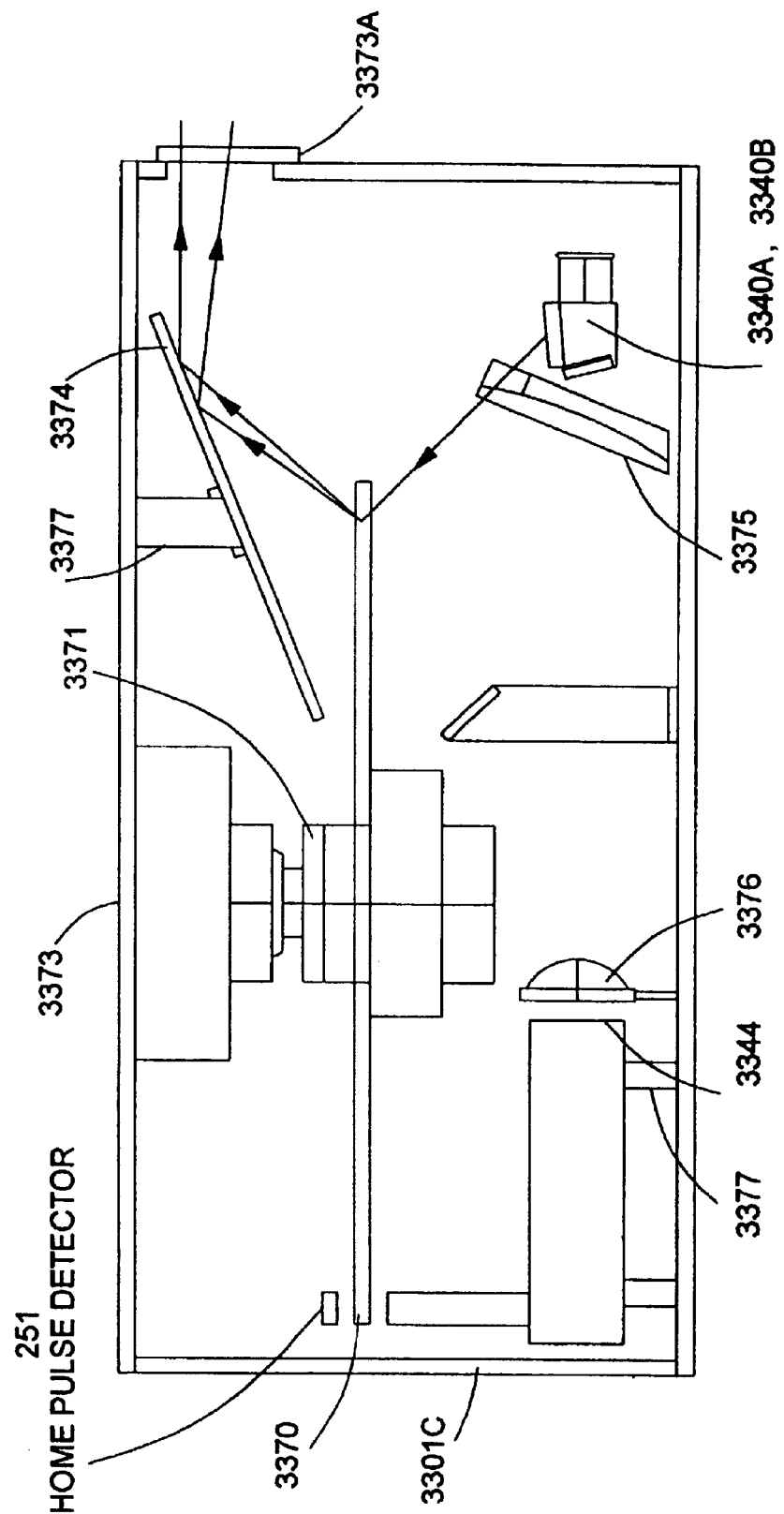
FIG. 15H is a schematic representation of side view of the second illustrative embodiment of the dual-beam/multi-wavelength LADAR-based imaging, detecting and dimensioning subsystem shown in FIG. 15H.
Figure 15I:
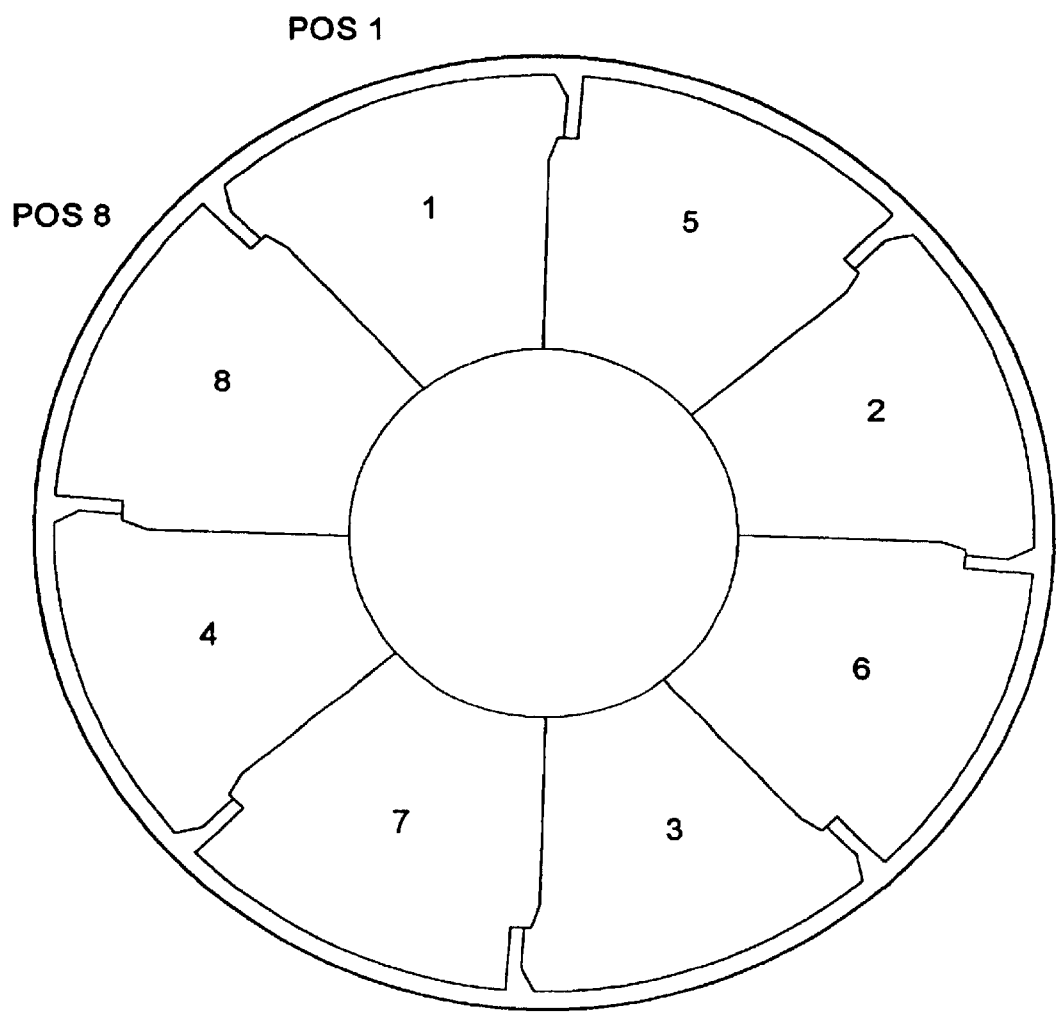
FIG. 15I is a schematic representation of the holographic scanning disc employed in the dual-beam/multi-wavelength LADAR-based imaging, detecting and dimensioning subsystem shown in FIGS. 15G and 15H.

As shown in FIGS. 15G and 15H, a post-disk beam folding mirror 3374 is mounted above the scanning disc 3370, at a tilt angle which causes the reflected laser beams to travel above scanning disk, substantially parallel to the disk surface, and exit through the light transmission window 3373A at the opposite end of the subsystem scanner housing. This arrangement allows for a more compact scanner design and increases the optical path length inside the scanner box. In turn, this reduces the optical throw of the scanner (i.e. the minimum distance from the scanner window at which the scanner can read). By selecting the proper angle of diffraction off the scanning disc, it is possible, with this holographic laser scanner design, to minimize, and virtually eliminate, scan line bow so that the scan lines are all essentially straight lines. This has a number of important advantages in a variety of bar code scanning applications (e.g. when reading high density bar codes with high aspect ratios, when reading bar codes with relatively larger errors in orientation, and when reading bar code symbols at greater label velocities).

Alternatively, a second beam folding mirror (not shown) can be mounted within the scanner housing, just prior to the scanner window 3373A, in order to direct the AM laser beam out a new window formed on the top surface of the scanner, rather than on the side surface thereof, as shown in FIG. 15E2. This modification to the scanner design would allow the AM laser beam to exit the scanner housing perpendicular to the scanning disk, rather than parallel thereto. This modification would minimize the distance that the scanner extends out into the area next to a conveyor system, or it could reduce the required overhead space in an overhead scanning application. Other beam folding options are also envisioned.

As shown in FIG. 15E2, the LADAR-based subsystem 3301B also includes a parabolic light collecting mirror 3375 mounted beneath the scanning disc, upon the optical bench 3372. The function of the light collection mirror 3375 is to (1) collect laser light that reflects off the scanned package 3364 and transmitted back through the scanning facet that generated the respective laser beam, and (2) focus the same to a focal point 3376 on a photodetector 3344 mounted on bracket 3377, above the scanning disc and light collection mirror 3375 as shown in FIG. 15E2. Preferably, bracket 3377 can be used to support post disc beam folding mirror 3374, as well. Also, photodetector 3344 can be realized as an avalanche-type photodetector as described above and shown in greater detail in FIG. 15C. The function of photodetector 3344 is to detect collected laser (return) light focused to focal point 3376, and produce an electrical signal corresponding thereto. The signal and data processing shown in FIG. 15A can be realized on one or more PC boards 3378 and can be provided with the necessary I/O interfaces required in any particular application.

The holographic LADAR-based subsystem 3301B operates in a manner similar to subsystem 3301A, described above. For each sweep of the AM laser beam, raw digital range data is generated and processed to produce package dimension type data described above. Also, the programmed digital image data processor 3359, or an analog equivalent of the general type described hereinabove in connection with the other system embodiments hereof, the analog signal from photodetector 3344 to produce symbol character data representative of bar code symbols on the scanned packages.

Notably, the holographic LADAR-based imaging and dimensioning systems 3301B described above, without modification, can also function as a compact single-line, laser scanner having a very large depth of field, reduced optical throw, and laser scan lines with minimum curvature (i.e. minimum bow). The single line scanner uses a holographic disk to create a sequence of scan lines that all leave the disk at the same diffraction angle but have different focal lengths. In the first embodiment of this scanner described above, the resulting linear scan pattern has six focal planes, providing a very large depth of field for high density bar codes. As mentioned above, six different holographic facets for the six focal planes are spatially repeated three times around the disk for a total of eighteen facets on the scanning disk. This replication of the basic scan pattern results in a high speed scanner.

Figure 16A:
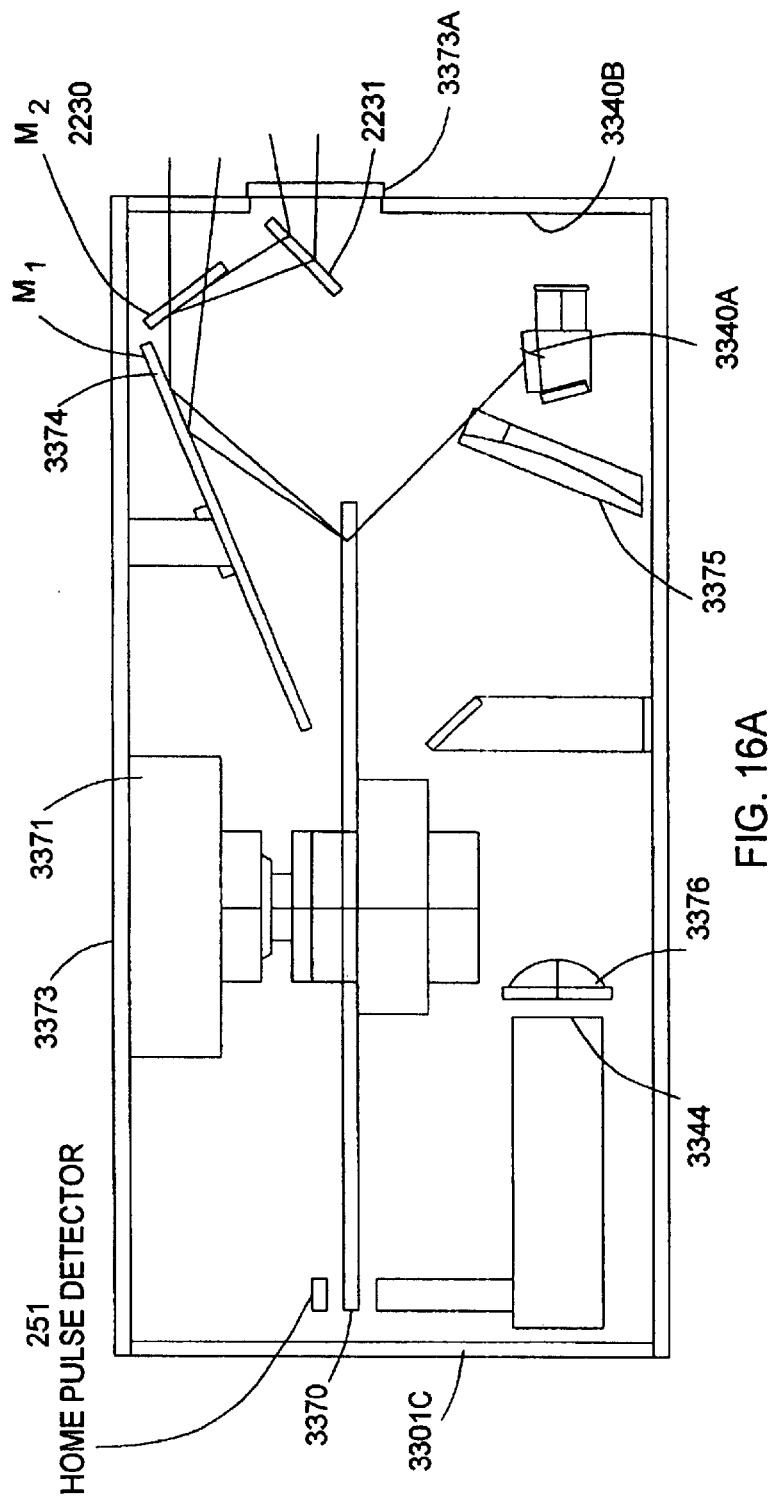
FIG. 16A is an elevated cross-sectional schematic view of the dual-beam/multi-wavelength LADAR-based subsystem of FIGS. 15G and 15H modified to include either the cylindrical lens shown in FIG. 16D or 16E, extending along substantially the entire length of the scanning window of the subsystem, in order to simultaneously project pairs of multi-wavelength laser scanning beams substantially perpendicular to the surface of the conveyor belt.
Figure 16B:
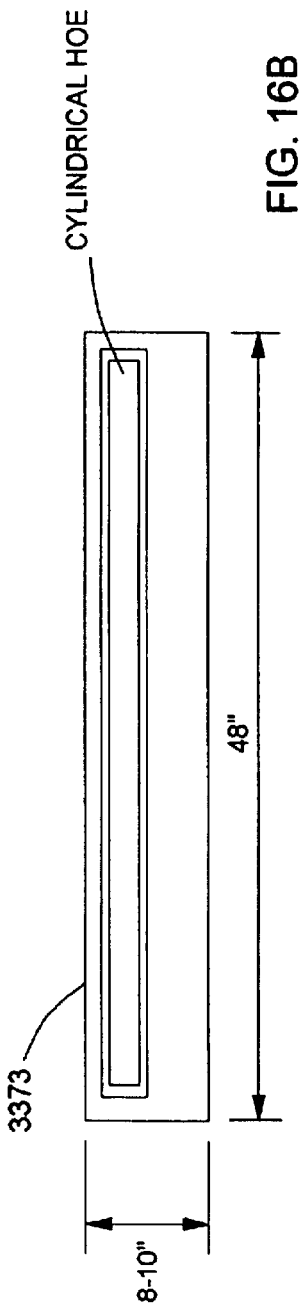
FIG. 16B is an elevated end schematic view of the dual-beam/multi-wavelength LADAR-based subsystem of FIG. 16, showing that the cylindrical-type focusing element (i.e. cylindrical holographic optical element HOE) extends along substantially the entire length of the scanning window of the subsystem, in order to simultaneously project pairs of multi-wavelength laser scanning beams substantially perpendicular to the surface of the conveyor belt.
Figure 16C:
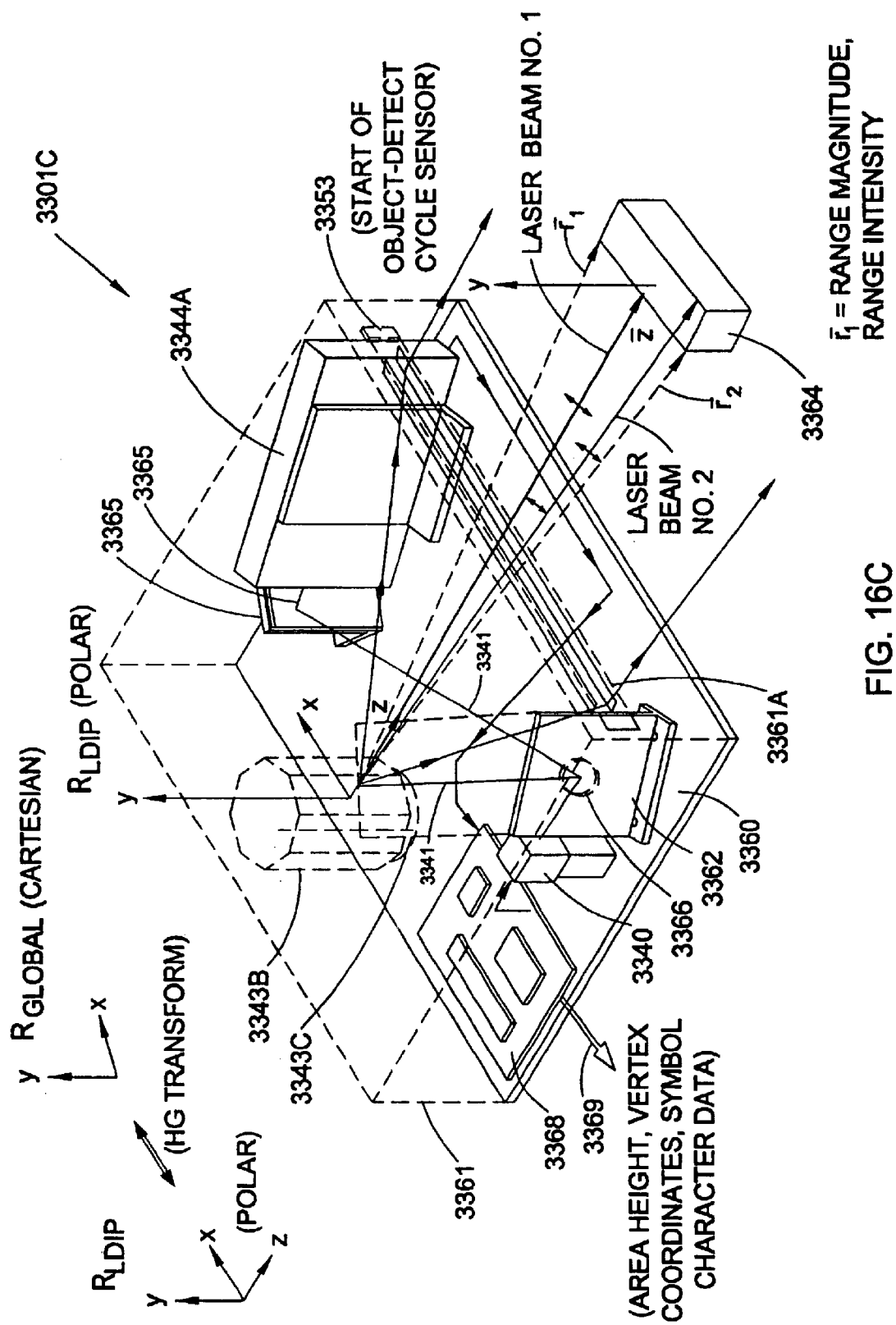
FIG. 16C is an elevated cross-sectional schematic view of the dual-beam/multi-wavelength LADAR-based subsystem of FIG. 15G modified to include either the cylindrical lens shown in FIG. 16D or 16E, extending along substantially the entire length of the scanning window of the subsystem, in order to simultaneously project pairs of multi-wavelength laser scanning beams substantially perpendicular to the surface of the conveyor belt.
Figure 16D:
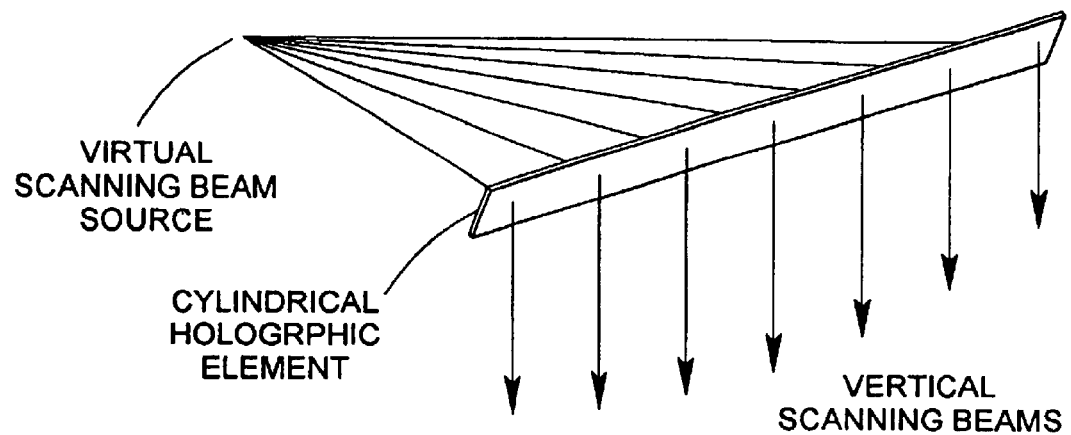
FIG. 16D is a schematic representation of a holographic embodiment of the cylindrical-type lens element which can be employed within the dual-beam/multi-wavelength LADAR-based subsystem of FIG. 16 in order to simultaneously project pairs of multi-wavelength laser scanning beams substantially perpendicular to the surface of the conveyor belt.
Figure 16E:
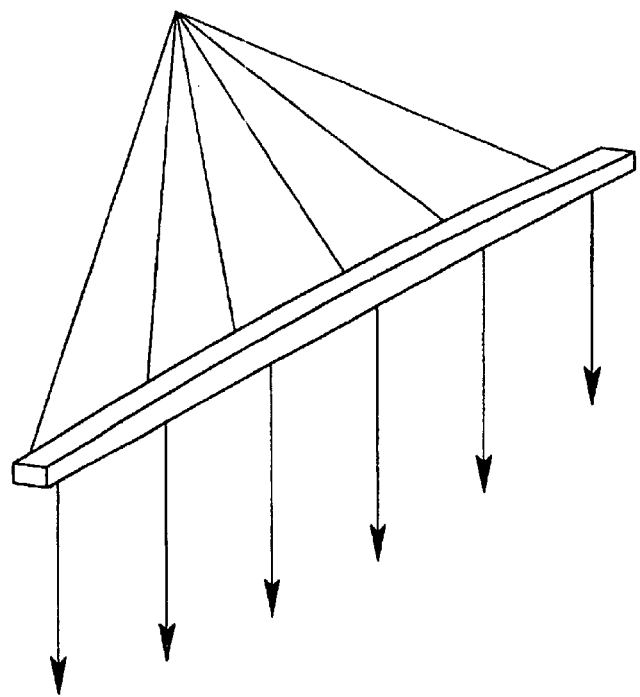
FIG. 16E is a schematic representation of a refractive embodiment of the cylindrical-type lens element which can be employed within the dual-beam/multi-wavelength LADAR-based subsystem of FIG. 16 in order to simultaneously project pairs of multi-wavelength laser scanning beams substantially perpendicular to the surface of the conveyor belt.

In FIG. 16, there is shown another embodiment of the unitary package identification and dimensioning system of FIG. 2A, wherein any of the dual-beam/multi-wavelength LADAR-based subsystems shown in FIGS. 15 through 15J can be modified so that the pair of laser scanning beams generated from its polygon scanning mechanism are projected perpendicular to the surface of the conveyor belt along the entire length thereof, using a beam folding mirror 2030 and a cylindrical-type focusing element (i.e. cylindrical holographic optical element HOE) 2231 as shown in FIGS. 16A, through 16C. Such optical elements 2230 and 2231 have been used to transform the subsystem 3301A of FIG. 15B into the subsystem 3301C shown in FIG. 16C, whereas these same optical components have been used to transform the subsystem 3301B of FIG. 15G into the subsystem 3301D shown in FIG. 16A. Either of these alternative subsystems, the cylindrical lens can be realized using a volume or reflective type holographic optical element (HOE) shown in FIG. 16D, or a refractive type lens element as shown in FIG. 16E. In either case, the beam folding mirror 2230 and cylindrical lens element 2231 each extend along substantially the entire length of the scanning window of the subsystem, in order to simultaneously project pairs of multi-wavelength laser scanning beams substantially perpendicular to the surface of the conveyor belt. The holographic and refractive cylindrical elements 2231 can be made as either a single unitary optical element, or can be made in pieces which are then assembled together as a unitary structure. Essentially, the cylindrical element 2231 emulates a narrow cross-sectional section (slice) of a light collimating lens having an aperture which is substantially equal to the length of the width of the conveyor belt along which packages are conveyed. The width of the cross-sectional slice is dependent on the angular separation of the incident multi-wavelength AM laser scanning/ranging beams passed therethrough during scanning operations. Notably, the advantage associated with the holographic implementation of this optical element is that it will enable the construction of a lighter and more compact device.

The LADAR-based imaging and dimensioning devices 3501A and 3501B described above have numerous applications outside of automatic package identifications and measurement, described hereinabove. In general, each of these ultra-compact devices of the present invention has the following capacities: measuring box size and shape to a tolerance of +/−2 to 3 mm, at 800 scans per second; locating positions of labels on transported boxes; operating from the top of a conveyor belt avoiding the need to make a break therein; identifying material present or not present in tilt trays, slots, etc.; confirming the shapes and sizes of objects in tunnel applications (e.g. also solves supermarket check out problem), counting people, animals, and other moving items moving through a portal; measuring shape and size of items; as well as measuring (or profiling) virtually anything in the three dimension space to a tolerance of about 2 mm or so, and generating accurate coordinate map therefrom.

Two-Dimensional Range Data Processing Method of Present Invention

Figure 17:
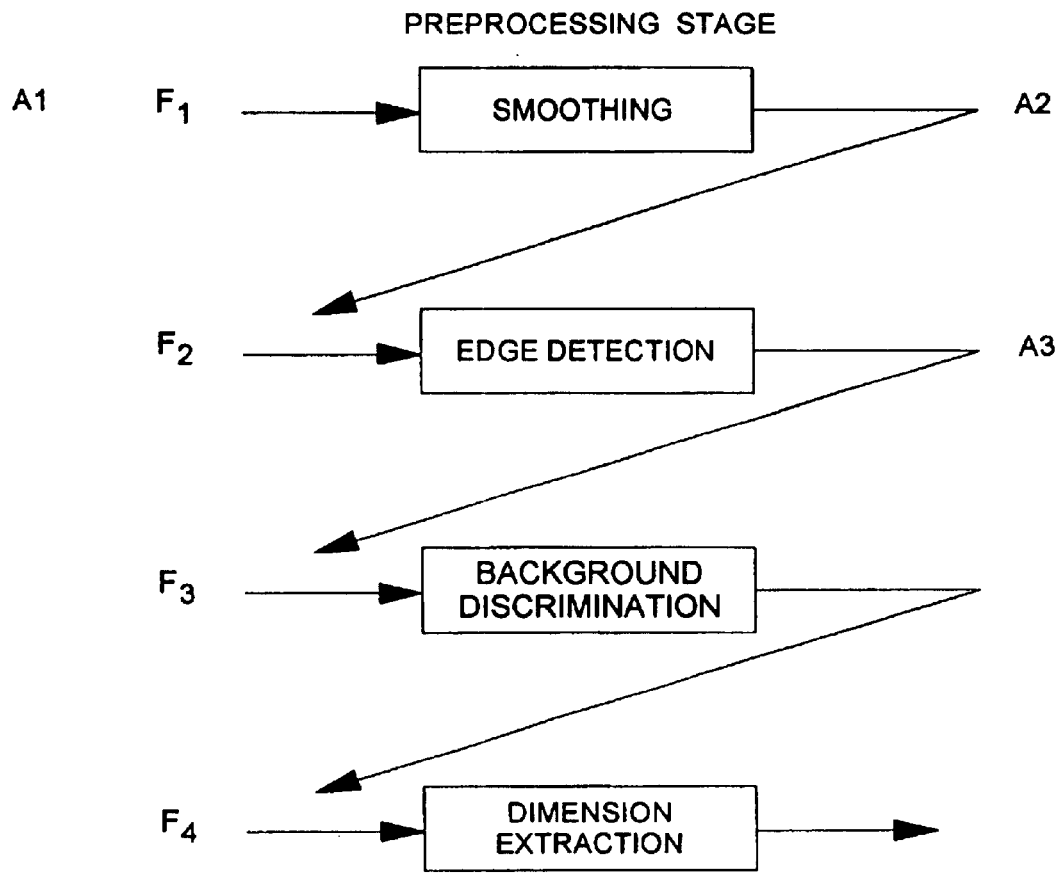
FIG. 17 is a high-level flow chart indicating the major stages the of 2-D range data processing method carried out within the package height/width/length dimensioning subsystem integrated within the LADAR-based package imaging, detection and dimensioning subsystem shown in FIG. 3.

The primary function of the package height/length/width dimensioning subsystem 600 is to compute the height, width, length, width and vertice coordinates of packages transported along the conveyor belt. This function is carried out using the enabling technology provided by the LADAR-based imaging, detecting and dimensioning subsystem 3301 of the present invention, wherein its 2-D range data map processor (i.e. image processing compute) 3356 of FIG. 15 bears a great deal of the computational burden to carry out such functions for subsystem 600. In practice, the primary function of processor 3356 is to process rows of raw range data captured by the LADAR-based imaging, detecting and dimensioning subsystem 3301 so that package dimension (PD) data is extracted therefrom and data representative of the package dimension data is produced for use by other subsystems in the package identification and measuring system. In accordance with the principles of the present invention, this functionality is realized using a novel 2-D range data processing method which, as shown in FIG. 17, employs three stages of preprocessing operations on the captured rows of range data, indicated as (1) "Smoothing", (2) "Edge-detection", and (3) "Background Discrimination". Thereafter, the method employs one stage of "Data Extraction" operations for extracting package dimension data therefrom. As will be described in greater detail hereinafter, the data extraction stage employs (i) 2-D image contour tracing techniques to locate range data indices spatially corresponding to the corner points associated with the scanned object (e.g. package). and (ii) geometric transformations to compute the height, vertices and surface area of the scanned package.

However, the LADAR-based subsystem 3301 also carries the burden of implementing the package velocity measurement subsystem 400 as well as the PIIT indication subsystem 500 and the predictive-type POOT indication subsystem 700. Also, the velocity measurement computation method of the present invention shown in FIGS. 30 to 32B requires simultaneously capturing and processing two raw data streams obtained from a pair of angularly-separated AM laser scanning/ranging beams scanned along the width of the conveyor belt. Also, shown in the flow chart of FIG. 30, computation of package dimensions involves knowledge of the package's velocity, as indicated at Block CC in FIG. 30, so that the velocity computation algorithm shown in FIG. 31 is nested within the high-level data processing method of the present invention schematically depicted in FIG. 30.

Figure 29A:
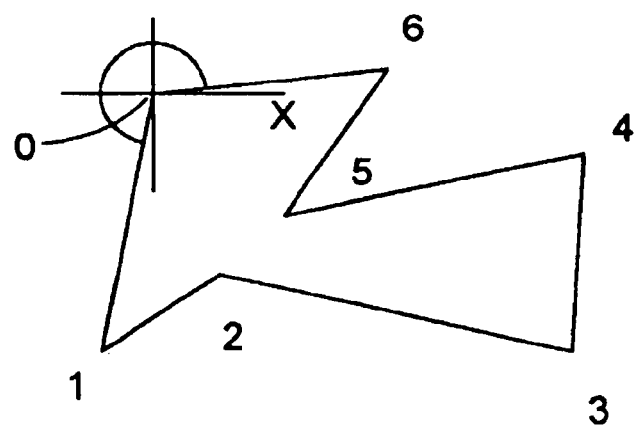
FIGS. 29A and 29B are polygonal contours which illustrative the method of package surface area computation carried out during Step B13 of the flow chart set forth in FIGS. 20A through 20E.
Figure 29B:
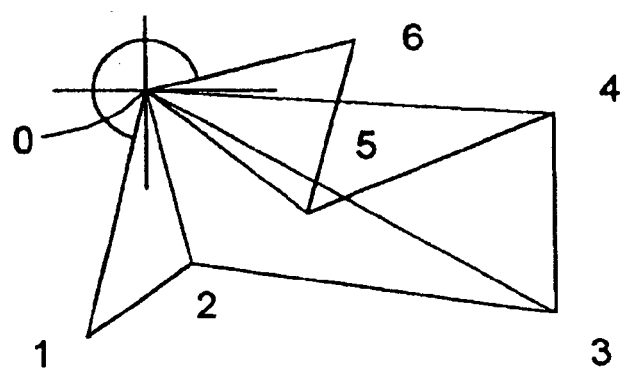
Figure 30:
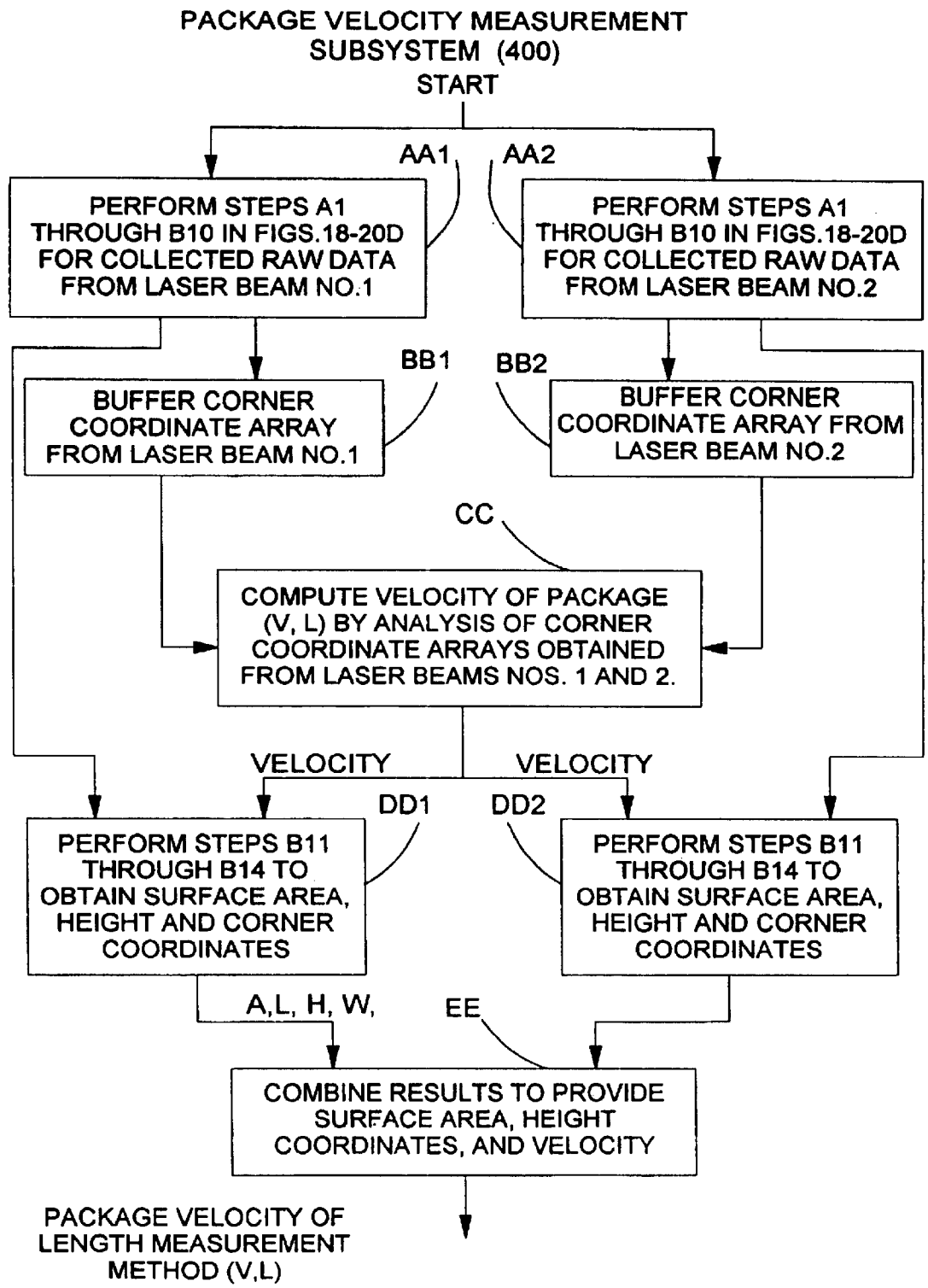
FIG. 30, taken together with certain steps indicated in FIGS. 20A through 20E, sets forth a flow chart describing the steps of involved in the range data processing method carried out in the LADAR-based imaging, detecting and dimensioning subsystem of the illustrative embodiment when using range data collected by both of the laser scanning beams produced by the subsystem so as to compute (i) the height, width and length dimensions of scanned packages, as well as (ii) the coordinates for the vertices of such packages relative to the local (polar) coordinate reference system symbolically embedded within the subsystem (using package velocity information computed by the image-processing based method illustrated in FIGS. 30 through 32B)
Figure 31:
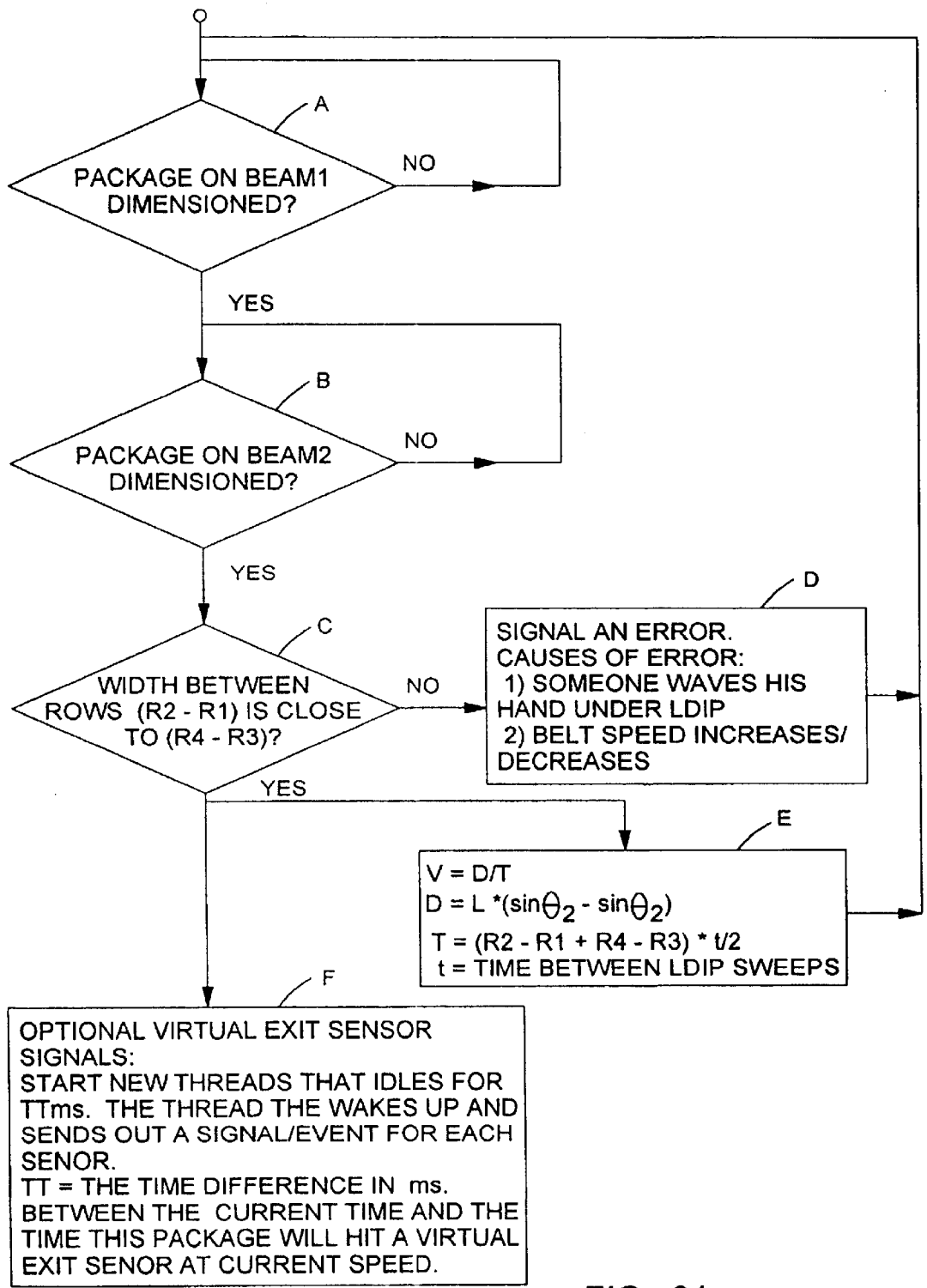
FIG. 31 is a flow chart illustrating the steps involved in carrying out the velocity computation stage set forth at Block CC in FIG. 30.

Thus, in order to fully appreciate the data processing method used to compute package dimensions of the present invention, regardless of whether the package's velocity is determined by external sensors as taught in Applicant's International Application No. WO 99/49411 or is computed using the integrated dual-beam method depicted in FIGS. 31 through 32B, Applicants will first describe how package dimensions are computed using the general method of the present of the present invention shown in FIGS. 17 through 29B, and thereafter using the integrated methods depicted in FIGS. 30 through 32B.

Figure 18:
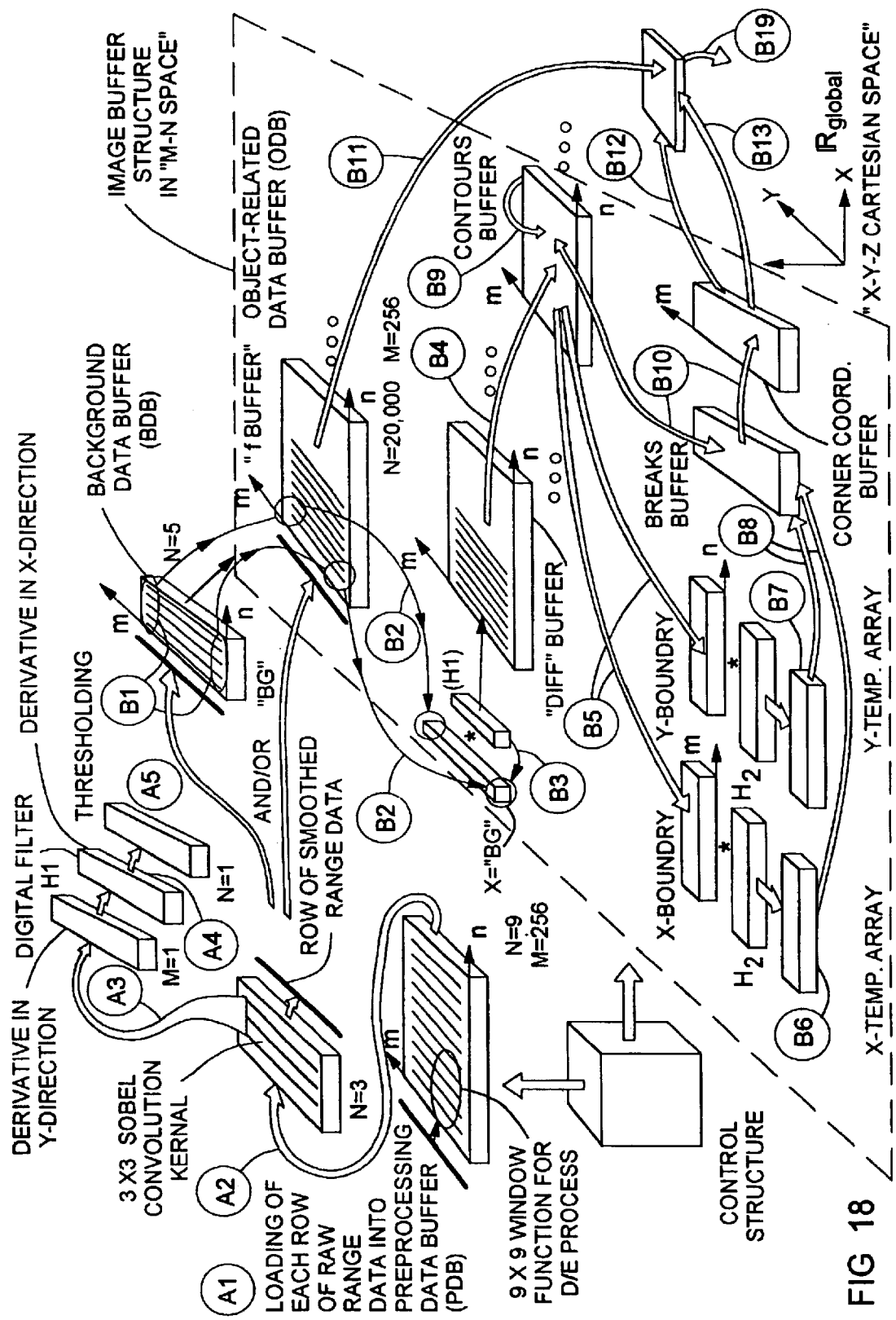
FIG. 18 is a schematic representation of the various steps involved in cyclically carrying out the 2-D range data processing method upon the computing platform of the LADAR-based imaging, detecting and dimensioning subsystem of the present invention.
Figure 20A:
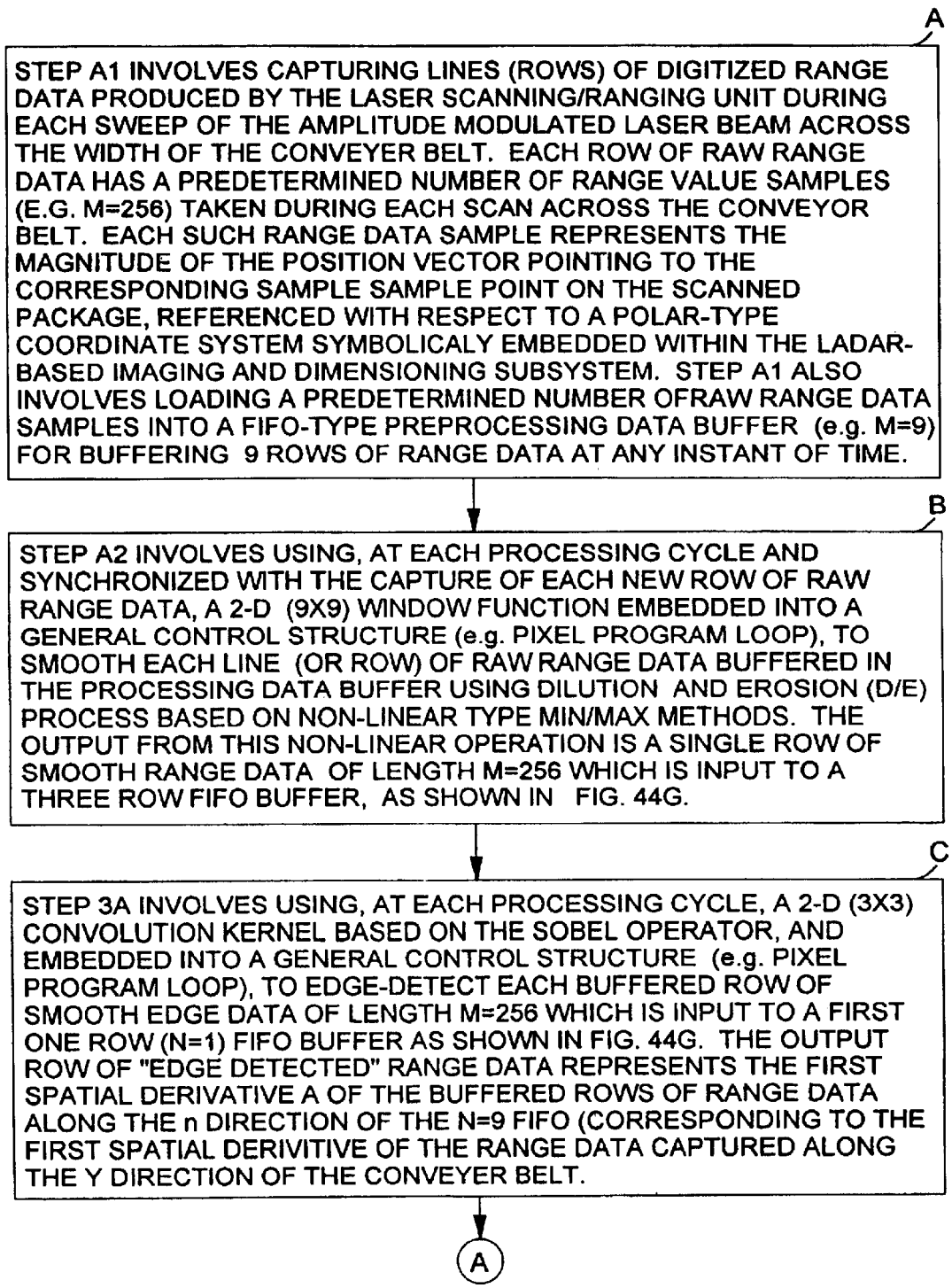
FIGS. 20A through 20E, taken together, set forth a flow chart describing the steps of involved in the range data processing method carried out in the LADAR-based imaging, detecting and dimensioning subsystem of the illustrative embodiment, when using range data collected by only one of the laser scanning beams produced by the subsystem so to compute (i) the height, width and length dimensions of scanned packages, as well as (ii) the coordinates for the vertices of such packages relative to the local (polar) coordinate reference system symbolically embedded within the subsystem (using package velocity information provided by either an external velocity sensor, or the image-processing based method of velocity computation illustrated in FIGS. 30 through 32B)
Figure 20B:
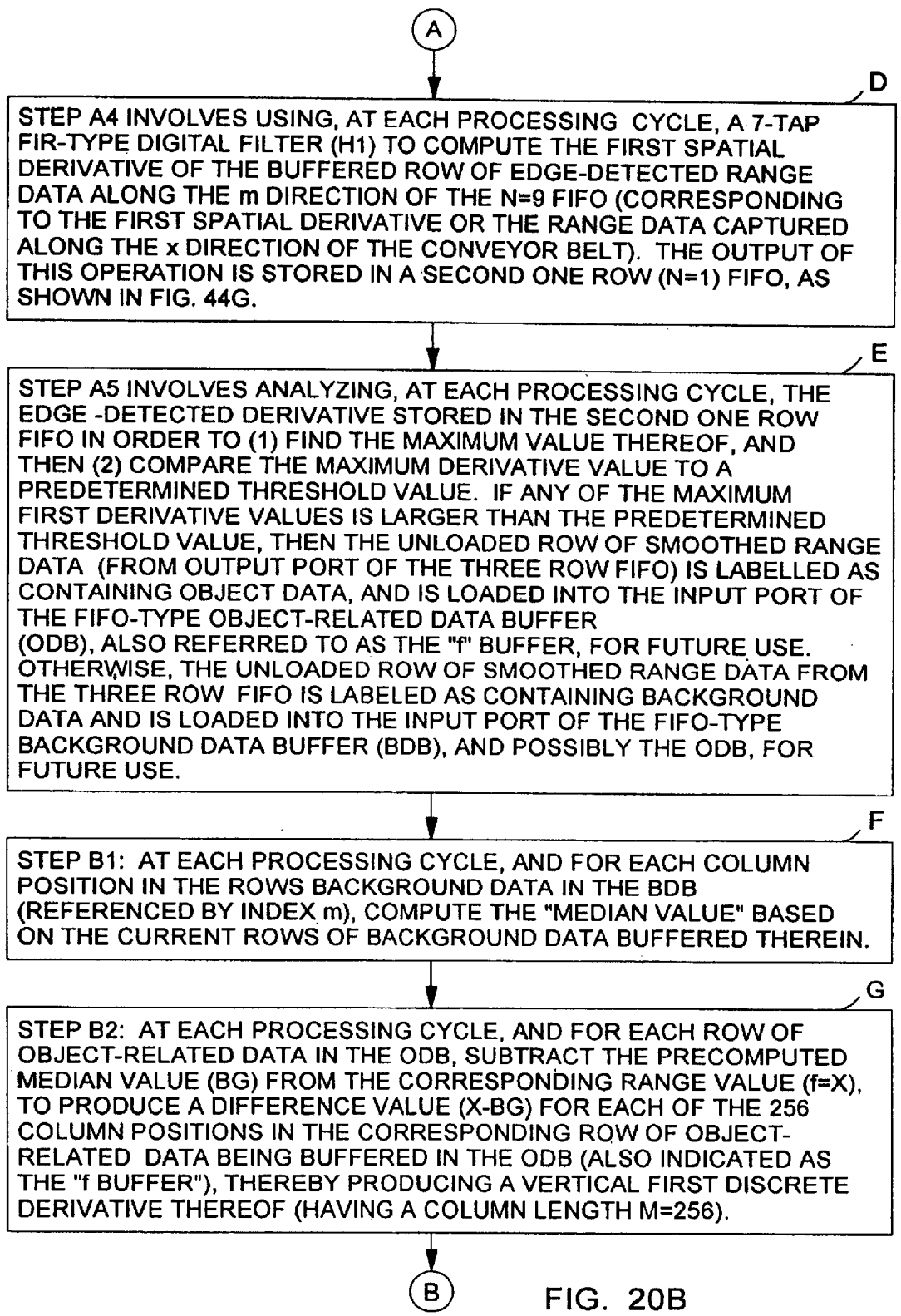

As shown in FIG. 18, the steps involved in carrying out the preprocessing stages of data processing are indicated as Steps A1 through A5, described in Blocks A through E in FIGS. 20A through 20B, whereas the steps involved in carrying out the data extraction stage are indicated as Steps B1 through B14, described in Blocks F through S in FIGS. 20B.

As indicated at Block A in FIG. 20A, Step A1 involves capturing lines (rows) of digitized "range data" produced by the laser scanning/ranging unit, during each sweep of the amplitude modulated laser beam across the width of the conveyor belt. Each row of raw range data has a predetermined number of range value samples (e.g. M=256) taken during each scan across the conveyor belt. Each such range data sample represents the magnitude of the position vector pointing to the corresponding sample point on the scanned package, referenced with respect to a polar-type coordinate system symbolically embedded within the LADAR-based imaging, detecting and dimensioning subsystem. As indicated at Block A, Step A1 also involves loading a predetermined number of rows of raw range data samples into a FIFO-type Preprocessing Data Buffer (e.g. M=9) for buffering 9 rows of range data at any instant of time.

Figure 20C:
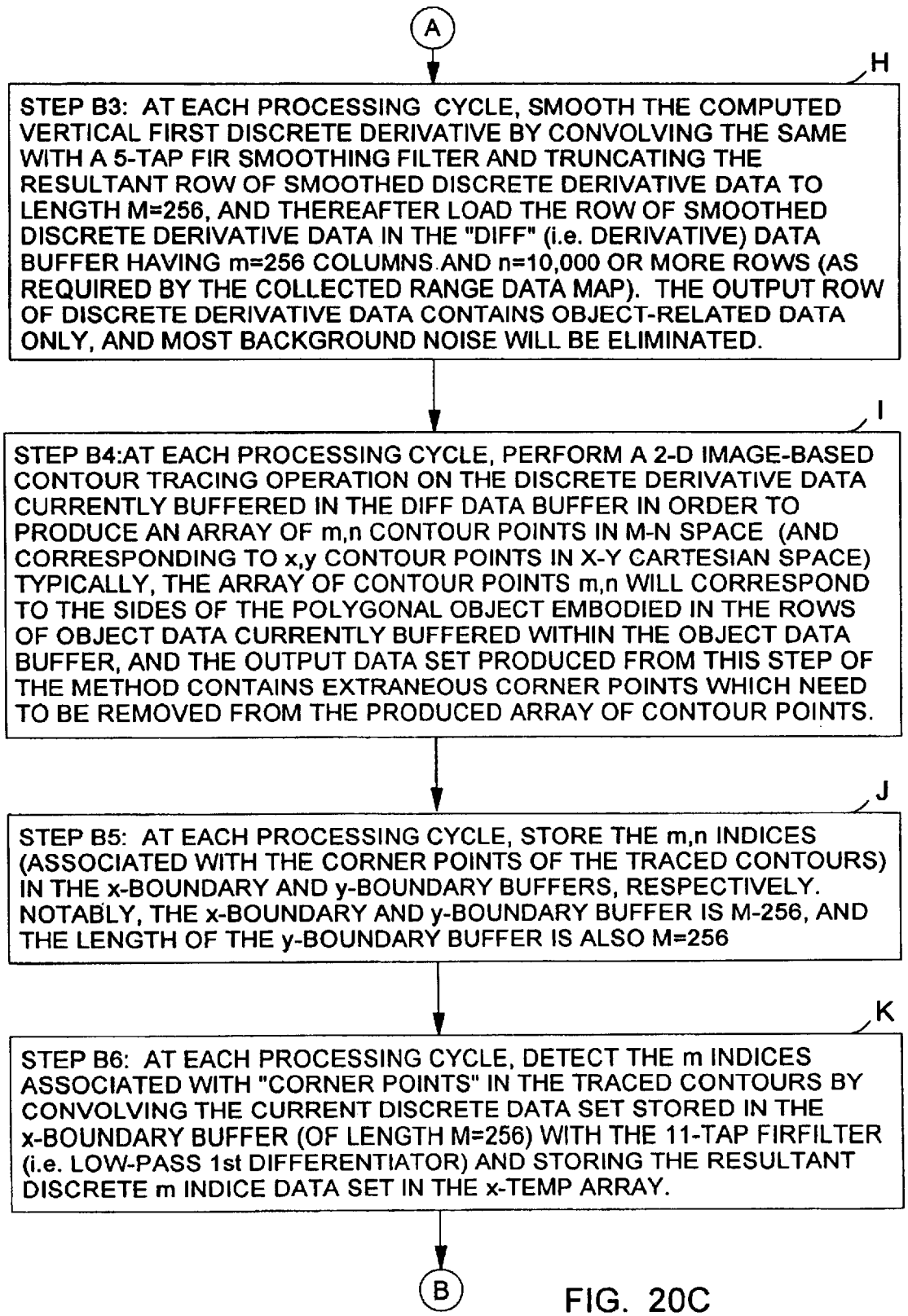
Figure 20D:
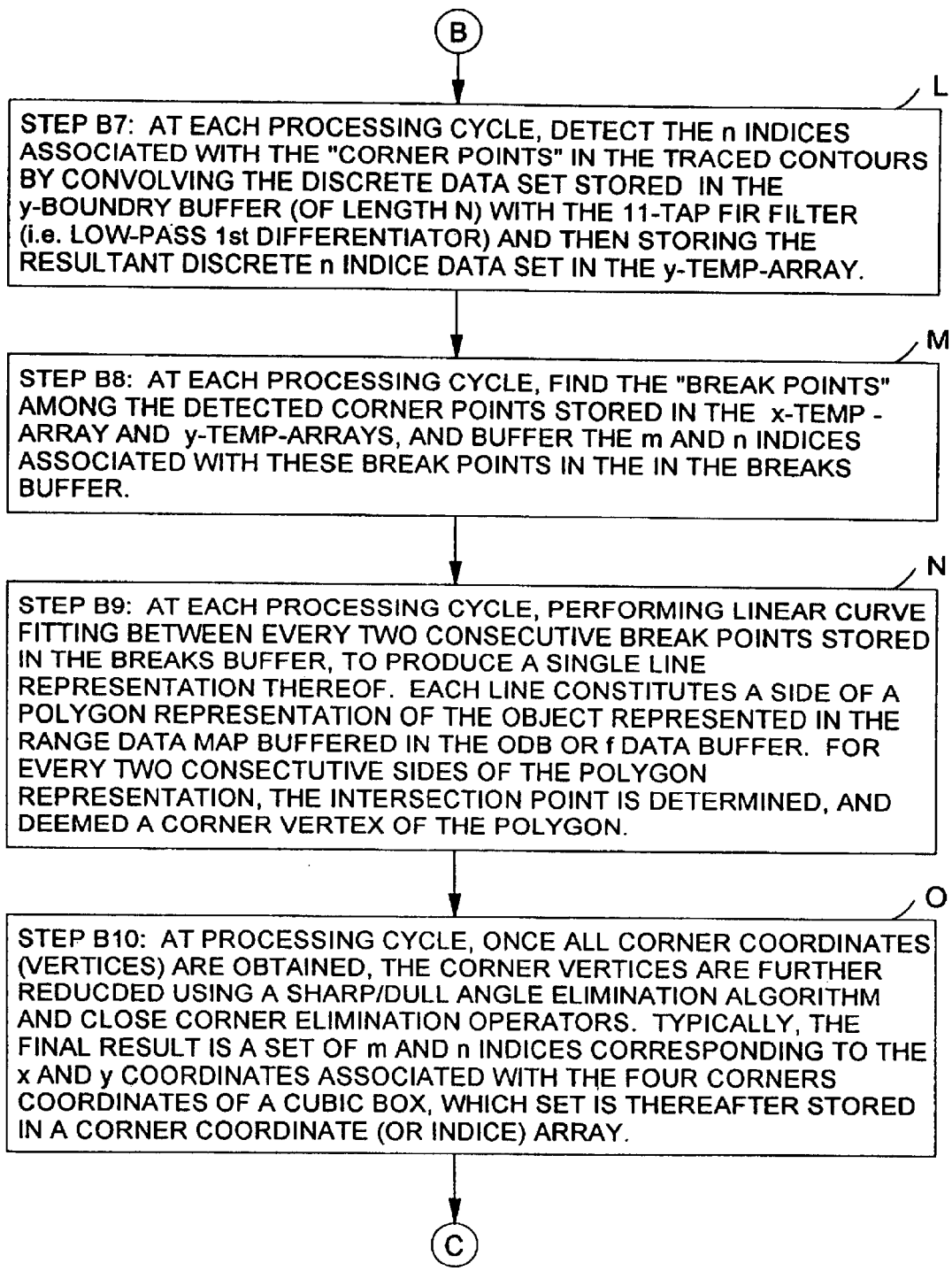
Figure 20E:
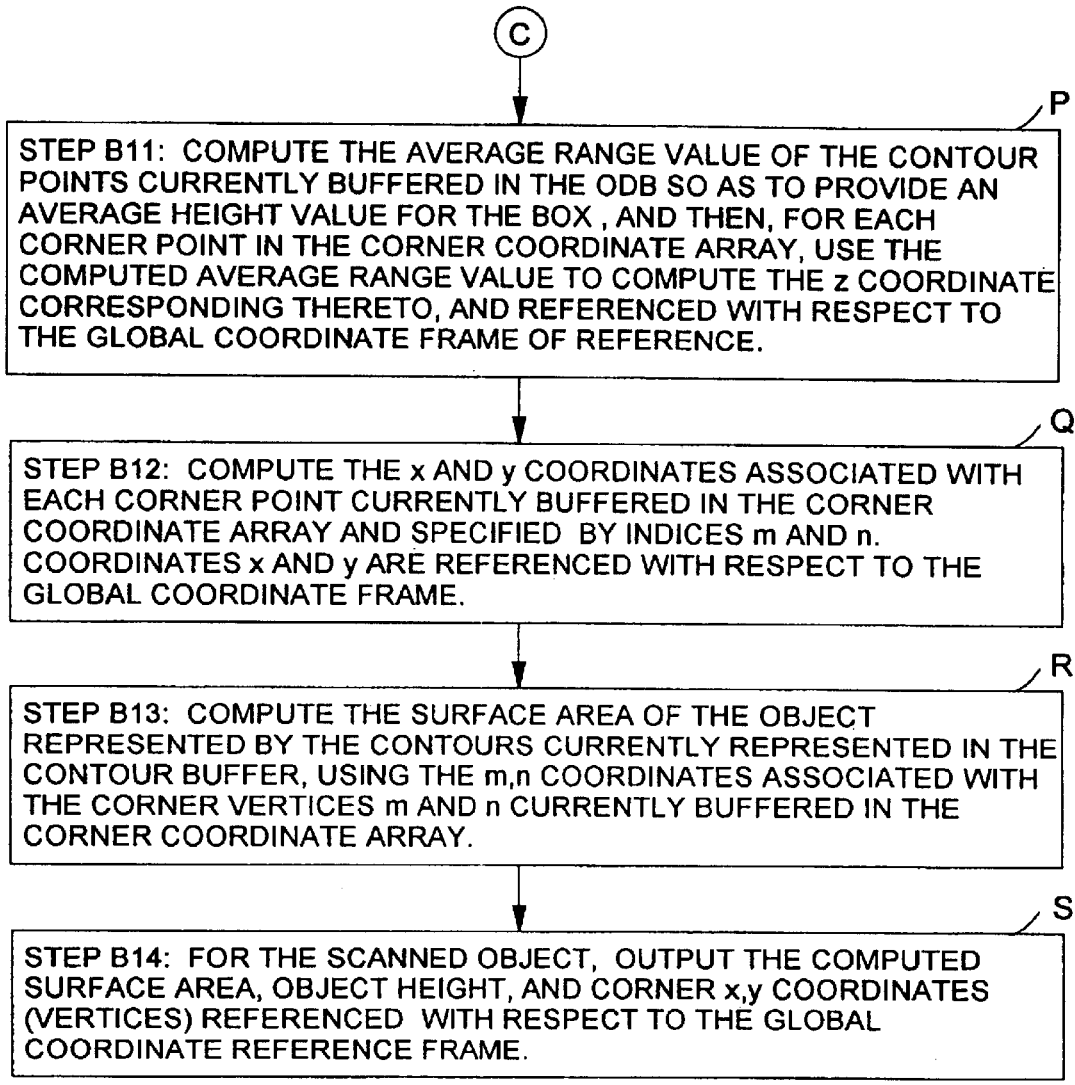
Figure 21A:
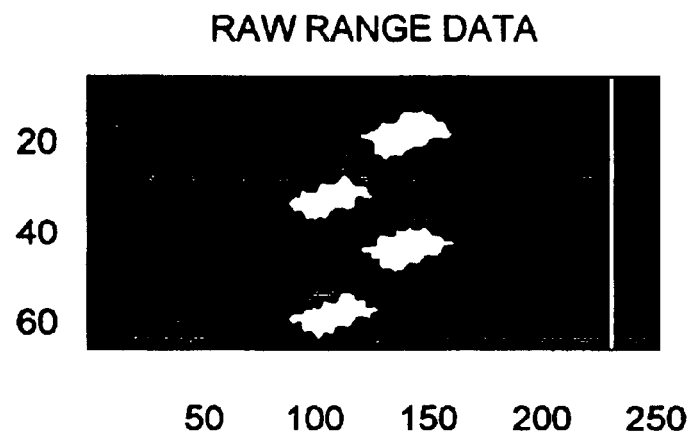
FIG. 21A is a graphical image of a 2-D range data map synthesized from a large number of rows of raw range data captured from the LADAR-based imaging, detecting and dimensioning subsystem of the present invention, in accordance with the data capturing operations specified in Step A1 of the flow chart set forth in FIGS. 20A through 20E.

FIG. 21A sets forth a graphical image of a 2-D range data map synthesized from a large number of rows of raw range data captured from the LADAR-based imaging, detecting and dimensioning subsystem of the present invention, in accordance with the data capturing operations specified in Step A1 of the flow chart set forth in FIGS. 20A through 20E.

As schematically illustrated in block form in FIG. 18, "CONTROL STRUCTURES" are required and used by the LADAR-based subsystem of the present invention. General control structures as "divide and conquer," backtracking, dynamic programming etc. support the implementation of the specific algorithms used in the LADAR-based subsystem hereof. These control structures consist of sequences or loops connecting abstract program modules. Window functions or operator kernels employed herein have to be embedded into a general control structure (pixel program loop), organizing the move of placed windows F(p) into all (non-border) point positions p of a given image according to a selected scan order, ensuring that the entire image domain is processed. Allowing small modifications, such a pixel program loop can be used for different local operators. For example, logically structured operators are characterized by data-dependent and/or location-dependent decisions. These decisions take place within the pixel program loop, and do not influence the general control structure of the program.

The use of predefined control structures allows often to describe the operators by giving only the operator kernel, which plays the role of a subroutine called at each pixel program loop. In general, the control structure of window operators allows the selection between different square windows of n×n pixel s (odd n), and between parallel or sequential processing. Special inputs made by the user at the beginning of the control structure, i.e. at program start, specify these selections.

With the input of a special parameter (PARSEQ=0 or =1) the user chooses parallel or sequential processing. If only parallel processing has to be implemented, then some program lines of the control structure can be eliminated. These rows have the label ⊕ in the following control structures.

The structure requires the following data arrays:
Ind(1 . . . n): This array contains the indices of indirect row addressing. for example, the initial values are given by DATA ind (1, 2, 3, 4, 5), if n=5.

Xind(1 . . . a), and these values are used as arguments of the operator kernel (cp. FIG. 3.5). For example, if n=5 then the following arrays are used:

DATA xind(1, 1, 0, −1, −1 −1, 0, 1, 2, 2, 2, 1, 0, −1, −2, −2, −2, −2, −2, −1, 0, 1, 2, 2, 0); DATA yind(0, 1, 1, 1, 0, −1, −1, −1, 0, 1, 2, 2, 2, 2, 2, 1, 0, −1, −2, −2, −2, −2, −2, −1, 0)

The control structure uses the following parameters and image files: The window size n is assumed to be odd. The value k::=(n−1)/2 follows after initializing n.

⊕ The parameter PARSEQ is specified for selecting parallel (PARSEQ=0) or sequential (PARSEQ=1) processing. For label ⊕, see above.

The original image f (or several input images in certain cases) and the resultant image h (in file OUT) have to be allocated as image files, Processing follows the scheme as given in FIG. 18I. Afterwards all open image files must be closed. Many of the operator kernels can be inserted at the location "processing of picture window . . ." of this control structure in FIG. 18I. If so, then this control structure is mentioned in the operator pseudo-program at the beginning of point (4). In this way repeated listings of identical control structures are avoided.

While the control structure includes row-wise buffering, operations which are necessary for opening or allocating an image file, acquiring an image (e.g. 2-D range map) via the LADAR-based scanning mechanism described above, are not contained in this control structure. Details on "general control structures" are provided in the textbook "HANDBOOK OF IMAGE PROCESSING OPERATORS" (1996) by R. Kletpe and P. Zamperoni, published by cohn Wiley and Sons, incorporated herein by reference.

As indicated at Block B in FIG. 20A, Step A2 involves using, at each processing cycle and synchronized with the capture of each new row of raw range data, a 2-D (9×9) window function embedded into a general control structure (e.g. pixel program loop), to "smooth" each line (or row) of raw range data buffered in the M=9 FIFO Data Buffer using Dilution and Erosion (D/E) processes based on non-linear type min/max methods well known in the image processing art. The output from this non-linear operation is a single row of smooth range data of length M=256 which is input to a three row FIFO buffer, as shown in FIG. 18. Details on the operation of the DIE algorithm are provided in the textbook "HANDBOOK OF IMAGE PROCESSING OPERATORS" (1996) by R. Kletpe and P. Zamperoni, published by John Wiley and Sons, supra.

Figure 21B:
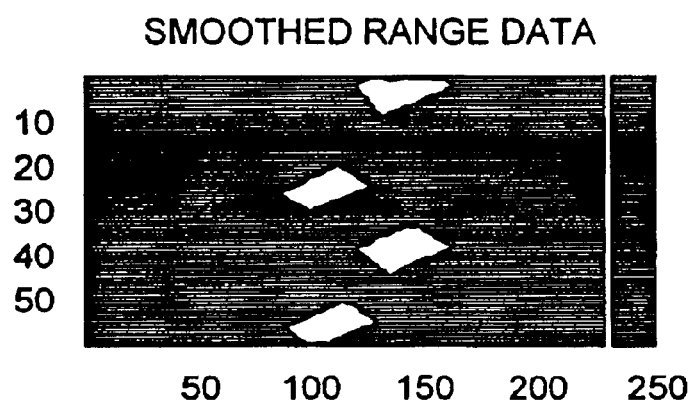
FIG. 21B is a graphical image of a 2-D range data map after being processed by the data processing operations specified in Step A2 of the flow chart set forth in FIGS. 20A through 20E.

FIG. 21B sets forth a graphical image of a 2-D range data map after being processed by the data processing operations specified in Step A2 of the flow chart set forth in FIGS. 20A through 20D.

As indicated at Block C in FIG. 20A, Step A3 involves using, at each processing cycle, a 2-D (3×3) convolution kernel based on the Sobel operato, and embedded into a general control structure (e.g. pixel program loop), to edge-detect each buffered row of smoothed range data of length M=256 which is input to a first one row (N=1) FIFO buffer as shown in FIG. 18. The output row of "edge-detected" range data represents the first spatial derivative of the buffered rows of range data along the n direction of the N=9 FIFO (corresponding to the first spatial derivative of the range data captured along the y direction of the conveyor belt). Details on the operation of the D/E algorithm are provided in the textbook "HANDBOOK Of IMAGE PROCESSING OPERATORS" (1996) by R. Kletpe and P. Zamperoni, supra.

Figure 21C:
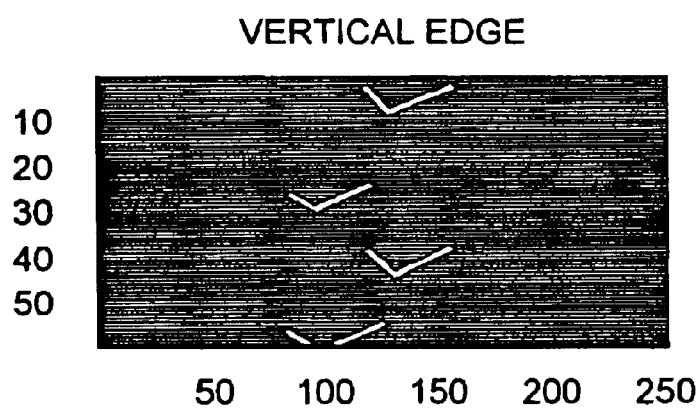
FIG. 21C is a graphical image of a 2-D range data map after being processed by the data processing operations specified in Step A3 of the flow chart set forth in FIGS. 20A through 20E.

FIG. 21C sets forth a graphical image of a 2-D range data map after being processed by the data processing operations specified in Step A3 of the flow chart set forth in FIGS. 20A through 20D;

As indicated at Block D in FIG. 20A, Step A4 involves using, at each processing cycle, a 7-tap FIR-type digital filter (H1) to compute the first spatial derivative of the buffered row of edge-detected range data along the m direction of the N=9 FIFO (corresponding to the first spatial derivative of the range data captured along the x direction of the conveyor belt). The output of this operation is stored in a second one row (N=1) FIFO, as shown in FIG. 18.

Figure 21D:
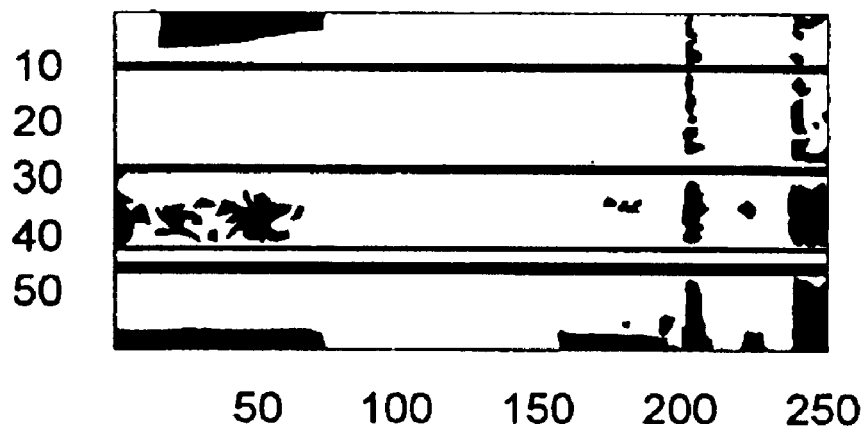
FIG. 21D is a graphical image of a 2-D range data map synthesized from a large number of rows of background data removed from rows of raw range data by the data processing operations specified in Step A4 of the flow chart set forth in FIGS. 20A through 20E.

FIG. 21D sets forth a graphical image of a 2-D range data map synthesized from a large number of rows of background data removed from rows of raw range data by the data processing operations specified in Step A4 of the flow chart set forth in FIGS. 20A through 20D;

As indicated at Block E in FIG. 20B, Step A5 involves analyzing, at each processing cycle, the edge-detected derivative stored in the second one row FIFO in order to (1) find the maximum value thereof, and then (2) compare the maximum derivative value to a predetermined threshold value. If any of the maximum first derivative values is larger than the predetermined threshold value, then the unloaded row of smoothed range data (from output port of the three row FIFO) is labeled as containing object data, and is loaded into the input port of the FIFO-type Object-related Data Buffer (ODB), also referred to as the "f" Buffer, for future use. Otherwise, the unloaded row of smoothed range data from the three row FIFO is labeled as containing background data and is loaded into the input port of the FIFO-type Background Data Buffer (BDB), and possibly also the ODB, for future use, This concludes the preprocessing operations performed on the input stream of range data from the conveyor belt. The subsequent steps form part of the Dimension Extraction stage of the image data processing method of the present invention.

As indicated at Blocks F through H in FIG. 20B, Steps B1 through B3 involves processing rows of smoothed range data in order to derive a 2-D first spatial derivative of the range data map so that 2-D contour tracing can be reliably performed on this spatial derivative data, and the indices m and n associated with corner points of the scanned package found. These data processing operations are further described in the algorithm set forth in FIG. 22.

As indicated at Block F in FIG. 20B, Step B1 involves computing, at each processing cycle and for each column position in the rows of background data in the BDB (referenced by index m), the "median value" based on the current rows of background data buffered therein. This computational operation is indicated in the first line of Block B in FIG. 22.

As indicated at Block G in FIG. 20B Step B2 involves subtracting, at each processing cycle and for each row of object-related data in the ODB, the precomputed median value (BG) from the corresponding range value (f=X), so as to produce a difference value (X−BG) for each of the 256 column positions in corresponding row of object-related data being buffered in the ODB (also indicated as the "f buffer"), thereby producing a vertical first discrete derivative thereof (having a column length M=256). This computational operation is indicated in the second line of Block B in FIG. 22.

Figure 22:
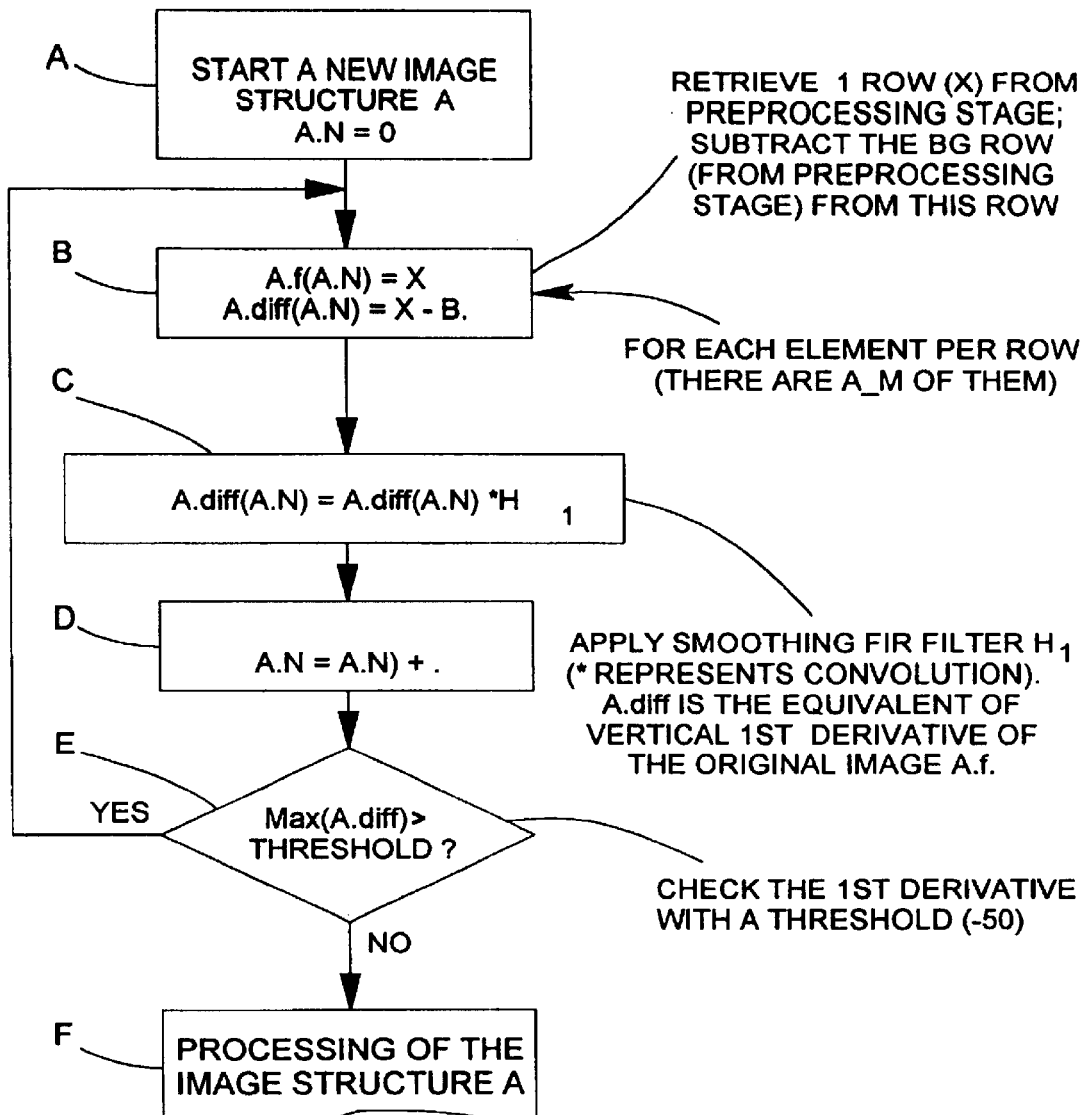
FIG. 22 is a flow chart describing the process of retrieving rows of range data, already preprocessed using smoothing and edge-detection techniques, and computing the first vertical derivative and stores the results in an image structure for further processing, such as contour tracing, etc.

As indicated at Block H in FIG. 20B, Step B3 involves smoothing, at each processing cycle, the computed vertical first discrete derivative. This can be achieved by convolving the same with a 5-tap FIR smoothing filter and truncating the resultant row of smoothed discrete derivative data to length M=256. Thereafter, the row of smoothed discrete derivative data is loaded into the "diff" (i.e. derivative) data buffer having m=256 columns and n=10,000 or more rows (as required by the collected range data map). The output row of discrete derivative data contains object-related data only, and most background noise will be eliminated. This computational operation is indicated at Block C in FIG. 22. As shown therein, this operation is repeated for each row of smoothed range data until the condition set forth in Block D in FIG. 22 is satisfied. When this condition is satisfied, then the control structure underlying the data processing method hereof invokes the contour tracing algorithm set forth in FIG. 22, and described in greater detail hereinbelow.

Figure 21E:
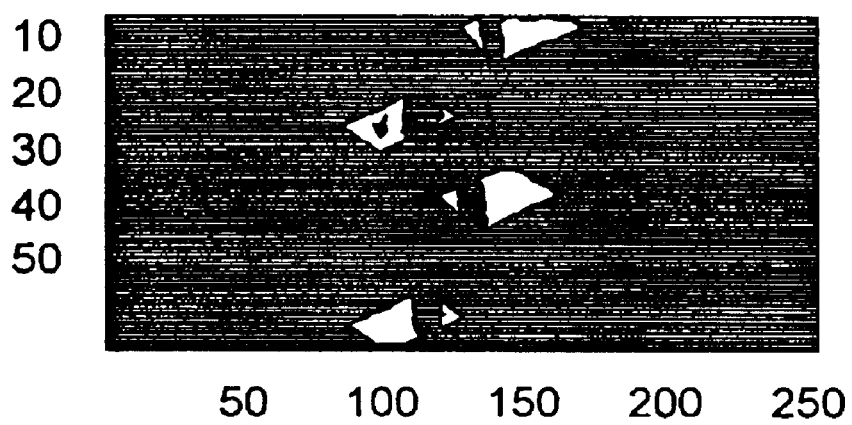
FIG. 21E is a graphical image of a differentiated 2-D range data map from which background data, indicated in FIG. 21D, is subtracted during being processed by the data processing operations specified in Steps B1, B2 and B3 of the flowchart set forth in FIGS. 20A through 20E.

FIG. 21E is a graphical image of a differentiated 2-D range data map from which background data, indicated in FIG. 21D, is subtracted while being processed by the data processing operations specified in Steps B1, B2 and B3 of the flow chart set forth in FIGS. 20A through 20D.

As indicated at Block 1 in FIG. 20B, Step B4 involves performing, at each processing cycle, a 2-D image-based contour tracing operation on the discrete derivative data currently buffered in the diff data buffer in order to produce an array of m,n contour points in M-N Space (and corresponding to x,y contour points in X-Y Cartesian Space). The contour tracing algorithm set forth in FIG. 22 can be used to carry out this step of the data processing method hereof. The array of contour points m,n produced by the algorithm will correspond to the sides of the polygonal object embodied in the rows of object data currently buffered within the Object Data Buffer, and the output data set produced from this step of the method contains extraneous corner points which need to be removed from the produced array of contour points.

Figure 22A:
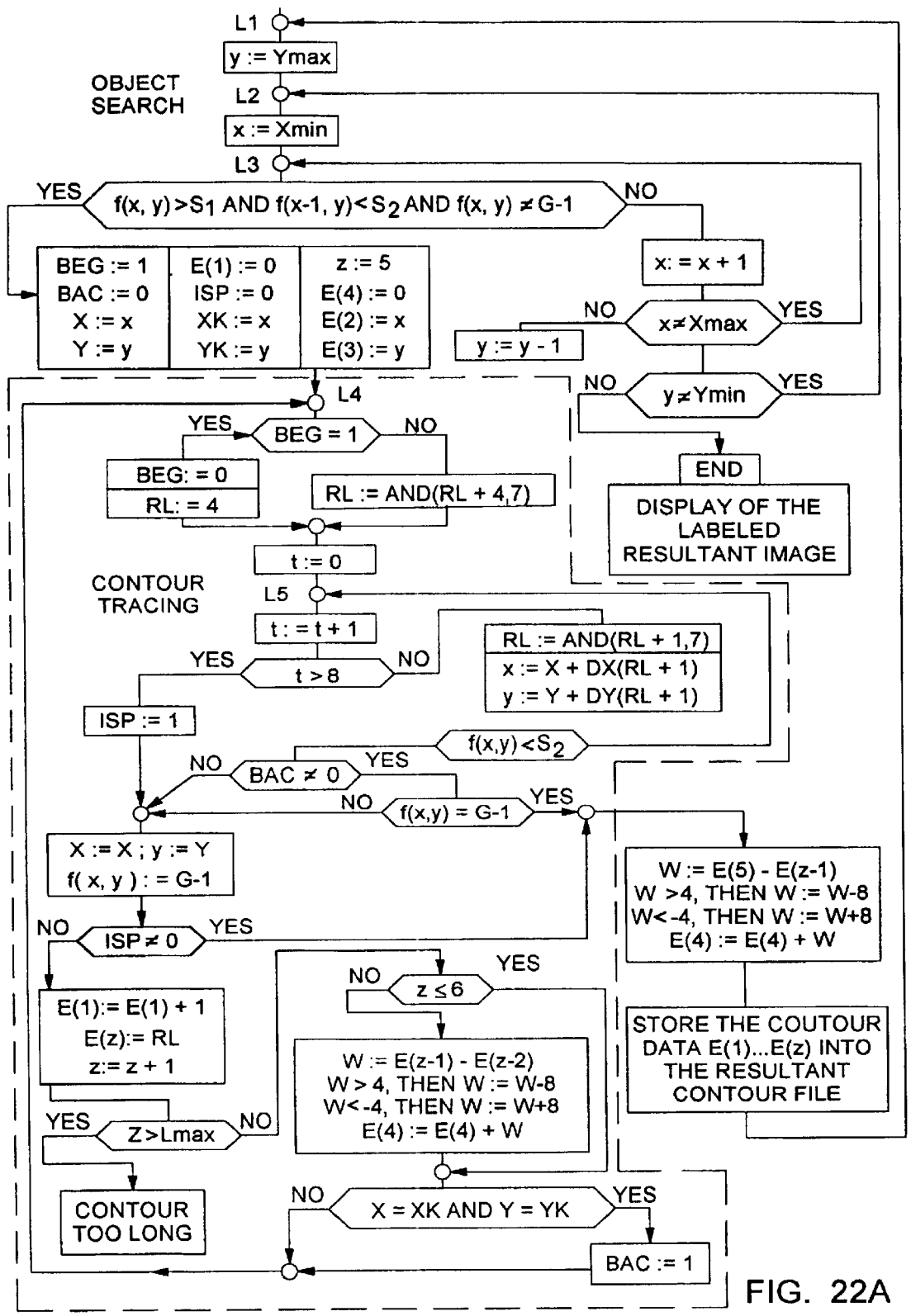
FIG. 22A is a flow chart describing the steps carried out by the contour tracing program employed in the LADAR-based imaging, detecting and dimensioning subsystem of the present invention.

The program set forth in FIG. 22A traces contours of objects in a bilevel image. It stores the encoded contours (Freeman code) into a file. This program could also be extended to an image-to-image transformation, e.g. by computing geometrical features (convex hull, diameter etc.) for these contours and by visualizing these features. These possible extensions are not introduced here, because this would require the development of a composite program taking account of too many different geometrical features.

The program of FIG. 22A performs a complete object search in the input image (i.e. the diff. Of the 2-D range map). If there are several objects (i.e. 8-components), then the program finds all of them, and it computes the contour codes of all objects. The input image can also be a gray value image, as would the case in many package scanning environments. In this case, a global threshold discriminates between object points (gray value higher than the threshold) and background points (gray value lower or equal than the threshold). The resultant file of encoded contours allows an error-free reconstruction of the bilevel input image.

The contour encoding algorithm is a fundamental procedure. It is often used in the context of shape analysis, of geometrical feature extraction of data-reducing image code generation, or of geometrical transformations of bilevel images. Contour codes have the advantage that geometrical features of the object can be computed by means of numerical manipulations of the contour code chain, sometimes just based on simple syntax rules. Algorithms on contour code chains are verv time-efficient in general, and they do not need access to the image data. A contour code chain allows an exact reconstruction of the object.

The whole process of contour code determination consists of two phases: object finding, and contour tracing. The First phase searches the image line-by-line until a reliable initial point of the next object is found. The second phase traces the contour of this object, and stores the resultant code sequence into a file. Both phases alternate during the whole process until all objects are encoded.

Details on the operation of the contour tracing algorithm, set forth in FIG. 22A, provided in the textbook "HANDBOOK OF IMAGE PROCESSING OPERATORS" (1996) by R. Kletpe and P. Zamperoni, published by John Wiley and Sons, incorporated herein by reference.

As indicated at Blocks J through M in FIG. 20C, Steps B5 through B8 involves processing the m and n indices associated with the traced contours generated in Step B4, so as to find the m and n indices of those corner points which qualify as "break points" and thus possibly corresponding to the corners of the scanned package.

As indicated at Block J in FIG. 20C, Step B5 involves storing, at each processing cycle, the m and n indices (associated with the corner points of the traced contours) in the x-boundary and y-boundary buffers, respectively. Notably, the length of the X-boundary buffer is M=256, and the length of the y-boundary buffer is also M=256. This computational operation is indicated at Block A in FIG. 23.

As indicated at Block K in FIG. 20C, Step B6 involves detecting, at each processing cycle, the m indices associated with "corner points" in the traced contour. This step can be achieved by convolving the current discrete data set stored in the x-boundary buffer (of length M=256) with the 11-tap FIR filter (i.e. low-pass 1st differentiator) and storing the resultant discrete m indice data set in the x-temp-array. This computational operation is indicated at Block B in FIG. 23.

Figure 23:
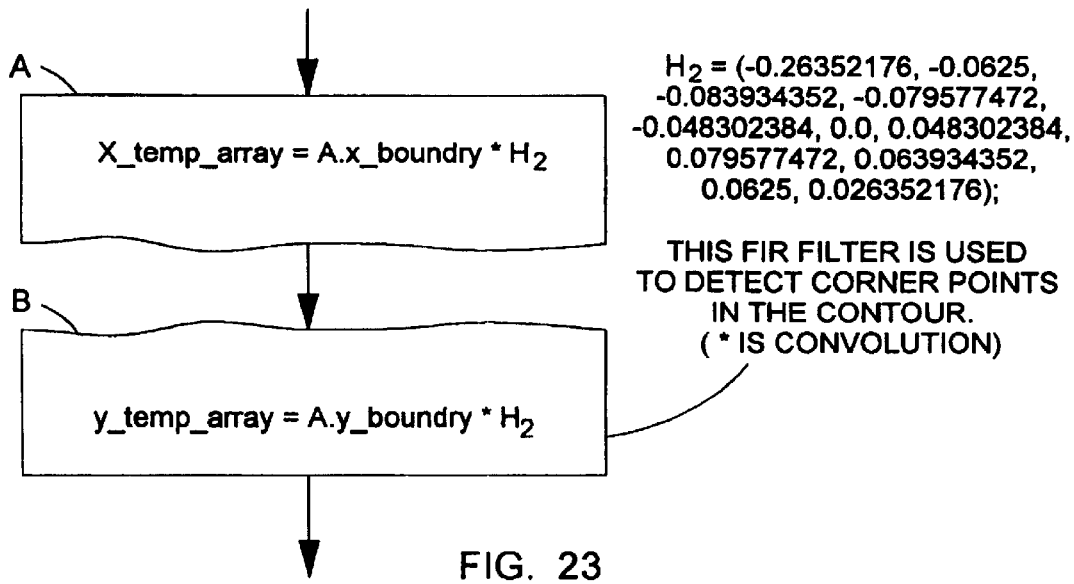
FIG. 23 is a flow chart describing the operations carried out during Step B6 and B7 of the flow chart set forth in FIGS. 20A through 20D.

FIG. 23 is a flow chart describing the operations carried out during Step B6 and B7 of the flow chart set forth in FIGS. 20A through 20D.

As indicated at Block L in FIG. 20C, Step B7 involves detecting, at each processing cycle, the n indices associated with the "corner points" in the traced contours. This step can be achieved by convolving the discrete data set stored in the y-boundary buffer (of length N) with the an 11-tap FIR digital filter (i.e. low-pass 1st differentiator) and then storing the resultant discrete n indice data set in the y-temp-array. This computational operation is indicated at Block B in FIG. 24.

Figure 24:
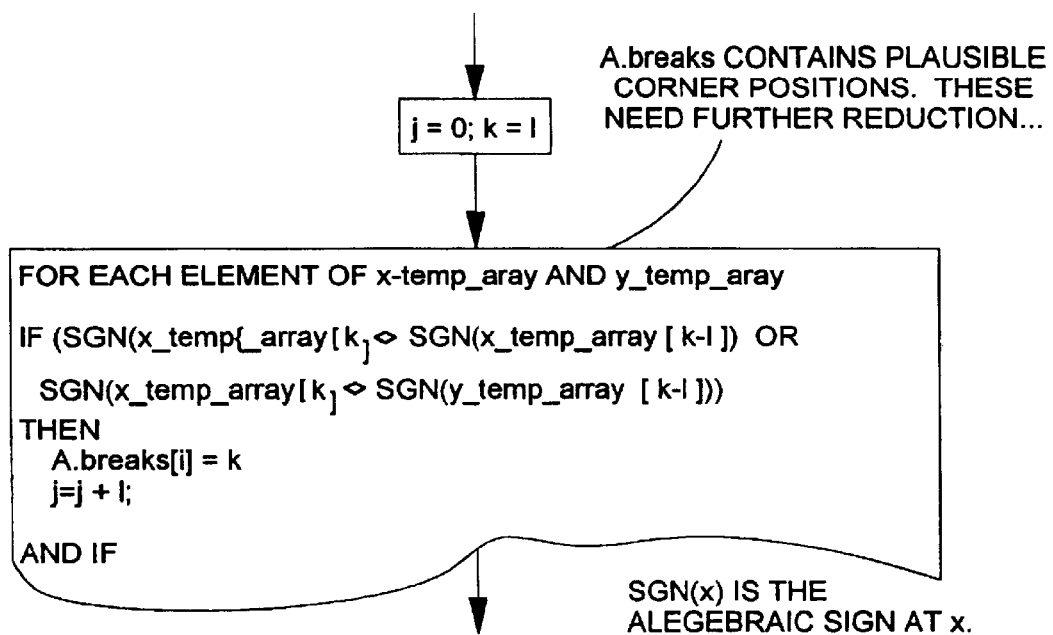
FIG. 24 is a flow chart describing the operations carried out during Steps B6 and B7 of the flow chart set forth in FIGS. 20A through 20E.

FIG. 24 is a flow chart describing the operations carried out during Steps B6 and B7 of the flow chart set forth in FIGS. 20A through 20D.

As indicated at Block M in FIG. 20C, Step B8 involves finding, at each processing cycle, the "break points" among the detected corner indices stored in the x-temp-array and y-temp-arrays, and buffering the m and n indices associated with these break points in the breaks buffer. In essence, the algorithm set forth in FIG. 24 first determines which m indices in the x_temp_array undergoes a "first derivative" zero-crossing, and then determines which n indices in the y_temp_array undergoes a "first derivative" zero-crossing. Any point along the traced contour having an m or n index (i.e. coordinate) with a zero value, indicating a range peak at the corresponding indices, is deemed to be a "break" point along the traced contour. A break point can be thought of as a location where the traced contour experiences a spatial discontinuity, corresponding to a possible corner point associated with the scanned package.

As indicated at Block N in FIG. 20D, Step B9 involves performing, at each processing cycle, linear curve fitting between every two consecutive break points stored in the breaks buffer, in order to produce a single line representation thereof. Each line constitutes a side of a polygon representation of the object embodied within the structure of the range data map buffered in the ODB (i.e. "f data buffer"). For every two consecutive sides of the polygon representation, the intersection point is determined, and deemed a corner vertex of the polygon.

Figure 25:
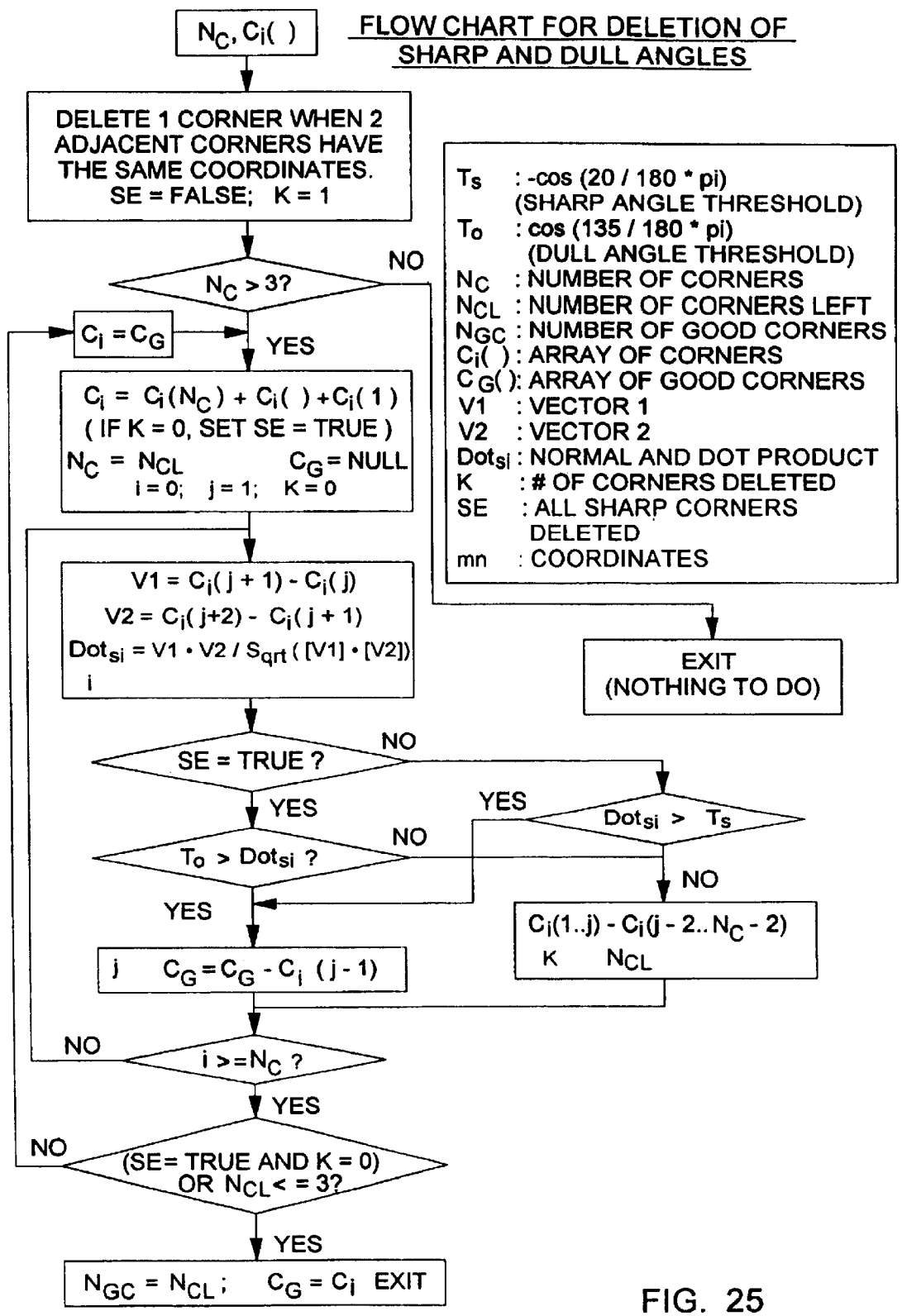
FIG. 25 is a flow chart describing the operations carried out during Step B10 of the flow chart set forth in FIGS. 20A through 20E.
Figure 26A:
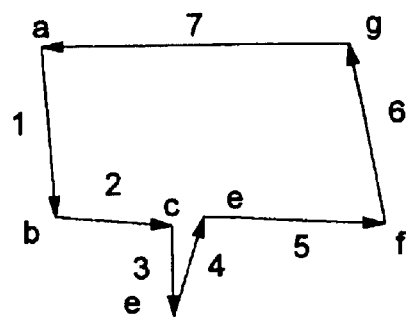
FIGS. 26A through 26D set forth polygonal contours of the type traced during Step B9, having corner points which are reduced using the algorithm set forth in FIG. 25.
Figure 26B:
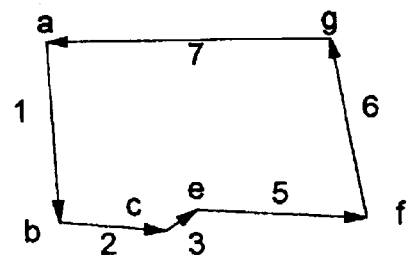
Figure 26C:
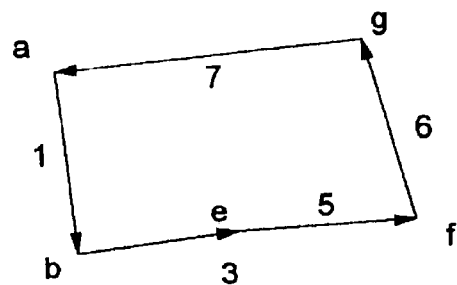
Figure 26D:
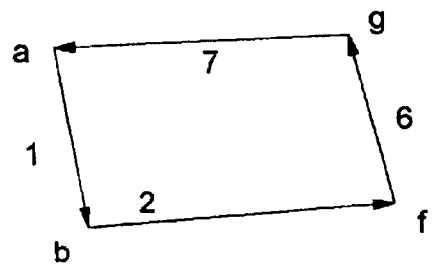

FIGS. 26A through 26D set forth polygonal contours of the type traced during Step B9, having corner points which are reduced using the algorithm set forth in FIG. 25.

As indicated at Block O in FIG. 20D, Step B10 involves at each processing cycle, reducing the corner vertices once all corner coordinates (vertices) have been obtained. This step can be carried out using the Sharp/Dull Angle Elimination algorithm and close corner elimination operators, set forth in FIG. 25. Typically, the final result is a set of m and n indices corresponding to the x and y coordinates associated with the four corners coordinates of a cubic box, which set is thereafter stored in a corner coordinate (or indice) array.

FIG. 25 is a flow chart describing the operations carried out during Step B10 of the flow chart set forth in FIGS. 20A through 20D). This algorithm eliminate wrong corners produced by the LADAR-based subsystem hereof. Vertex deletion is done is 2 stages where vertexes with too sharp an angle are deleted in the first. The following, second, stage deletes dull vertexes.

FIG. 15D1 is an example of an output representing a rectangle with three erroneous corners caused by noise. The goal of the algorithm is to combine lines '2', '3', '4', and '5' into a single line, therefore vertexes 'c', 'd', and 'e' have to be eliminated. The first stage searches vertexes 'a' to 'g' and eliminates any sharp ones. Vertex 'd' is deleted in the first round and the polygon would look like the one in FIG. 26C1. A second round turns out no sharp angles and stage 1 is completed.

The second stage of the algorithm again searches vertexes 'a' to 'g' and eliminates any dull ones. First, vertex 'c' is deleted, then 'e'. The polygon transformed from FIG. 26C1 to FIG. 26C then to FIG. 26D4. A second round in stage 2 also turns out nothing and the algorithm yields the polygon in FIG. 26D.

As indicated at Block P in FIG. 20D, Step B11 involves computing the average range value of the contour points currently buffered in the ODB so as to provide an average height value for the box, and then, for each corner point in the corner coordinate array use the computed average range value to compute the z coordinate corresponding thereto, and referenced with respect to the global coordinate frame of reference.

Figure 27:
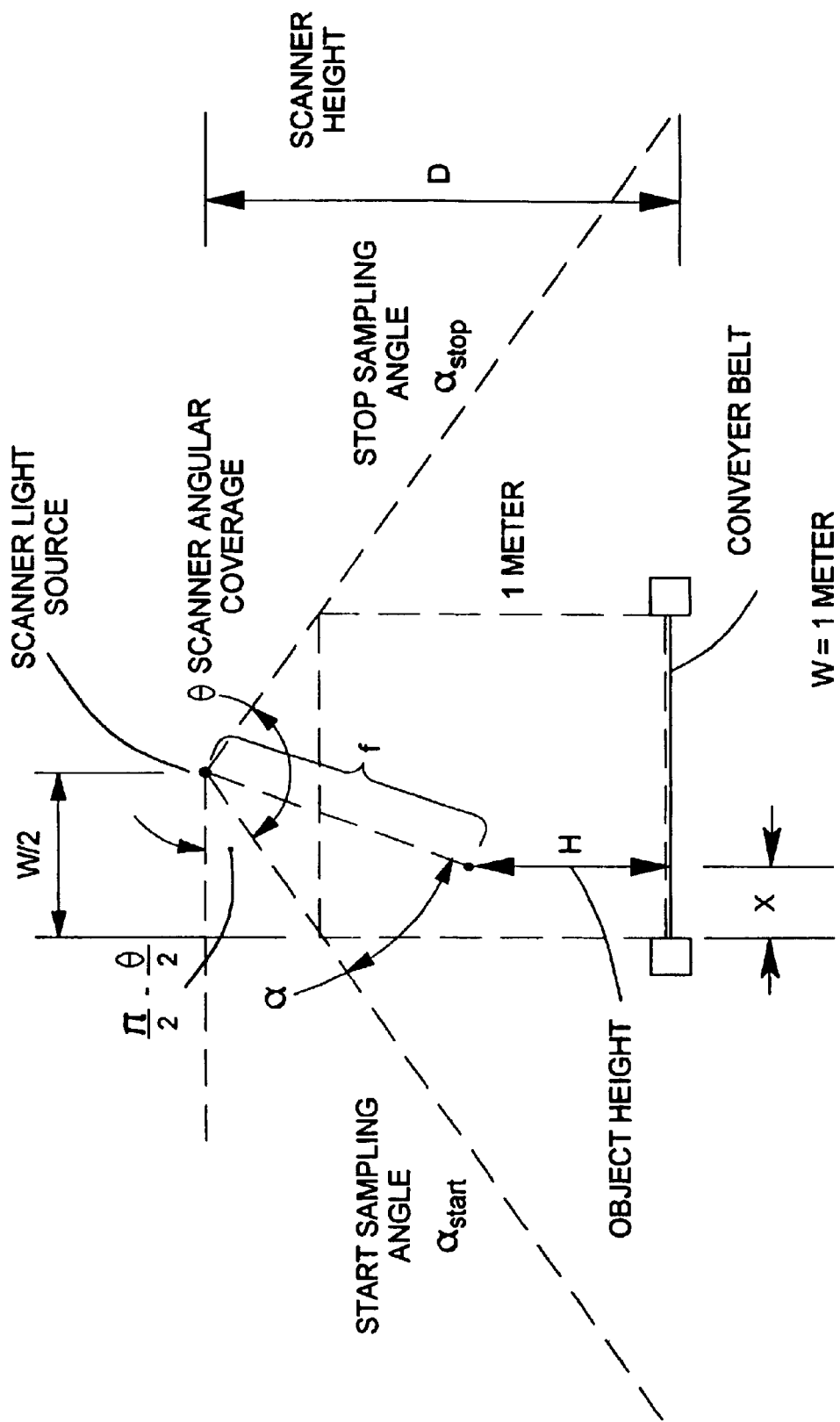
FIG. 27 is a schematic representation of the LADAR-based subsystem of the present invention, illustrating the geometrical transformation between the polar coordinate reference system embedded therewithin and the height of a package scanned thereby defined relative to the Cartesian coordinate reference system symbolically embedded within the unitary package identification and dimensioning system of the present invention.

Having determined the (m,n) indices corresponding to the corner points of the scanned package, and the average height of the scanned package, the data processing method hereof then proceeds to compute corresponding x and y coordinates for each such set of corner indices using geometric transformations. As shown in FIG. 27, these geometric transformation can be schematically represented in the "polar-coordinate" based geometrical representation of the LADAR-based imaging, detecting and dimensioning subsystem of the present invention.

In particular, as indicated at Block Q in FIG. 20D, Step B12 involves computing the x and y coordinates associated with each corner point currently buffered in the corner coordinate array and specified by indices m and n. Coordinates x and y are referenced with respect to the global coordinate frame. Mathematical expressions for computing these parameters, within geometric transformations implicitly embodied therewithin, can be derived using the geometrical model set forth in FIG. 15D.

According to the geometrical model shown in FIG. 15D, every point scanned by the AM laser beam of the LADAR-based subsystem hereof can be specified a position vector defined within a polar coordinate system embodied therewithin, as shown. Each position vector can be represented by (R, α), where R is the magnitude of the distance from the light source/scanner (e.g. polygonal or holographic scanning element) to the point on the scanned object, and α is the angle of the position vector emanating from the start of scan point, as reference in FIG. 15D, and where the SOS pulse photodetector 3352A in FIG. 15A is located. The value R is obtained through the phase detection output from A/D conversion circuit 3348. The value α is obtained from the sampling set up, using the SOS pulse generator 3352, shown in FIG. 15A. For example, if a total of M points were sampled at a constant interval from the start of scanning line to the stop scanning line, as shown in FIG. 15D, and the point in question in the m$^{th}$ sampling, then α=m/M.

In view of the fact that the polar-coordinate based LADAR unit hereof 3501 and 3502 produces accurately measured values for parameters (R, α, m), the data processing method hereof must employ a geometric transformation between (R, α, m) and (H, x, y), Cartesian coordinate parameters referenced relative to the global coordinate reference employed by the greater system for package data tracking operations and the like. A suitable geometrical transformation for (R, α, m) . . . (H, x, y) is set forth below.

The first parameter in (H, x, y), namely "H", the height of the scanned object (e.g. package), can be computed using the formula:

$$H=D-R\ Sin(\pi/2-\theta/2+\alpha)$$

The second parameter in (H, x, y), namely "x", the position of the sampling point with respect to the edge of the conveyor belt can then be computed using the formula:

$$x=w/2-R\ Cos(\pi/2-/2+\alpha)$$

assuming the LADAR-based unit is mounted at the center of the conveyor belt (i.e. at w/2).

Finally, the third parameter in (H, x, y), namely "y", the coordinate along the belt's travelling direction, can be computed using the following formula:

$$y=m.v$$

where υ is the velocity from the tachometer (3803).

As indicated at Block R in FIG. 20D, Step B13 involves computing the surface area of the object represented by the contours currently represented in the contour buffer, using the m,n coordinates associated with the corner vertices m and n currently buffered in the corner coordinate array.

Figure 28:
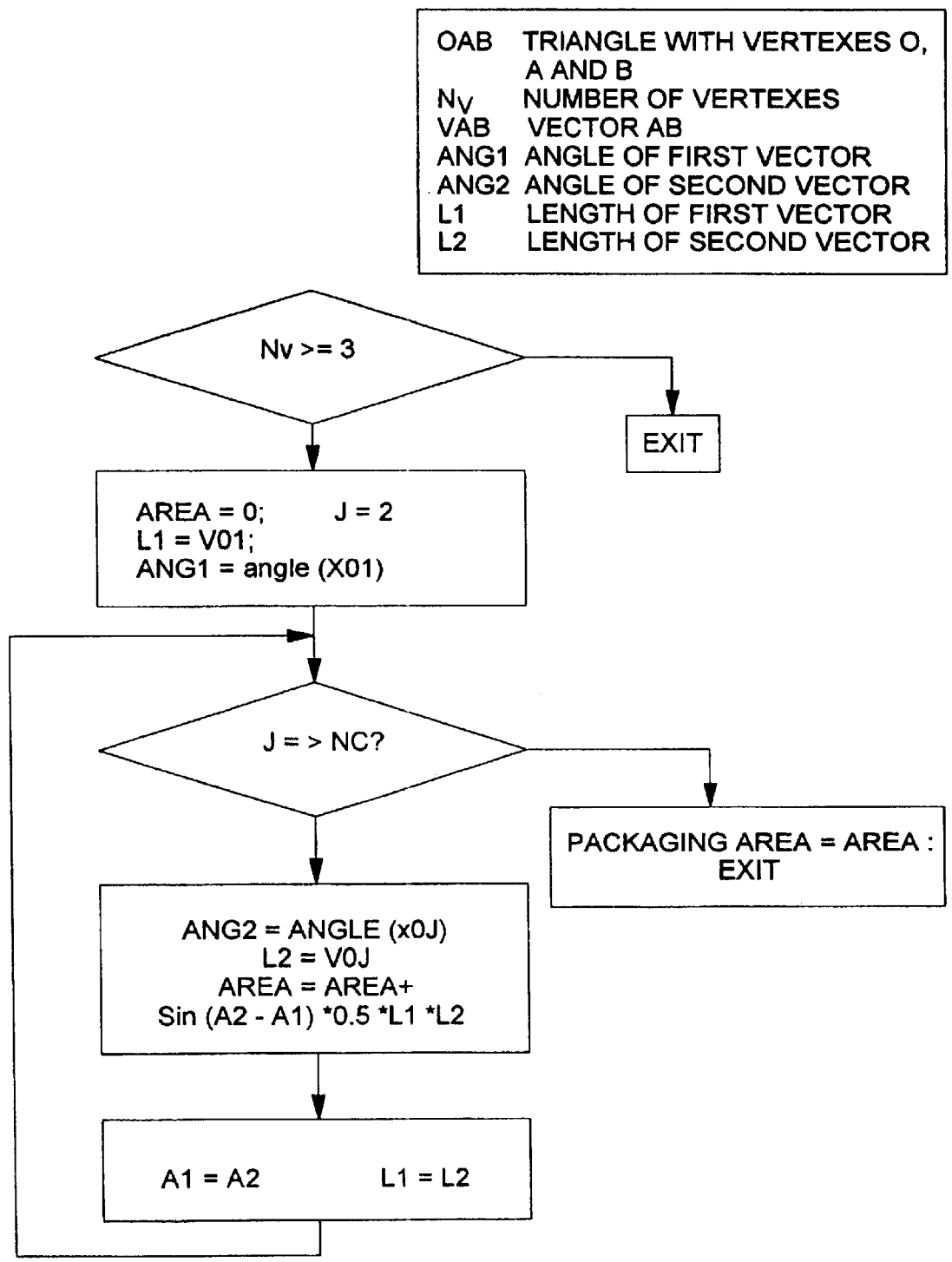
FIG. 28 is a flow chart describing the surface computation operations carried out during Step B13 of the flow chart set forth in FIGS. 20A through 20E.

The algorithm set forth in FIG. 28 sets forth surface computation operations which can be carried out during Step B13 of the flow chart set forth in FIGS. 20A through 20D. FIGS. 29A and 29B set forth polygonal contours which illustrate the method of package surface area computation carried out during Step B13 of the flow chart set forth in FIGS. 20A through 20D.

The algorithm shown in FIG. 28 computes the area of the polygon-shaped package by summing the areas of the triangles that made up the polygon. For example, the polygon shown in FIG. 29A is made up of 5 triangles. The area 012, 023, 034, and 056 are positive and is negative for 045. In order to determine the polarity of the triangle (OAB)'s area, angles of the 2 vectors OA and OB need to be computed. If the angle of OB is bigger than OA, the area is positive, otherwise negative. The package's area will be the absolute value of the above sum.

As indicated at Block S in FIG. 20D, Step B14 involves outputting, for the geometrically represented object (which has been scanned and data-sampled), the computed surface area, height, and corner x,y coordinates thereof, referenced with respect to the global coordinate reference frame.

In summary, the LADAR-based imaging and profiling subsystem of the present invention is capable of performing two distinct functions: by analyzing the phase difference between the transmitted AM laser beam, and the received (i.e. return) AM laser bean, the subsystem can geometrically profile virtually any object that is passed; also, by analyzing the magnitude of the return AM laser beam, the subsystem can generate a video image of the object (e.g. box or package or whatever) that is moved across the transmitted AM laser beam.

In alternative embodiments, it would be desirable to use blue VLDs with a characteristic wavelength of about 405 nm (now commercially available from Nichia, of Japan), in order to generate the AM laser beam having a high resolution and long DOF. This would enable the LADAR-based imaging and profiling subsystem hereof to capture fairly high resolution images of scanned objects and thus read 1D and 2D bar code symbols embodied in the structure thereof, and thus be successfully decoded. Also, by providing mechanisms for causing the AM laser beam to be locally "dithered" about a reference direction, it should be possible to produce high density raster scanning patterns for read labels bearing text and the like using OCR techniques, well known in the art. Furthermore, the LADAR-based imaging and profiling subsystem of the present invention can be used in systems, wherein the AM laser beam produced therefrom is used to locate the label (e.g. text or bar code symbol label), while a high speed rastered laser beam is steered to the located label and aggressively scanned therewith in order to read the label.

Having described the general method of package dimensioning, it is now appropriate to discuss a more specialized version involving the use of a dual-beam method of velocity computation that is nested within the package dimension computation method at Block CC.

As indicated at Blocks AA1 and AA2 in FIG. 30, the specialized method using an integrated technique of package velocity computation (requiring the use of dual angularly-separated AM laser beams) involves the image processing computer 3356 in FIG. 15 performing steps A1 through B10 in FIGS. 18 through 20D for raw data colllected from laser beams Nos. 1 and 2, and then buffer the resulting "corner coordinate array" data sets in seperate buffers (beam buffer No. 1 and beam buffer No. 2). Then, at Block CC, the computer computes the velocity of the package (v) by analysing the corner coordinate array data sets buffered in buffers Nos. 1 and 2, in accordance with the computational method illustrated in FIG. 31, and supporting schematics set forth in FIGS. 32 through 32B. Then, after having computed the velocity measure at Block CC, the image processing computer 3356 proceeds to Blocks DD1 and DD2 to perform steps B11 through B12 to obtain the packages's surface area, length, width height and vertice coordinates, based on information collected from the different AM laser beams. At Block EE, the dimension data results can be combined using various criteria to provide a final package dimension data set.

Figures 33A, 33B:
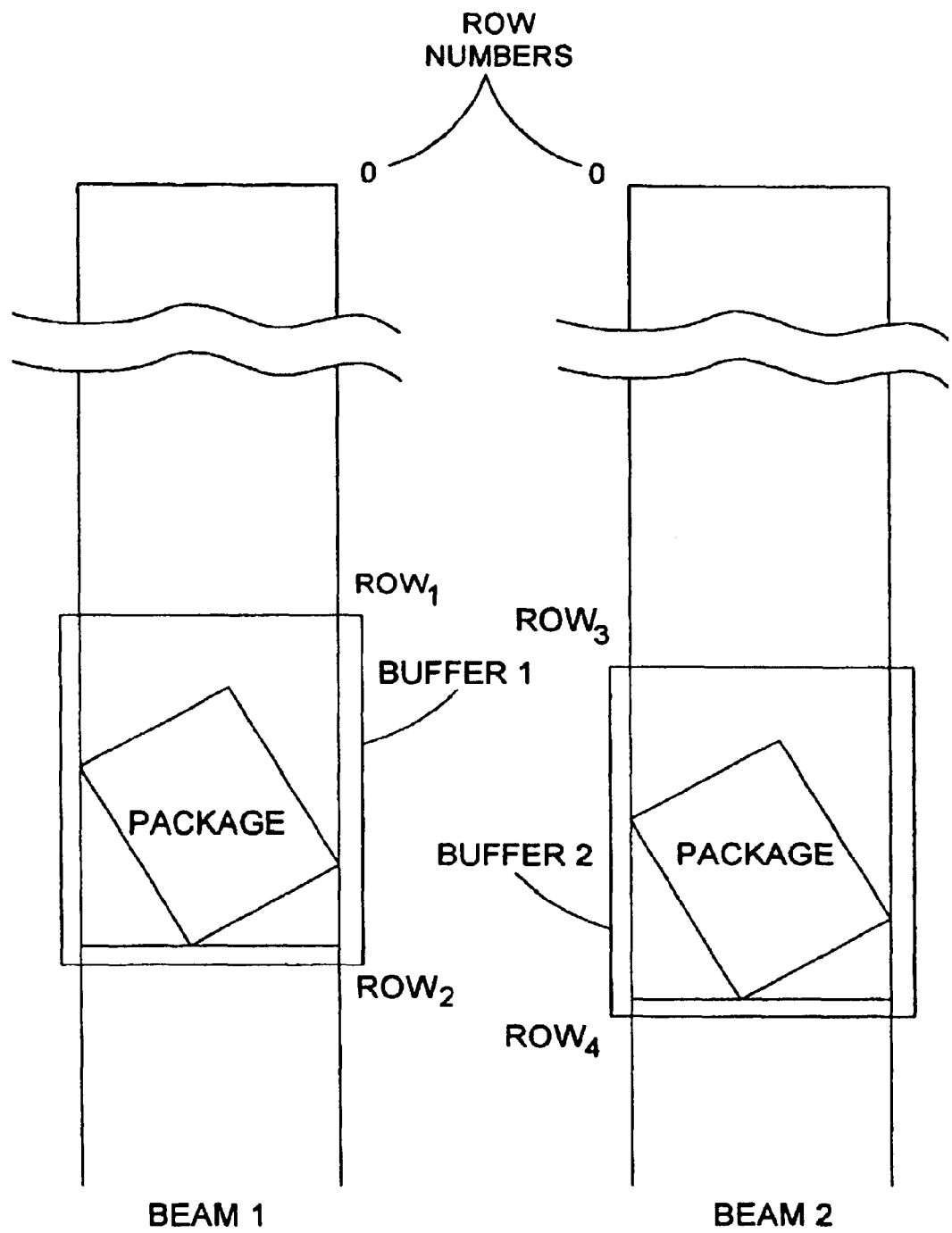
FIG. 33A is a schematic representation of the package-in-the-tunnel (PITT) indication subsystem shown in FIG. 3 realized using any of the LADAR-based imaging, detecting and dimensioning subsystems depicted in FIGS. 15 through 15K, wherein the extreme portion of one of the amplitude modulated (AM) laser scanning beams produced by the LADAR-based imaging, detecting and dimensioning subsystem is used to generate an object sensing beam is reflected across the width of the conveyor belt of the system, is reflected off a mirror on the opposite side of the conveyor belt, and is detected at a prespecified "time window" and processed in effort to detect the presence or absence of packages being transported along the conveyor belt, for use in confirming/validating the package dimension data generated by the package height/width/length profiling subsystem shown in FIG. 3.
FIG. 33B is a schematic representation of the package-in-the-tunnel (PITT) indication subsystem shown in FIG. 3 realized using any of the LADAR-based imaging, detecting and dimensioning subsystems depicted in FIGS. 16 through 15K, wherein the extreme portion of one of the amplitude modulated (AM) laser scanning beams produced by the LADAR-based imaging, detecting and dimensioning subsystem is used to generate an object sensing beam which is reflected across the width of the conveyor belt of the system, is reflected off a mirror on the opposite side of the conveyor belt, and is then detected at a prespecified "time window" and processed in effort to detect the presence or absence of packages being transported along the conveyor belt, for use in confirming/validating the package dimension data generated by the package height/width/length profiling subsystem shown in FIG. 3.
Figure 33C:
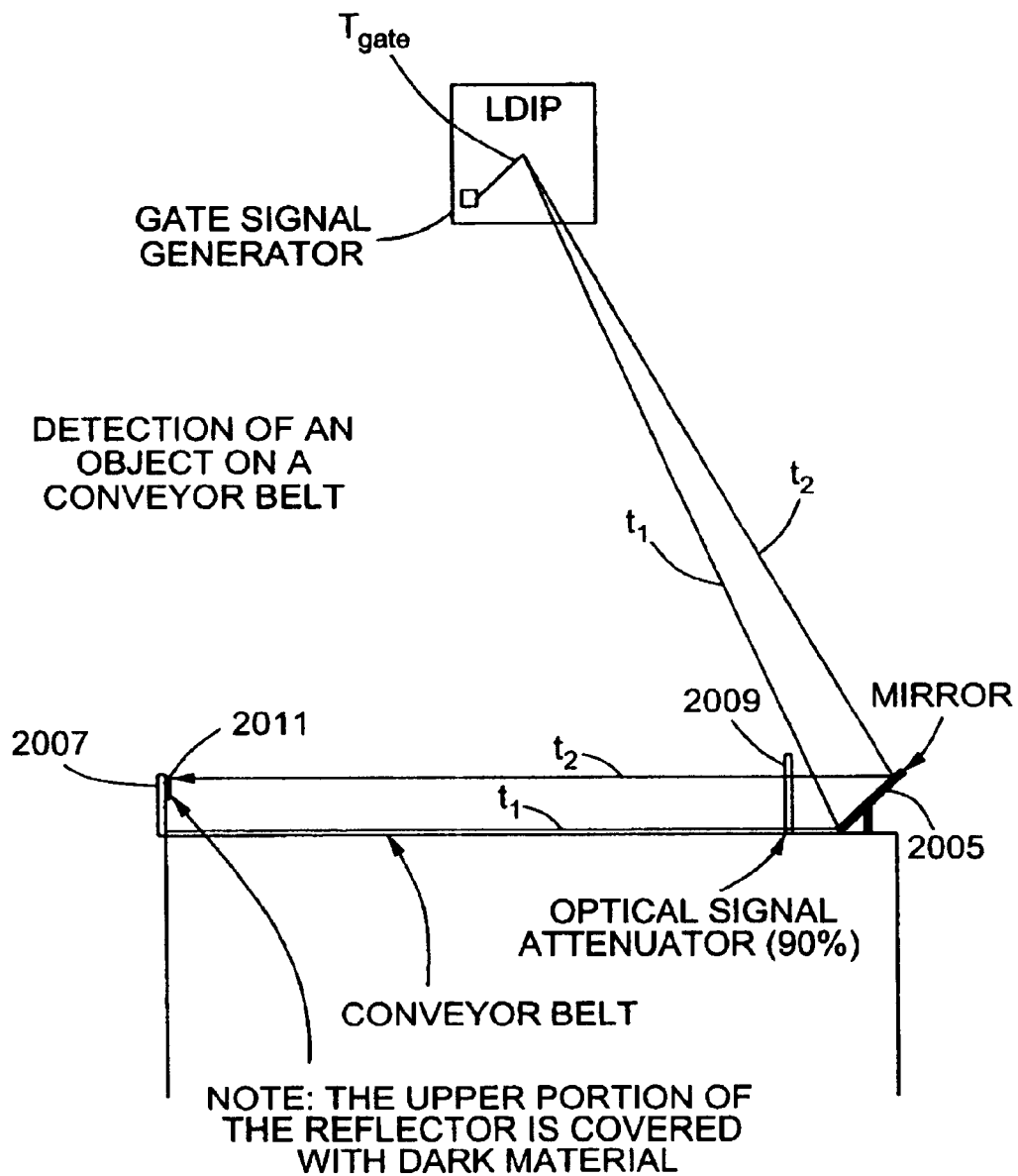
FIG. 33 is a schematic representation specifying particular geometric parameters used in the computation of package velocity according to the dual laser scanning beam method illustrated in FIG. 31.
Figure 33D:
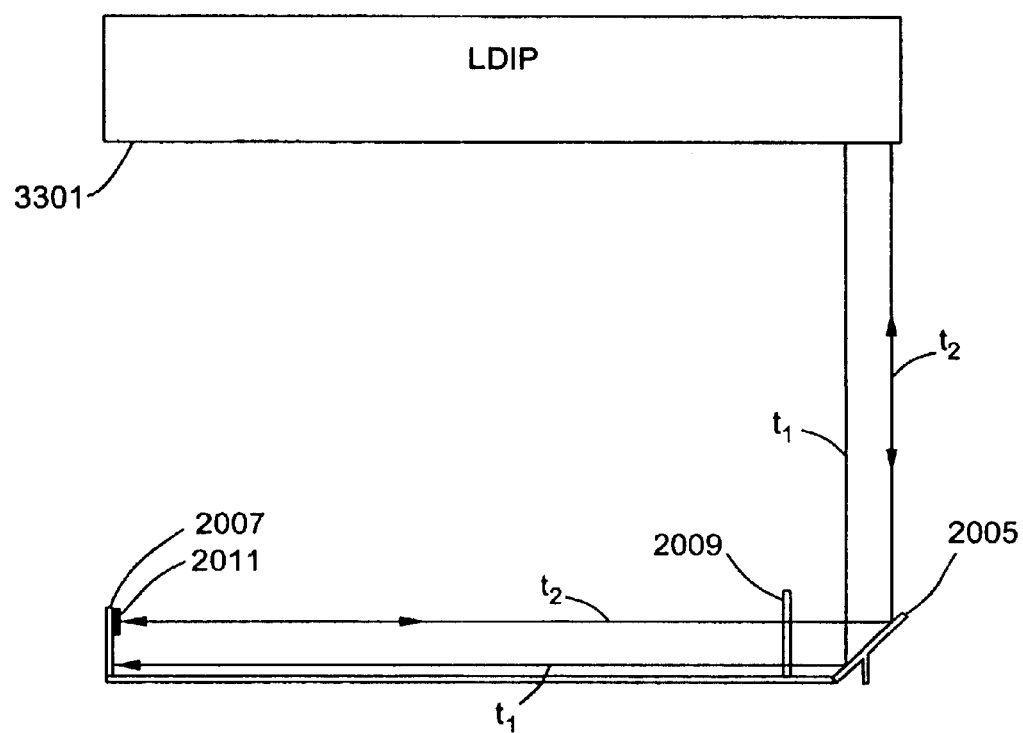

The Package-In-Tunnel Signaling Subsystem to the First Illustrative Embodiment of the Present Invention As shown in FIG. 33A, the package-in-the-tunnel (PITT) indication subsystem shown in FIG. 3 can be realized using any of the LADAR-based imaging, detecting and dimensioning subsystems depicted in FIGS. 15 through 15K, wherein the extreme portion of one of the amplitude modulated (AM) laser scanning beams produced by the LADAR-based imaging, detecting and dimensioning subsystem is used to generate an object sensing beam is reflected off mirror 2005 across the width of the conveyor belt of the system, is reflected off mirror 2007 on the opposite side of the conveyor belt, and is eventually detected at a prespecified "time window" and processed in effort to detect the presence or absence of packages being transported along the conveyor belt. Upon detecting a package into the tunnel, the subsystem 500 then generates a package-out-of-tunnel (POOT) data clement which is provided to subsystem 100 as described hereinbelow. Also, such information can be used to confirm/validate package dimension data generated by the package height/width/length profiling subsystem 600 shown in FIG. 3. In the event that the computed package dimension data does not appear reliable, for whatever reason, then the PIIT indication/signal subsystem 500 can compute the length of the detected package, and provide this information to the package queuing, processing and handling subsystem 1000, as will be described in greater detail below.

As shown in FIG. 33B, the package-in-the-tunnel (PITT) indication subsystem shown in FIG. 3 may also be realized using any of the LADAR-based imaging, detecting and dimensioning subsystems depicted in FIGS. 16 through 15K, wherein the extreme portion of one of the amplitude modulated (AM) laser scanning beams produced by the LADAR-based imaging, detecting and dimensioning subsystem is used to generate an object sensing beam is reflected off mirror 2005 across the width of the conveyor belt of the system, is reflected off mirror 2007 on the opposite side of the conveyor belt, and is eventually detected at a prespecified "time window" and processed in effort to detect the presence or absence of packages being transported along the conveyor belt. Upon detecting a package into the tunnel, the subsystem 500 then generates a package-out-of-tunnel (POOT) data element which is provided to subsystem 100 as described hereinbelow. Also, such information can be used to confirm/validate package dimension data generated by the package height/width/length profiling subsystem 600 shown in FIG. 3. In the event that the computed package dinmension data does not appear reliable, for whatever reason, then the PIIT indication/signal subsystem 500 can compute the length of the detected package, and provide this information to the package queuing, processing and handling subsystem 1000, as will be described in greater detail, below.

Figure 34:
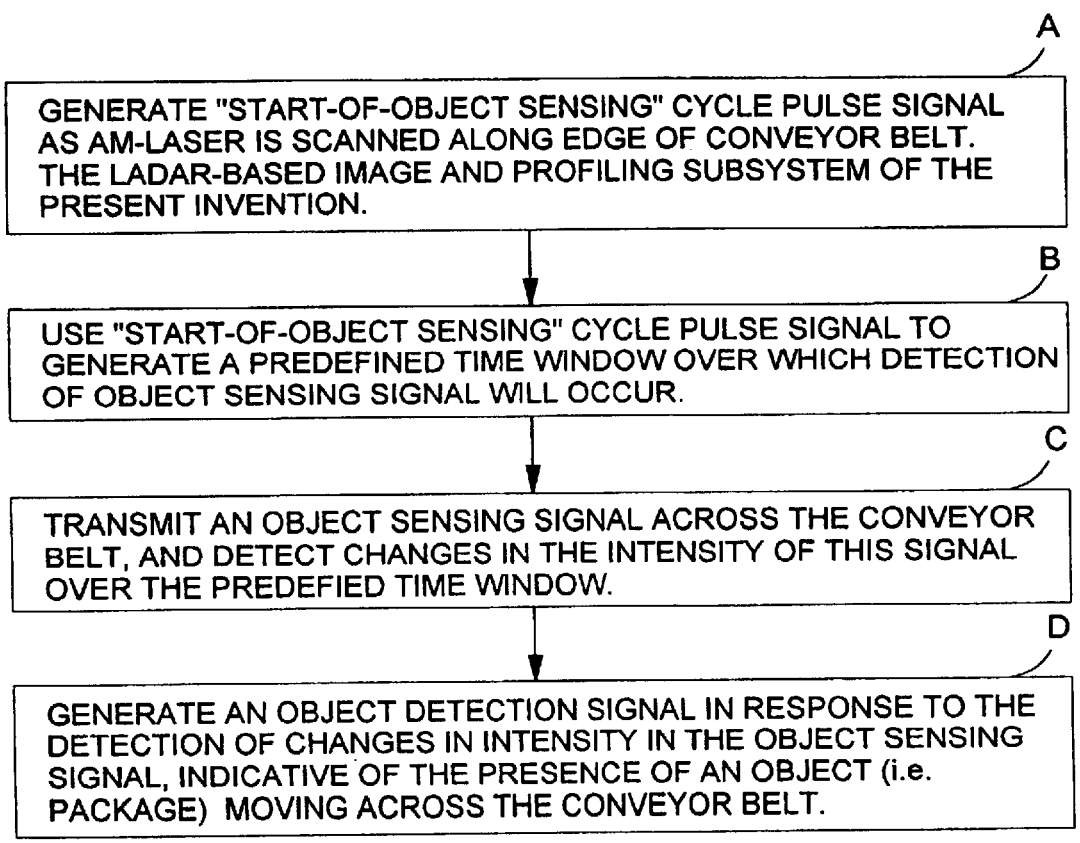
FIG. 34 is a high-level flow chart illustrating the steps involved in carrying out a generalized method of package (i.e. object) detection along a conveyor belt using a portion of the amplitude-modulated laser scanning beam generated by the LADAR-based imaging, detecting, and dimensioning subsystem of the present invention.
Figure 35A:
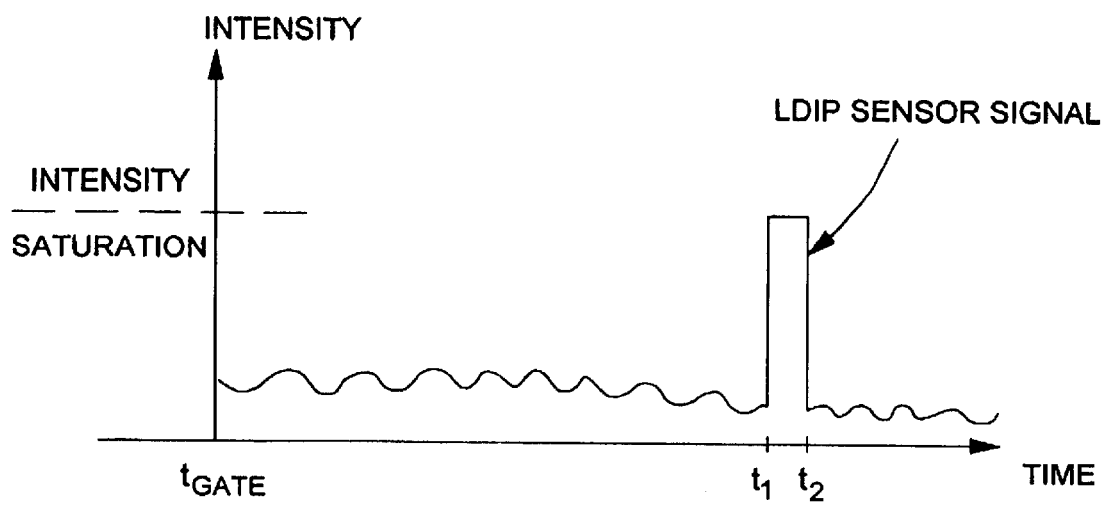
FIG. 35A is a schematic representation showing the time versus intensity characteristics of the object sensing signal generated by reflecting the extreme portion of the laser scanning beam from the LADAR-based system, across the conveyor belt of the system to a partially-absorptive mirror element, back across the conveyor belt and back towards the LADAR-based subsystem for detection and analog signal processing during a prespecified time window referenced against a gate or "start-of-object-sensing cycle" pulse signal generated aboard the LADAR-based subsystem illustrated in FIG. 35A, and having a time duration (i.e. time window) of about 100 milliseconds, as illustrated in FIG. 35B.
Figure 35B:
FIG. 35B is a schematic representation showing the time versus intensity characteristics of the gate or "start-of-object-sensing cycle" pulse signal generated aboard the LADAR-based subsystem when the laser scanning beam is detected by a photosensor located at the extreme end of the scanning window, as shown in FIGS. 15B and 15G, and 16A and 16C.
Figure 35C:
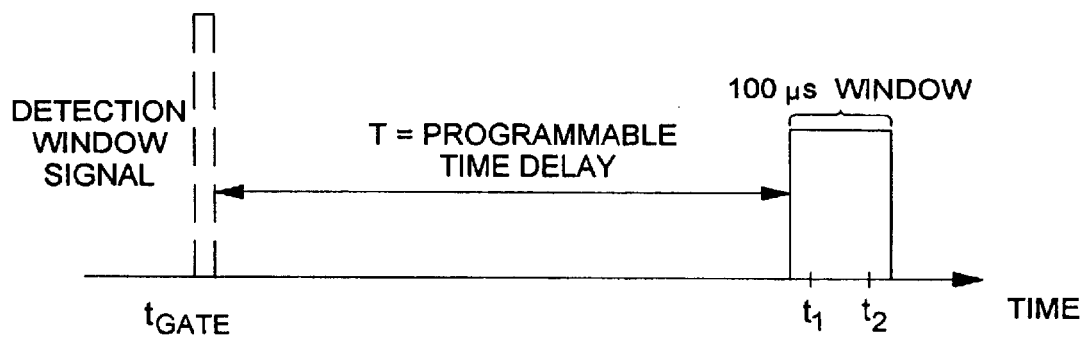
FIG. 35C is a schematic representation showing the time versus intensity characteristics of the time duration or time window over which object sensing signal detection and processing occurs, referenced to the "start-of-object-sensing cycle" pulse signal illustrated in FIG. 35B.

Referring to FIG. 34, there is shown a flow chart describing the major steps associated with a generalized method of package (i.e. object) detection along a conveyor belt using a portion of the amplitude-modulated laser scanning beam generated by the LADAR-based imaging, detecting, and dimensioning subsystem of the present invention. As indicated at Block A in FIG. 34, the method involves generating a SOSC pulse signal as an AM laser scanning beam is scanned along the edge of the conveyor belt by LADAR-based subsystem 3301. As illustrated in FIG. 35B, the SOSC pulse signal is generated by photodetector 335 and pulse generator circuit 335A shown in FIG. 15. As indicated at Block B in FIG. 34, the SOSC pulse signal is used to generate a predefined time-window (e.g. 100 microseconds) over which detection of sensor signal (produced by absorptive strip 2010 shown in FIG. 15A) and depicted in FIG. 35A, will occur. As illustrated in FIG. 35C, the time window signal can be generated in various ways depending on the type of implimentation involved. As indicated at Block C in FIG. 34, the object sensing signal (illustrated in FIG. 35A) is produced and changes in the intensity of returned object sensing signal are detected during the predefined time-window using first derivative signal processing and thresholding techniques in effort to detect either the leading or falling edge of the sensor pulse signal shown in FIG. 35A Finally, as indicated at Block D, an object detection signal is generated in response to detecting the sensor pulse signal within the prespecified time window. For each such output signal generated, a PIIT data element is produced to indicate that an object has entered the scanning tunnel.

FIGS. 36A through 36C describe a software implementation of the PIIT indication subsystem 500 described above and generally illustrated in FIGS. 33A through 33C. FIG. 36A shows a digital representation of an exemplary object sensing signal which has been derived from a selected portion of the AM laser scanning beam generated by the LADAR-based subsystem of the present invention. A time-windowed portion of this signal is digitally processed by a FIR-type digital filter so as to compute a first derivative signal thereof. The output data set is then compared against threshold values to determine whether or not a package is present or absent from the conveyor belt over the time period (i.e. time window) of interest, as required by the package-in-the-tunnel (PITT) indication subsystem shown in FIG. 3, as well as the package height, width and length profiling subsystem of FIG. 3. FIG. 36B provides a schematic representation of the weights (i.e. coefficients) used in the FIR-type digital filter. FIG. 36C shows a digital representation of the output of the FIR digital filter.

Figure 37:
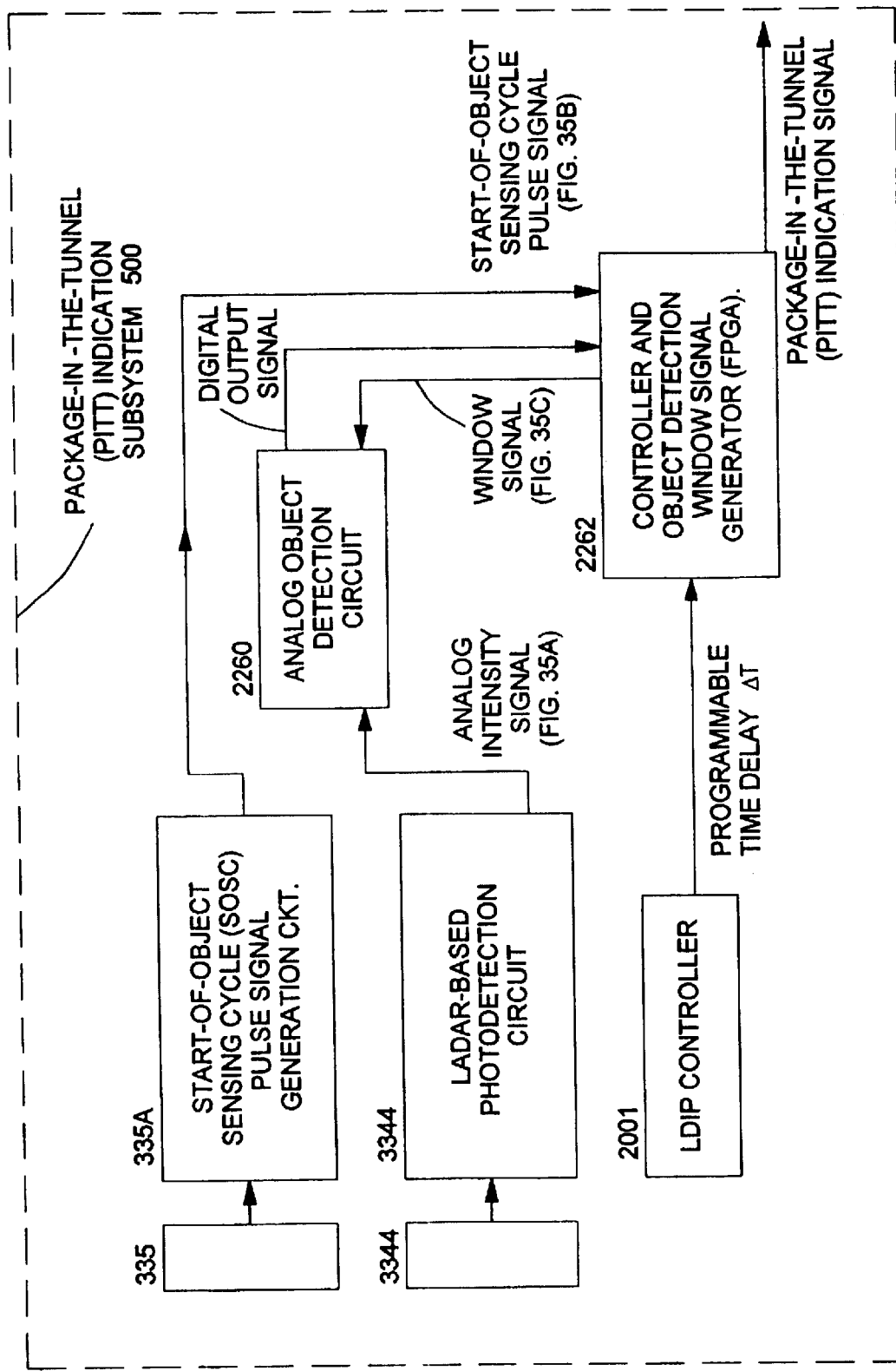
FIG. 37 is a hard-ware implementation of the PITT indication subsystem shown in FIG. 3, based on object sensing techniques involving the use of a selected portion of the AM laser scanning beam produced by the LADAR-based imaging, detecting and dimensioning subsystem of FIG. 3, shown comprising a start-of-object-sensing cycle (SOSC) pulse generation circuit, a LADAR-based photo-detection circuit, an analog object detection circuit, controller circuit with object detection window signal generation capabilities (e.g. realizable using an field programmable gate array (FPGA) device.
Figure 38:
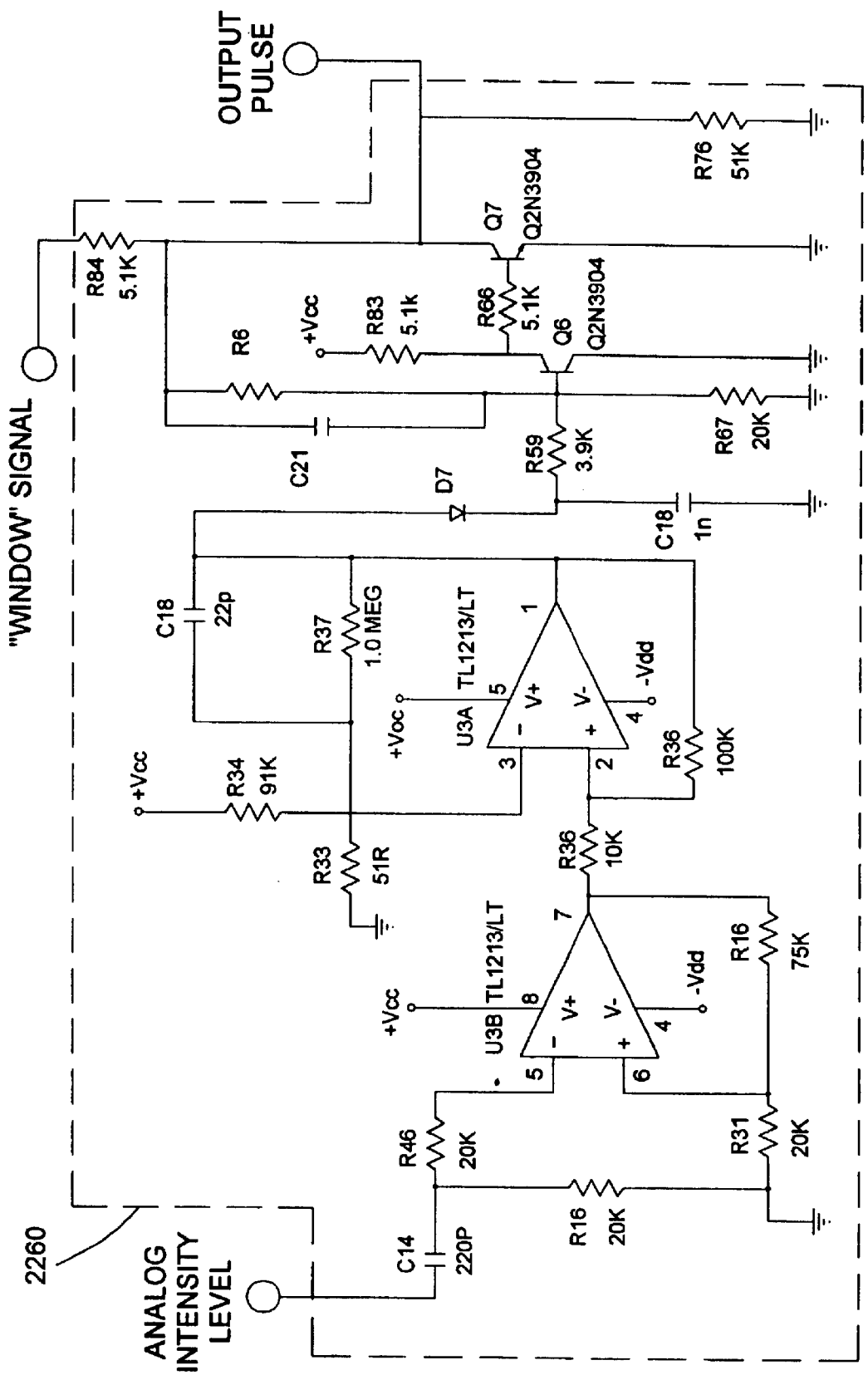
FIG. 38 is an analog circuit implementation of the analog object detection circuit shown in FIG. 37, which performs a first derivative function on the analog intensity varying object sensing signal over a prespecified/controlled time period (i.e. time-window), and thresholds the first derivative signal to determine whether or not a package is present or absent from the conveyor belt over the time-window and generates a digital output signal to indicate the state of such determinations.
Figure 39:
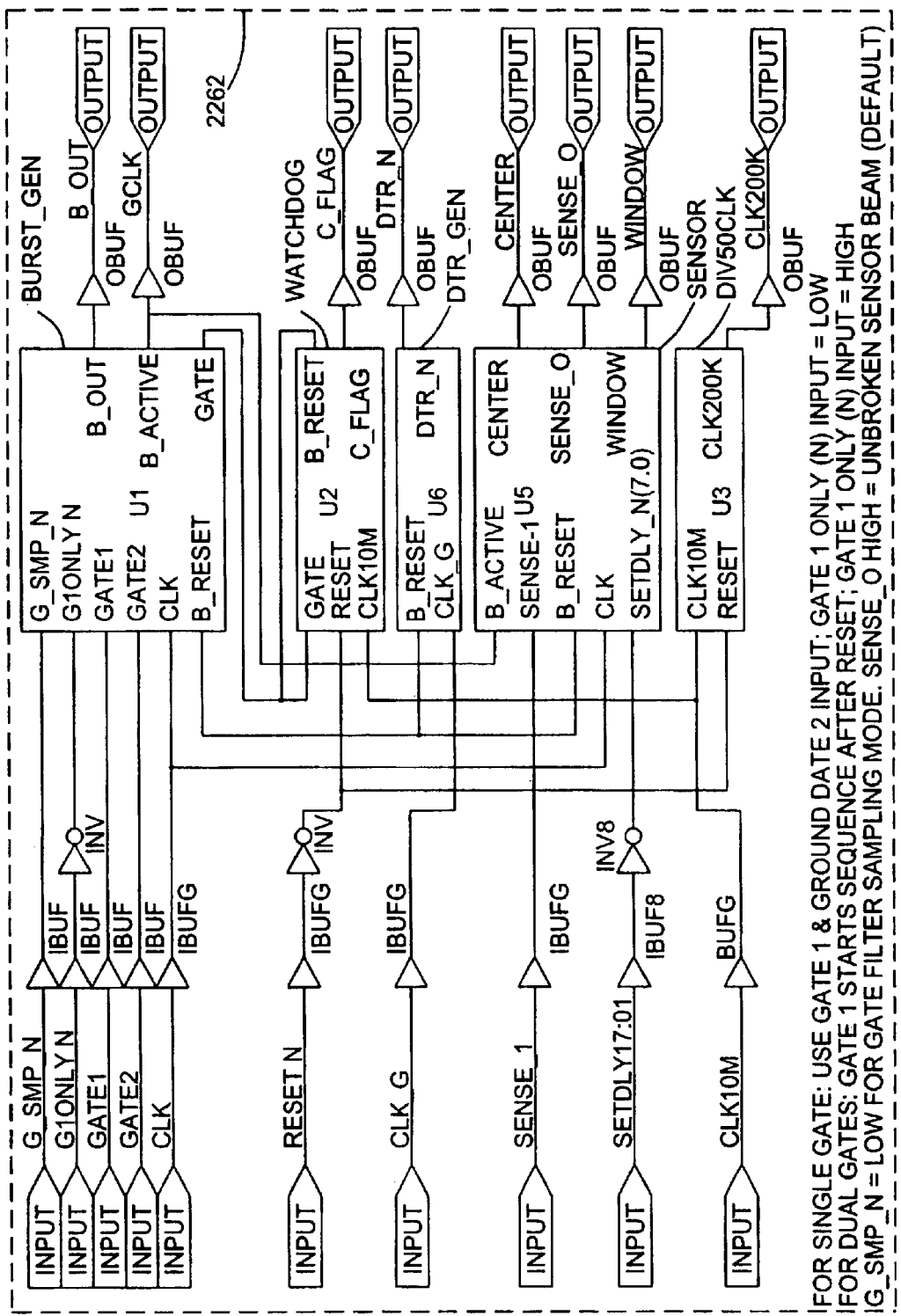
FIG. 39 is a schematic representation of the digital circuit used to realize the controller circuit with object detection window signal generation capabilities shown in FIG. 37.

A hard-ware implementation of the PITT indication subsystem 500 is shown in FIGS. 37 through 39. Like the software based implementation described above, this implementation too is based on object sensing techniques involving the use of a selected portion of the AM laser scanning beam produced by the LADAR-based imaging, detecting and dimensioning subsystem of FIG. 3. As shown in FIG. 37, the PIIT subsystem 500 comprises a number of subcomponents, namely: a start-of-object-sensing cycle (SOSC) pulse generation circuit 335A and photodetector 335; LADAR-based photo-detection circuit 334 and avalanche photodetector 3344; an analog object detection circuit 2260; and controller circuit 2262 (e.g. a programmed field programmable gate array (FPGA) device), having object detection window signal generation capabilities embodied therewithin, as specified by FIGS. 35A through 35C, described above.

An analog circuit implementation of the analog object detection circuit 2260 is shown in FIG. 37. The function of this circuit is to perform a first derivative function on the analog intensity varying object sensing signal (shown in FIG. 35A) over a prespecified/controlled time period (i.e. time-window) (indicated in FIG. 35C), and thresholds the first derivative signal to determine whether or not an package is present or absent from the conveyor belt over the time-window based on the detection of the object sensor signal (shown in FIG. 35A), and generate a digital output signal to indicate the state of such determinations.

The digital circuit implementation of the controller circuit 2262 is shown in FIG. 38. Its functions are to control the sampling of the intensity varying input signal, generating the time-window signals for circuit 2260 (referenced to the SOSC pulse signal input and a programmable time delay parameter provided by LDIP controller 2001. In practice, there are many way in which to realize the generalized method shown in FIGS. 33A through 35C.

The Package-Out-Of The-Tunnel Indication Subsystem of the Illustrative Embodiment of the Present invention In the illustrative embodiment, the POOT indication subsystem 700 is realized as a predictable system in which, time stamped PITT data elements are provided to the POOT system 700 for each package detected as entering the scanning tunnel, and based on the velocity of the package, the LDIP controller 2001 can generate a POOT data element for supply to subsystem 1000 when the corresponding package has predictably travelled to the output point of the scanning tunnel (at the detected velocity) some time delay later.

Alternatively, although less preferred, a LDIP device 3301 or other object sensing device can be mounted at the exit of the scanning tunnel to detected when a package has exited the scanning tunnel and generating a POOT data element each time such an occurrence has been detected.

The In-Motion Package Weighing Subsystem of the First Illustrative Embodiment of the Present Invention As shown in the FIG. 1C and 1D, the in-motion package weighing subsystem 750 is preferably arranged about the package height/width profiling subsystem 600. As shown, the in-motion weighing subsystem 750 comprises: a scale platform integrated with the conveyor subsystem 300, for producing analog or digital weight signals indicative of the weight of a package(s) moving across the scale platform; a filtering circuit for filtering the analog or digital weight signals in order to remove noise components and artifacts therefrom; and a signal processor for processing the filtered weight signals in order to produce a digital word representative of the measured weight of the package. Notably, the in-motion weighing subsystem of the illustrative embodiment can be used to realize using the 9480 EXPRESS-WEIGHT™ In-Motion Variable Box and Package Weighing System from Mettler-Toledo, Inc. of Worthington, Ohio.

The Data Element Queuing, Handling and Processing Subsystem of the First Illustrative Embodiment of the Present Invention In FIGS. 40A and 40B, the structure and function of data element queuing, handling and processing subsystem 1000 is shown in greater detail. As shown in FIGS. 40A and 40B, all data elements entering subsystem 1000 are provided to an I/O subsystem 1001, the output port of which is connected to a data element time-stamping unit 1002 that is controlled by a timing/control unit 1003. In the illustrative embodiment, there are four possible types of data elements that might be loaded into the system event queue 1004, realized as a FIFO data structure known in the computing art. As shown in FIGS. 40A and 40B, the four possible data element types are: package data elements; scan beam data elements; package-in-tunnel (PIT) data elements; and package out-of-tunnel (POOT) data elements.

As shown in FIGS. 40A and 40B, the data element queuing, handling and processing subsystem 1000 further comprises a number of other modules, namely: a moving package tracking queue 1005, realized as a FIFO data structure known in the computing art, for queuing package data elements, package-in-tunnel (PIT) data elements and package out-of-tunnel (POOT) data elements; and a data element analyzer 1006 (e.g. programmed microprocessor and associated memory structures) for reading the different types of data elements from the output of the system event queue 1004 and analyzing and handling the same according to the Data Element Handling Rules set forth in FIGS. 41A1 and 41B.

As shown in FIG. 40A, scan beam data elements generated from "holographic type" laser scanning subsystems shown in FIG. 4A1 must be processed using a system of data processing modules illustrated in FIGS. 40A and 40B. As shown in FIGS. 40A and 40B, this system of data processing modules comprises a data element combining module 1007A for combining (i) each scan beam data element generated from "holographic-type" laser scanning subsystems and accessed from the system event queue 1004 with (ii) each and every package data element in the moving package tracking queue 1005, so as to produce a plurality of combined data element pairs; a package surface geometry modeling module 1008A for generating a geometrical model for the package represented by the package data element in each combined data element pair produced by the data element combining module 1007A; a homogeneous transformation (HG) module 1009A for transforming (i.e. converting) the coordinates of each package surface geometry model produced at the "dimensioning position" in the global coordinate reference frame $R_{global}$, into package surface geometry model coordinates at the "scanning position" within the scanning tunnel (i.e. displaced a distance z from the package dimensioning position); a scan beam geometry modeling module 1010A for generating a geometrical model for the laser scanning beam represented by the scan beam data element in each combined data element pair produced by the data element combining module 1007A; a homogeneous transformation (HG) module 1011A for transforming (i.e. converting) the coordinates of each scanning beam geometry model referenced to the local frame of reference symbolically embedded within the holographic laser scanning system, into scanning beam geometry model coordinates referenced to the global coordinate reference $R_{global}$ at the "scanning position" within the scanning tunnel; a scan beam and package surface intersection determination module 1012A for determining, for each combined data element pair produced from the data element combining module, whether the globally-referenced scan beam model produced by the HG transformation module 1009A intersects with the globally-referenced package surface model produced by the HG transformation module 1011A, and if so, then the data output subsystem 1013A produces, as output, package identification data, package dimension data (e.g. height, width data etc.), and package weight data, for use by auxiliary systems associated with the tunnel scanning system of the present invention.

Scan beam data elements generated from "non-holographic type" laser scanning subsystems must be processed using a different system of data processing modules than that shown in FIGS. 40A and 40B. Such alternative methods are described in Applicants's Internnation Application No. WO 99/49411, supra. Such methods can be applied to polygonal-type scanning methods, as well as 1D and 2D image scanning methods, as employed for example in the system embodiments described in FIGS. 49 and 53, to be described in detail hereinbelow.

Having described the overall structure and function of the data element queuing, handling and processing subsystem 1000, it is appropriate at this juncture to now briefly describe the operation thereof with reference to FIGS. 40A and 40B.

Prior to loading into the system event queue 1004, each data element is time-stamped (i.e. $T_i$) by the timing stamping module 1002 driven by a master clock within timing/control unit 103 referenced to the global reference frame $R_{global}$. All data elements in the system event queue 1004 are handled by a data element analyzer/handler 1006 which is governed by the table of Data Element Handling Rules set forth in FIGS. 41A and 41B. In general, subsystem 1000 is best realized by a computing platform having a multi-tasking operating system capable of handling multiple "threads" at the same time.

Each package moving through the scanning tunnel will be represented by a data element (i.e. an object in an object-oriented programming environment, e.g. Java programming environment) stored in a moving package tracking queue 1005 operably connected to the data element handler 1006. Package data elements are placed in the moving package tracking queue 1005 and matched with each scan beam data element accessed from the system event queue 1004 using a data element combining module 1007A. Scan beam data elements generated from holographic-based scanning units are processed along the scan data processing channel illustrated by blocks 1008A, 1009A, 1010A, 1011A, 1012A, and 1013A set forth in FIGS. 40A and 40B. This is because scan beam data elements generated from holographic-based scanning units have been generated from laser scanning beams (or finite scanning sectors) which can be tracked with scan package identification data by tracking facet sectors on the scanning disc in issue.

The Package Surface Geometry Modeling Subsystem of the First Illustrative Embodiment of the Present Invention As shown in FIG. 42, a surface geometry model is created for each package surface by the package surface geometry modeling subsystem (i.e. module) 1008A deployed with the data element queuing, handling and processing subsystem 1000 of FIG. 40A. In the illustrative embodiment, each surface of each package transported through package dimensioning/measuring subsystem 600 is mathematically represented (i.e. modeled) using at least three position vectors (referenced to x=0, y=0, z=0) in the global reference frame $R_{global}$, and a normal vector to the package surface indicating the direction of incident light reflection therefrom. The table of FIG. 43 describes a preferred procedure for creating a vector-based surface model for each surface of each package transported through the package dimensioning/measuring subsystem 600 hereof.

The Scan Beam Geometry Modeling Subsystem of the First Illustrative Embodiment of the Present Invention As shown in FIGS. 44A1 through 44A2, a vector-based model is created by the scan beam geometry modeling subsystem (i.e. module) 1010A, for the propagation of the laser scanning beam (ray) emanating from a particular point on the facet, to its point of reflection on the corresponding beam folding mirror, towards to the focal plane determined by the focal length of the facet.

The table set forth in FIGS. 44B1 through 44B3 define the parameters used to construct the diffraction-based geometric optics model of the scanning facet and laser scanning beam shown in FIGS. 44A1 and 44A2. Details of this modeling procedure can be found in Applicant's copending application Ser. No. 08/726,522 filed Oct. 7, 1996; and Ser. No. 08/573,949 filed Dec. 18, 1995.

Figure 44D:
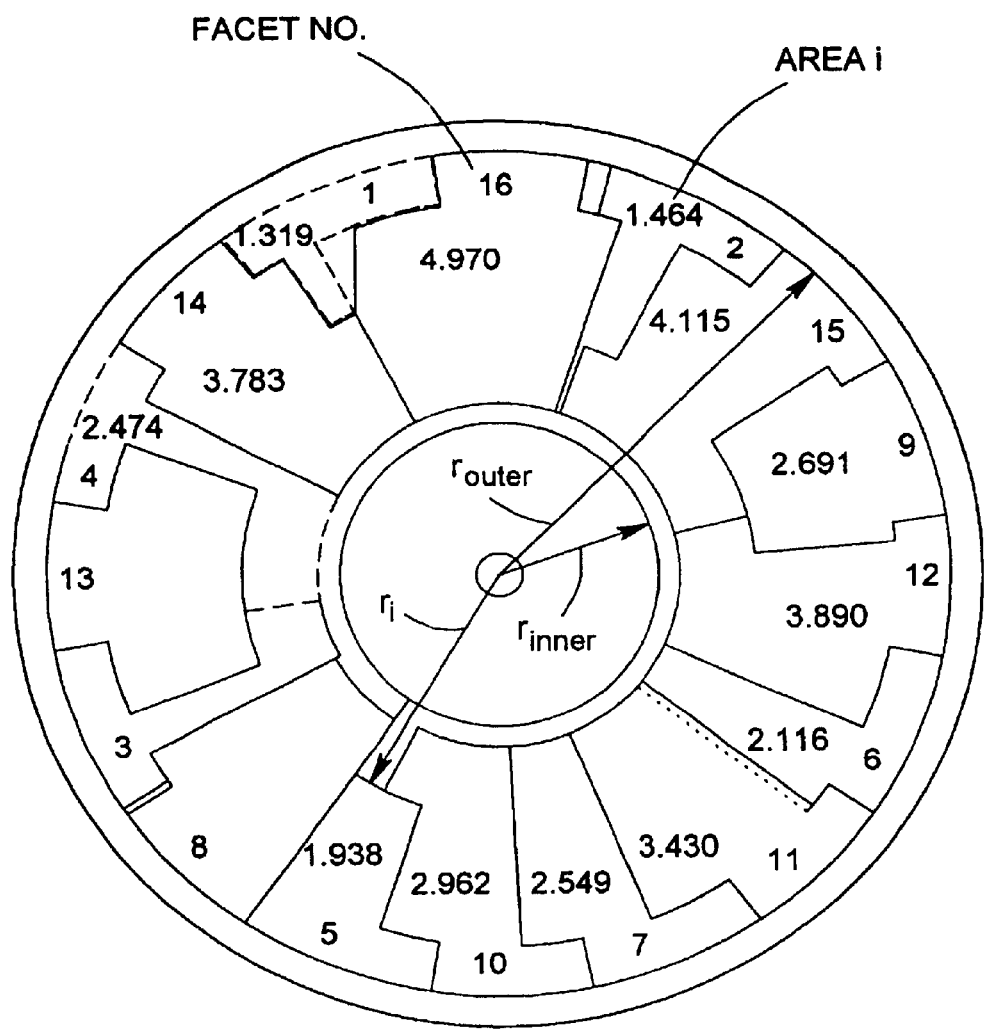
FIG. 44D is a schematic representation of the laser scanning disc shown in FIGS. 44A1 and 44A2, labeled with particular parameters associated with the diffraction-based geometric optics model thereof.

FIG. 44D provides a schematic representation of the laser scanning disc shown in FIGS. 44A1 and 44A2, labeled with particular parameters associated with the diffraction-based geometric optics model thereof.

In FIG. 45, a preferred procedure is described for creating a vector-based ray model for laser scanning beams which have been produced by a holographic laser scanning subsystem of the system hereof, that may have collected the scan data associated with a decoded bar code symbol read thereby within the tunnel scanning subsystem.

The Scan Surface Modeling Subsystem of the First Illustrative Embodiment of the Present Invention FIG. 46 schematically shows how the scan surface modeling subsystem (i.e. module) shown of FIGS. 40A and 40B can be used to define a vector-based 2-D surface geometry model for each candidate scan beam generated by the polygonal-based bottom scanners in the tunnel scanning system. As shown in FIG. 46, each omnidirectional scan pattern produced from a particular polygon-based bottom scanning unit is mathematically represented (i.e. modeled) using four position vectors (referenced to x=0, y=0, z=0) in the global reference frame $R_{global}$, and a normal vector to the scanning surface indicating the direction of laser scanning rays projected therefrom during scanning operations.

The Homogeneous (HG) Transformation Module of the First Illustrative Embodiment of the Present Invention FIGS. 46 and 47 schematically describes how the homogeneous (HG) transformation module 1009A of FIGS. 40A and 40B uses homogeneous transformations to convert a vector-based model within a local scanner coordinate reference frame $R_{localscannerj}$ into a corresponding vector-based model created within the global scanner coordinate reference frame $R_{global}$. This mathematical technique is essential in that it converts locally-referenced coordinates used to represent a laser beam (which scanned a bar code symbol) into globally-referenced coordinates used to represent the same laser scanning beam.

FIG. 46 describes how the homogeneous (HG) transformation module 1010A of FIG. 22 uses homogeneous transformations to convert a vector-based package surface model specified within the global coordinate reference frame $R_{global}$ at the "package height/width profiling position", into a corresponding vector-based package surface model created within the global coordinate reference frame $R_{global}$ specified at the "scanning position" within the tunnel scanning system. This mathematical technique is essential in that it converts locally-referenced coordinates used to represent a package surface into globally-referenced coordinates used to represent the same package surface. Notably, this method of coordinate conversion involves computing the package travel distance (z=d) between the package height/width profiling and scanning positions using (1) the package or conveyor belt velocity (v) and the difference in time (i.e. $\Delta T = T1 - T2$) indicated by the time stamps (T1 and T2) placed on the package data element and scan beam data element, respectively, matched thereto during each scan beam/package surface intersection determination carried out within module 1012A in the data element queuing, handling and processing subsystem 1000 of FIGS. 40A and 40B. Notably, this package displacement distance z=d between the profiling and scanning positions is given by the mathematical expression d=v $\Delta T$.

Figure 48A:
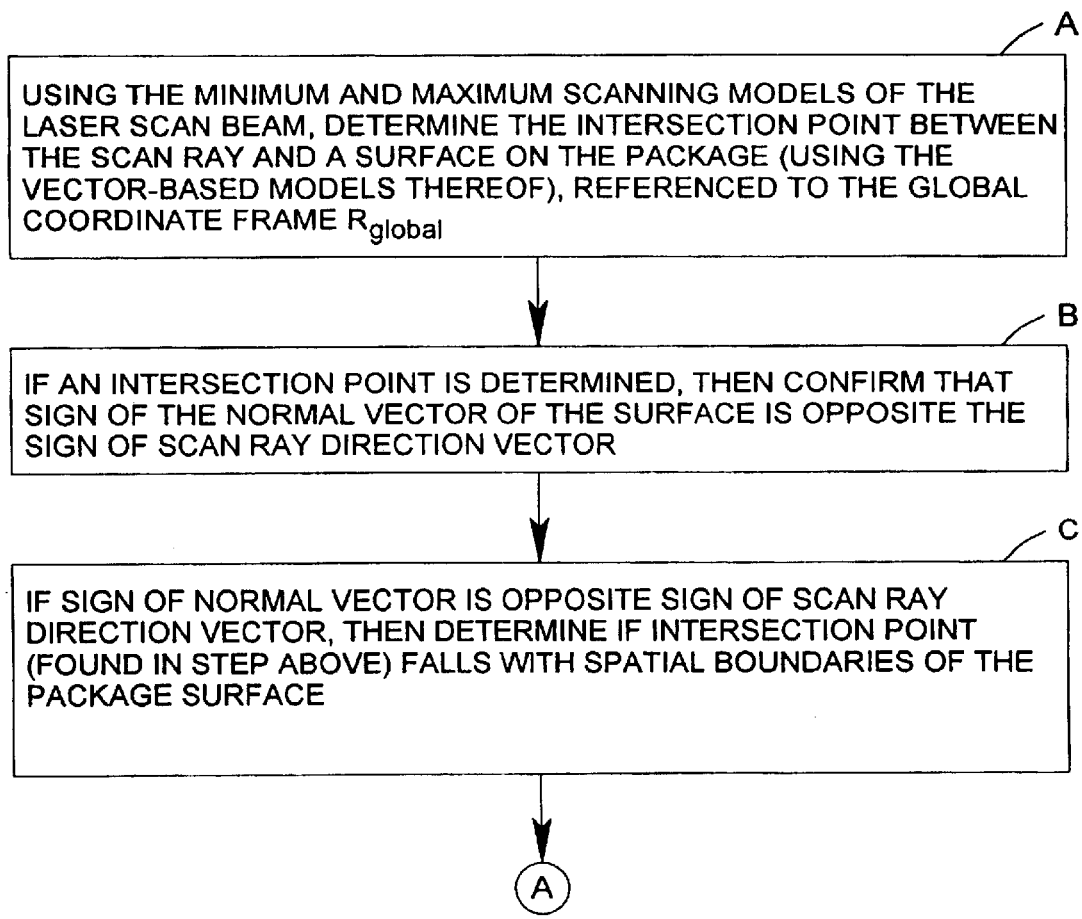
FIGS. 48A and 48B, taken together, provide a procedure for determining whether the scan beam (rays) associated with a particular scan beam data element produced by a holographic scanning subsystem intersects with any surface on the package that has been scanned at a particular scanning position, and thus whether to correlate a particular package identification data element with particular package measurement data element acquired by the system.
Figure 48B:
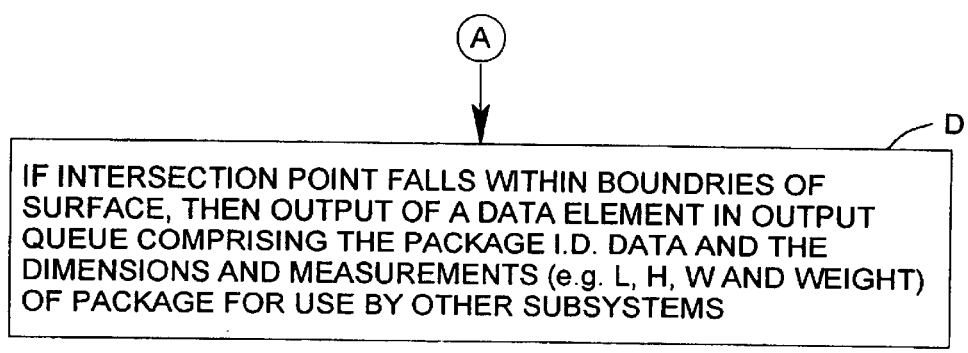

The Scan Beam and Package Surface Intersection Determination Subsystem of the First Illustrative Embodiment of the Present Invention for Use with Scan Beam Data Elements Produced by Holographic Scanning Subsystems FIGS. 48A and 48B, taken together, describes a procedure which is carried out within the scan beam and package surface intersection determination module 1012A of the illustrative embodiment in order to determine whether (i) the scan beam (rays) associated with a particular scan beam data element produced by a holographic scanning subsystem intersects with (ii) any surface on the package that has been scanned at a particular scanning position, and thus whether to correlate a particular package identification data element with particular package measurement data element acquired by the system.

As indicated at Block A in FIG. 48A, the first step of the procedure involves using the minimum and maximum scan rays models of the laser scan beam to determine the intersection point between the scan ray and a surface on the package (using the vector-based models thereof) referenced to the global coordinate reference frame. As indicated at Block B in FIG. 48A, if an intersection point has been determined at Block A, then confirm that the sign of the normal vector of the surface is opposite the sign of the scan ray direction vector. As indicated at Block C in FIG. 31A, if the sign of the normal vector is opposite the sign of the scan ray direction vector, then determine if the intersection point (found at Block A) falls within the spatial boundaries of the package surface. As indicated at Block D in FIG. 48B, if the intersection point falls within the boundaries of the surface, then output a data element to the output queue in the data output subsystem 1013A, wherein the data element comprises package identification data and data representative of the dimensions and measurements of the package by the system for use by other subsystems. When a scan beam data element taken from the system event queue 1004 is correlated with a package data element using the above described method, then the subsystem 1000 outputs a data element (in an output data queue 1013A) containing the package ID data and the package dimensional and measurement data. Such data elements can be displayed graphically, printed out as a list, provided to sorting subsystems, shipping pricing subsystems, routing subsystems and the like.

Unitary Package Identification and Dimensioning System Constructed According to a Second Illustrated Embodiment of the Present Invention;

Referring now to FIGS. 49 through 52, a unitary package identification and dimensioning system of the second illustrated embodiment 3000 will now be described in detail.

Figure 49:
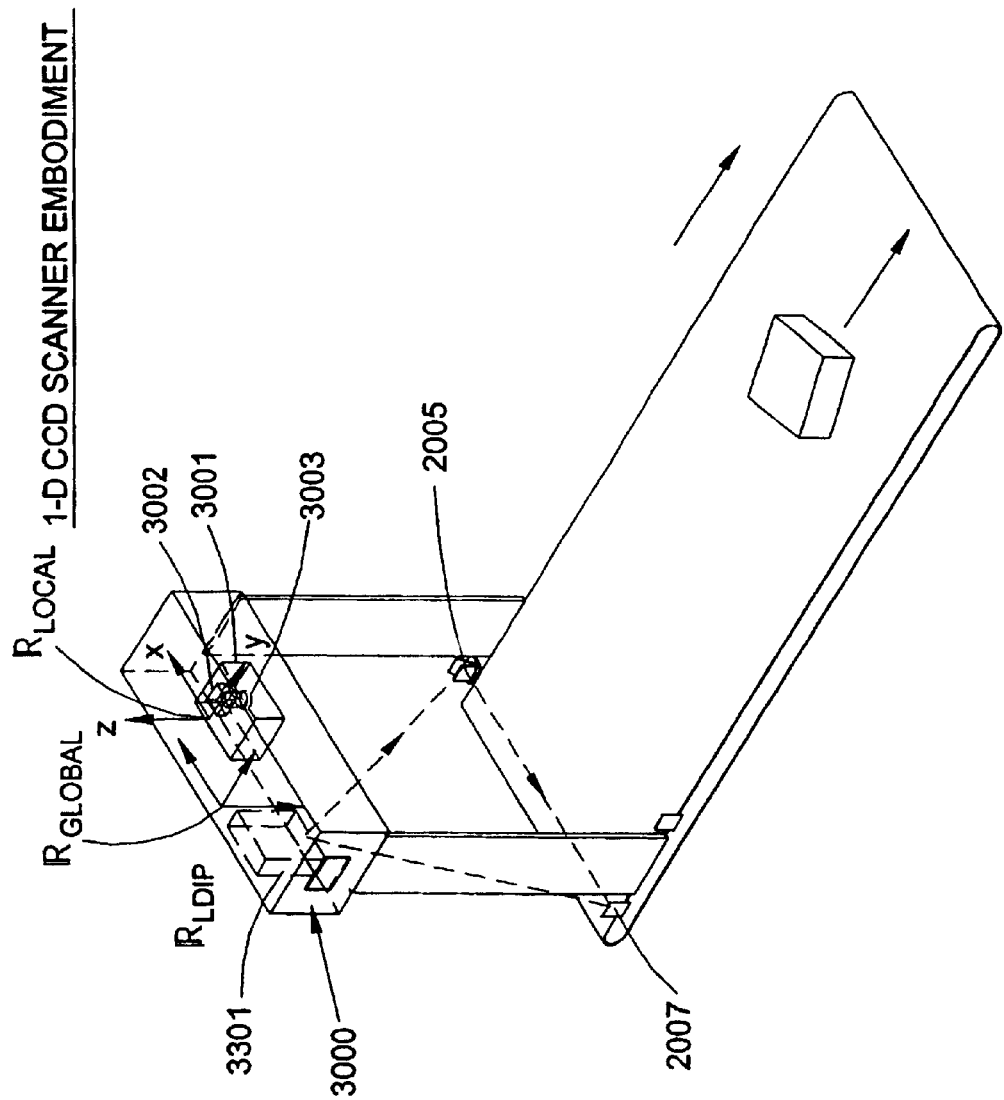
FIG. 49 is a perspective view of an automated tunnel-type laser scanning package identification and weighing system constructed in accordance with the second illustrated embodiment of the present invention, wherein packages, arranged in a non-singulated or singulated configuration, are transported along a high speed conveyor belt, dimensioned by the LADAR-based imaging, detecting and dimensioning subsystem of the present invention, weighed by a weighing scale, and identified by an automatic bar code symbol reading system employing a 1-D (i.e. linear) CCD-based scanning array below which a light focusing lens is mounted for imaging bar coded packages transported therebeneath and decode processing to read such bar code symbols in a fully automated manner without human intervention.

As shown in FIG. 49, system 3000 mounted above a conveyor belt like the system shown in FIGS. 1A through 1D, and employs a LADAR-based imaging, detecting and dimensioning subsystem 3301 as described above, and an automatic bar code symbol reading system 3001 employing a 1-D (i.e. linear) CCD-based scanning array 3002 (having 6000 pixels to cover 48" at 130 dots/inch resolution), below which a light focusing lens 3003 is mounted for imaging bar coded packages transported therebeneath and decode processing to read such bar code symbols in a fully automated manner without human intervention.

Figure 50:
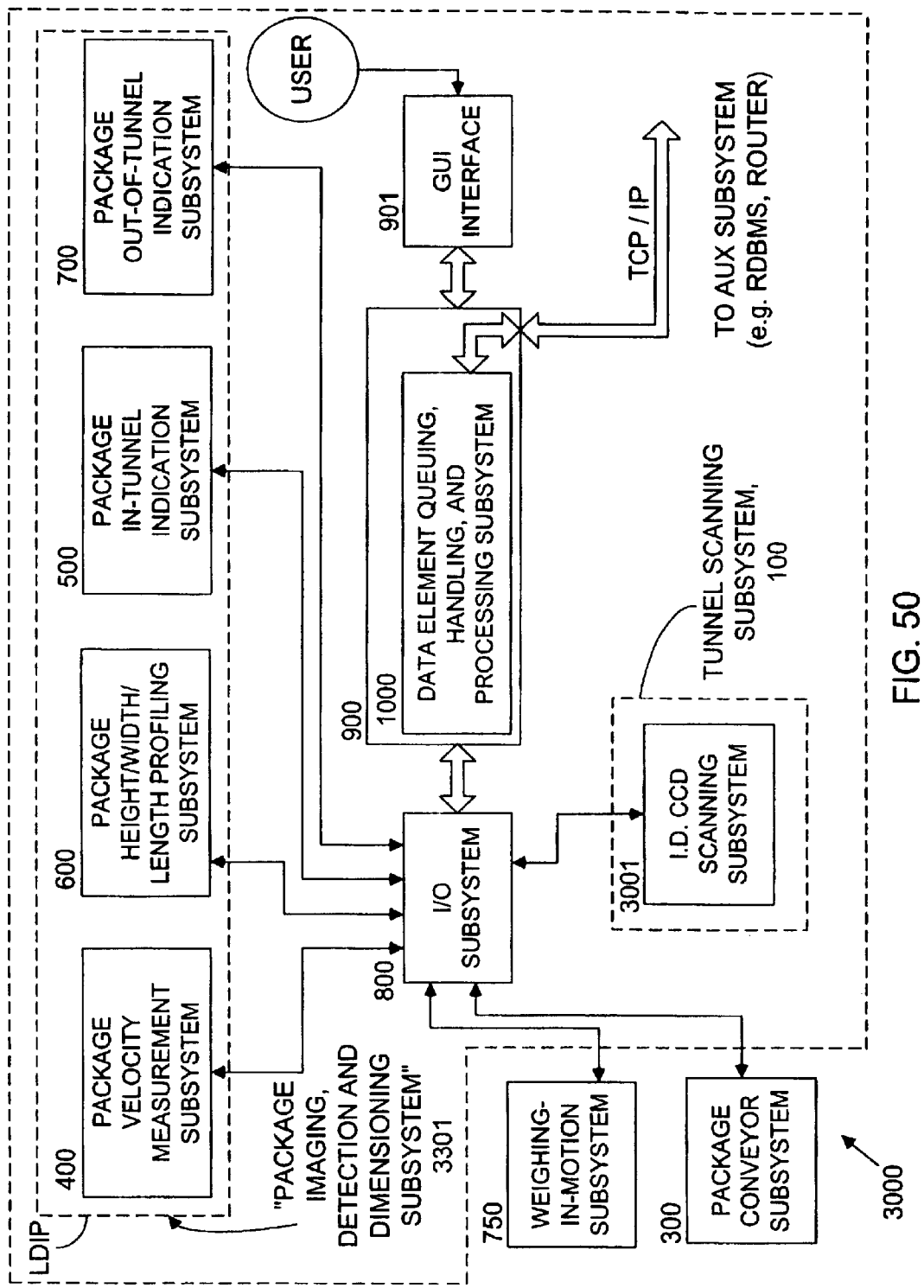
FIG. 50 is a schematic block diagram illustrating the subsystem components of the automated tunnel-type package identification and measurement system of FIG. 49, namely its LADAR-based package imaging, detecting and dimensioning subsystem, package velocity computation subsystem, the package-in-tunnel indication subsystem, the package-out-of-tunnel subsystem, the package weighing-in-motion subsystem, the 1-D (i.e. linear) CCD-based bar code symbol reading subsystem, the data-element queuing, handling and processing subsystem, the input/output port multiplexing subsystem, and the conveyor belt subsystem integrated together as shown.

FIG. 50 shows that this unitary system 3000 is similar to system 1 except that it employs a 1-D (i.e. linear) CCD-based bar code symbol reading subsystem 3001 to read bar code symbols on packages, rather than a holographic scanning system. In all other respects, these systems are similar in operation.

Figure 51:
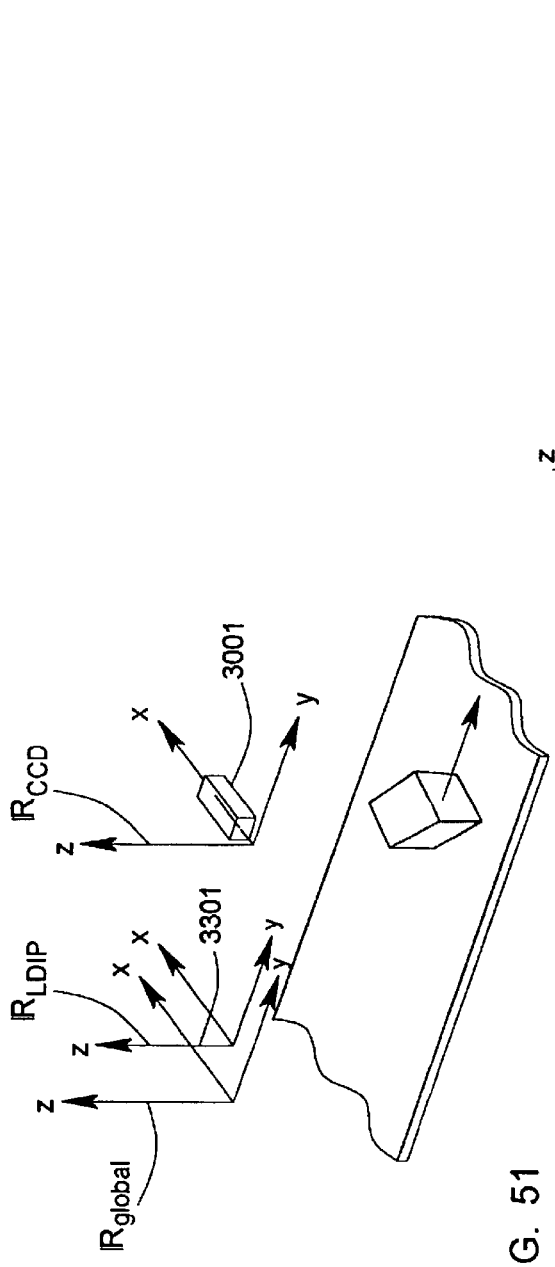
FIG. 51 is a schematic representation showing the relative spatial relation between the global coordinate reference system $R_{global}$ symbolically embedded within the unitary package identification system, the local coordinate reference system $R_{LDIP}$ symbolically embedded within the package imaging, detecting and dimensioning subsystem, and the local coordinate reference system $R_{CCD}$ symbolically embedded within the 1D CCD array within the bar code symbol reading system.
Figure 52:
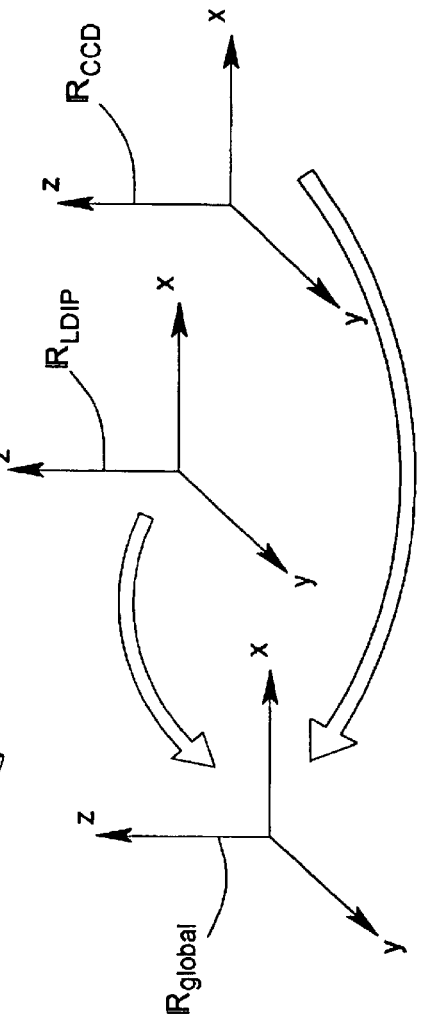
FIG. 52 is a schematic representation illustrating that all coordinates referenced with respect to one of the local coordinate systems depicted in FIG. 51 are converted to the global coordinate reference system using homogeneous transformations.

FIG. 51 illustrates the relative spatial relation between the global coordinate reference system $R_{global}$ symbolically embedded within the unitary package identification system 3000, the local coordinate reference system $R_{LDIP}$ symbolically embedded within the package imaging, detecting and dimensioning subsystem 3301, the local coordinate reference system $R_{CCD}$ symbolically embedded within the 1D CCD array within the bar code symbol reading system 3001. Also, FIG. 52 illustrates that all coordinates referenced with respect to one of the local coordinate systems depicted in FIG. 51 are converted to the global coordinate reference system using homogeneous transformations, as practiced in the first system embodiment described above. In this system, the scan surface and package surface intersection determination subsystem will be modified to account for the fact that images of bar code symbols are captured and read and not scanned by laser scanning beams. To address this fact, the center of the image read by the 1D CCD-based bar code read by subsystem 3001 is determined relative to the local coordinate system embedded within the 1D CCD camera system, and then such coordinates are converted back to the global coordinate reference frame embedded within the unitary system 3000. This enables the system to determine whether there is an intersection between a particular bar code read by the 1D CCD scanner 3001 and a package dimensioned by subsystem 600.

Unitary Package Identification and Dimensioning System Constructed According to a Third Illustrated Embodiment of the Present Invention;

Referring now to FIGS. 53 through 56, a unitary package identification and dimensioning system of the second illustrated embodiment 3000 will now be described in detail.

Figure 53:
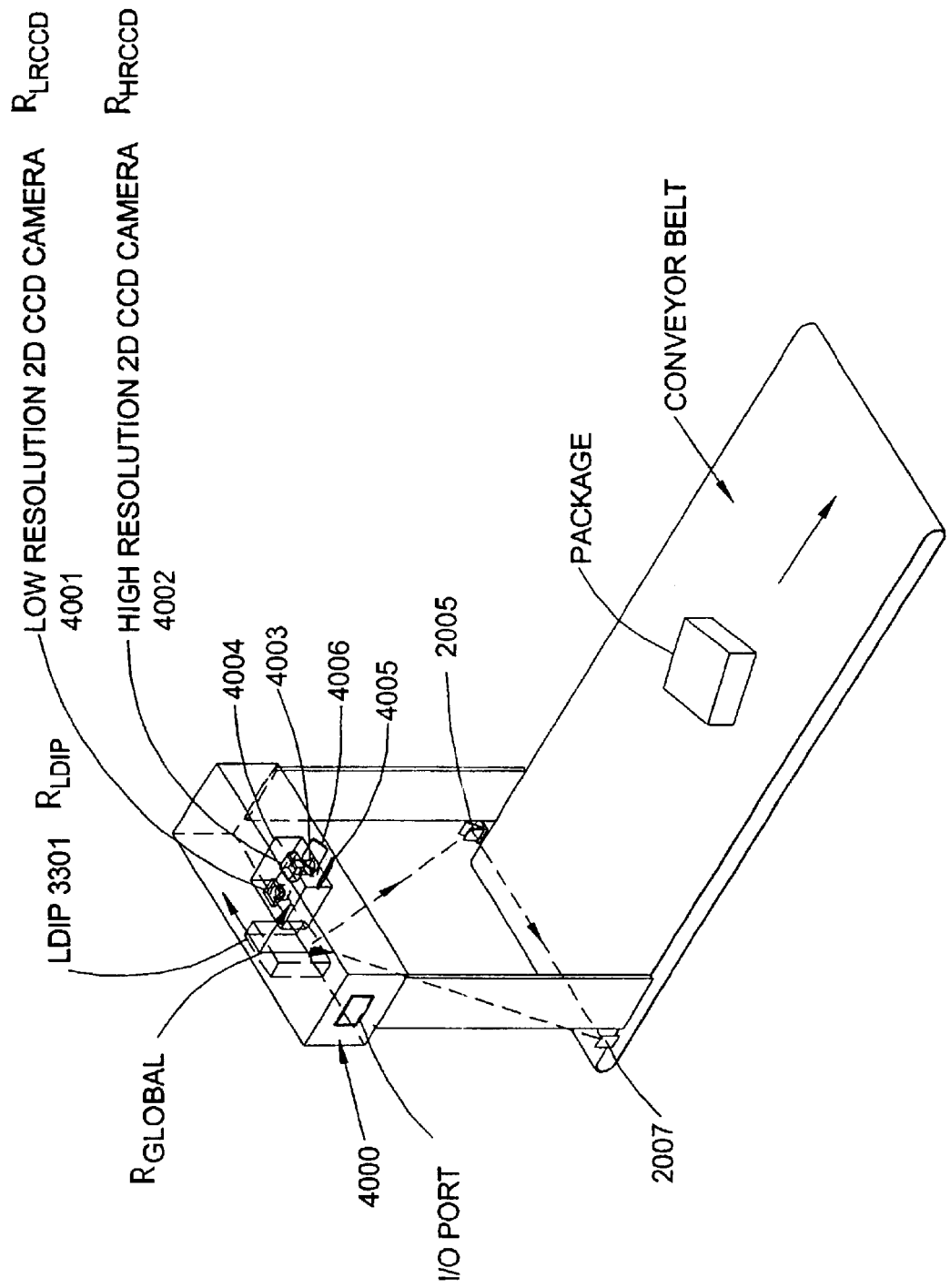
FIG. 53 is a perspective view of an automated tunnel-type laser scanning package identification and weighing system constructed in accordance with the third illustrated embodiment of the present invention, wherein packages, arranged in a non-singulated singulated configuration, are transported along a high speed conveyor belt, dimensioned by the LADAR-based package imaging, detecting and dimensioning subsystem, weighed by the in-weighing subsystem, imaged by a low-resolution CCD camera to locate the x,y position of labels on scanned packages, and identified by an automatic bar code symbol reading system comprising a stationarily-mounted light focusing lens mounted below a vertically-translatable 2-D CCD-based high-resolution scanning array controlled by package height information obtained from the LADAR-based package imaging, detecting and dimensioning subsystem, a pair of orthogonally-mounted field-of-view (FOV) steerable mirrors mounted beneath the 2-D CCD-based scanning array and controlled by the x,y coordinates collected by the low-resolution CCD camera, so as to scan detected package labels, collect high-resolution scan data therefrom, and decode processing the same so as to read bar code symbols within the detected package label in a fully automated manner without human intervention.
Figure 54:
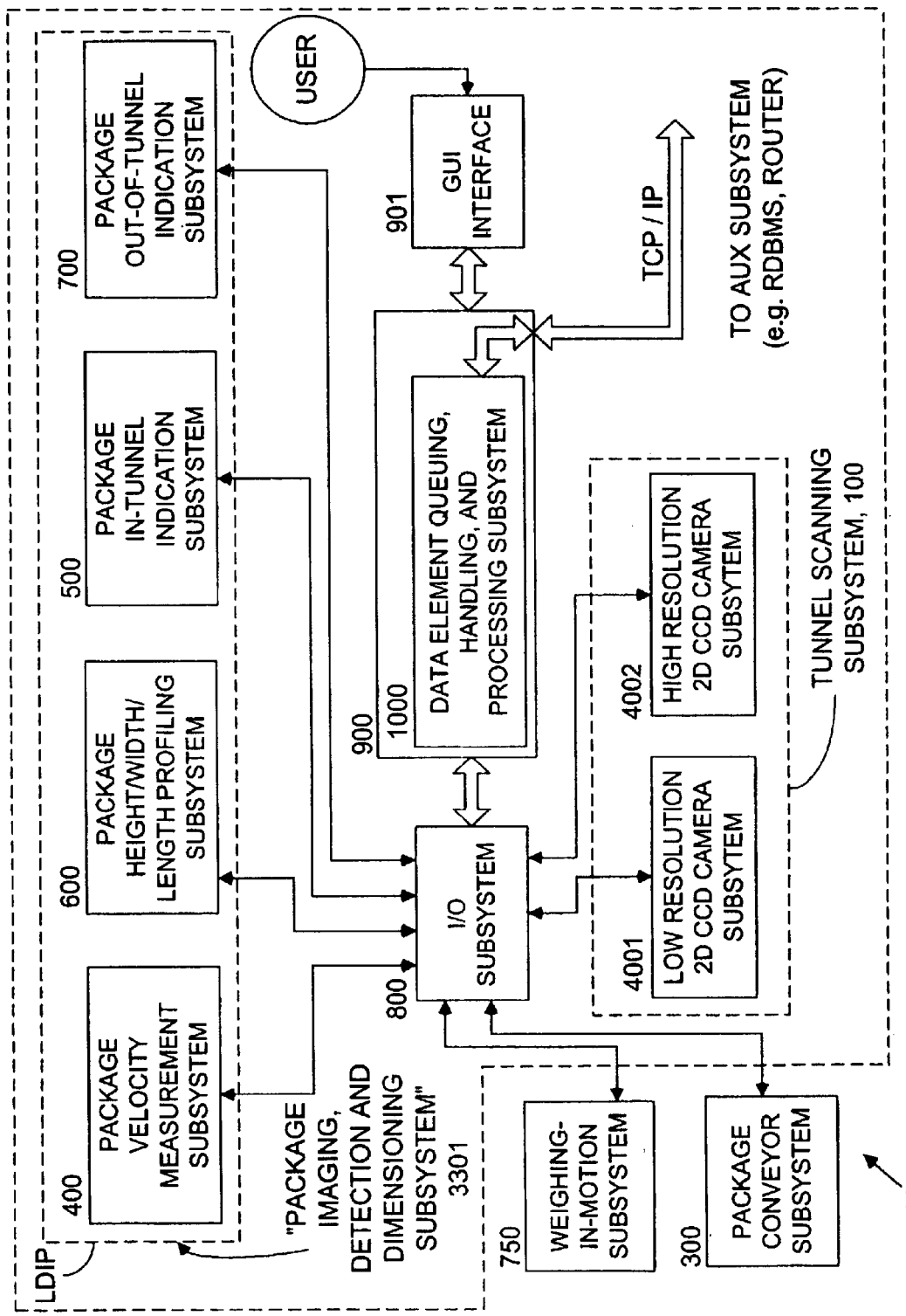
FIG. 54 is a is a schematic block diagram illustrating the subsystem components of the automated tunnel-type package identification and measurement system of FIG. 50, namely its LADAR-based package imaging, detecting and dimensioning subsystem, package velocity computation subsystem, the package-in-tunnel indication subsystem, the package-out-of-tunnel subsystem, the package weighing-in-motion subsystem, the 2-D steerable CCD-based bar code symbol reading subsystem, the data-element queuing, handling and processing subsystem, the input/output port multiplexing subsystem, and the conveyor belt subsystem integrated together as shown.

As shown in FIG. 53, system 4000 mounted above a conveyor belt like the system shown in FIGS. 1A through 1D, and comprises: a LADAR-based imaging, detecting and dimensioning subsystem 3301 as described above; a low-resolution CCD camera 4001 (having 640×640 pixels) to locate the x,y position of bar code labels on scanned packages; and an automatic bar code symbol reading system 4002 comprising a stationarily-mounted light focusing lens 4003 mounted below a vertically-translatable (along the z axis) 2-D CCD-based high-resolution scanning array 4004 (e.g. 1000×1000 pixels) having its position along the z axis controlled by package height information obtained from the LADAR-based package imaging, detecting and dimensioning subsystem 3301; a pair of orthogonally-mounted field-of-view (FOV) steerable mirrors 4005 and 4006 mounted beneath the lens 4003 and controlled by the x,y coordinates collected by the low-resolution CCD camera 4001, so as to scan detected package labels, collect high-resolution scan data therefrom, and decode processing the same so as to read bar code symbols within the detected package label in a fully automated manner without human intervention;

FIG. 54 shows that this unitary system 4000 is similar to system 1 and 3000 except that it employs a 2-D Hight resolution CCD-based bar code symbol reading subsystem 4002 is used to read bar code symbols on packages, rather than a holographic scanning system, and that a low resolution CCD camera 4001 and subsystem 3301 are used to adjust the focus and steer the FOV of this CCD camera 4002 to where the low-resolution CCD camera determine where the bar code label is located. All other respects, these systems are similar in operation.

Figure 55:
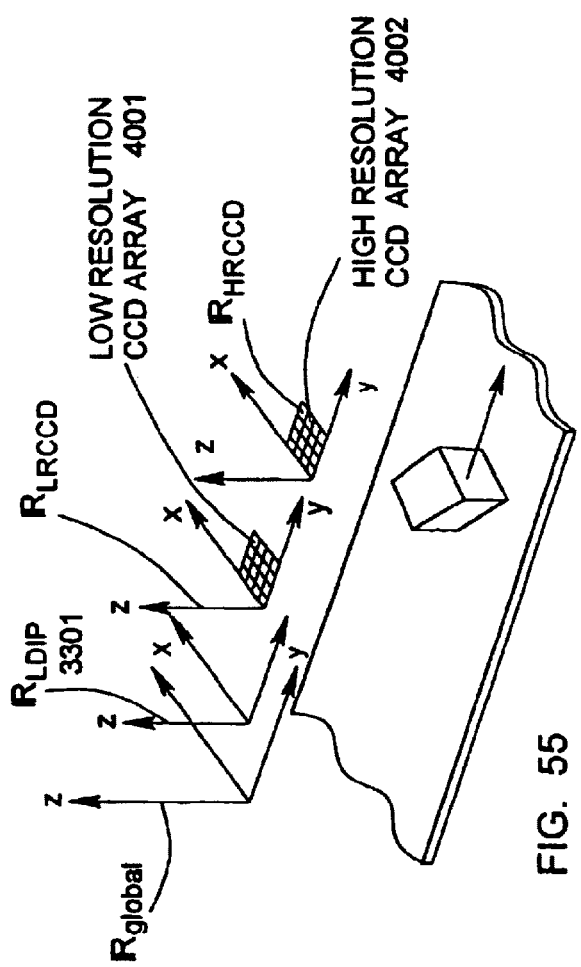
FIG. 55 is a schematic representation showing the relative spatial relation between the global coordinate reference system $R_{global}$ symbolically embedded within the unitary package identification system, the local coordinate reference system $R_{LDIP}$ symbolically embedded within the package imaging, detecting and dimensioning subsystem, the local coordinate reference system $R_{LRCCD}$ symbolically embedded within the low-resolution 2D CCD scanning array (i.e. camera) within the bar code symbol reading system, and the local coordinate reference system $R_{HRCCD}$ symbolically embedded within the high-resolution 2D CCD scanning array (i.e. camera) within the bar code symbol reading system.
Figure 56:
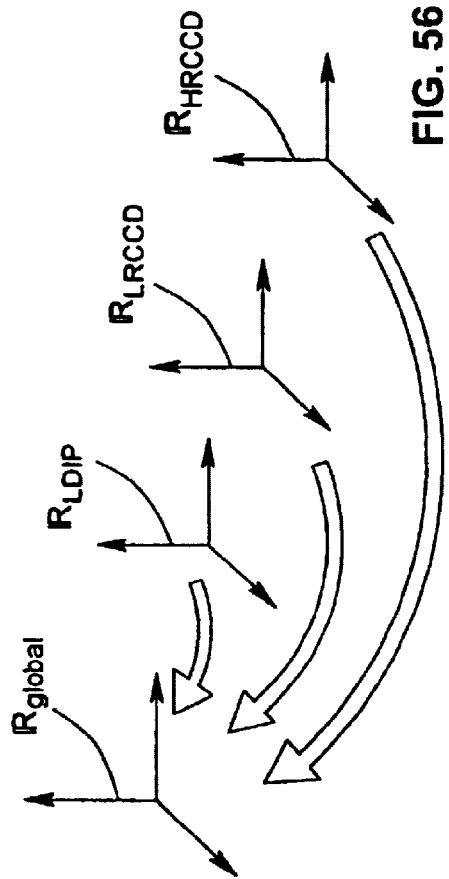
FIG. 56 is a schematic representation illustrating that all coordinates referenced with respect to one of the local coordinate systems depicted in FIG. 56 are converted to the global coordinate reference system using homogeneous transformations.

FIG. 55 illustrates the relative spatial relation between the global coordinate reference system $R_{global}$ symbolically embedded within the unitary package identification system 4000, the local coordinate reference system $R_{LDIP}$ symbolically embedded within the package imaging, detecting and dimensioning subsystem 3301, the local coordinate reference system $R_{LRCCD}$ symbolically embedded within the low-resolution 2D CCD scanning array (i.e. camera) 4001, and the local coordinate reference system $R_{HRCCD}$ symbolically embedded within the high-resolution 2D CCD scanning array (i.e. camera) 4002. Also, FIG. 56 illustrates that all coordinates referenced with respect to one of the local coordinate systems depicted in FIG. 55 are converted to the global coordinate reference system using homogeneous transformations, as practiced in the first system embodiment described above. In this system, the scan surface and package surface intersection determination subsystem will be modified to account for the fact that images of bar code symbols are captured and read and not scanned by laser scanning beams. To address this fact, the center of the image read by by the low resolution 2D CCD-based subsystem 4001 is determined relative to the local coordinate system embedded therewithin, and then such cooridinates are converted back to the global coordinate reference frame embedded within the unitary system 4000. Also, the center of the image read by the high resolution 2D CCD-based subsystem 4002 is determined relative to the local coordinate system embedded therewithin, and then such coordinates are converted back to the global coordinate reference frame embedded within the unitary system 4000. Such coordinate transformations enables the system 4000 to determine whether there is an intersection between a particular bar code read by the high-resolution CCD scanner 4002 and a package dimensioned by subsystem 600.

Applications of the System of the Present Invention

In general, the package identification and measuring systems of the present invention can be installed in package routing hubs, shipping terminals, airports, factories, and the like. There, of course will be numerous other applications for such systems as new situations arise, and the capabilities of such systems become widely known to the general public.

Modifications of the Illustrative Embodiments

While the package conveyor subsystems employed in the illustrative embodiments have utilized belt or roller structures to transport package, it is understood that this subsystem can be realized in many ways, for example: using trains running on tracks passing through the laser scanning tunnel; mobile transport units running through the scanning tunnel installed in a factory environment; robotically-controlled platforms or carriages supporting packages, parcels or other bar coded objects, moving through a laser scanning tunnel subsystem.

While the various embodiments of the package identification and measuring system hereof have been described in connection with linear (1-D) and 2-D code symbol scanning applications, it should be clear, however, that the system and methods of the present invention are equally suited for scanning alphanumeric characters (e.g. textual information) in optical character recognition (OCR) applications, as well as scanning graphical images in graphical scanning arts. All that will be required is to provide image data storage buffers in each of the scanning units so that images of bar code symbols can be reconstructed during scanning operations, and then character recognition techniques, such as taught in U.S. Pat. No. 5,727,081 to Burges, et al, incorporated herein by reference.

Advantages and Other Features of the System of the Present Invention

Through proper programming, the automated package identification and measuring systems of the illustrative embodiments described hereinabove can read virtually any bar code symbology imaginable (e.g. Interleaved two of five, Code 128 and Code three of nine) and formats so as to sort and identify packages at various package rates required by USPS or other end-users. The systems of the illustrative embodiments can read the ZIP Code (six digits), Package Identification Code (PIC) (sixteen characters)[r] and Tray bar code (ten digits) symbols.

The tunnel scanning systems hereof can be configured so that all of the products passing through the "tunnel" shall be scanned and read for the valid USPS bar coded symbols regardless of the position of the bar code symbol on the surface of the product. This also includes the bottom surface of the product.

The tunnel scanning system hereof can be provided with additional equipment including, for example, tachometers, dimensioning units, support structures, special power units (if required), air compressors and any other support equipment required by an application at hand.

Preferably, the tunnel scanning systems of the illustrative embodiments are constructed using standard interfaces such that scanners, decoders, concentrator, etc. are interchangeable.

The tunnel scanning systems hereof can read bar coded symbols through the entire population of tray and tub label holders in use by the USPS, and other package or parcel carriers. In addition, the tunnel scanning systems can read bar code symbols on the package products when the bar code symbol label is placed under diaphanous materials.

There will be more than one bar code symbol on many of the packages found in the tunnel system hereof. Some of these symbols will not be valid USPS symbols. If there are multiple symbols on a package, the scanner logic will automatically identify and process only the USPS valid symbols.

The tunnel scanning systems of the illustrative embodiments can process all types of products (e.g. trays and tubs having extremely large variance in surface types, colors, and plastics (e.g. Tyvek material, canvass, cardboard, polywrap, Styrofoam, rubber, dark packages). Some of these product types include: softpack-pillows, bags; packages having non-flat bottoms, such as flats, trays, and tubs with and without bands; cartons; rugs; duffel bags (without strings or metal clips); tires: wooden containers; and sacks.

It is understood that the laser scanning systems, modules, engines and subsystems of the illustrative embodiments may be modified in a variety of ways which will become readily apparent to those skilled in the art, and having the benefit of the novel teachings disclosed herein. All such modifications and variations of the illustrative embodiments thereof shall be deemed to be within the scope and spirit of the present invention as defined by the Claims to Invention appended hereto.

What is claimed is:

1. An automated unitary-type package identification and dimensioning system supported above a conveyor belt structure, said automated unitary-type package identification and measuring system comprising:
   a single system housing supported above said conveyor belt structure;
   a package identification subsystem, disposed within said single system housing, for reading bar codes on packages transported along said conveyor belt structures and producing package identification data that identifies each said package, and wherein said package identification subsystem includes a 1D imaging-based camera for capturing 1D images of said packages transported past said system housing; and
   a package dimensioning subsystem, disposed within said single system housing, for capturing package dimension information about the dimensions of each said package as each said package is transported past said system housing, and for associating with said package dimension data with package identification data produced by said package identification subsystem.

2. The automated unitary-type package identification and dimensioning system of claim 1, wherein said package dimensioning subsystem comprises
   (i) a Laser Detecting And Ranging (LADAR-based) scanning method for capturing two-dimensional range data maps of the space above said conveyor structure, along which said packages are transported, and
   (ii) a two-dimensional image contour tracing method for extracting package dimension data from said two-dimensional range data maps.

3. The automated unitary-type package identification and dimensioning system of claim 1, wherein the velocity of each said package is computed by using a pair of amplitude modulated laser beams projected from said package dimensioning subsystem at different angular projections over slid conveyor belt structure along which said packages are transported.

4. The automated unitary-type package identification and measuring system of claim 3, wherein the amplitude modulated laser beams have multiple wavelengths to sense packages having a wide range of reflectivity characteristics.

* * * * *